US012751011B2

(12) United States Patent
Yu et al.

(10) Patent No.: US 12,751,011 B2
(45) Date of Patent: Sep. 29, 2026

(54) THREE-DIMENSIONAL MEMORY DEVICE CONTAINING COMPOSITE DIELECTRIC ISOLATION STRUCTURE IN A STAIRCASE REGION AND METHODS OF FORMING THE SAME

(71) Applicant: SANDISK TECHNOLOGIES LLC, Addison, TX (US)

(72) Inventors: Jixin Yu, Milpitas, CA (US); Koichi Matsuno, Fremont, CA (US); Ruogu Matthew Zhu, San Jose, CA (US); Johann Alsmeier, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 426 days.

(21) Appl. No.: 18/360,541

(22) Filed: Jul. 27, 2023

(65) Prior Publication Data

US 2024/0334695 A1 Oct. 3, 2024

Related U.S. Application Data

(60) Provisional application No. 63/492,566, filed on Mar. 28, 2023.

(51) Int. Cl.
*H10B 43/27* (2023.01)
*H10B 41/27* (2023.01)

(52) U.S. Cl.
CPC ............ *H10B 43/27* (2023.02); *H10B 41/27* (2023.02)

(58) Field of Classification Search
None
See application file for complete search history.

(56) References Cited

U.S. PATENT DOCUMENTS

| | | | |
|---|---|---|---|
| 9,806,093 | B2 | 10/2017 | Toyama et al. |
| 9,818,693 | B2 | 11/2017 | Toyama et al. |
| 9,818,759 | B2 | 11/2017 | Kai et al. |
| 9,853,038 | B1 | 12/2017 | Cui et al. |
| 10,038,006 | B2 | 7/2018 | Furihata et al. |
| 10,115,681 | B1 | 10/2018 | Ariyoshi |
| 10,249,640 | B2 | 4/2019 | Yu et al. |
| 10,381,371 | B2 | 8/2019 | Ogawa et al. |
| 10,840,260 | B2 | 11/2020 | Kai et al. |

(Continued)

FOREIGN PATENT DOCUMENTS

CN 112928117 A 6/2012

OTHER PUBLICATIONS

Endoh et al., "Novel Ultra High-Density Memory with a Stacked-Surrounding Gate Transistor (S-SGT) Structured Cell," IEDM Proc. (2001) 33-36.

(Continued)

*Primary Examiner* — Sarah K Salerno
(74) *Attorney, Agent, or Firm* — THE MARBURY LAW GROUP PLLC

(57) ABSTRACT

A three-dimensional memory device includes laterally spaced apart vertical stacks of electrically conductive layers and insulating layers. A composite dielectric isolation structure provides electrical isolation between neighboring pairs of vertical stacks. The composite dielectric isolation structure includes at least one retro-stepped dielectric material portion, and may further include at least one finned insulating support structure or a vertical stack of dielectric material plates.

12 Claims, 141 Drawing Sheets

(56) References Cited

U.S. PATENT DOCUMENTS

| | | | | |
|---|---|---|---|---|
| 10,872,857 | B1 | 12/2020 | Otsu et al. | |
| 10,879,264 | B1 | 12/2020 | Otsu et al. | |
| 10,903,237 | B1 | 1/2021 | Hosoda et al. | |
| 11,081,443 | B1 | 8/2021 | Mizutani et al. | |
| 11,114,459 | B2 | 9/2021 | Iwai et al. | |
| 11,133,252 | B2 | 9/2021 | Ito et al. | |
| 11,282,783 | B2 | 3/2022 | Otsu et al. | |
| 11,322,440 | B2 | 5/2022 | Kubo | |
| 11,342,245 | B2 | 5/2022 | Cui et al. | |
| 11,355,506 | B2 | 6/2022 | Tokita et al. | |
| 11,450,685 | B2 | 9/2022 | Yoshida | |
| 11,532,570 | B2 | 12/2022 | Mizuno et al. | |
| 2019/0057974 | A1 | 2/2019 | Lu et al. | |
| 2021/0057336 | A1 | 2/2021 | Shao et al. | |
| 2021/0134827 | A1 | 5/2021 | Iwai et al. | |
| 2021/0210424 | A1 | 7/2021 | Otsu et al. | |
| 2021/0210428 | A1 | 7/2021 | Ohsawa et al. | |
| 2021/0210503 | A1 | 7/2021 | Matsuno et al. | |
| 2021/0210504 | A1 | 7/2021 | Otsu et al. | |
| 2021/0242128 | A1 | 8/2021 | Ito et al. | |
| 2021/0366808 | A1 | 11/2021 | Cui et al. | |
| 2021/0366920 | A1 | 11/2021 | Tokita et al. | |
| 2021/0366924 | A1 | 11/2021 | Tokita et al. | |
| 2021/0375918 | A1 | 12/2021 | Zhang | |
| 2021/0384206 | A1* | 12/2021 | Iwai | H10B 43/10 |
| 2021/0391345 | A1 | 12/2021 | Otsu et al. | |
| 2022/0102273 | A1 | 3/2022 | Kubo | |
| 2022/0102375 | A1 | 3/2022 | Kubo | |
| 2022/0189872 | A1 | 6/2022 | Sano et al. | |
| 2022/0223614 | A1 | 7/2022 | Takuma et al. | |
| 2022/0254728 | A1 | 8/2022 | Matsuno et al. | |
| 2022/0254733 | A1 | 8/2022 | Mizuno et al. | |
| 2022/0328403 | A1* | 10/2022 | Tobioka | H10B 41/10 |
| 2022/0328413 | A1 | 10/2022 | Kubo et al. | |
| 2022/0328512 | A1 | 10/2022 | Tanaka et al. | |
| 2022/0352091 | A1 | 11/2022 | Yu et al. | |
| 2022/0352196 | A1 | 11/2022 | Shimomura et al. | |
| 2022/0352197 | A1 | 11/2022 | Matsuno et al. | |
| 2022/0375958 | A1 | 11/2022 | Shimabukuro et al. | |
| 2023/0038557 | A1 | 2/2023 | Ogawa et al. | |
| 2023/0041950 | A1 | 2/2023 | Chibvongodze et al. | |
| 2023/0044232 | A1 | 2/2023 | Kai et al. | |
| 2023/0045001 | A1 | 2/2023 | Ogawa et al. | |
| 2023/0057885 | A1 | 2/2023 | Itou et al. | |
| 2023/0064713 | A1 | 3/2023 | Shimomura | |
| 2023/0069307 | A1 | 3/2023 | Shimomura | |

OTHER PUBLICATIONS

U.S. Appl. No. 17/810,097, filed Jun. 30, 2022, SanDisk Technologies LLC.

U.S. Appl. No. 17/810,124, filed Jun. 30, 2022, SanDisk Technologies LLC.

U.S. Appl. No. 18/062,807, filed Dec. 7, 2022, SanDisk Technologies LLC.

U.S. Appl. No. 18/221,689, filed Jul. 13, 2023, SanDisk Technologies LLC.

U.S. Appl. No. 18/221,711, filed Jul. 13, 2023, SanDisk Technologies LLC.

U.S. Appl. No. 18/350,595, filed Jul. 11, 2023, SanDisk Technologies LLC.

U.S. Appl. No. 18/352,726, filed Jul. 11, 2023, SanDisk Technologies LLC.

U.S. Appl. No. 18/352,752, filed Jul. 14, 2023, SanDisk Technologies LLC.

U.S. Appl. No. 18/353,546, filed Jul. 17, 2023, SanDisk Technologies LLC.

U.S. Appl. No. 18/353,577, filed Jul. 17, 2023, SanDisk Technologies LLC.

U.S. Appl. No. 18/354,246, filed Jul. 18, 2023, SanDisk Technologies LLC.

U.S. Appl. No. 18/354,269, filed Jul. 18, 2023, SanDisk Technologies LLC.

U.S. Appl. No. 18/355,067, filed Jul. 19, 2023, SanDisk Technologies LLC.

U.S. Appl. No. 18/356,825, filed Jul. 21, 2023, SanDisk Technologies LLC.

U.S. Appl. No. 18/358,702, filed Jul. 25, 2023, SanDisk Technologies LLC.

U.S. Appl. No. 18/358,727, filed Jul. 25, 2023, SanDisk Technologies LLC.

U.S. Appl. No. 63/383,001, filed Nov. 9, 2022, SanDisk Technologies LLC.

Tobioka, A. et al., "Three-Dimensional Memory Device Containing Composite Dielectric Isolation Structure in a Staircase Region and Methods of Forming the Same," U.S. Appl. No. 18/360,641, filed Jul. 27, 2023.

ISR—Notification of Transmittal of The International Search Report and Written Opinion of the International Searching Authority for International Patent Application No. PCT/US2024/012887, mailed Jun. 4, 2024, 12 pages.

IPRP-WO—Notification Concerning Transmittal of International Preliminary Report on Patentability and Written Opinion of the International Searching Authority for International Patent Application No. PCT/US2024/012887, mailed Oct. 9, 2025, 7 pages.

* cited by examiner

THREE-DIMENSIONAL MEMORY DEVICE CONTAINING COMPOSITE DIELECTRIC ISOLATION STRUCTURE IN A STAIRCASE REGION AND METHODS OF FORMING THE SAME

FIELD

The present disclosure relates generally to the field of semiconductor devices, and particularly to a three-dimensional memory device including composite dielectric isolation structures in a staircase region and methods of forming the same.

BACKGROUND

A three-dimensional memory device including three-dimensional vertical NAND strings having one bit per cell are disclosed in an article by T. Endoh et al, titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device comprises: insulating layers that are vertically spaced apart from each other and that continuously laterally extend between a first first-type lateral isolation trench fill structure and a second first-type lateral isolation trench fill structure that laterally extend along a first horizontal direction and laterally spaced apart from each other along a second horizontal direction; first electrically conductive layers vertically interlaced with the insulating layers and contacting the first first-type lateral isolation trench fill structure; second electrically conductive layers vertically interlaced with the insulating layers and contact the second first-type lateral isolation trench fill structure; and a composite dielectric isolation structure located between the first electrically conductive layers and the second electrically conductive layers and comprising a retro-stepped dielectric material portion, a vertical stack of dielectric material plates, and a pair of second-type lateral isolation trench fill structures that are laterally spaced apart along the first horizontal direction.

According to another aspect of the present disclosure, a three-dimensional memory device is provided, which comprises: insulating layers that are vertically spaced from each other and that continuously laterally extend between a first first-type lateral isolation trench fill structure and a second first-type lateral isolation trench fill structure that laterally extend along a first horizontal direction and laterally spaced apart from each other along a second horizontal direction; first electrically conductive layers vertically interlaced with the insulating layers and contacting the first first-type lateral isolation trench fill structure; second electrically conductive layers vertically interlaced with the insulating layers and contact the second first-type lateral isolation trench fill structure; and a composite dielectric isolation structure located between the first electrically conductive layers and the second electrically conductive layers, wherein the composite dielectric isolation structure comprises a retro-stepped dielectric material portion, and a pair of finned insulating support structures each including a respective vertically-extending insulating core and a respective vertical stack of insulating fins that laterally extend outward from the respective vertically-extending insulating core.

According to yet another aspect of the present disclosure, a three-dimensional memory device is provided, which comprises: a first alternating stack of first insulating layers and first electrically conductive layers and a second alternating stack of second insulating layers and second electrically conductive layers, wherein the first alternating stack and the second alternating stack are located between a pair of first-type lateral isolation trench fill structures that laterally extend along a first horizontal direction and laterally spaced apart from each other along a second horizontal direction; and a composite dielectric isolation structure located between the first alternating stack and the second alternating stack and comprising a pair of retro-stepped dielectric material portions, an insulating support structure comprising a vertical insulating wall portion located between the pair of retro-stepped dielectric material portions, and a pair of second-type lateral isolation trench fill structures that are laterally spaced apart along the first horizontal direction by the insulating support structure.

According to still another aspect of the present disclosure, a method comprises forming an alternating stack of insulating layers and sacrificial material layers over a substrate; forming lateral isolation trenches through the alternating stack, wherein the lateral isolation trenches comprise first-type lateral isolation trenches that laterally continuously extend through a contact region along a first horizontal direction and pairs of second-type lateral isolation trenches that are interlaced with the first-type lateral isolation trenches along a second horizontal direction, wherein each pair of second-type lateral isolation trenches is laterally spaced apart from each other along the first horizontal direction by a gap located within the contact region; forming etch stop liners at end portions of the second-type lateral isolation trenches that are located in the contact region such that the etch stop liners are not present on portions of the second-type lateral isolation trenches that are distal from the contact region and the etch stop liners are not present within the first-type lateral isolation trenches; and replacing portions of the sacrificial material layers with electrically conductive layers, wherein each vertical stack of electrically conductive layers is formed between and does not laterally extend along the second horizontal direction farther than a most proximal first-type lateral isolation trench of the first-type lateral isolation trenches and a most proximal pair of second-type lateral isolation trenches of the pairs of second-type lateral isolation trenches.

According to another aspect of the present disclosure, a method comprises: forming an alternating stack of insulating layers and sacrificial material layers over a substrate; forming an alternating stack of insulating layers and sacrificial material layers over a substrate; forming cavities through the alternating stack; forming fin recesses around the cavities by isotropically laterally recessing the sacrificial material layers; forming finned insulating support structures in volumes of the fin recesses and the cavities; forming lateral isolation trenches through the alternating stack, wherein the lateral isolation trenches comprise first-type lateral isolation trenches that laterally extend through a contact region along a first horizontal direction and pairs of second-type lateral isolation trenches that are interlaced with the first-type lateral isolation trenches along a second horizontal direction, wherein each pair of second-type lateral isolation trenches is laterally spaced apart from each other along the first horizontal direction by at least one of the finned insulating support structures; forming laterally-extending cavities by performing an isotropic etch process that isotropically recesses the sacrificial material layers by providing an isotropic etchant into the first-type lateral isolation trenches and the pairs of second-type lateral isolation trenches; and forming vertical stacks of electrically conductive layers in the laterally-extending cavities.

BRIEF DESCRIPTION OF THE DRAWINGS

FIG. 32E is a vertical cross-sectional view of the third exemplary structure along the vertical plane E-E' of FIG. 32B.

FIG. 32F is a horizontal cross-sectional view of the third exemplary structure along the horizontal plane F-F' of FIG. 32A.

FIG. 32G is a horizontal cross-sectional view of the third exemplary structure along the horizontal plane G-G' of FIG. 32A.

FIG. 32H is a horizontal cross-sectional view of the third exemplary structure along the horizontal plane H-H' of FIG. 32A.

FIG. 33A is a vertical cross-sectional view of the third exemplary structure after formation of electrically conductive layers according to the third embodiment of the present disclosure.

FIG. 33B is a top-down cross-sectional view of the third exemplary structure of FIG. 33A. The vertical plane A-A' is the cut plane of the vertical cross-sectional view of FIG. 33A.

FIG. 33C is a vertical cross-sectional view of the third exemplary structure along the vertical plane C-C' of FIG. 33B.

FIG. 33D is a vertical cross-sectional view of the third exemplary structure along the vertical plane D-D' of FIG. 33B.

FIG. 33E is a vertical cross-sectional view of the third exemplary structure along the vertical plane E-E' of FIG. 33B.

FIG. 33F is a horizontal cross-sectional view of the third exemplary structure along the horizontal plane F-F' of FIG. 33A.

FIG. 33G is a horizontal cross-sectional view of the third exemplary structure along the horizontal plane G-G' of FIG. 33A.

FIG. 33H is a horizontal cross-sectional view of the third exemplary structure along the horizontal plane H-H' of FIG. 33A.

Figure 34A:
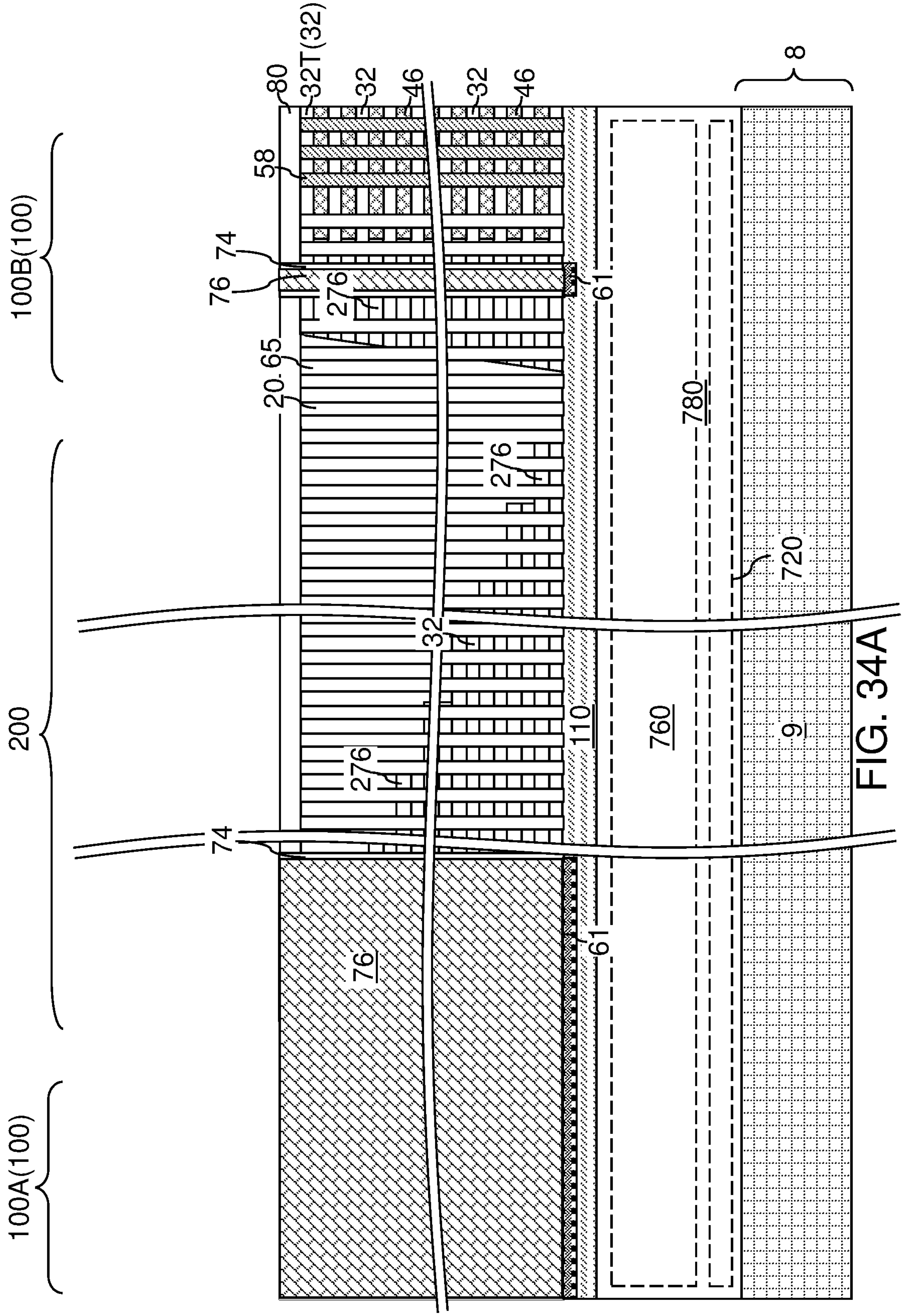

FIG. 34A is a vertical cross-sectional view of the third exemplary structure after formation of lateral isolation trench fill structures according to the third embodiment of the present disclosure.

Figure 34B:
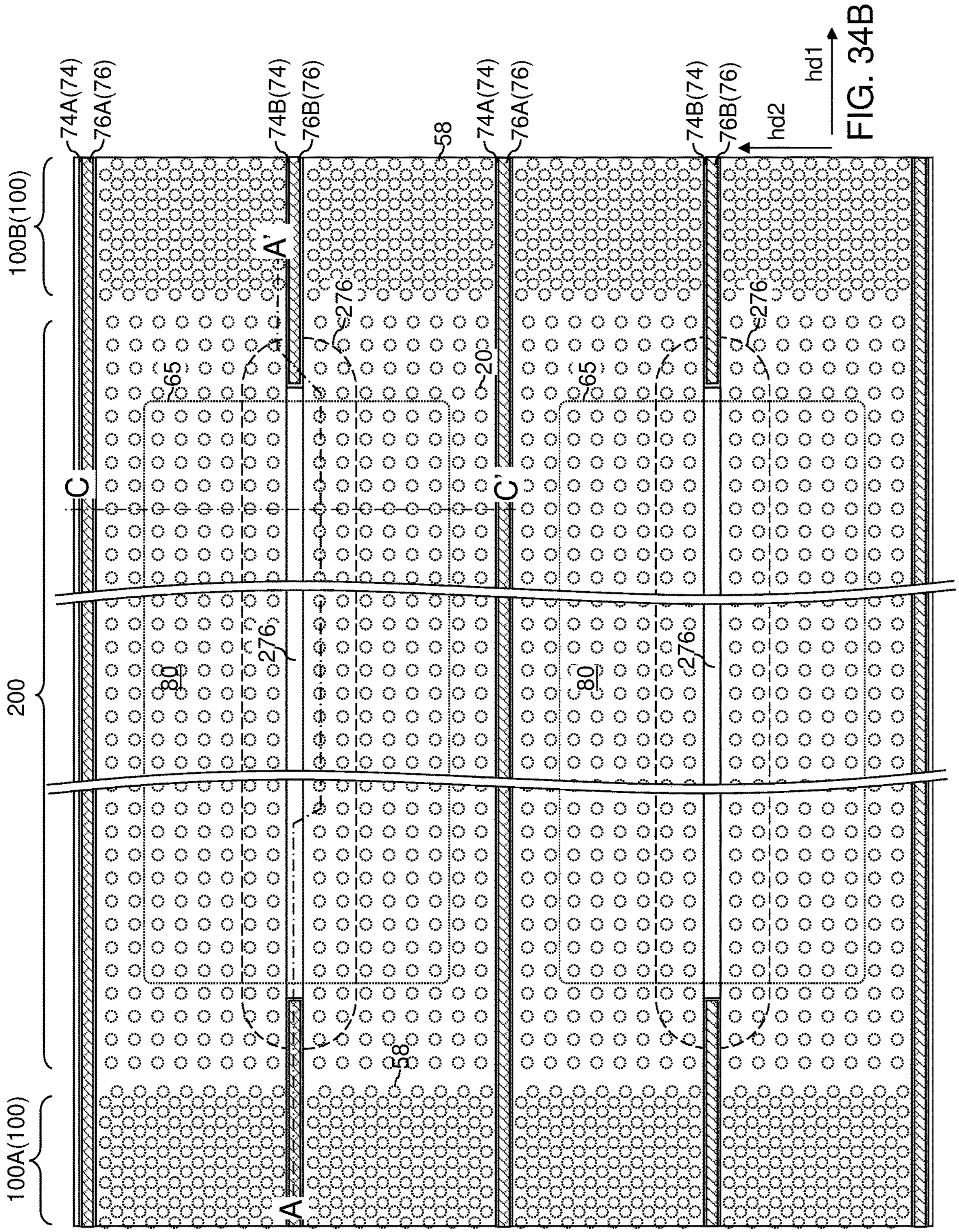

FIG. 34B is a top-down cross-sectional view of the third exemplary structure of FIG. 34A. The vertical plane A-A' is the cut plane of the vertical cross-sectional view of FIG. 34A.

Figure 34C:
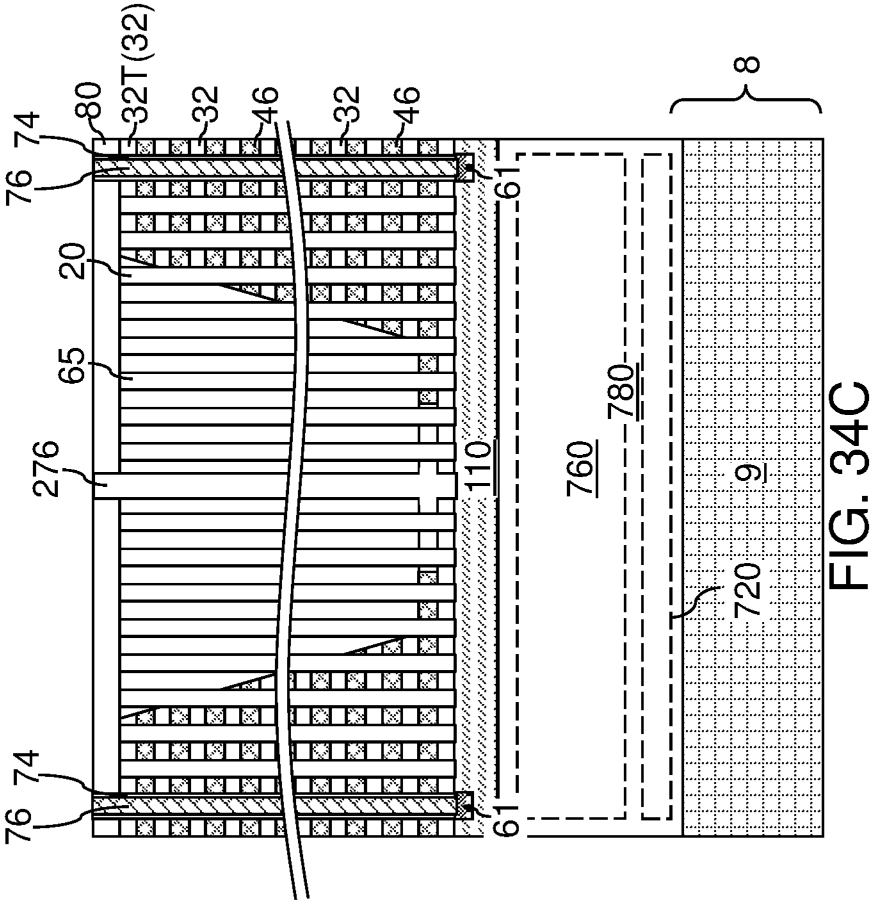

FIG. 34C is a vertical cross-sectional view of the third exemplary structure along the vertical plane C-C' of FIG. 34B.

Figure 35A:
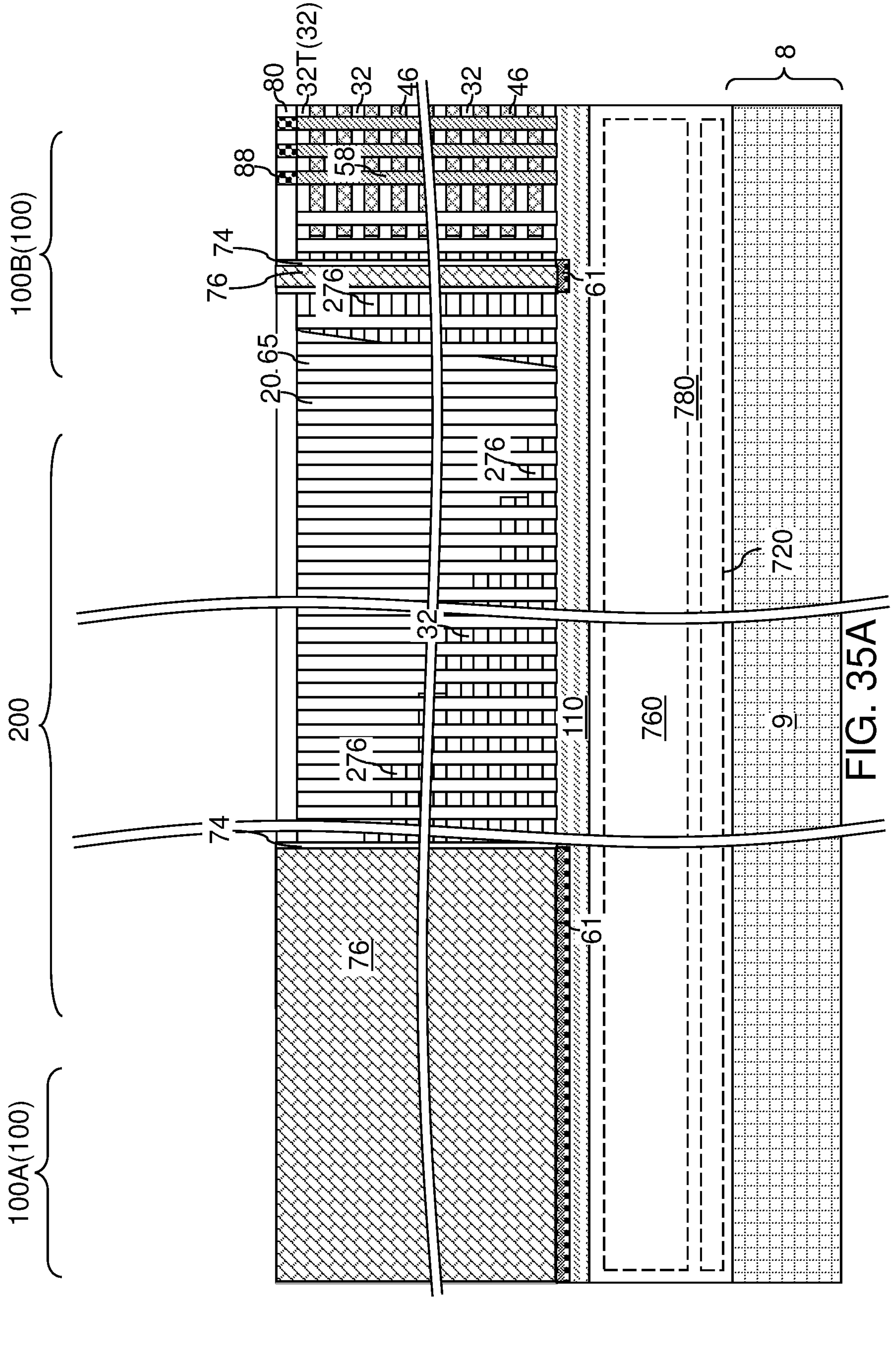

FIG. 35A is a vertical cross-sectional view of the third exemplary structure after formation of contact via structures according to the third embodiment of the present disclosure.

Figure 35B:
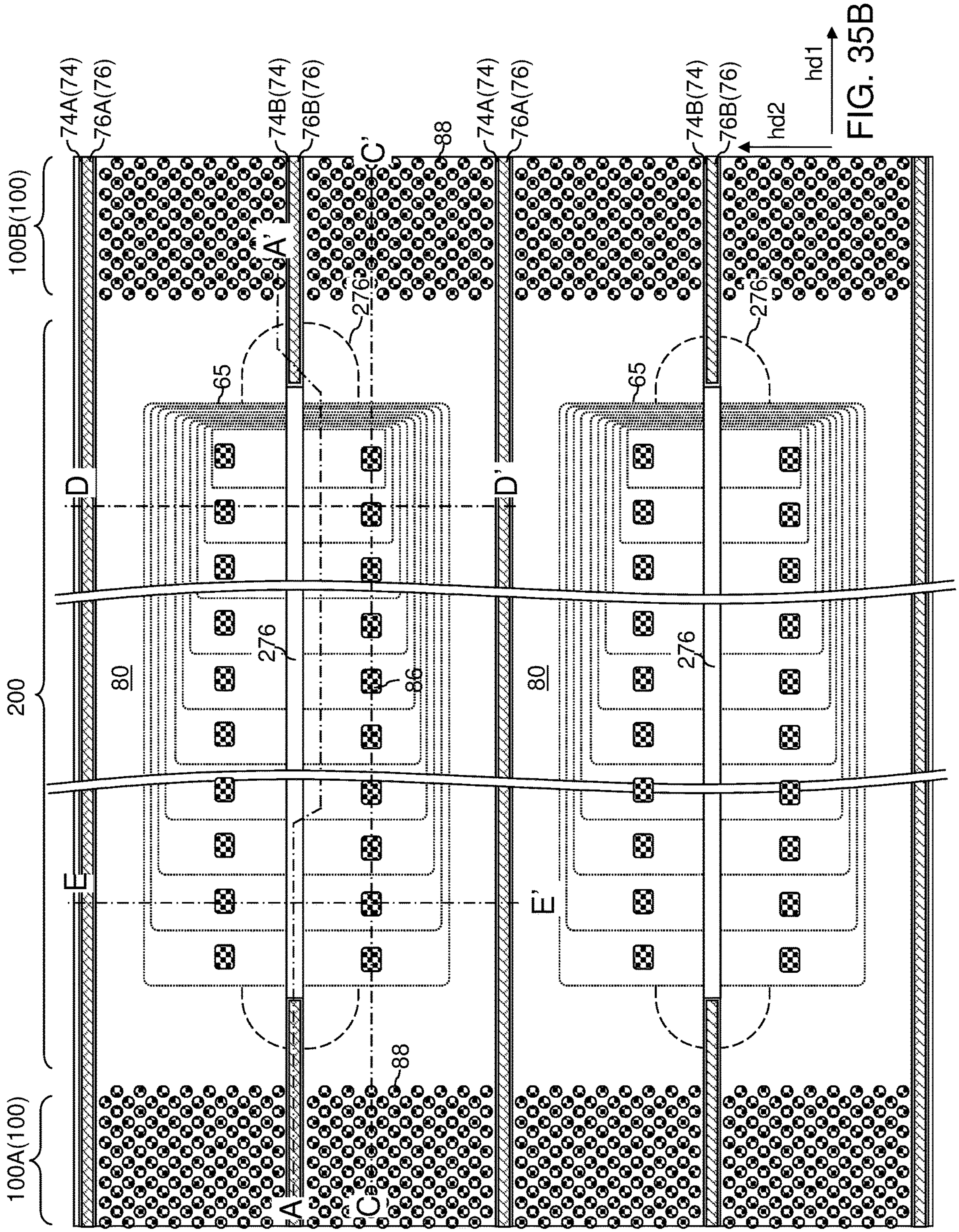

FIG. 35B is a top-down cross-sectional view of the third exemplary structure of FIG. 35A. The vertical plane A-A' is the cut plane of the vertical cross-sectional view of FIG. 35A.

Figure 35C:
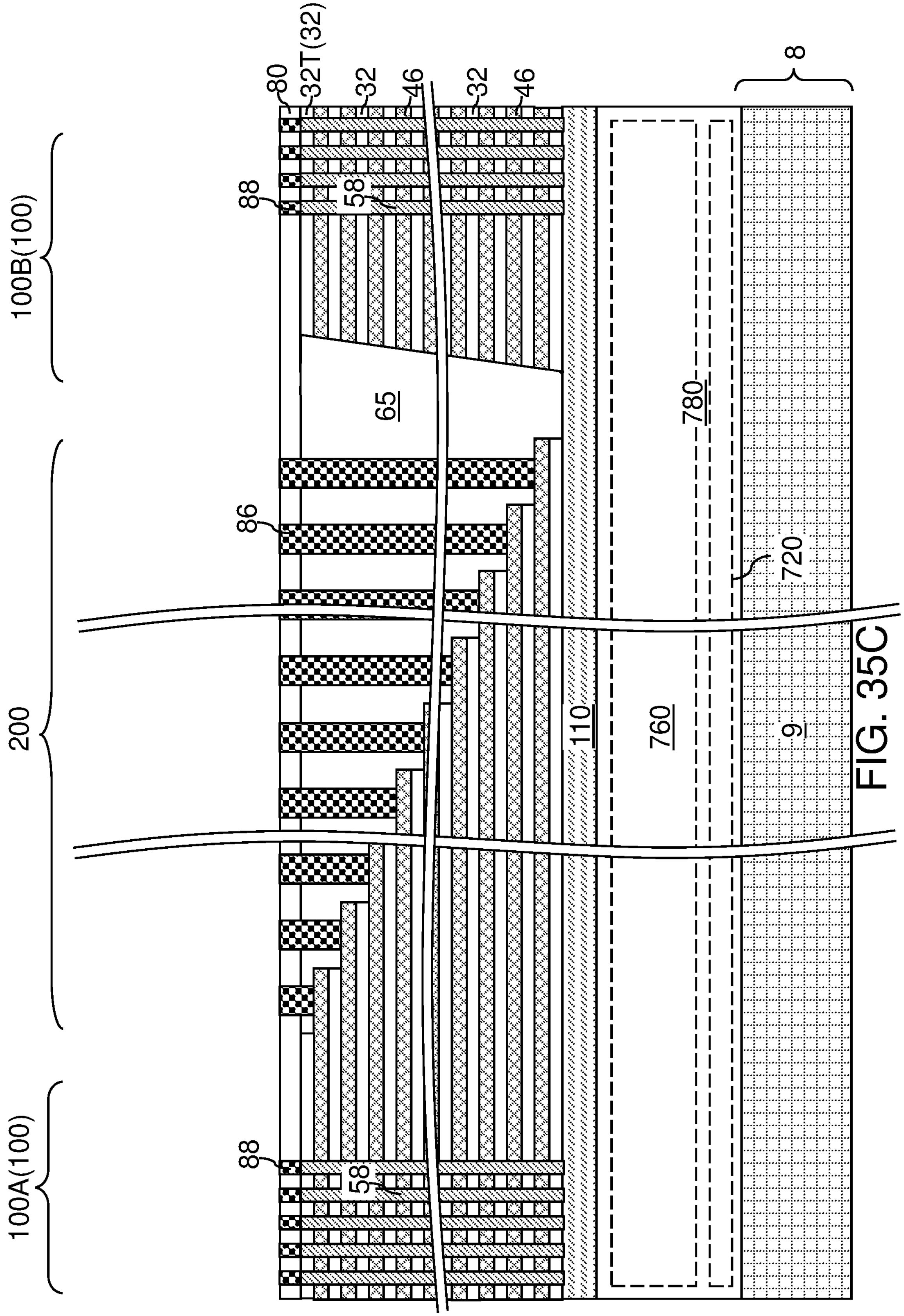

FIG. 35C is a vertical cross-sectional view of the third exemplary structure along the vertical plane C-C' of FIG. 35B.

Figure 35D:
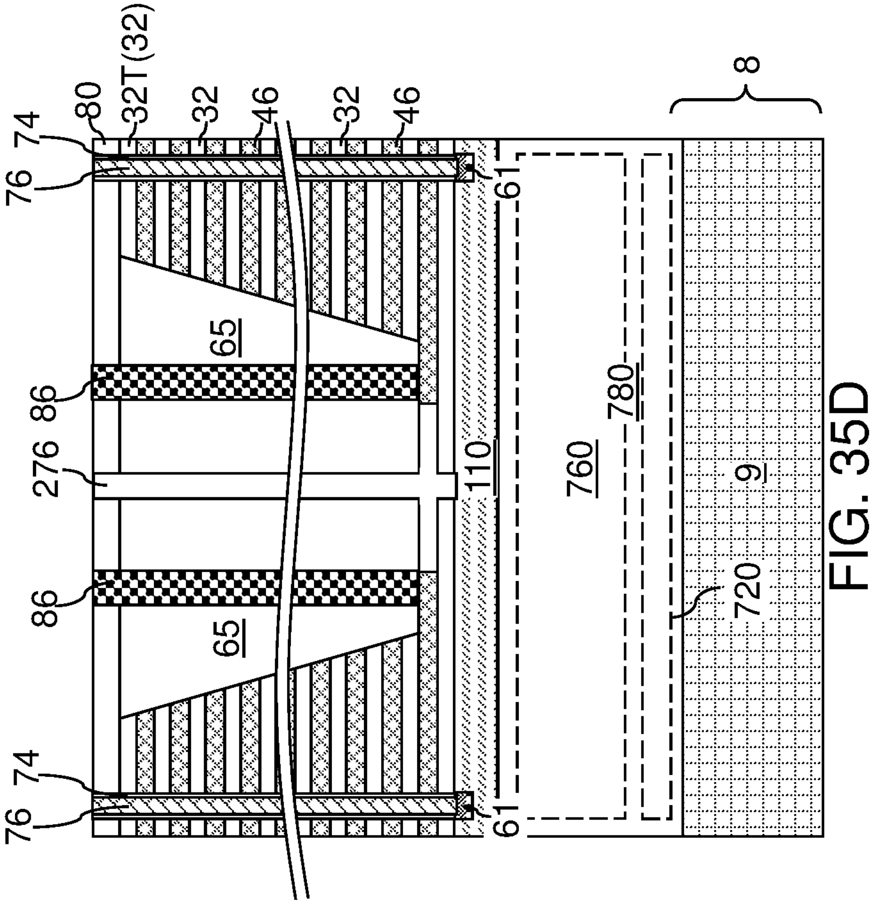

FIG. 35D is a vertical cross-sectional view of the third exemplary structure along the vertical plane D-D' of FIG. 35B.

Figure 35E:
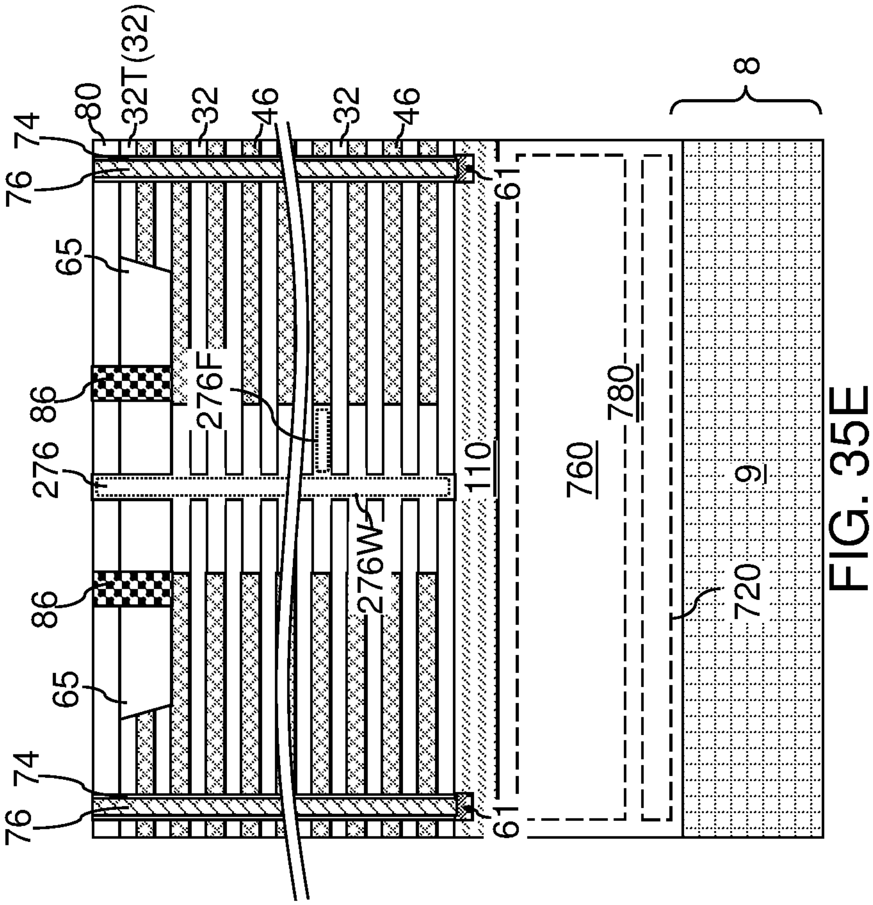

FIG. 35E is a vertical cross-sectional view of the third exemplary structure along the vertical plane E-E' of FIG. 35B.

DETAILED DESCRIPTION

As discussed above, the embodiments of the present disclosure are directed to a three-dimensional memory device including composite dielectric isolation structures in a staircase region which provide support during replacement of sacrificial material layers with electrically conductive layers, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as “first,” “second,” and “third” are employed merely to identify similar elements, and different ordinals may be employed across the specification and the claims of the instant disclosure. The term “at least one” element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a “contact” between elements refers to a direct contact between elements that provides an edge or a surface shared by the elements. If two or more elements are not in direct contact with each other or among one another, the two elements are “disjoined from” each other or “disjoined among” one another. As used herein, a first element located “on” a second element can be located on the exterior side of a surface of the second element or on the interior side of the second element. As used herein, a first element is located “directly on” a second element if there exist a physical contact between a surface of the first element and a surface of the second element. As used herein, a first element is “electrically connected to” a second element if there exists a conductive path consisting of at least one conductive material between the first element and the second element. As used herein, a “prototype” structure or an “in-process” structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1:
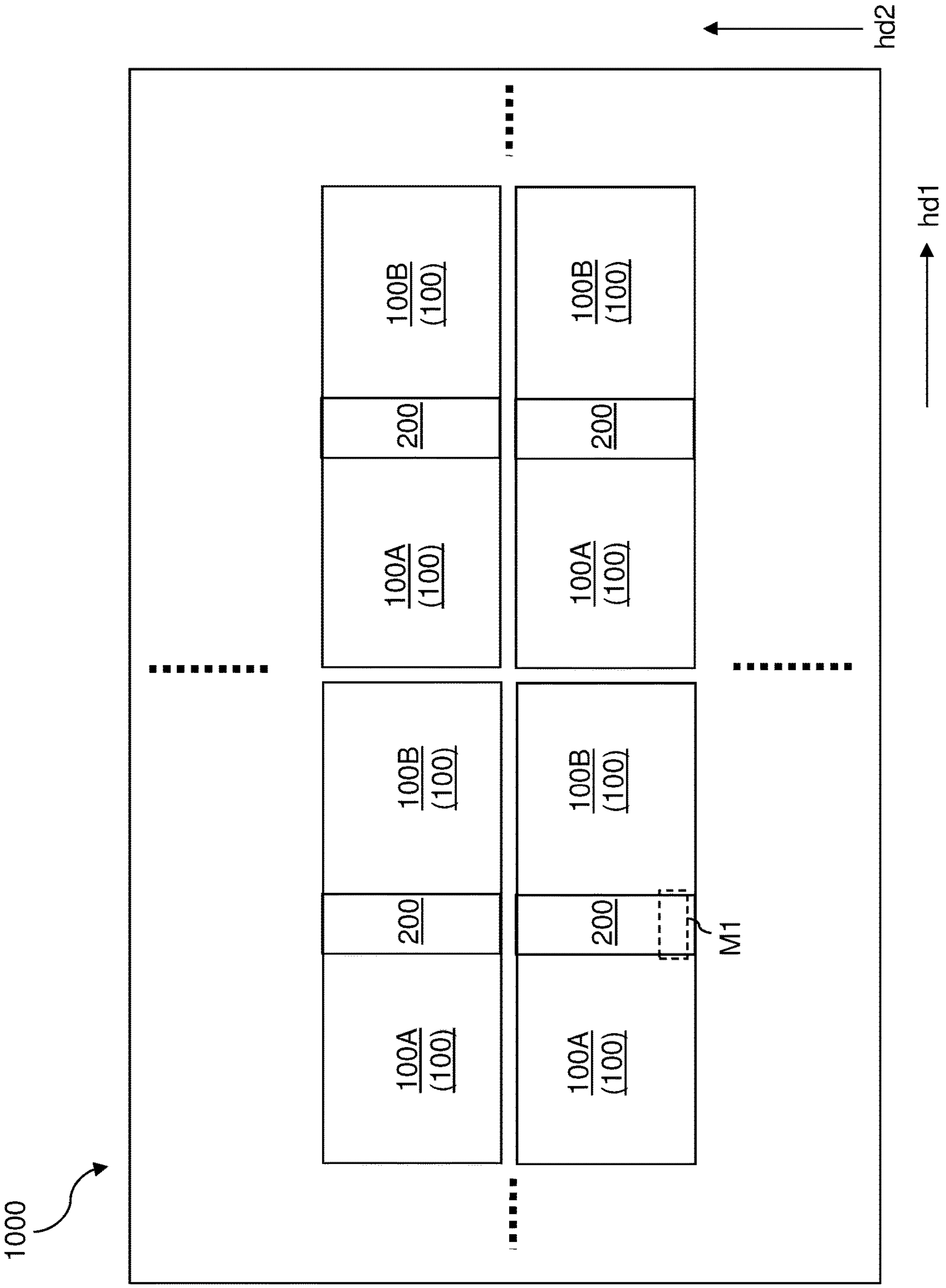
FIG. 1 is a plan view of an exemplary semiconductor die including multiple three-dimensional memory array regions according to an embodiment of the present disclosure.

Referring to FIG. 1, an exemplary semiconductor die 1000 according to an embodiment of the present disclosure is illustrated. The exemplary semiconductor die 1000 includes multiple three-dimensional memory array regions and multiple inter-array regions. The first exemplary semiconductor die 1000 can include multiple planes, each of which includes two memory array regions 100, such as a first memory array region 100A and a second memory array region 100B that are laterally spaced apart by a respective contact region 200. Generally, a semiconductor die 1000 may include a single plane or multiple planes. The total number of planes in the semiconductor die 1000 may be selected based on performance requirements on the semiconductor die 1000. A pair of memory array regions 100 in a plane may be laterally spaced apart along a first horizontal direction hd1 (which may be the word line direction). For example, each pair of memory array regions 100 in a plane may include first memory array region 100A and a second memory array region 100B that are laterally spaced apart along the first horizontal direction hd1 by an contact region 200. A second horizontal direction hd2 (which may be the bit line direction) can be perpendicular to the first horizontal direction hd1.

The exemplary semiconductor die 1000 of FIG. 1 can be manufactured employing various embodiments of the present disclosure to be described below. Three exemplary structures are employed to provide exemplary sequences of processing steps for forming the exemplary semiconductor die 1000 of FIG. 1.

Figure 2:
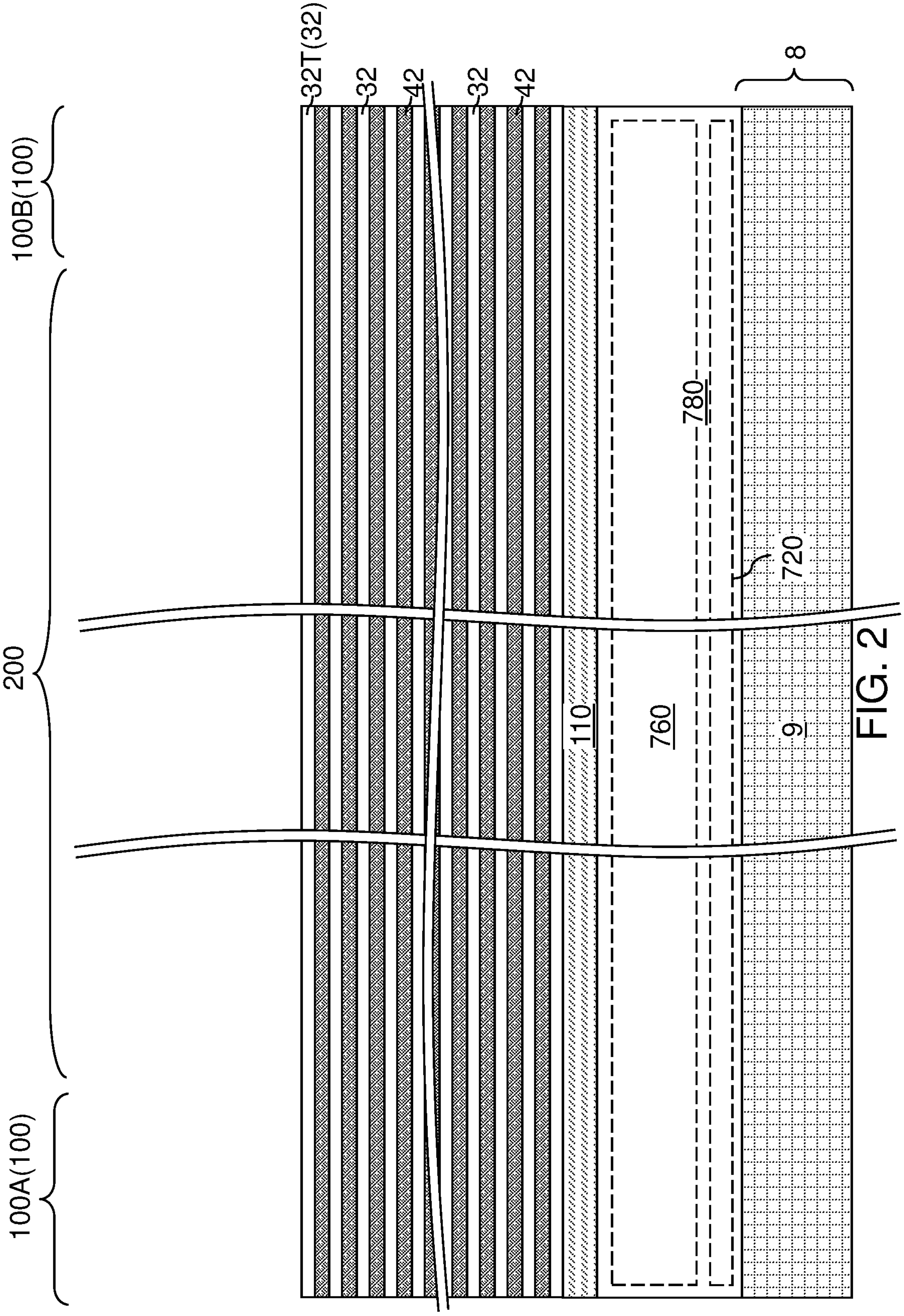
FIG. 2 is a vertical cross-sectional view of region M1 in FIG. 1 of a first exemplary structure for forming the semiconductor die after formation of optional semiconductor devices, optional lower level dielectric layers, optional lower metal interconnect structures, a semiconductor material layer, and an alternating layer stack of insulating layers and sacrificial material layers according to a first embodiment of the present disclosure.

Referring to FIG. 2, a first exemplary structure is illustrated, which comprises a substrate 8 including a substrate semiconductor layer 9. The substrate 8 may be a single crystalline silicon wafer, a silicon on insulator (SOI) substrate, or an insulating (e.g., glass or quartz) substrate. The substrate semiconductor layer 9 may be a single crystalline semiconductor material layer such as a single crystalline silicon layer that is epitaxially grown on a silicon wafer or SOI substrate, or a doped well in an upper portion of a silicon wafer or SOI substrate. Semiconductor devices 720 can be formed on the top surface of the substrate semiconductor layer 9. For example, the semiconductor devices 720 may include field effect transistors, resistors, capacitors, diodes, and/or various other semiconductor devices known in the art. In one embodiment, the semiconductor devices 720 may include a peripheral (i.e., driver) circuit for controlling the operation of three-dimensional memory arrays to be subsequently formed thereabove. Metal interconnect structures embedded in dielectric material layers can be formed above the semiconductor devices. The metal interconnect structures are herein referred to as lower-level metal interconnect structures 780, and the dielectric material layers are herein referred to as lower-level dielectric material layers 760. The lower-level metal interconnect structures 780 are electrically connected to various nodes of the semiconductor devices 720, and can include metal line structures and metal via structures located at various levels of the lower-level dielectric material layers 760.

A semiconductor material layer 110 can be formed on the top surface of the lower-level dielectric material layers 760. The semiconductor material layer 110 may be single crystalline or polycrystalline, and may be formed by a layer transfer from a source substrate (such as a single crystalline silicon layer including a buried hydrogen implantation layer), or may be formed by deposition of a semiconductor material (which may be a polycrystalline semiconductor material, such as polysilicon).

An alternating stack of insulating layers 32 and sacrificial material layers 42 can be formed over the semiconductor material layer 110. As used herein, an alternating stack refers to a sequence of multiple instances of a first element and multiple instances of a second element that is arranged such that an instance of a second element is located between each vertically neighboring pair of instances of the first element, and an instance of a first element is located between each vertically neighboring pair of instances of the second element. An alternating stack refers to a sequence of multiple instances of a first material layer and multiple instances of a second material layer such that the instances of the first material layer and the instances of the second material layer are interlaced.

The insulating layers 32 can be composed of the first material, and the sacrificial material layers 42 can be composed of the second material, which is different from the first material. Each of the insulating layers 32 continuously extends over the entire area of the substrate 8, and may have a uniform thickness throughout. Each of the sacrificial material layers 42 includes a sacrificial dielectric material and continuously extends over the entire area of the substrate 8, and may have a uniform thickness throughout. Insulating materials that may be used for the insulating layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a dielectric material, which is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The second material of the sacrificial material layers 42 may be subsequently replaced with electrically conductive electrodes which may function, for example, as control gate electrodes of a vertical NAND device. In one embodiment, the sacrificial material layers 42 may be material layers that comprise silicon nitride.

Each insulating layer 32 may have a first thickness, which may be in a range from 15 nm to 60 nm, although lesser and greater thicknesses may also be employed. Each sacrificial material layer 42 may have a second thickness, which may be in a range from 15 nm to 60 nm, although lesser and greater thicknesses may also be employed. The total number of repetitions of a pair of an insulating layer 32 and a sacrificial material layer 42 in the alternating stack (32, 42) may be in a range from 16 to 1,024, such as from 64 to 512, although lesser and greater numbers may also be employed. The topmost layer among the insulating layers 32 is herein referred to as a topmost insulating layer 32T.

In an alternative embodiment, the semiconductor devices 720, the lower-level metal interconnect structures 780, and the lower-level dielectric material layers 760 may be located next to the alternating stack (32, 42) over the substrate 8 rather than underneath the alternating stack (32, 42). In yet another alternative embodiment, the semiconductor devices 720, the lower-level metal interconnect structures 780, and the lower-level dielectric material layers 760 may be omitted and not formed over the substrate 8. Instead, the semiconductor devices 720 of the peripheral (i.e., driver) circuit may be formed over a separate substrate and then bonded over the three-dimensional memory device. Optionally, the semiconductor material layer 110 may also be omitted in case the substrate 8 is later removed and a top source contact layer is formed on an exposed surface of the memory device, or it may be modified to function as part of a lateral source contact (e.g., direct strap contact) which is subsequently formed under the alternating stack.

Figure 3A:
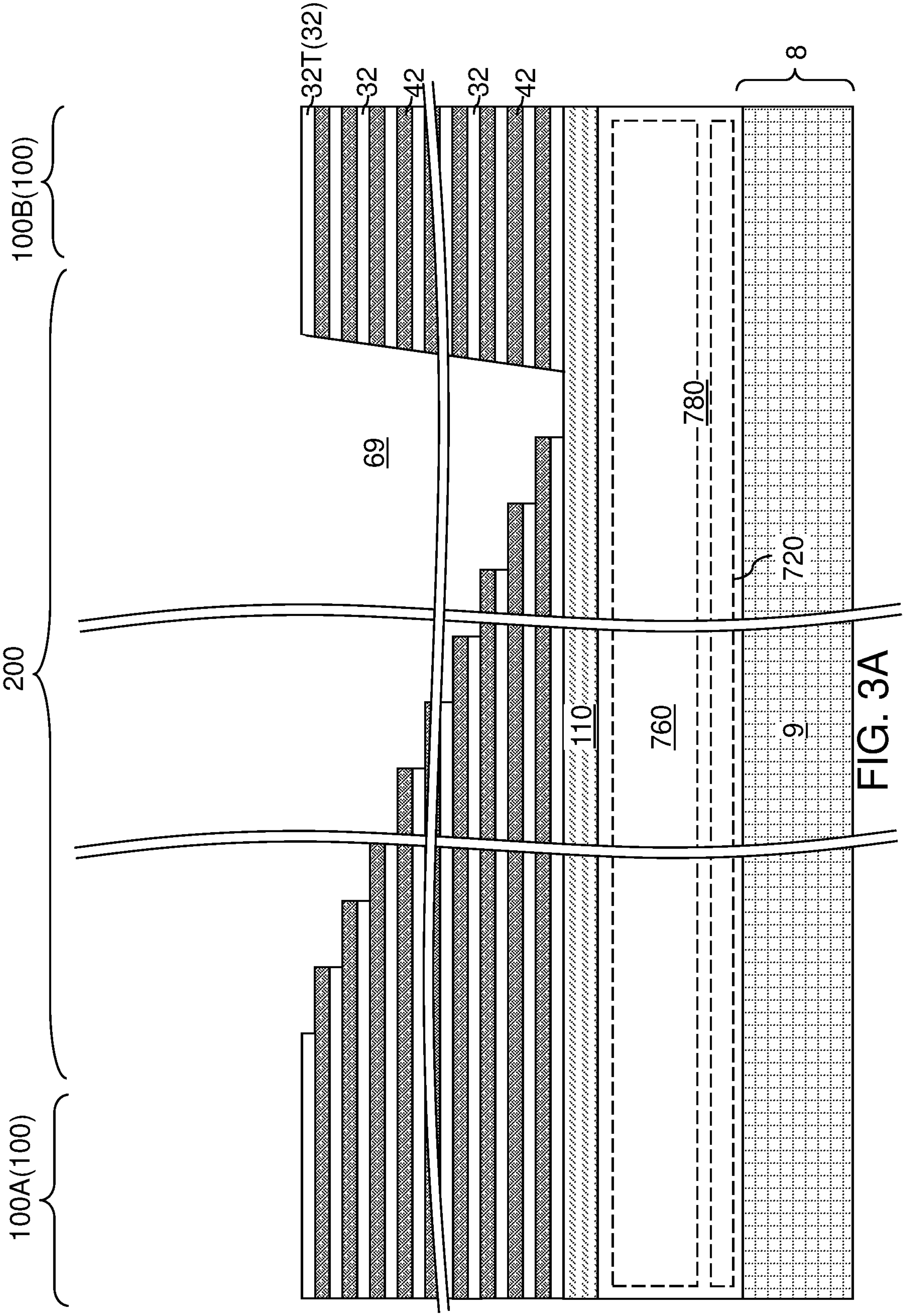
FIG. 3A is a vertical cross-sectional view of the first exemplary structure after formation of stepped cavities according to a the first embodiment of the present disclosure.
Figure 3B:
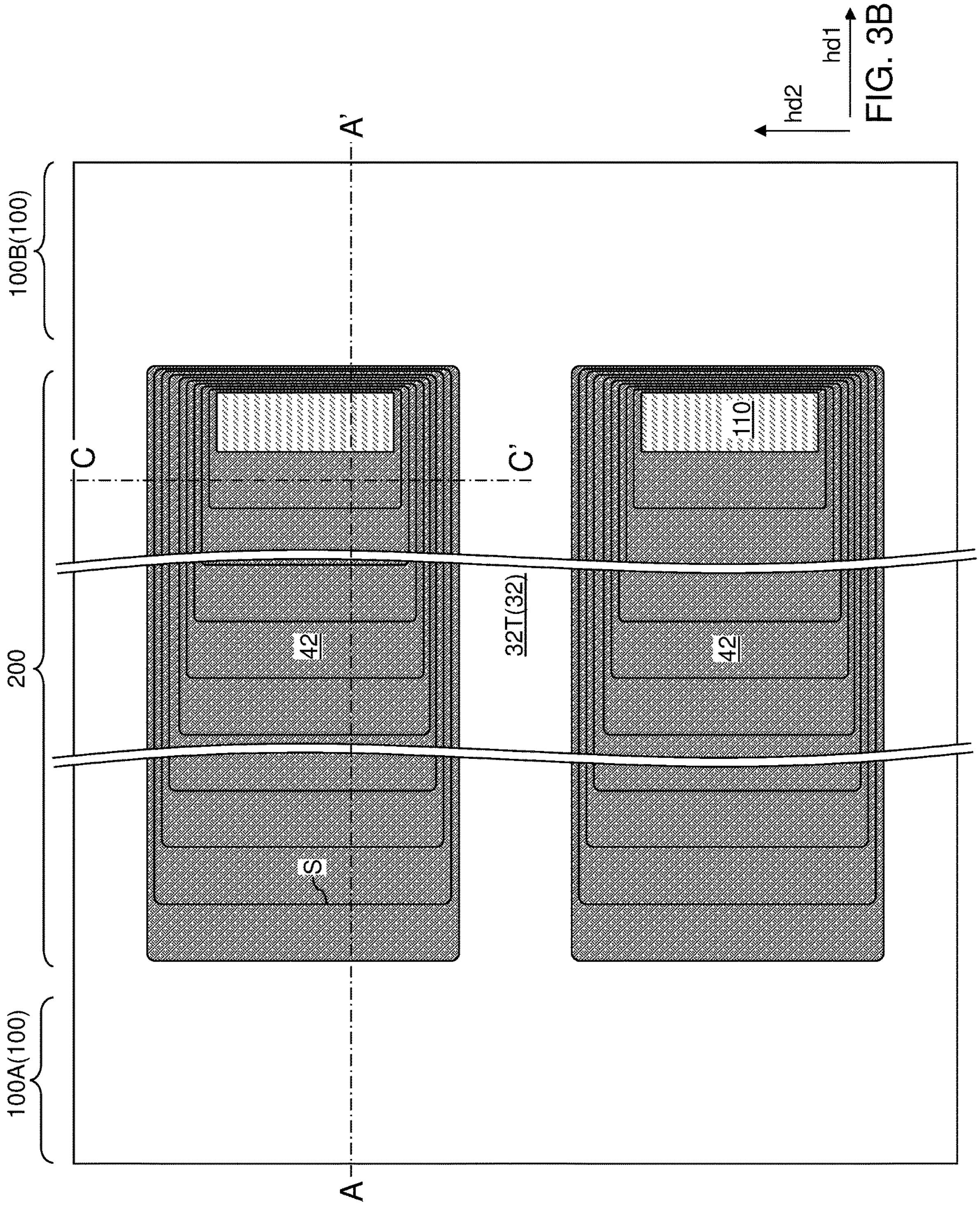
FIG. 3B is a top-down cross-sectional view of the first exemplary structure of FIG. 3A. The vertical plane A-A' is the cut plane of the vertical cross-sectional view of FIG. 3A.
Figure 3C:
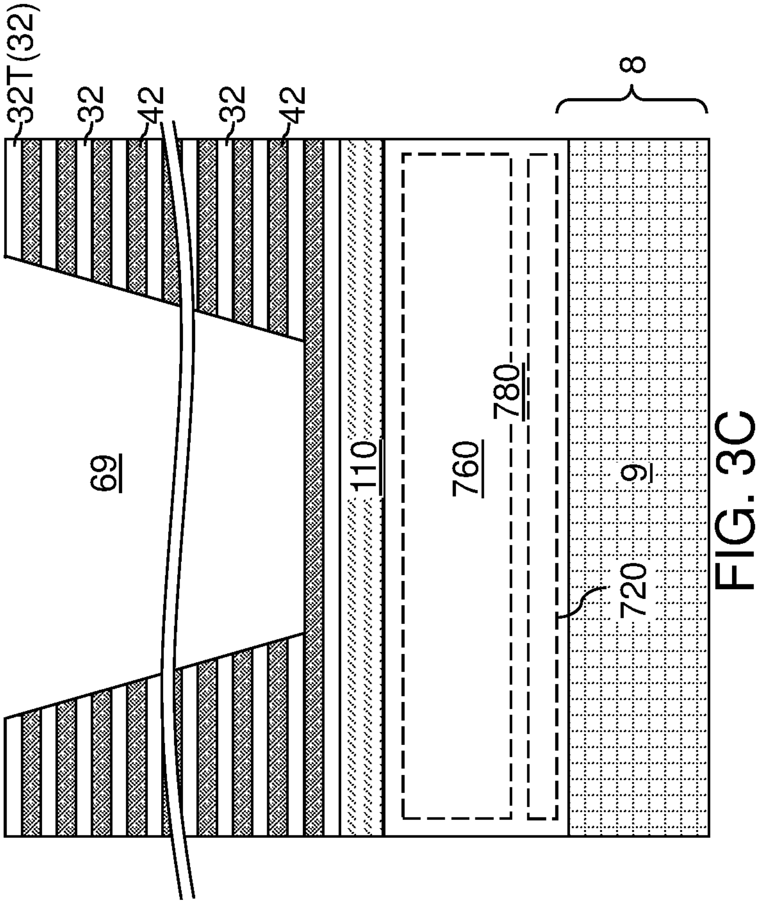
FIG. 3C is a vertical cross-sectional view along the vertical plane C-C' of FIG. 3B.

Referring to FIGS. 3A-3C, stepped surfaces can be formed within the inter-array regions 200 simultaneously. A hard mask layer (not shown) such as a metallic or dielectric mask material layer can be formed over the alternating stack, and can be patterned to form multiple rectangular openings. The areas of openings within the hard mask layer correspond to areas in which stepped surfaces are to be subsequently formed. Each opening through the hard mask layer may be rectangular, and may have a pair of sides that are parallel to the first horizontal direction hd1 and a pair of sides that are parallel to the second horizontal direction hd2. The rectangular openings through the hard mask layer may be arranged along the second horizontal direction hd2, and may, or may not, be alternately staggered along the first horizontal direction hd1.

A trimmable mask layer (not shown) can be applied over the alternating stack. The trimmable mask layer can include a trimmable photoresist layer that can be controllably trimmed by a timed ashing process. The trimmable mask layer can be patterned with an initial pattern such that a segment of each rectangular opening in the hard mask layer that is most proximal to the memory array regions 100 is not masked by the trimmable mask layer, while the rest of each rectangular opening is covered by the trimmable mask layer. For example, the trimmable mask layer can have a rectangular shape having straight edges that are parallel to the second horizontal direction hd2, such that the straight edges are located over a vertical step of respective stepped surfaces that is most proximal to one of the memory array regions 100.

The stepped surfaces can be formed within the rectangular openings in the hard mask layer by iteratively performing a set of layer patterning processing steps. The set of layer patterning processing steps comprises an anisotropic etch process that etches unmasked portions of a pair of a insulating layer 32 and a sacrificial material layer 42, and a mask trimming process in which the trimmable mask layer is isotropically trimmed to provide shifted sidewalls that are shifted away from the most proximal memory array region 100. A final anisotropic etch process can be performed after the last mask trimming process, and the trimmable mask layer can be removed, for example, by ashing. The hard mask layer can be removed selective to the materials of the alternating stack (32, 42), for example, by an isotropic etch process (such as a wet etch process). Alternatively, any other suitable process may be used to form the stepped surfaces.

A stepped cavity 69 can be formed within each area of the rectangular opening in the hard mask layer. Each stepped cavity 69 can include a cliff region in which a tapered sidewall of the alternating stack (32, 42) vertically extends from the bottommost layer of the alternating stack (32, 42) to the topmost layer of the alternating stack (32, 42). Each stepped cavity 69 has respective stepped surfaces as stepped bottom surfaces. Each stepped cavity has a pair of stepped sidewalls that laterally extend along the first horizontal direction hd1. Each stepped sidewall of the stepped cavity 69 adjoins the stepped surfaces at the bottom edge, and extends to the top surface of the topmost layer of the alternating stack (32, 42). Stepped surfaces underlie each stepped cavity 69. Generally, the stepped surfaces 69 can be formed by patterning the alternating stack (32, 42) in each contact region 200, which is located between a respective first memory array region 100A and a second memory array region 100B.

Generally, each stepped cavity 69 may have stepped surfaces including vertically-extending surface segments that are interlaced with horizontally-extending surface segments and generally progressing from the bottommost surface of the stepped surfaces (which may be a top surface segment of the semiconductor material layer 110) to the topmost surface of the alternating stack (32, 42) along the first horizontal direction hd1. Further, each stepped cavity 69 may comprise a pair of tapered sidewalls that are parallel to the first horizontal direction hd1, laterally spaced from each other along the second horizontal direction hd2, and having a respected stepped bottom end adjoined to a respective stepped periphery of the stepped surfaces.

Figure 4A:
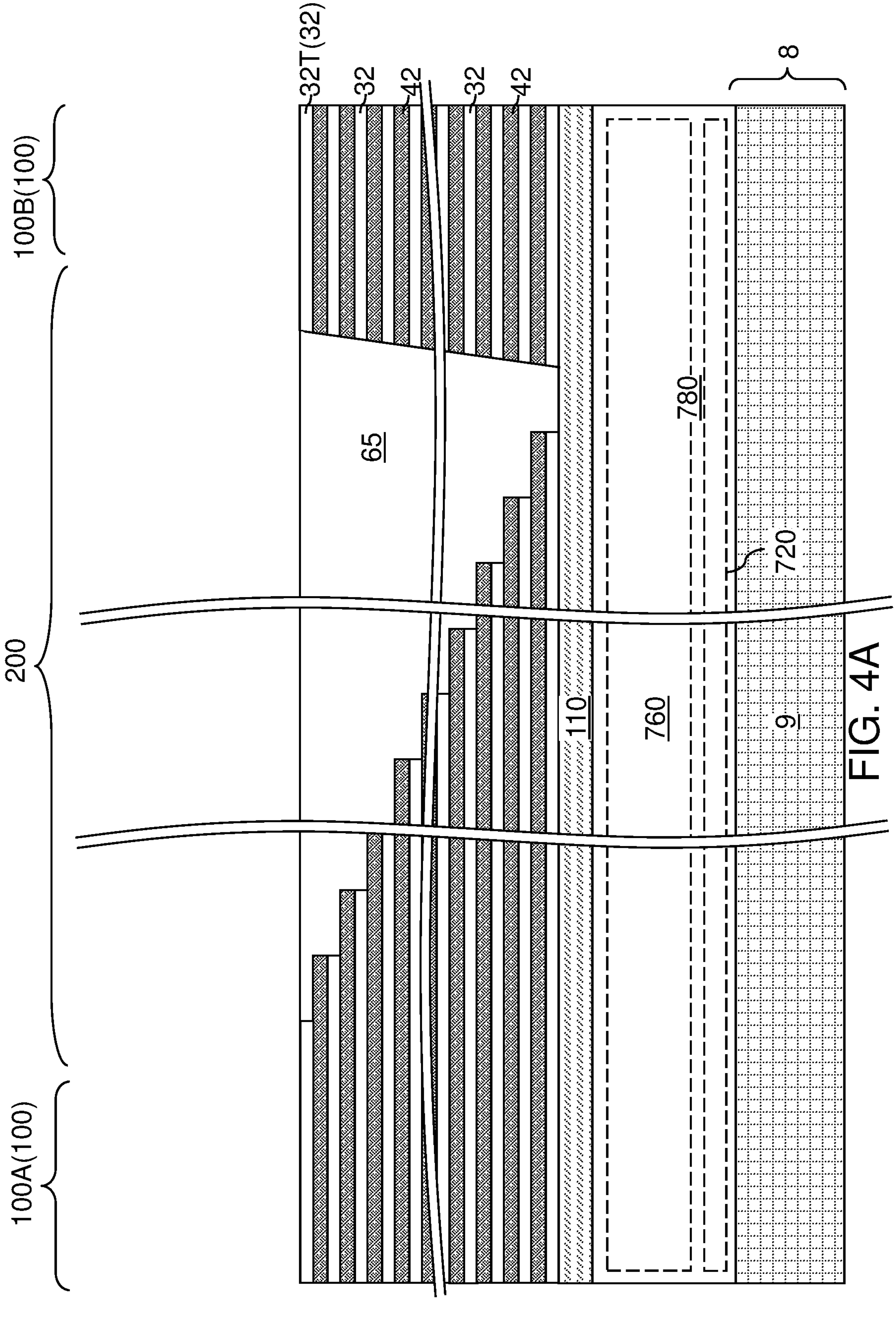
FIG. 4A is a vertical cross-sectional view of the first exemplary structure after formation of retro-stepped dielectric material portions according to the first embodiment of the present disclosure.
Figure 4B:
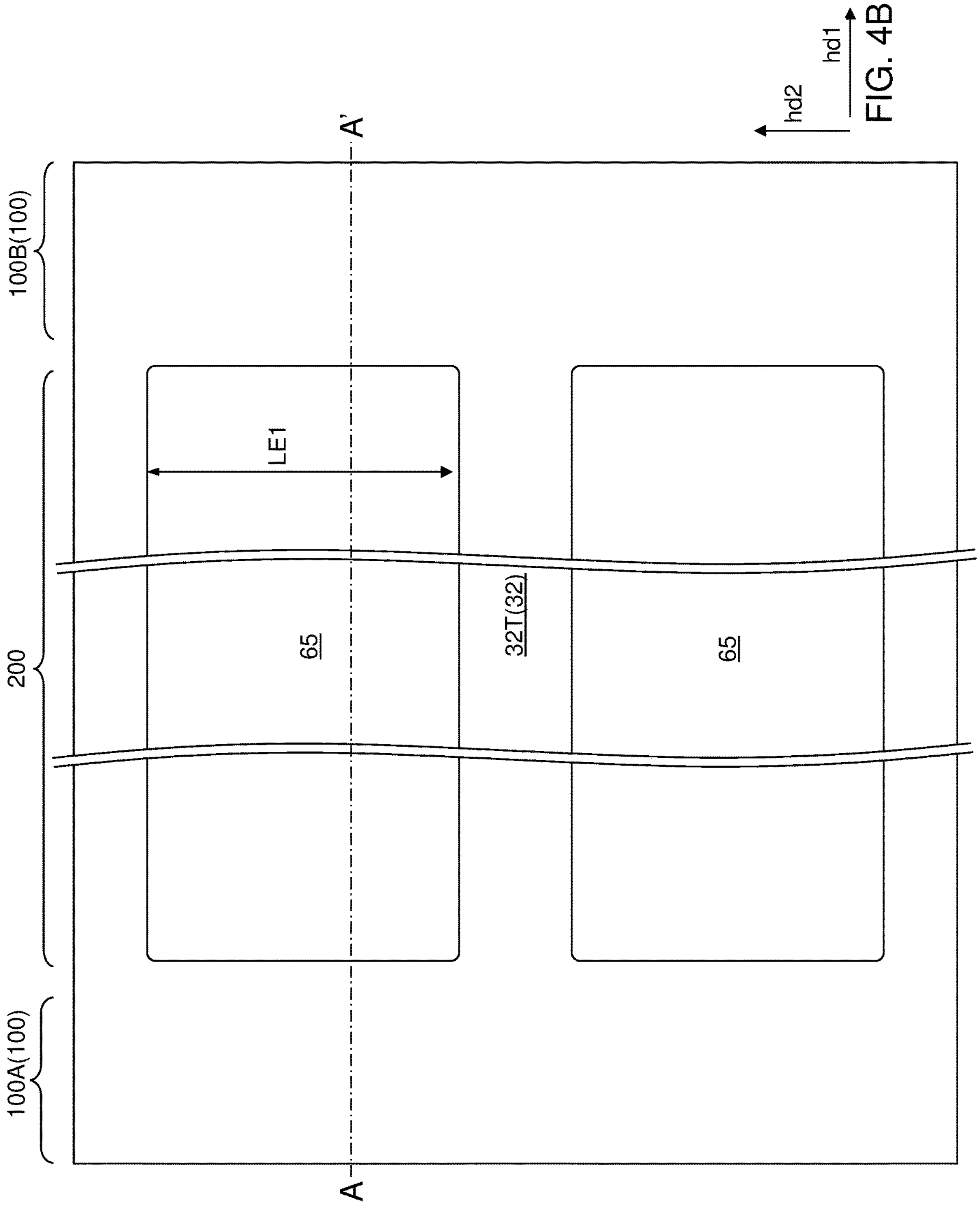
FIG. 4B is a top-down cross-sectional view of the first exemplary structure of FIG. 4A. The vertical plane A-A' is the cut plane of the vertical cross-sectional view of FIG. 4A.

Referring to FIGS. 4A and 4B, a dielectric fill material (such as undoped silicate glass (i.e., silicon oxide) or a doped silicate glass) can be deposited in each stepped cavity. The dielectric fill material can be planarized to remove excess portions of the dielectric fill material from above the horizontal plane including the topmost surface of the alternating stack (32, 42). Each remaining portion of the dielectric fill material that fills a respective stepped cavity 69 constitutes a retro-stepped dielectric material portion 65. Each retro-stepped dielectric material portion 65 is formed over stepped surfaces of the alternating stack (32, 42).

Each retro-stepped dielectric material portions 65 fills a respective stepped cavity 69. In one embodiment, each retro-stepped dielectric material portion 65 has a first lateral extent LE1 along the second horizontal direction (e.g., bit line direction) hd2. In one embodiment, each retro-stepped dielectric material portion 65 has a first variable lateral extent along the first horizontal direction (e.g., word line direction) hd1 that decreases stepwise with a vertical distance from the horizontal plane including the bottommost surface of the alternating stack (32, 42). In one embodiment, the retro-stepped dielectric material portion 65 has a pair of tapered sidewalls that extend along the first horizontal direction hd1.

Figure 5A:
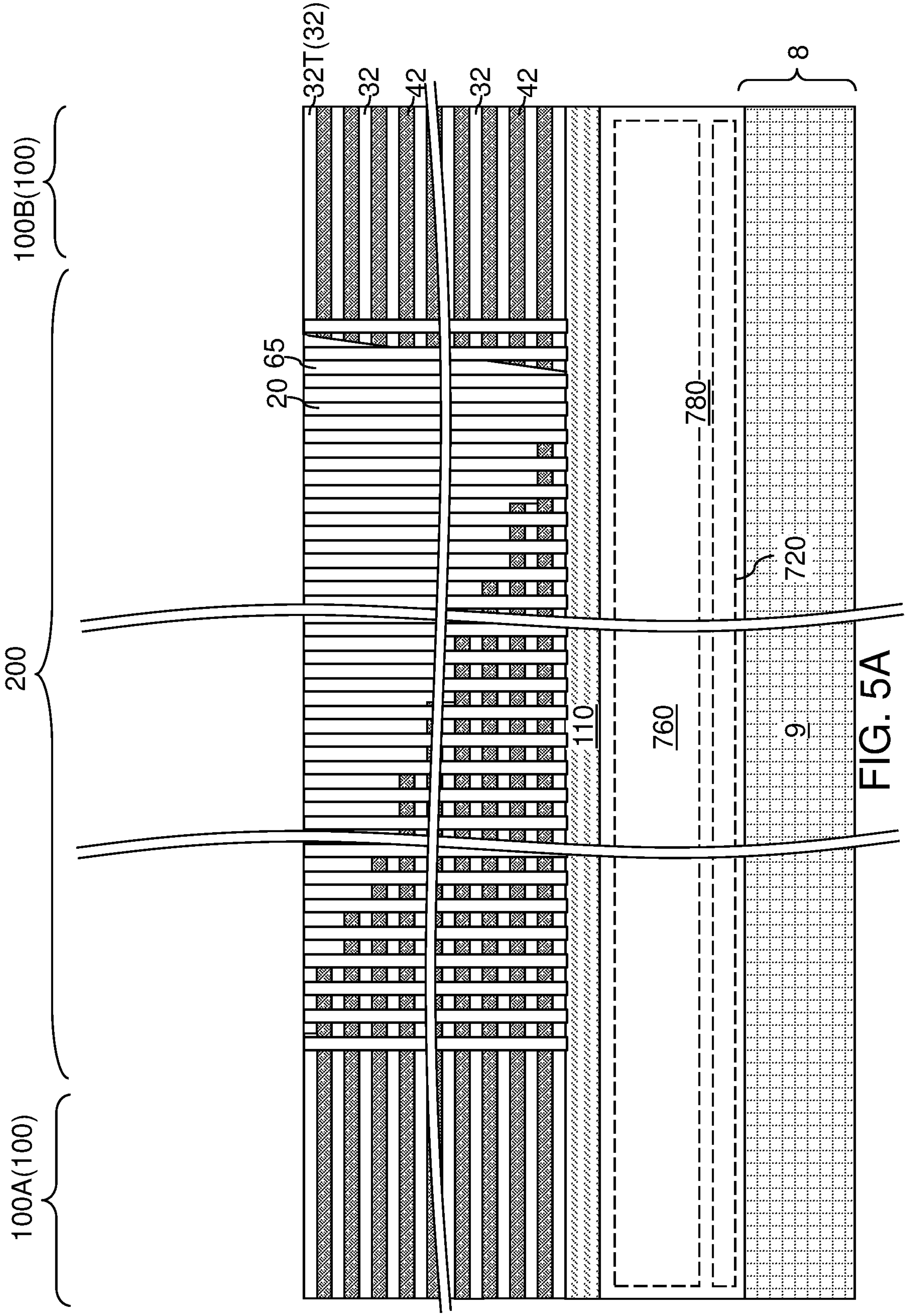
FIG. 5A is a vertical cross-sectional view of the first exemplary structure after formation of support pillar structures according to the first embodiment of the present disclosure.
Figure 5B:
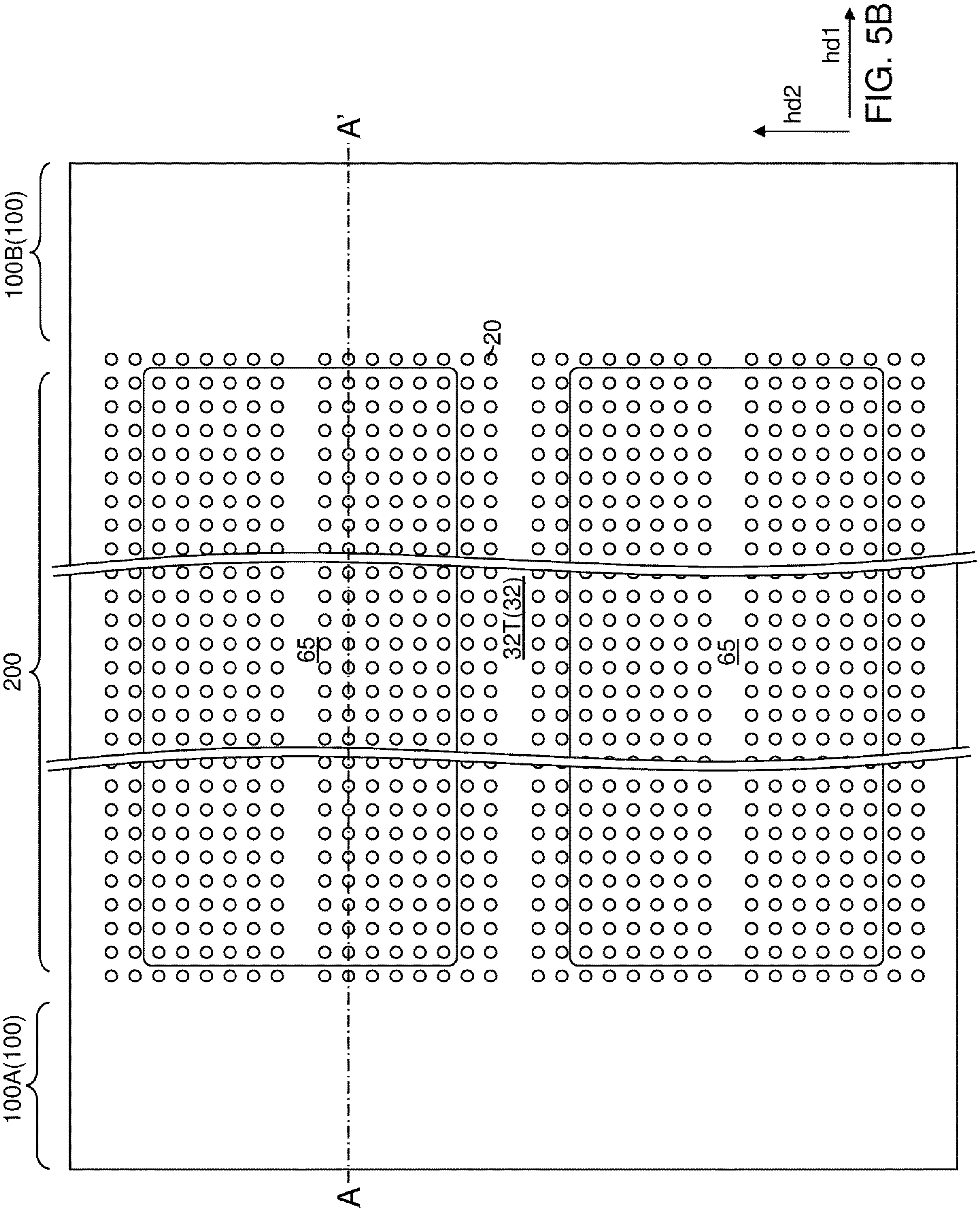
FIG. 5B is a top-down cross-sectional view of the first exemplary structure of FIG. 5A. The vertical plane A-A' is the cut plane of the vertical cross-sectional view of FIG. 5A.

Referring to FIGS. 5A and 5B, an optional photoresist layer (not shown) can be applied over the alternating stack (32, 42) and the retro-stepped dielectric material portions 65, and can be lithographically patterned to form arrays of openings in the contact region 200. An anisotropic etch process can be performed to transfer the pattern of the opening in the photoresist layer through the retro-stepped dielectric material portions 65 and/or through the alternating stack (32, 42) to form optional support openings. Each of the support openings may vertically extend from the horizontal plane including the topmost surface of the alternating stack (32, 42) at least to the horizontal plane including the bottommost surface of the alternating stack (32, 42), and optionally into an upper portion of the semiconductor material layer 110. The photoresist layer can be subsequently removed, for example, by ashing.

At least one dielectric fill material, such as undoped silicate glass (i.e., silicon oxide) and/or a doped silicate glass can optionally be deposited in the support openings. Excess portions of the at least one dielectric fill material can be removed from above the horizontal plane including the top surface of the topmost insulating layer 32T by a planarization process, which may employ a recess etch process. Remaining portions of the at least one dielectric fill material constitutes optional support pillar structures 20, which are subsequently used to provide structural support during replacement of the sacrificial material layers 42 with electrically conductive layers. Alternatively, the step illustrated in FIGS. 5A and 5B may be omitted, and the support pillar structures 20 may either be omitted or formed during the same processing steps as the memory opening fill structures, as will be described below with respect to FIGS. 6A to 8B.

Figure 6A:
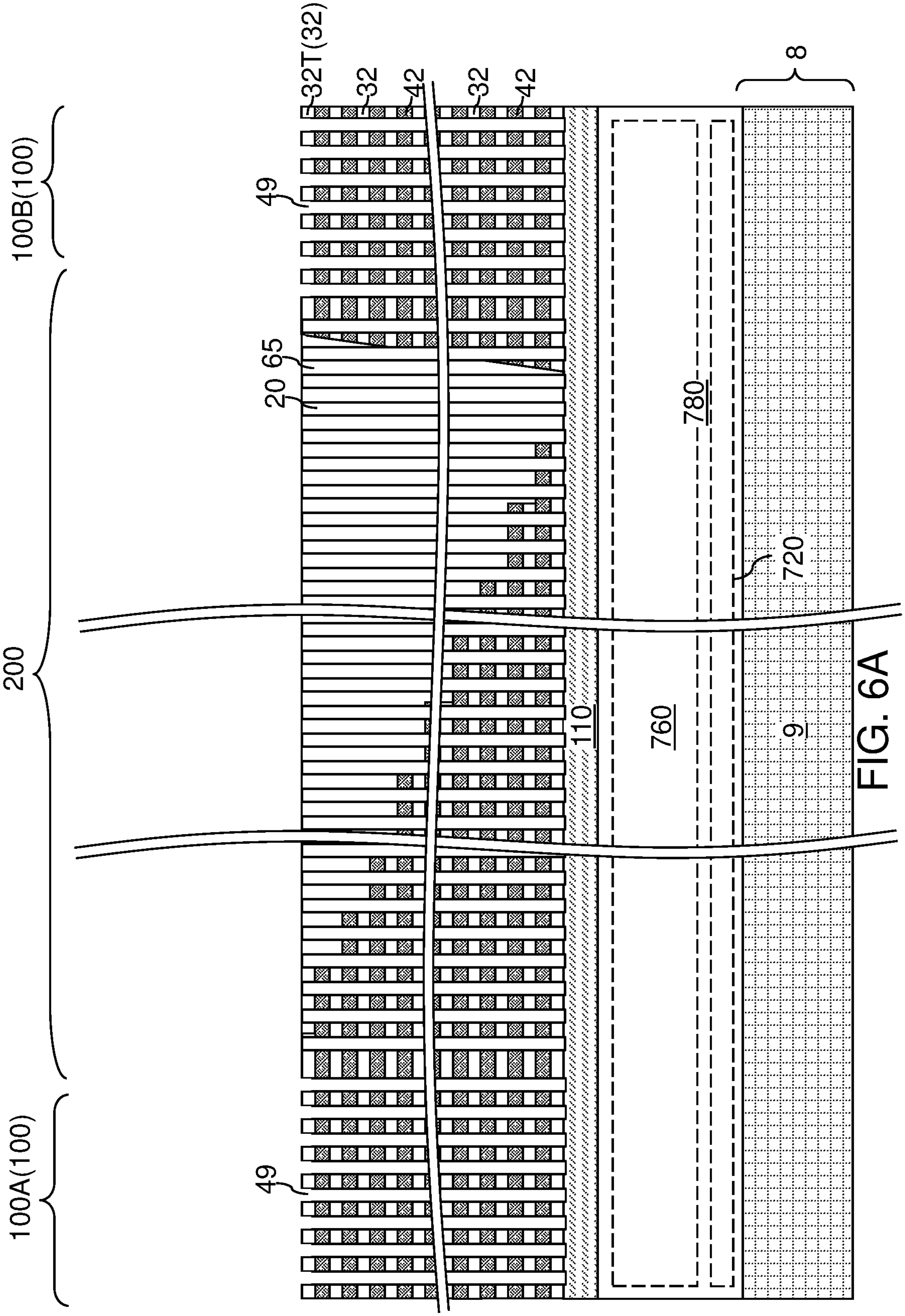
FIG. 6A is a vertical cross-sectional view of the first exemplary structure after formation of memory openings according to the first embodiment of the present disclosure.
Figure 6B:
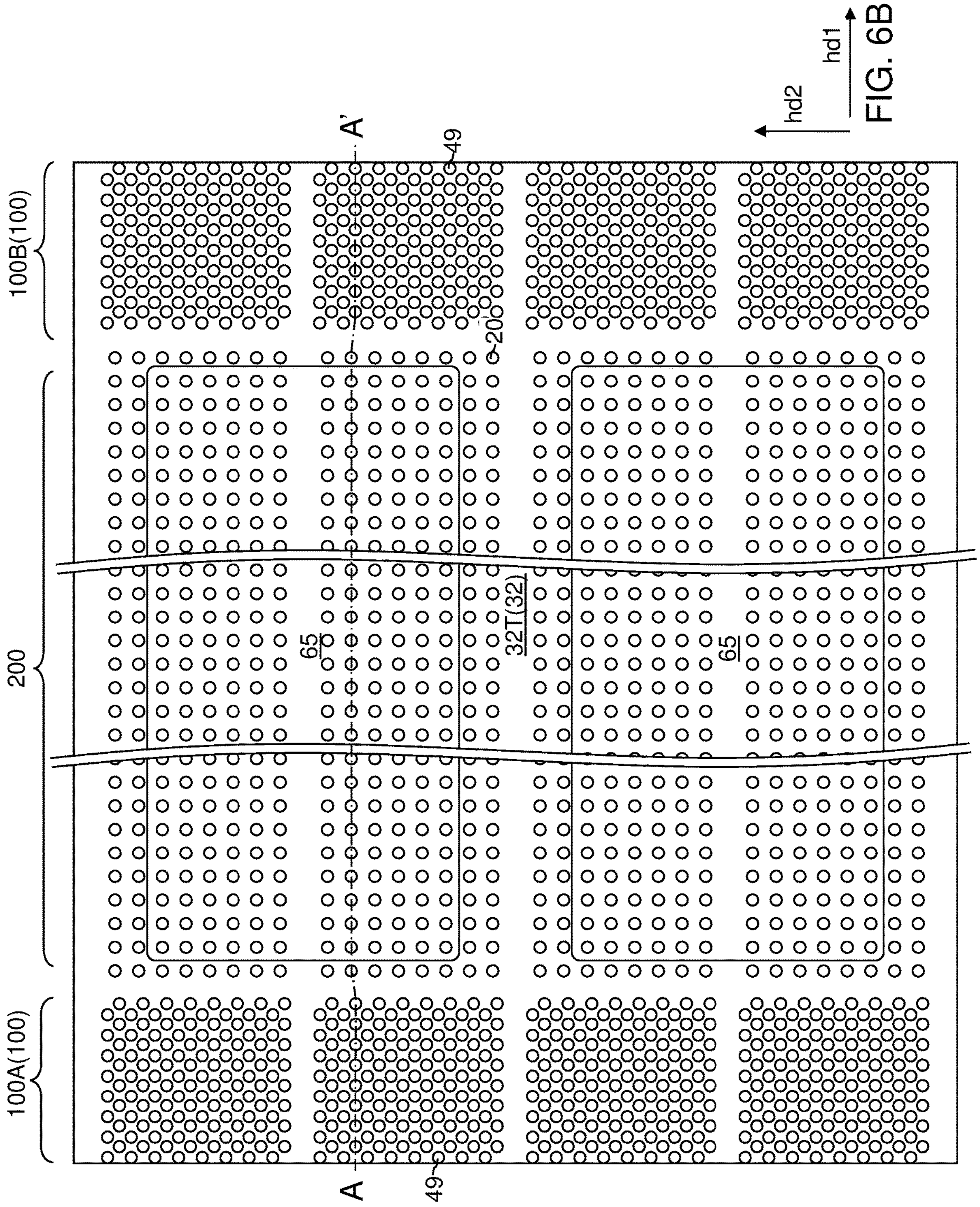
FIG. 6B is a top-down cross-sectional view of the first exemplary structure of FIG. 6A. The vertical plane A-A' is the cut plane of the vertical cross-sectional view of FIG. 6A.

Referring to FIGS. 6A and 6B, a photoresist layer (not shown) can be applied over the alternating stack (32, 42), and can be lithographically patterned to form arrays of memory openings 49 in the memory regions 100. An anisotropic etch process can be performed to transfer the pattern of the opening in the photoresist layer through the alternating stack (32, 42) to form memory openings 49. Each of the memory openings 49 may vertically extend from the horizontal plane including the topmost surface of the alternating stack (32, 42) at least to the horizontal plane including the bottommost surface of the alternating stack (32, 42), and optionally into an upper portion of the semiconductor material layer 110. The photoresist layer can be subsequently removed, for example, by ashing. In the alternative embodiment, the above described support openings in the contact region 200 may be formed at the same time as the memory openings 49 in the memory regions 100.

FIGS. 7A-7F are sequential vertical cross-sectional views of a region around a memory opening during formation of a memory opening fill structure according to the first embodiment of the present disclosure.

Figure 7B:
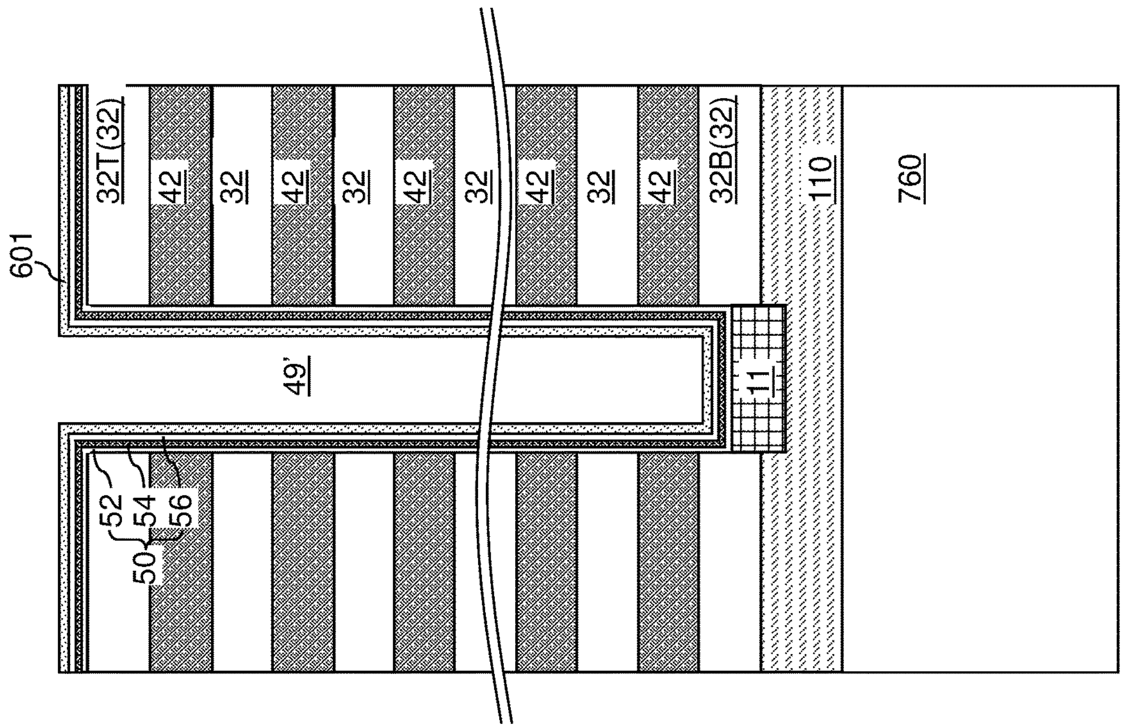
FIGS. 7A-7F are sequential vertical cross-sectional views of a region around a memory opening during formation of a memory opening fill structure according to the first embodiment of the present disclosure.
Figure 7A:
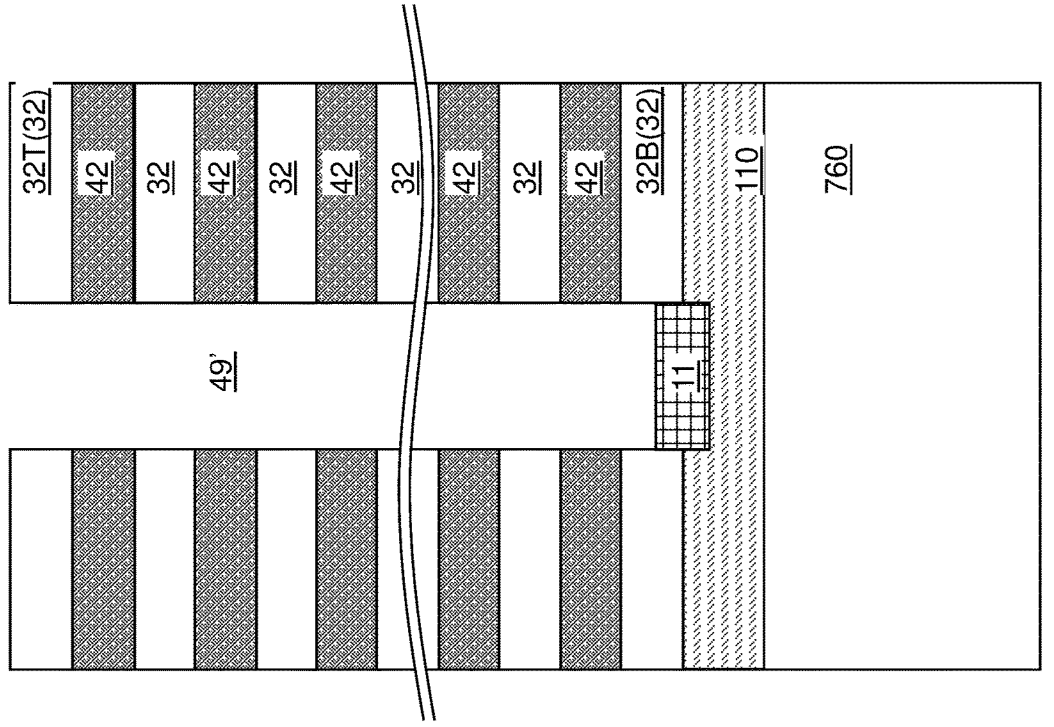

Referring to FIG. 7A, a memory opening 49 in the exemplary device structure of FIGS. 6A and 6B is illustrated. The memory opening 49 extends through the alternating stack (32, 42), and optionally into an upper portion of the semiconductor material layer 110. The recess depth of the bottom surface of each memory opening 49 with respect to the top surface of the semiconductor material layer 110 can be in a range from 0 nm to 30 nm, although greater recess depths can also be employed. Optionally, the sacrificial material layers 42 can be laterally recessed partially to form laterally-extending cavities (not shown), for example, by an isotropic etch.

An optional pedestal channel portion 11 (which may be a silicon pedestal) can be formed at the bottom portion of each memory opening 49, for example, by a selective semiconductor deposition process. In one embodiment, the pedestal channel portion 11 can be doped with electrical dopants of the same conductivity type as the semiconductor material layer 110, which is a first conductivity type. In one embodiment, the top surface of each pedestal channel portion 11 can be formed below a horizontal plane including the top surface of the bottommost insulating layer 32B. The pedestal channel portion 11 can be a portion of a transistor channel that extends between a source region to be subsequently formed in the semiconductor material layer 110 and a drain region to be subsequently formed in an upper portion of the memory opening 49. A memory cavity 49' is present in the unfilled portion of the memory opening 49 above the pedestal channel portion 11.

Referring to FIG. 7B, a stack of layers including a blocking dielectric layer 52, a memory material layer 54, and an optional dielectric liner 56 can be deposited in each memory opening 49. The stack of layers is herein referred to as a memory film 50.

The blocking dielectric layer 52 can include a single dielectric material layer or a stack of a plurality of dielectric material layers. In one embodiment, the blocking dielectric layer 52 can include a dielectric metal oxide layer consisting essentially of a dielectric metal oxide. In one embodiment, the blocking dielectric layer 52 can include a dielectric metal oxide having a dielectric constant greater than 7.9. i.e., having a dielectric constant greater than the dielectric constant of silicon nitride. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed.

The memory material layer 54 may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within laterally-extending cavities into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer. Generally, the memory material layer 54 may comprise a vertical stack of memory elements that are located at levels of the sacrificial material layers 42. For example, the vertical stack of memory elements may be embodied as annular portions of the memory material layer 54 located at levels of the sacrificial material layers 42.

The optional dielectric liner 56, if present, comprises a dielectric liner material. In one embodiment, the dielectric liner 56 may comprise a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric liner 56 can include a stack of a first silicon oxide layer, a silicon oxynitride layer, and a second silicon oxide layer, which is commonly known as an ONO stack. In one embodiment, the dielectric liner 56 can include a silicon oxide layer that is substantially free of carbon or a silicon oxynitride layer that is substantially free of carbon. The thickness of the dielectric liner 56 can be in a range from 2 nm to 20 nm, although lesser and greater thicknesses can also be employed.

Optionally, a sacrificial cover material layer 601 may be formed over the memory film 50.

Figure 7D:
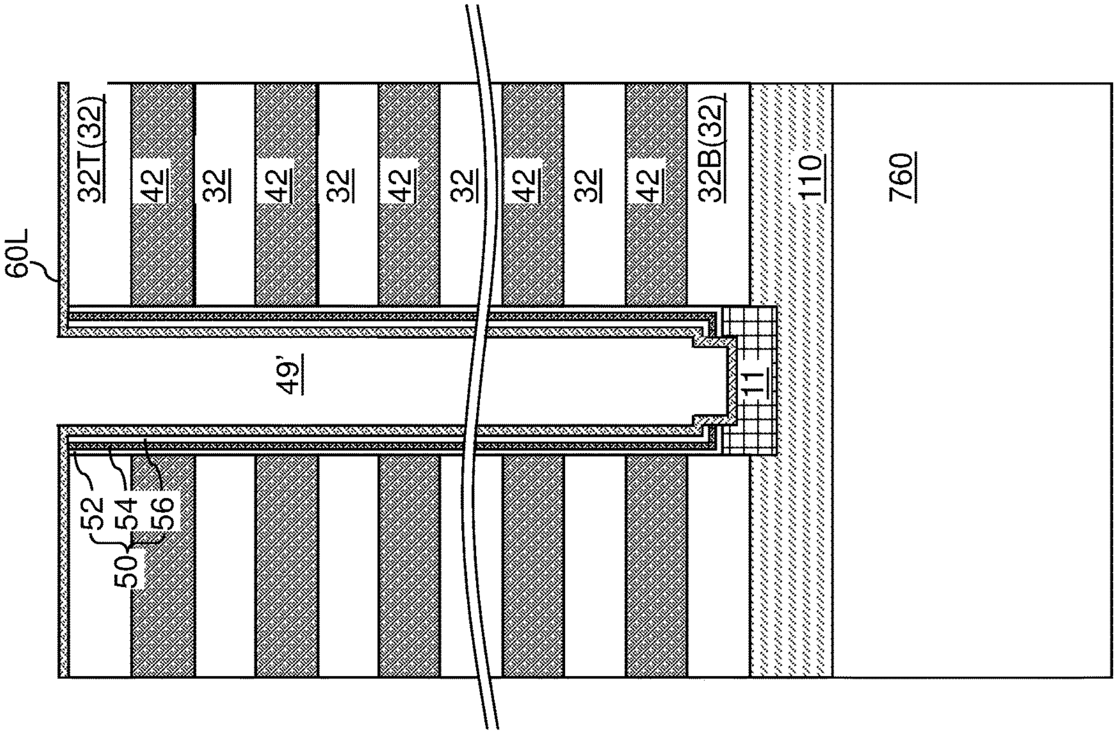
Figure 7C:
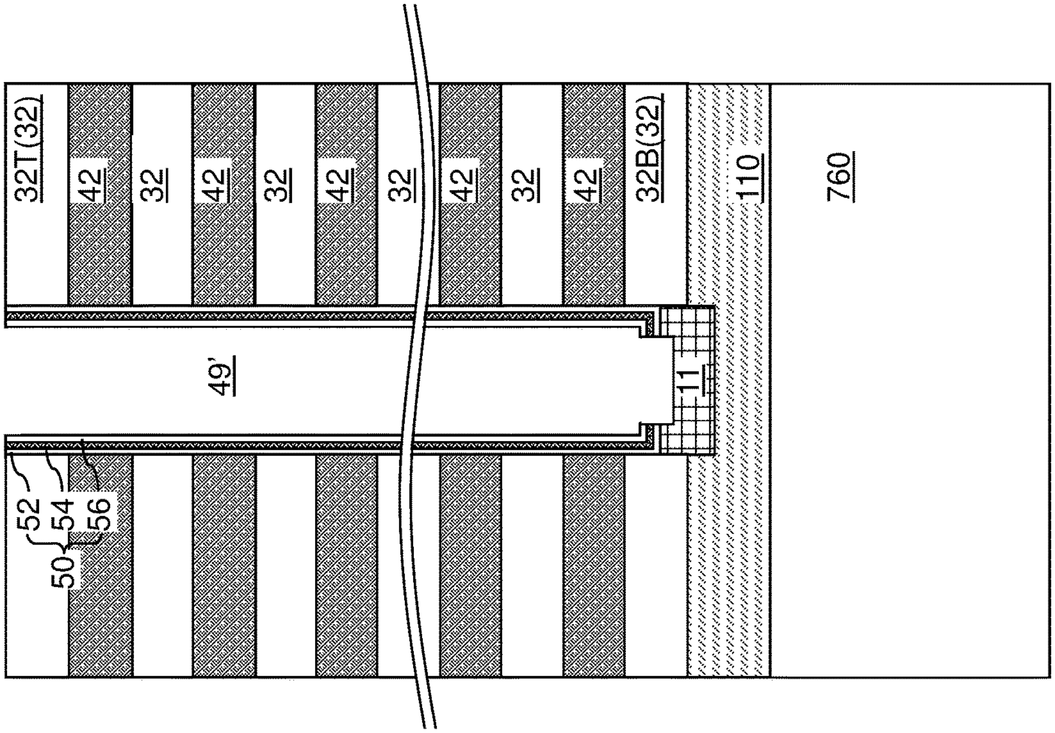

Referring to FIG. 7C, the optional sacrificial cover material layer 601, the dielectric liner 56, the memory material layer 54, the blocking dielectric layer 52 are sequentially anisotropically etched employing at least one anisotropic etch process. The portions of the sacrificial cover material layer 601, the dielectric liner 56, the memory material layer 54, and the blocking dielectric layer 52 located above the top surface of the topmost insulating layer 32T can be removed by the at least one anisotropic etch process. Further, the horizontal portions of the sacrificial cover material layer 601, the dielectric liner 56, the memory material layer 54, and the blocking dielectric layer 52 at a bottom of each memory cavity 49' can be removed to form openings in remaining portions thereof. Each of the sacrificial cover material layer, the dielectric liner 56, the memory material layer 54, and the blocking dielectric layer 52 can be etched by a respective anisotropic etch process employing a respective etch chemistry, which may or may not be the same for the various material layers.

Each remaining portion of the sacrificial cover material layer 601, if employed, can have a tubular configuration. A surface of the pedestal channel portion 11 (or a surface of the semiconductor material layer 110 in case a pedestal channel portions 11 is not employed) can be physically exposed underneath the opening through the sacrificial cover material layer, the dielectric liner 56, the memory material layer 54, and the dielectric metal oxide blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 110 in case pedestal channel portions 11 are not employed) by a recess distance. In one embodiment, the sacrificial cover material layer 601, the dielectric liner 56, the memory material layer 54, and the blocking dielectric layer 52 can have vertically coincident sidewalls. The sacrificial cover material layer 601 can be subsequently removed selective to the material of the dielectric liner 56. In case the sacrificial cover material layer 601 includes amorphous silicon, a wet etch process employing hot trimethyl-2 hydroxyethyl ammonium hydroxide ("hot TMY") or tetramethyl ammonium hydroxide (TMAH) can be performed to remove the sacrificial cover material layer. Alternatively, the sacrificial cover material layer 601 may be retained in the final device if it comprises a silicon material.

Referring to FIG. 7D, a semiconductor channel layer 60L can be deposited directly on the semiconductor surface of the pedestal channel portion 11 or the semiconductor material layer 110 if the pedestal channel portion 11 is omitted, and directly on the memory film 50. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 110 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Figure 7F:
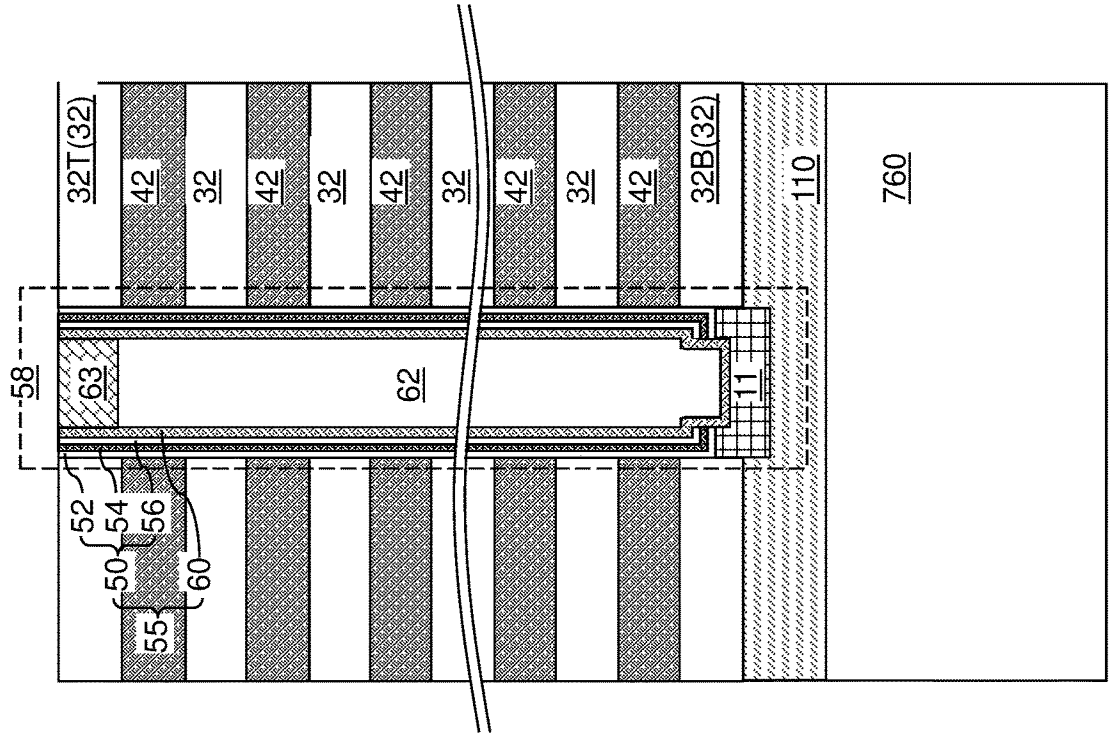
Figure 7E:
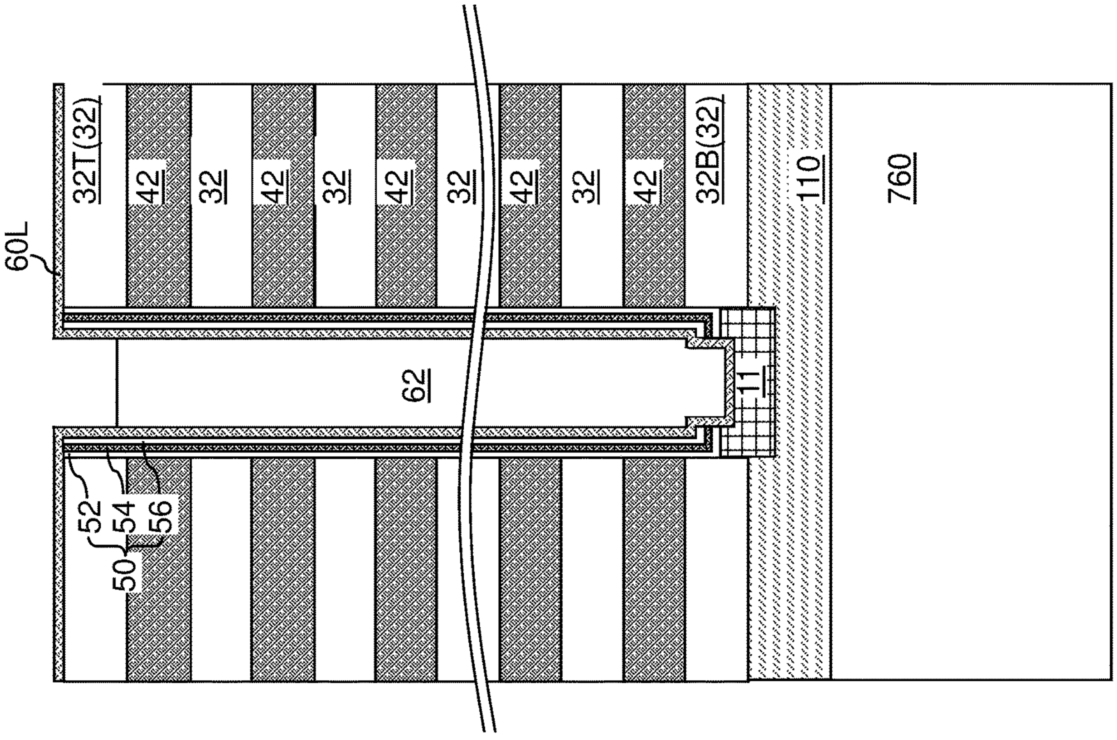

Referring to FIG. 7E, a dielectric core layer can be deposited to fill any remaining portion of the memory cavity 49' within each memory opening 49. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

The horizontal portion of the dielectric core layer can be removed, for example, by a recess etch process such that each remaining portions of the dielectric core layer is located within a respective memory opening 49 and has a respective top surface below the horizontal plane including the top surface of the topmost insulating layer 32T. Each remaining portion of the dielectric core layer constitutes a dielectric core 62.

Referring to FIG. 7F, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the topmost insulating layer 32T, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

Each combination of a memory film 50 and a vertical semiconductor channel 60 within a memory opening 49 constitutes a memory stack structure 55. The memory stack structure 55 is a combination of a vertical semiconductor channel 60, an optional dielectric liner 56, a plurality of memory elements comprising portions of the memory material layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58.

In the alternative embodiment in which the support openings are formed at the same time as the memory openings 49, the support pillar structures 20 may be formed in the support openings at the same time as the memory opening fill structures 58. In this alternative embodiment, the support pillar structures 20 have the same composition as the memory opening fill structures 58, but are not electrically connected to the subsequently formed bit lines.

Figure 8A:
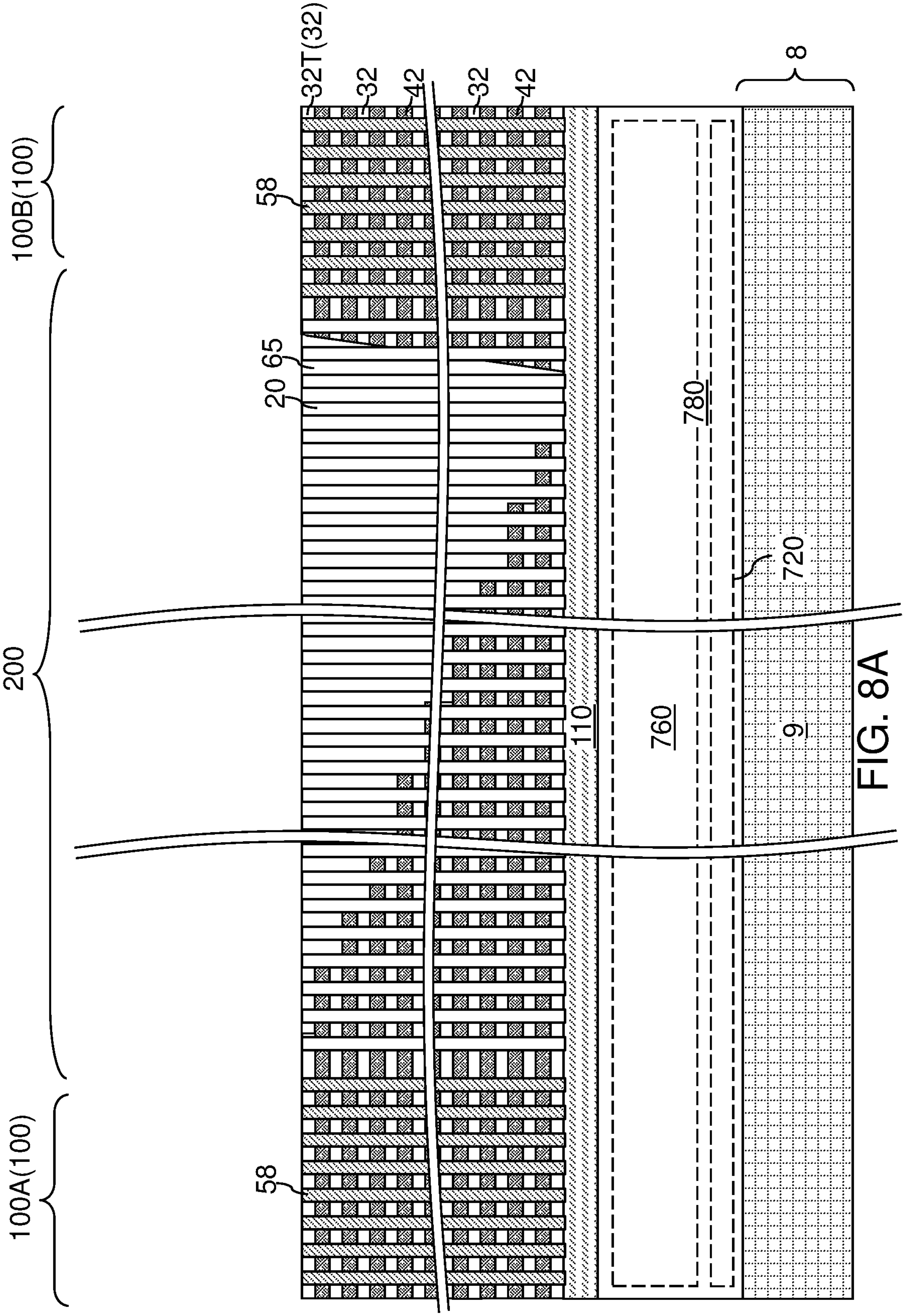
FIG. 8A is a vertical cross-sectional view of the first exemplary structure after formation of memory opening fill structures according to the first embodiment of the present disclosure.
Figure 8B:
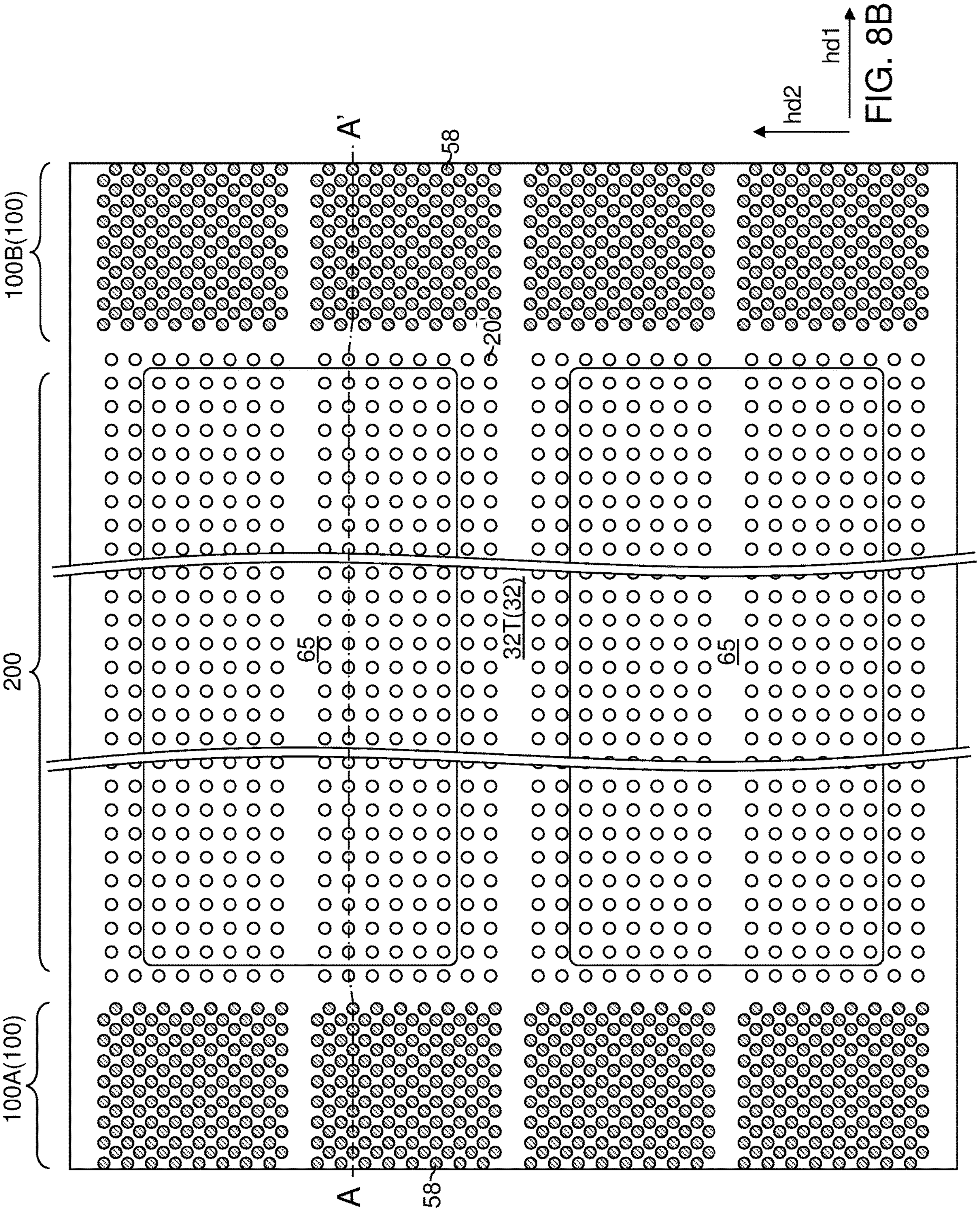
FIG. 8B is a top-down cross-sectional view of the first exemplary structure of FIG. 8A. The vertical plane A-A' is the cut plane of the vertical cross-sectional view of FIG. 8A.

Referring to FIGS. 8A and 8B, the first exemplary structure is illustrated after formation of memory opening fill structures 58 and support pillar structure 20 within the memory openings 49 and the support openings 19, respectively. An instance of a memory opening fill structure 58 can be formed within each memory opening 49. An instance of the support pillar structure 20 can be formed within each support opening. Other memory stack structures including different layer stacks or structures for the memory film 50 and/or for the vertical semiconductor channel 60 may also be used.

Figure 9A:
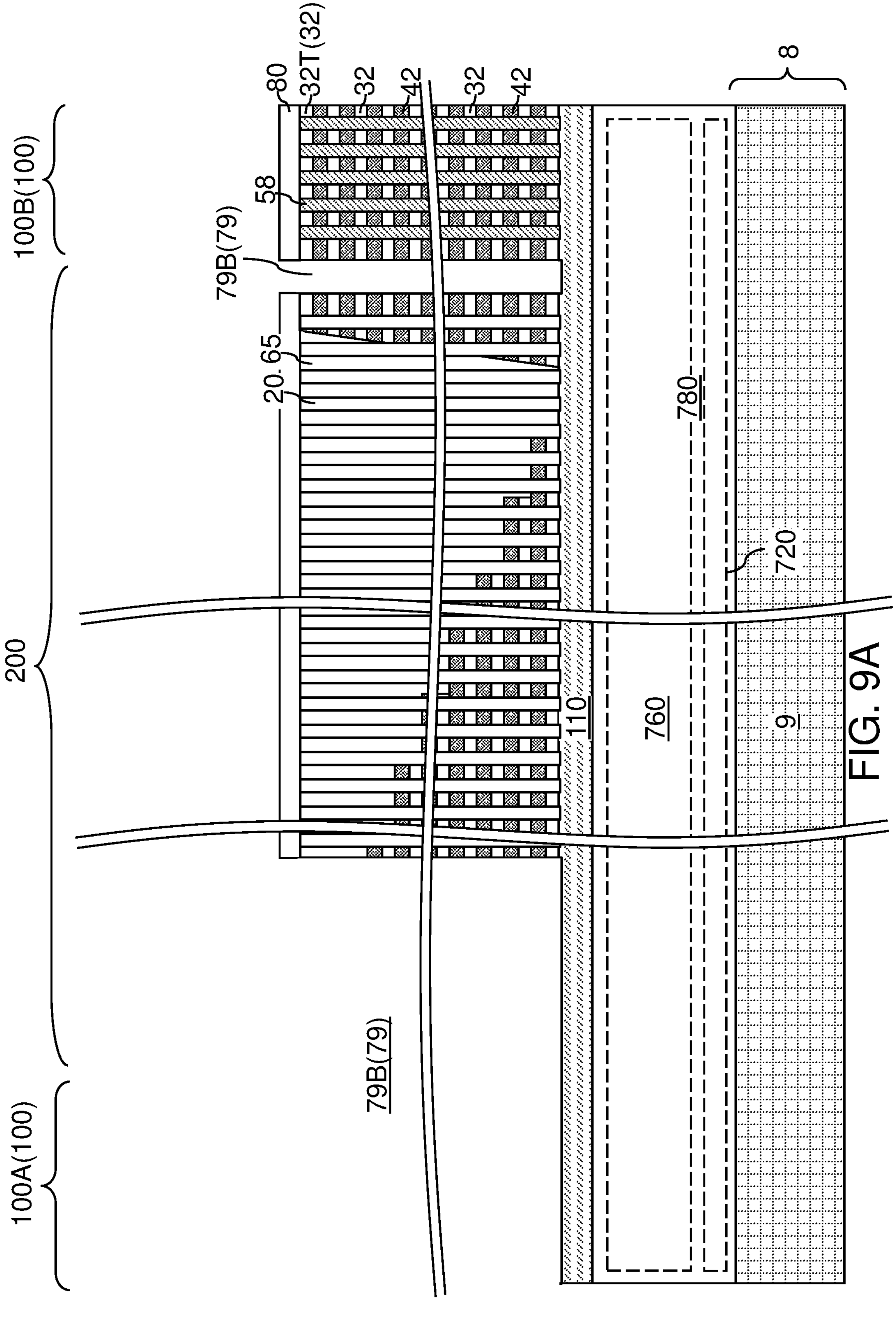
FIG. 9A is a vertical cross-sectional view of the first exemplary structure after formation of lateral isolation trenches according to the first embodiment of the present disclosure.
Figure 9B:
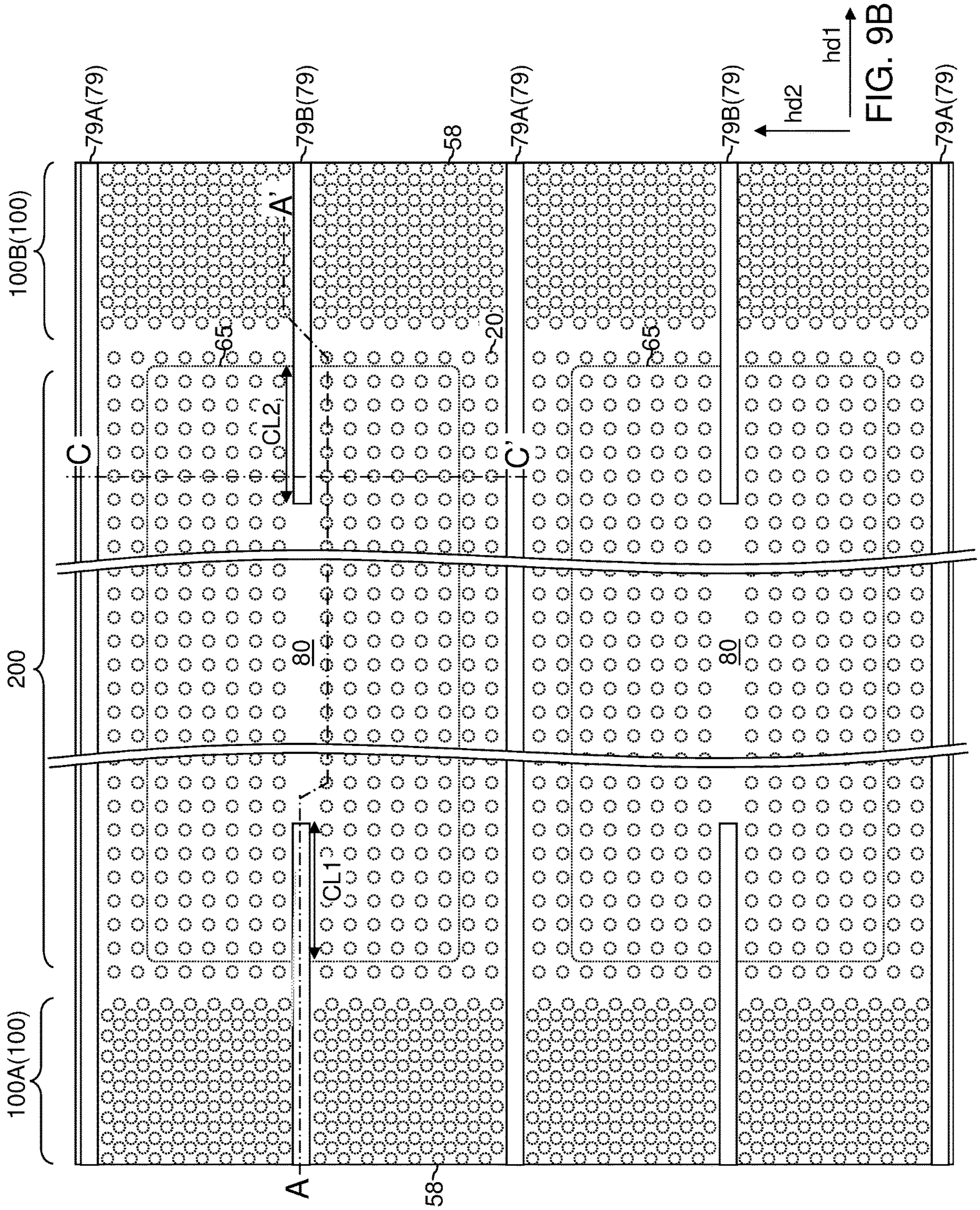
FIG. 9B is a top-down cross-sectional view of the first exemplary structure of FIG. 9A. The vertical plane A-A' is the cut plane of the vertical cross-sectional view of FIG. 9A.
Figure 9C:
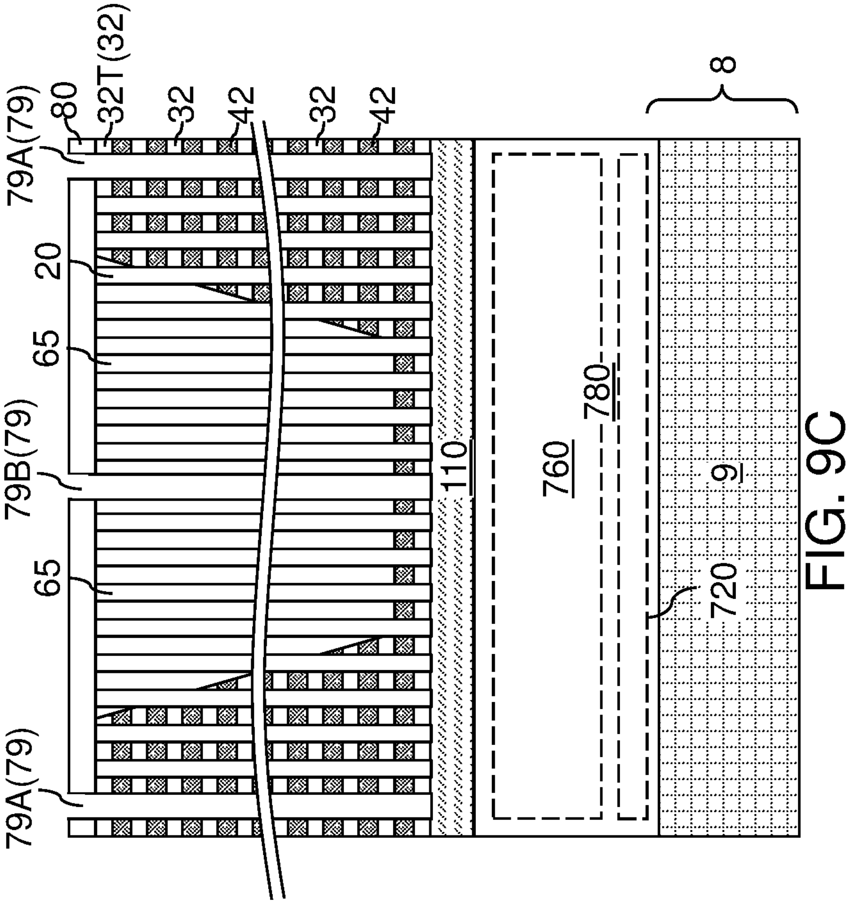
FIG. 9C is a vertical cross-sectional view along the vertical plane C-C' of FIG. 9B.

Referring to FIGS. 9A-9C, a contact-level dielectric layer 80 can be formed over the alternating stack (32, 42) of insulating layer 32 and sacrificial material layers 42, and over the memory opening fill structures 58 and the support pillar structures 20. The contact-level dielectric layer 80 includes a dielectric material that is different from the dielectric material of the sacrificial material layers 42. For example, the contact-level dielectric layer 80 can include silicon oxide. The contact-level dielectric layer 80 can have a thickness in a range from 50 nm to 500 nm, although lesser and greater thicknesses can also be employed.

A photoresist layer (not shown) can be applied over the contact-level dielectric layer 80, and is lithographically patterned to form elongated openings in areas between clusters of memory opening fill structures 58. The pattern in the photoresist layer can be transferred through the contact-level dielectric layer 80, the alternating stack (32, 42), and the retro-stepped dielectric material portions 65 employing an anisotropic etch to form lateral isolation trenches 79, which vertically extend from the top surface of the contact-level dielectric layer 80 at least to the top surface of semiconductor material layer 110, and laterally extend through at least one memory array region 100 and at least a peripheral portion the contact region 200.

In one embodiment, the lateral isolation trenches 79 can laterally extend along a first horizontal direction hd1 (which is a word line direction), and can be laterally spaced apart among one another along a second horizontal direction hd2 (which is a bit line direction) that is perpendicular to the first horizontal direction hd1. The memory opening fill structures 58 can be arranged in rows that extend along the first horizontal direction hd1. Each lateral isolation trench 79 can have a uniform width that is invariant along the lengthwise direction (i.e., along the first horizontal direction hd1). Multiple rows of memory opening fill structures can be located between a neighboring pair of lateral isolation trenches 79. In one embodiment, the lateral isolation trenches 79 can include source contact openings in which source contact via structures can be subsequently formed. The photoresist layer can be removed, for example, by ashing.

According to an aspect of the present disclosure, the lateral isolation trenches 79 comprise first-type lateral isolation trenches 79A and second-type lateral isolation trenches 79B that are interlaced with the first-type lateral isolation trenches 79A along the second horizontal direction hd2. Each of the first-type lateral isolation trenches 79A laterally extends continuously through the contact region 200, the first memory array region 100A. and the second memory array region 100B along the first horizontal direction hd1. Each of the second-type lateral isolation trenches 79B laterally extends through a respective one of the memory regions 100 (e.g., 100A or 100B), and partially into a peripheral portion of the contact region 200 without extending into a center portion of the contact region 200 or into the other one of the memory regions 100. In one embodiment, each pair of second-type lateral isolation trenches 79B can be laterally spaced apart from each other along the first horizontal direction hd1 by a gap located within the contact region 200. In one embodiment, each pair of second-type lateral isolation trenches 79B may be aligned to each other along the second horizontal direction hd2. In this case, each lengthwise sidewall of a second-type lateral isolation trench 79B may be formed within a vertical plane that is parallel to the first horizontal direction hd1. The vertical plane can contain a lengthwise sidewall of another second-type lateral isolation trench 79B within a respective pair of second-type lateral isolation trenches 79B. In one embodiment, each pair of second-type lateral isolation trenches 79B may be positioned midway between a neighboring pair of first-type lateral isolation trenches 79A. In this case, a unit repetition structure including a first-type lateral isolation trench 79A and a pair of second-type lateral isolation trench 79B spaced apart from each other along the first horizontal direction hd1 can be repeated along the second horizontal direction hd2 with a uniform periodicity.

The width of the lateral isolation trenches 79 can be greater than the thickness of each sacrificial material layer 42. For example, the ratio of the width of the lateral isolation trenches 79 along the second horizontal direction hd2 to the thickness of each sacrificial material layer 42 may be in a range from 2 to 30, such as from 4 to 15, although lesser and greater ratios may also be employed. According to an aspect of the present disclosure, the first-type lateral isolation trenches 79A may be formed between neighboring pairs of retro-stepped dielectric material portions 65, and each pair of second-type lateral isolation trenches 79B may cut through a respective one of the retro-stepped dielectric material portions 65, as shown in FIGS. 9B and 9C.

The first-type lateral isolation trenches 79A may be laterally interlaced with the retro-stepped dielectric material portions 65 along the second horizontal direction hd2. As shown in FIG. 9B, a cut length (CL1 or CL2) of each second-type lateral isolation trench 79B may be measured along the first horizontal direction hd1 between an end wall of the respective second-type lateral isolation trench 79B to which a remaining portion of a retro-stepped dielectric material portion 65 is exposed and another end wall of the retro-stepped dielectric material portion 65 contacts a sidewall of the topmost insulating layer 32T that is parallel to the second horizontal direction hd2. The end wall of a second-type lateral isolation trench 79 is parallel to the second horizontal direction hd2. The cut length (CL1 or CL2) of each second-type lateral isolation trench 79B may be in a range from 50% to 150%, such as from 80% to 120%, of the lateral distance along the second horizontal direction hd2 between neighboring pairs of a first-type lateral isolation trench 79A and a second-type lateral isolation trench 79B in a memory array region 100.

Generally, lateral isolation trenches 79 laterally extending along the first horizontal direction hd1 can be formed through the contact-level dielectric layer 80 and the alternating stack (32, 42). The alternating stack (32, 42) is divided into multiple alternating stacks (32, 42) that are laterally spaced apart along the second horizontal direction hd2 by the first-type lateral isolation trenches 79A. Layer stacks (32, 42, 80) are formed, each of which includes a respective patterned portion of the contact-level dielectric layer 80 and a respective alternating stack (32, 42) and laterally spaced among one another by the lateral isolation trenches 79.

Figure 10A:
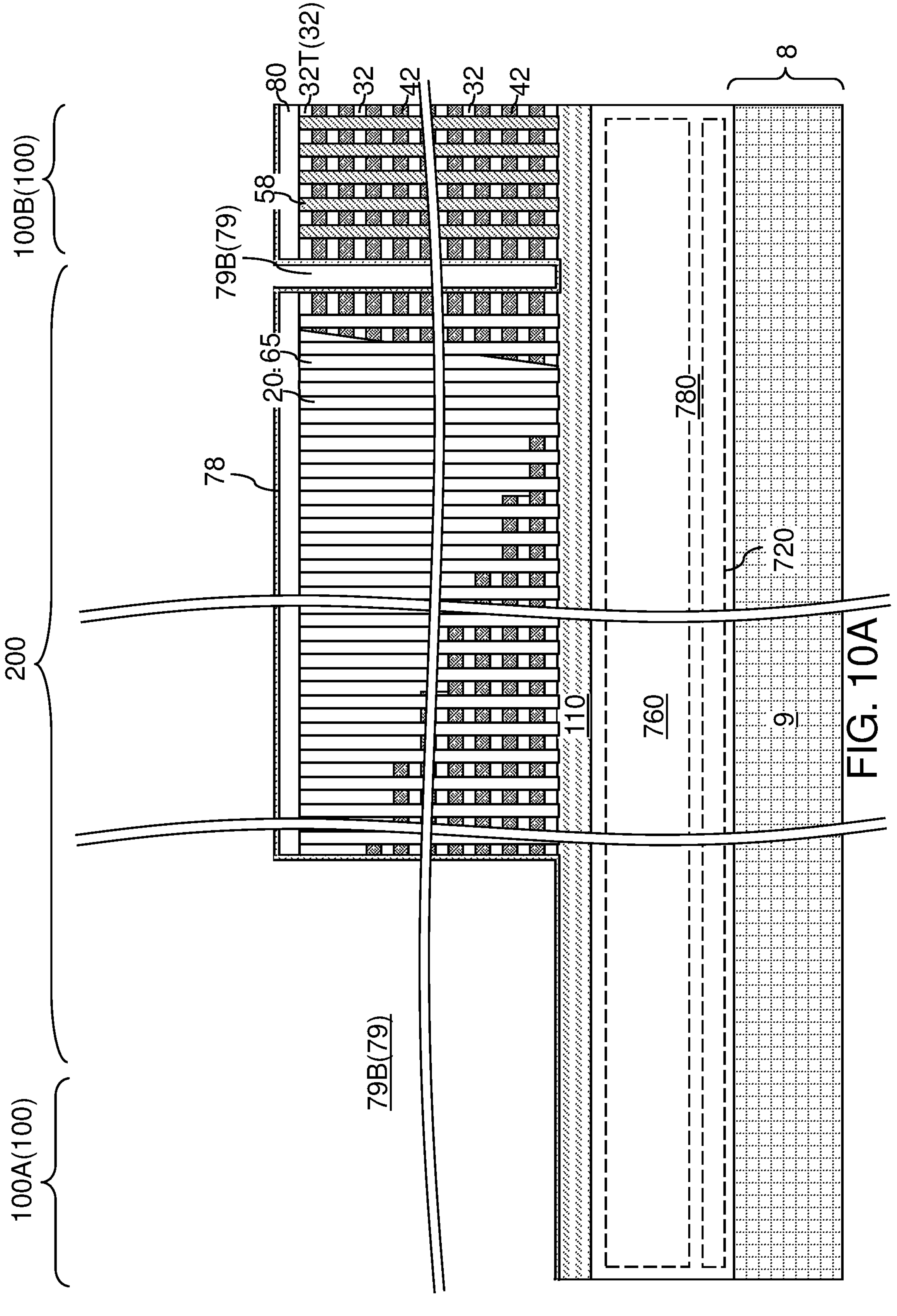
FIG. 10A is a vertical cross-sectional view of the first exemplary structure after formation of an etch stop liner according to the first embodiment of the present disclosure.
Figure 10B:
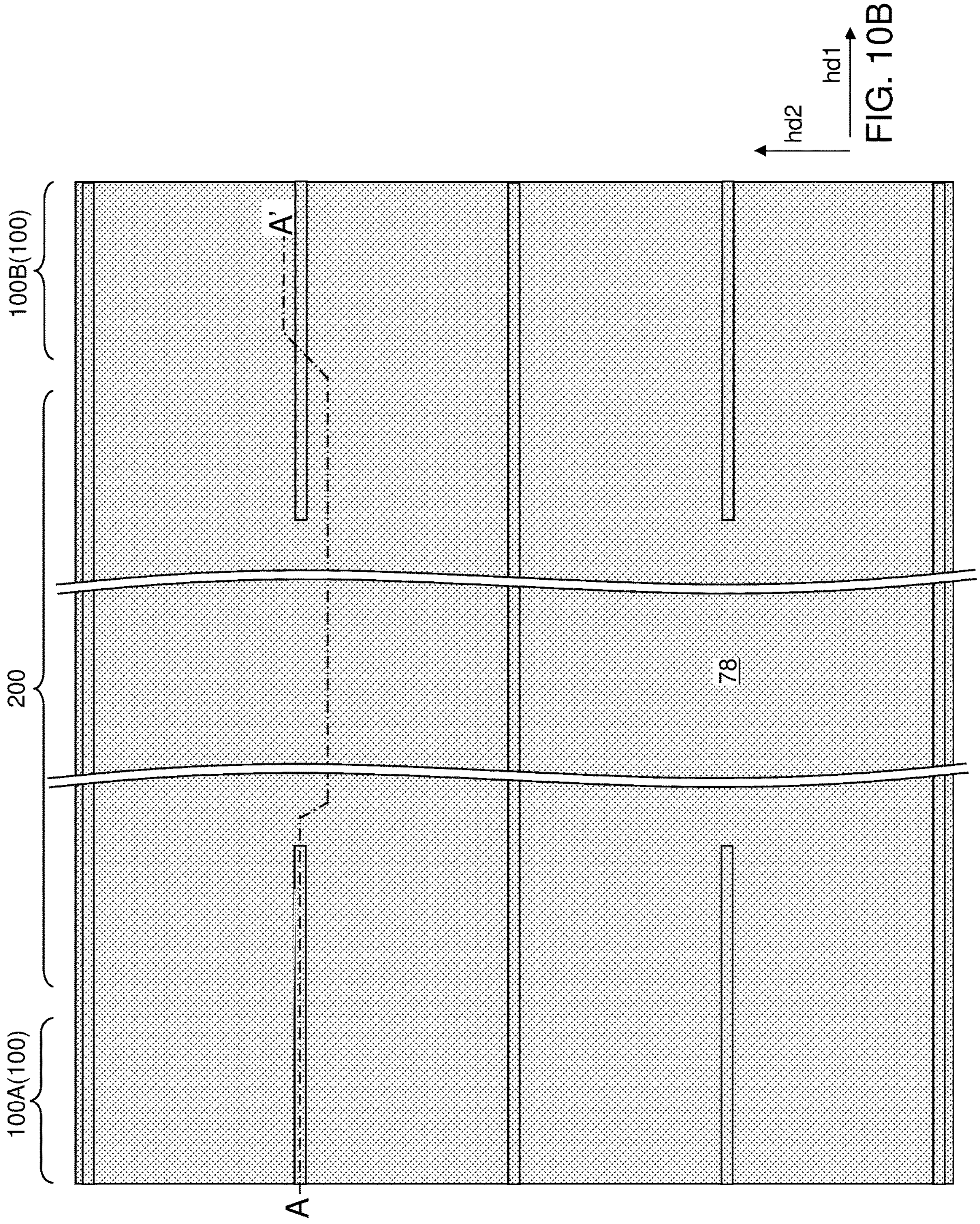
FIG. 10B is a top-down cross-sectional view of the first exemplary structure of FIG. 10A. The vertical plane A-A' is the cut plane of the vertical cross-sectional view of FIG. 10A.

Referring to FIGS. 10A and 10B, a dielectric etch stop material that is different from the material of the sacrificial material layers 42 can be conformally deposited in the backside trenches 79 and over the contact-level dielectric layer 80 to form an etch stop liner 78. The etch stop liner 78 may comprise silicon oxide, a doped silicate glass, silicon carbonitride, silicon oxynitride, or a dielectric metal oxide material that is resistant to an etch chemistry to be subsequently employed to remove the sacrificial material layers 42. In one embodiment, the etch stop liner 78 comprises silicon oxide. The etch stop liner 78 may be deposited by a conformal deposition process such as a chemical vapor deposition process. The thickness of the etch stop liner 78 may be in a range from 10 nm 100 nm, such as from 20 nm to 60 nm, although lesser and greater thicknesses may also be employed.

Figure 11A:
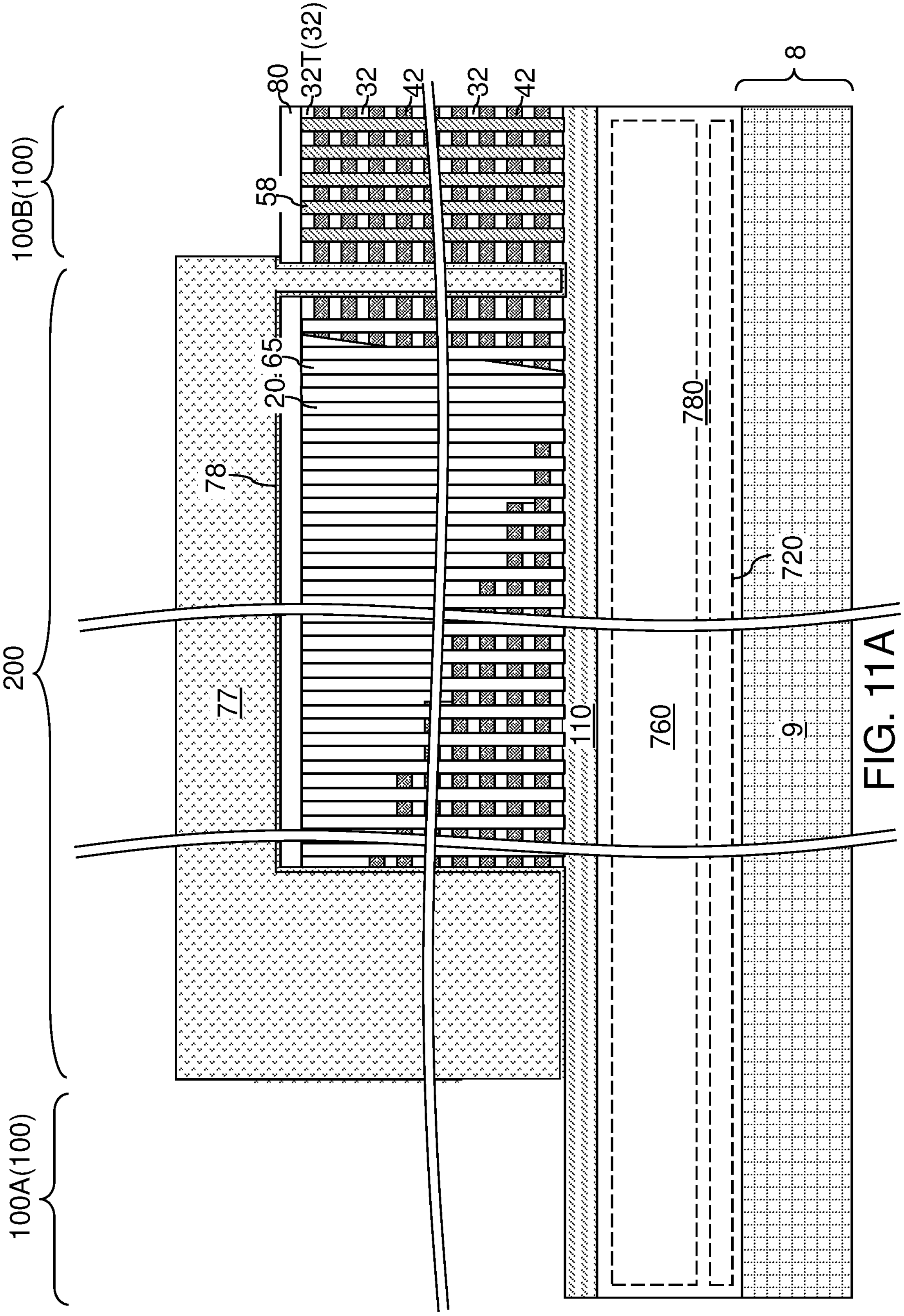
FIG. 11A is a vertical cross-sectional view of the first exemplary structure after patterning the etch stop liner according to the first embodiment of the present disclosure.
Figure 11B:
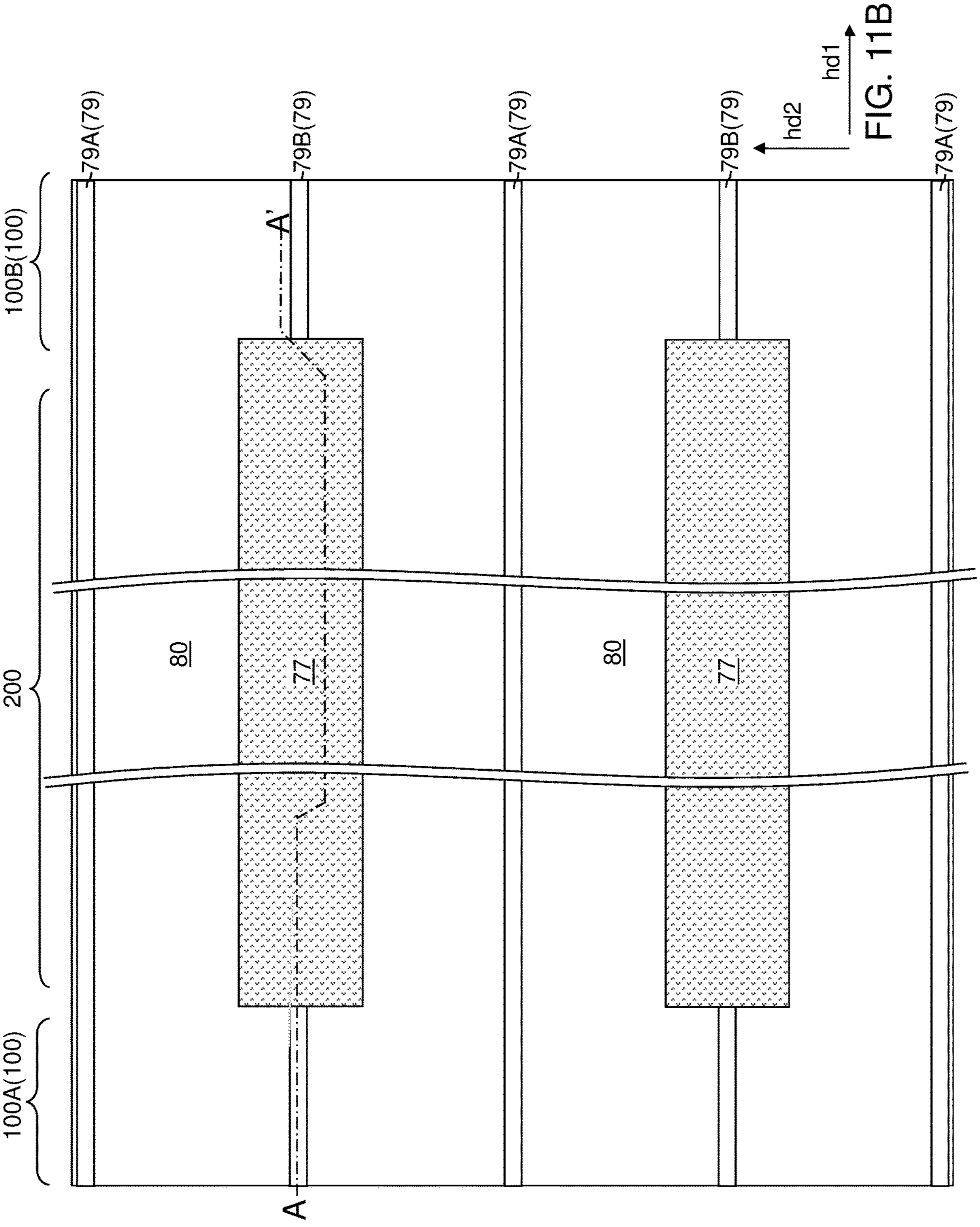
FIG. 11B is a top-down cross-sectional view of the first exemplary structure of FIG. 11A. The vertical plane A-A' is the cut plane of the vertical cross-sectional view of FIG. 11A.
Figure 12A:
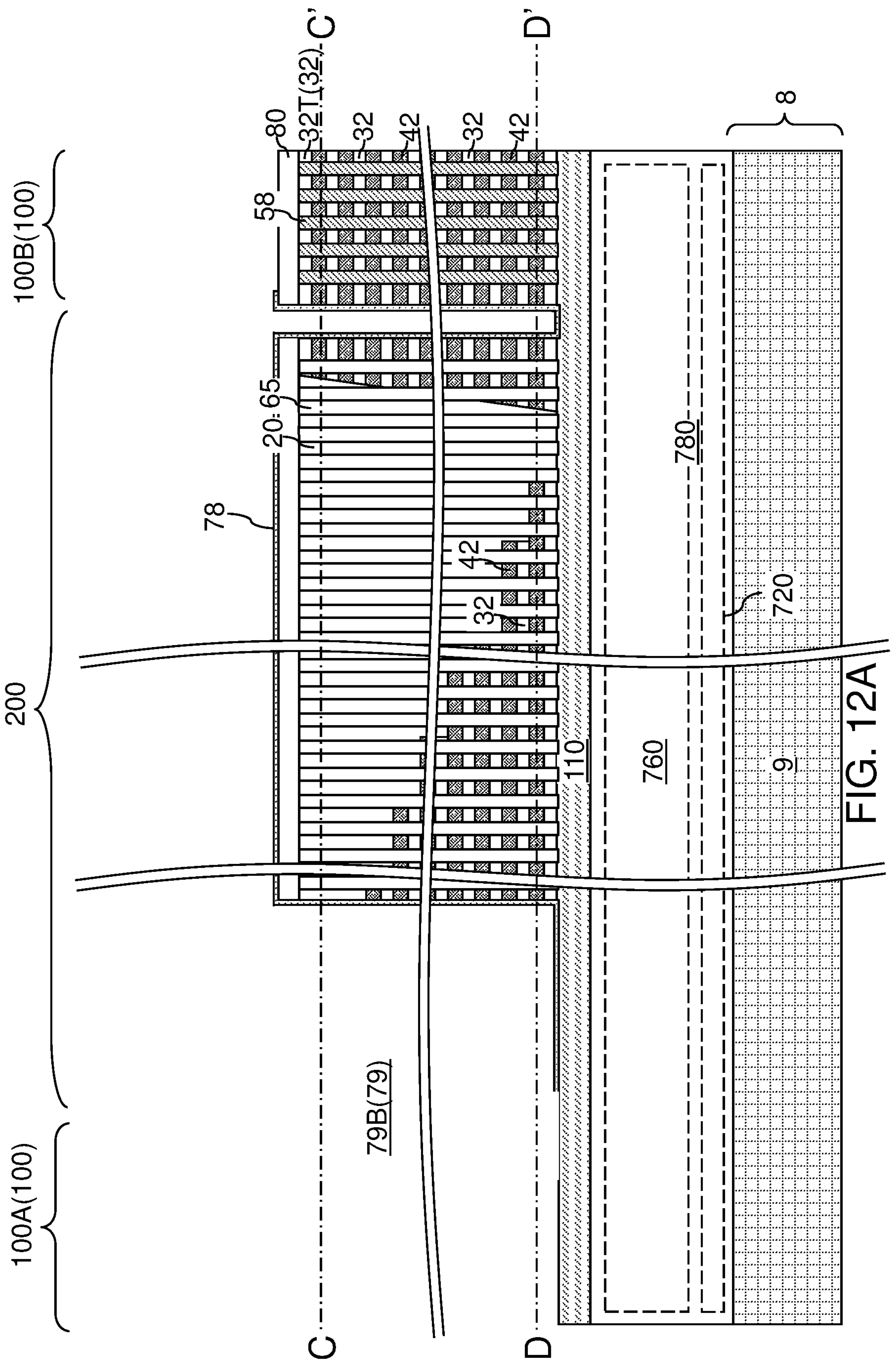
FIG. 12A is a vertical cross-sectional view of the first exemplary structure after removing a patterned photoresist layer according to the first embodiment of the present disclosure.
Figure 12B:
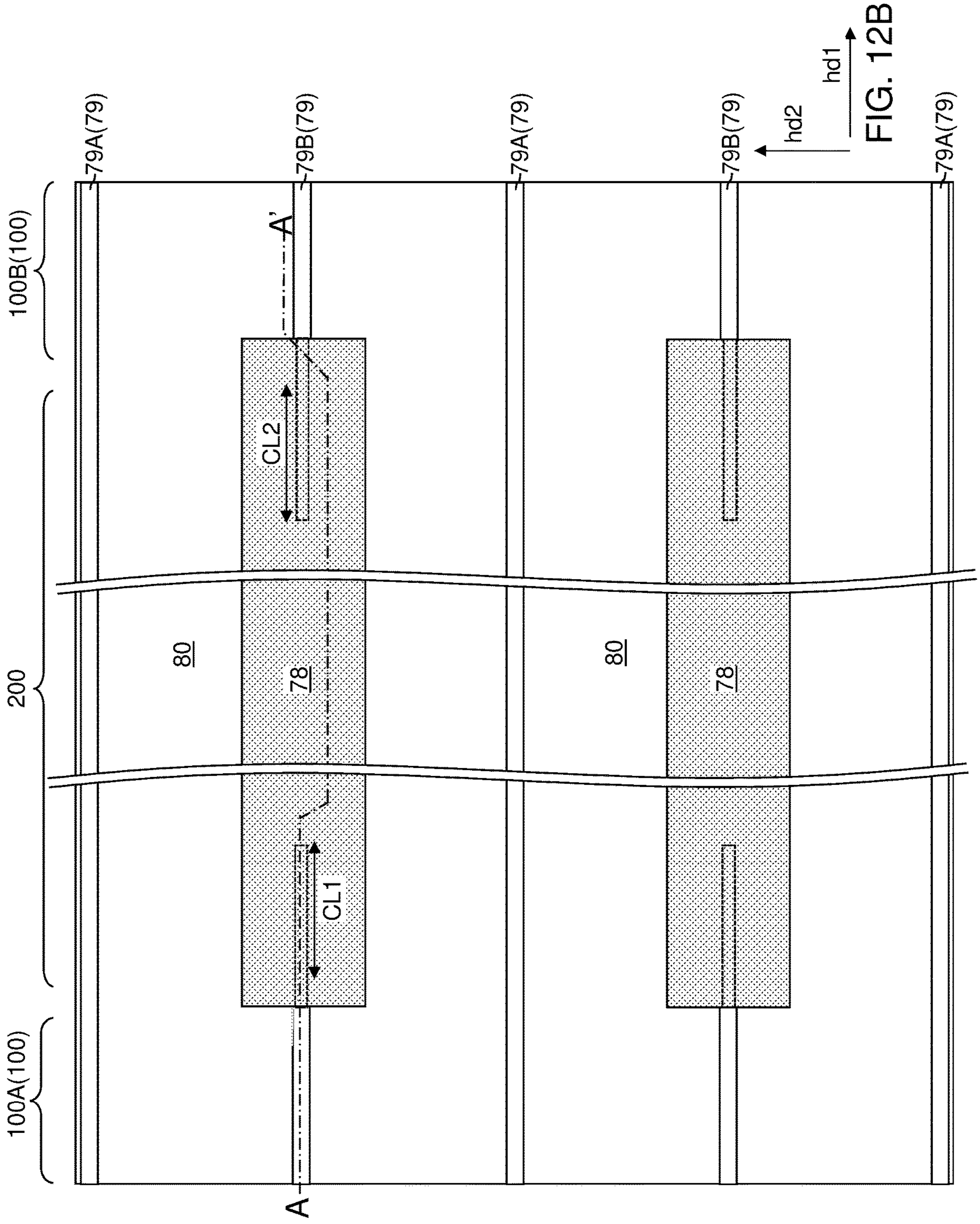
FIG. 12B is a top-down cross-sectional view of the first exemplary structure of FIG. 12A. The vertical plane A-A' is the cut plane of the vertical cross-sectional view of FIG. 12A.
Figure 12C:
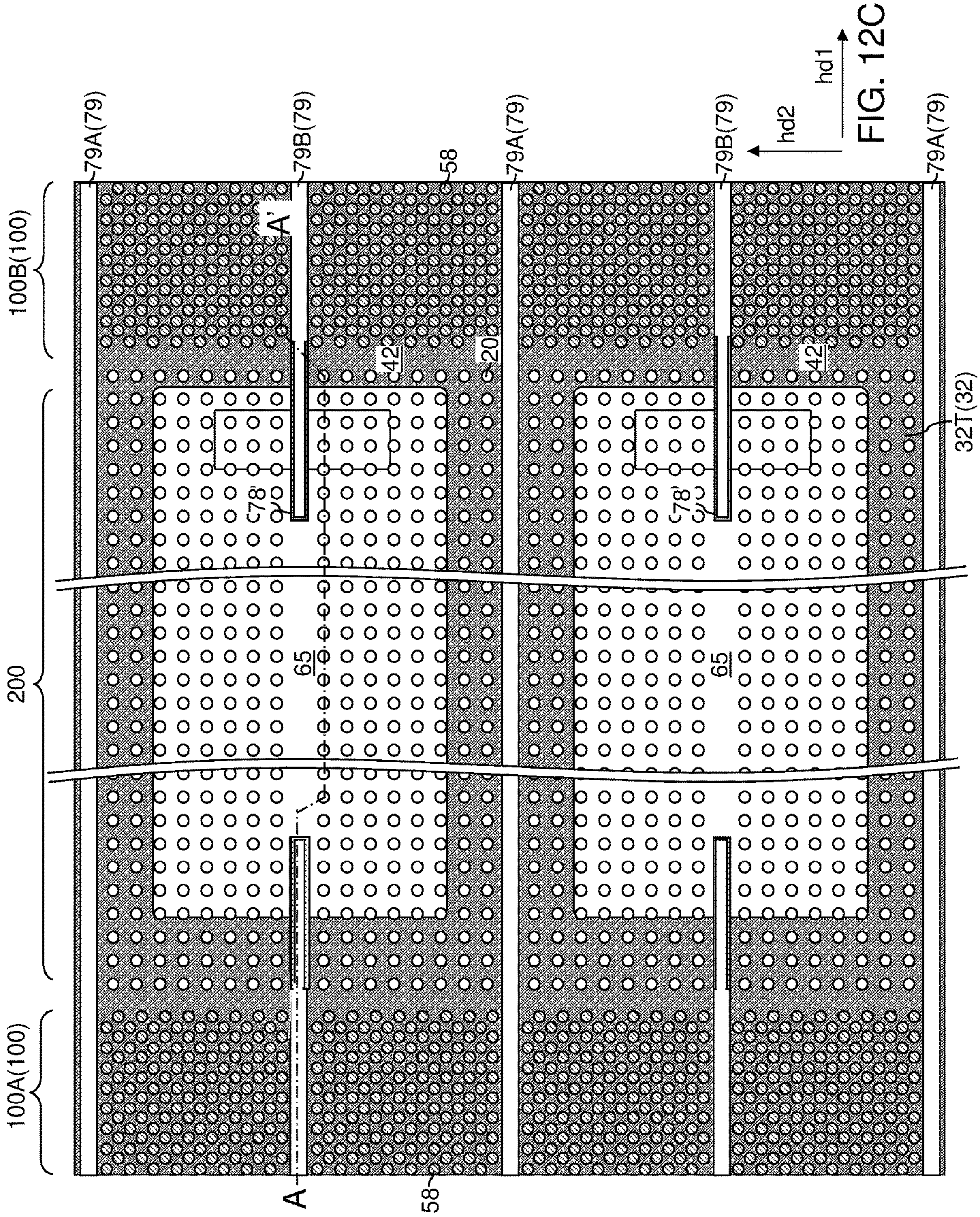
FIG. 12C is a horizontal cross-sectional view of the first exemplary structure along the horizontal plane C-C' of FIG. 12A.
Figure 12D:
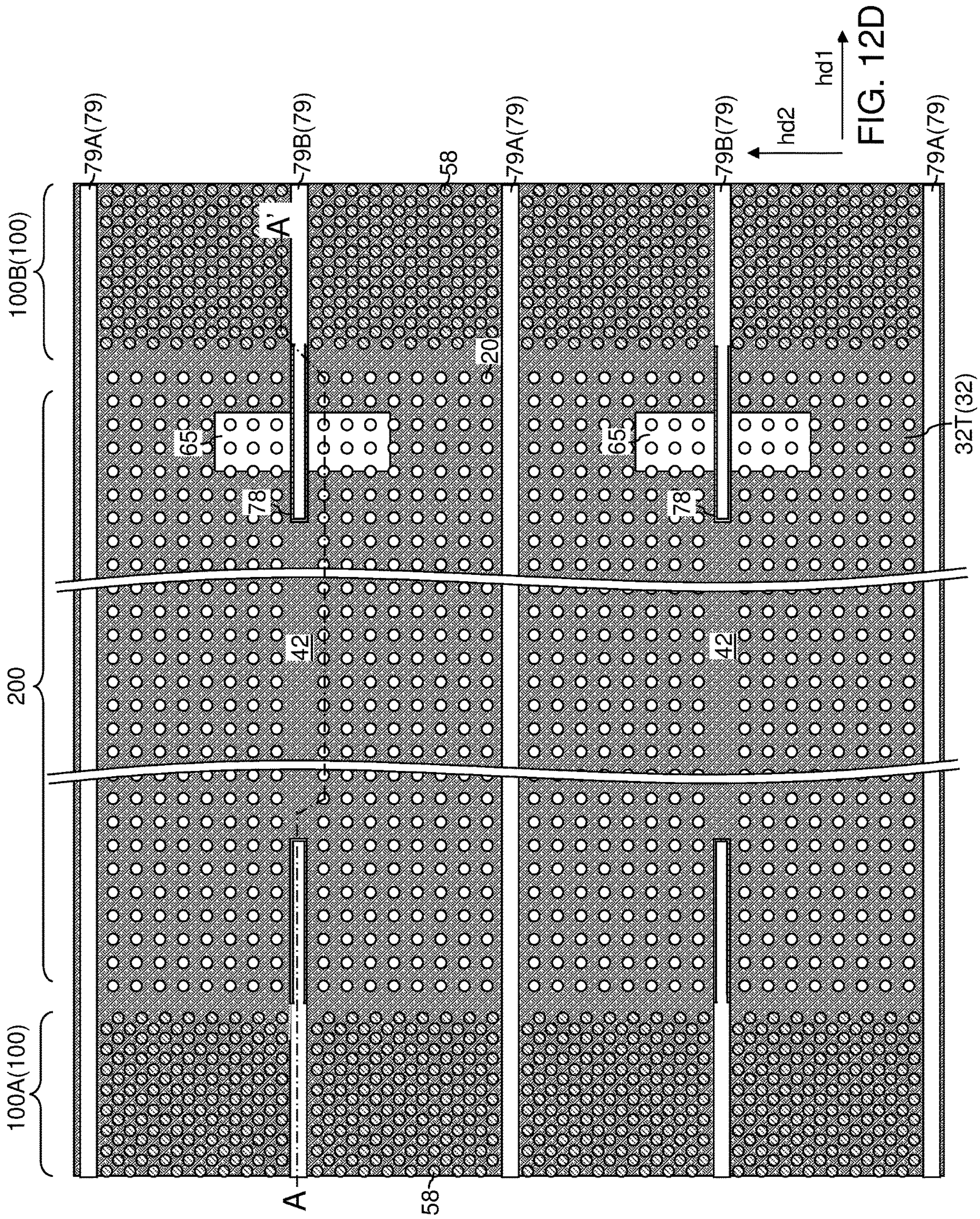
FIG. 12D is a horizontal cross-sectional view of the first exemplary structure along the horizontal plane D-D' of FIG. 12A.

Referring to FIGS. 11A and 11B, a photoresist layer 77 can be applied over the etch stop liner 78, and can be lithographically patterned into discrete photoresist material portions 77 that cover end portions of the second-type lateral isolation trenches 79B located in and/or in proximity to the contact region 200, without covering portions of the second-type lateral isolation trenches 79B that are distal from the contact region 200 and without covering any of the first-type lateral isolation trenches 79A. In one embodiment, portions of the second-type lateral isolation trenches 79B located in the memory regions (100A, 100B) are not covered by the photoresist layer. An etch process can be performed to remove portions of the etch stop liner 78 that are not covered by the photoresist layer 77. The etch process may comprise an isotropic etch process or an anisotropic etch process.

Remaining portions of the etch stop liner 78 formed at the processing steps of FIGS. 10A and 10B comprise multiple etch stop liners 78 covering end portions of the second-type lateral isolation trenches 78. In one embodiment, each etch stop liner 78 may cover two end portions of a pair of second-type lateral isolation trenches 79B located in the contact region 200 and may laterally extend through the contact region 200 along the first horizontal direction hd1. Generally, the etch stop liners 78 can be formed at end portions of the second-type lateral isolation trenches 79B that are located in the contact region 200 such that the etch stop liners 78 are not present on portions of the second-type lateral isolation trenches 79B that are located in the memory regions (100A, 100B) distal from the contact region 200, and are not present within the first-type lateral isolation trenches 79A.

Referring to FIGS. 12A-12D, the photoresist layer 77 may be removed, for example, by ashing. The etch stop liner 78 covers the entirety of each cut length (CL1 or CL2) of the end portion of each of the second-type lateral isolation trenches 79B. Thus, the retro-stepped dielectric material portions 65 are not physically exposed to any cavity located within the second-type lateral isolation trenches 79B.

Referring to FIGS. 13A-13H, an isotropic etch process can be performed to introduce an isotropic etchant that etches a material of the sacrificial material layers 42 into the first-type lateral isolation trenches 79A and into the pairs of second-type lateral isolation trenches 79B. For example, if the sacrificial material layers 42 comprise silicon nitride, the isotropic etch process may comprise a wet etch process employing hot phosphoric acid. Laterally-extending cavities 43 are formed in volumes from which portions of the sacrificial material layers 42 are removed by the isotropic etch process.

According to an aspect of the present disclosure, the isotropic etch process has an etch distance that is greater than one half of a lateral distance between a first-type lateral isolation trench 79A and a pair of second-type lateral isolation trenches 79B that is most proximal to the first-type lateral isolation trench 79A. In one embodiment, the etch distance is less than the lateral distance between a first-type lateral isolation trench 79A and a pair of second-type lateral isolation trenches 79B that is most proximal to the first-type lateral isolation trench 79A. In one embodiment, the etch distance is less than the lateral dimension of the etch stop liners 78 along the first horizontal direction hd1.

Figure 13A:
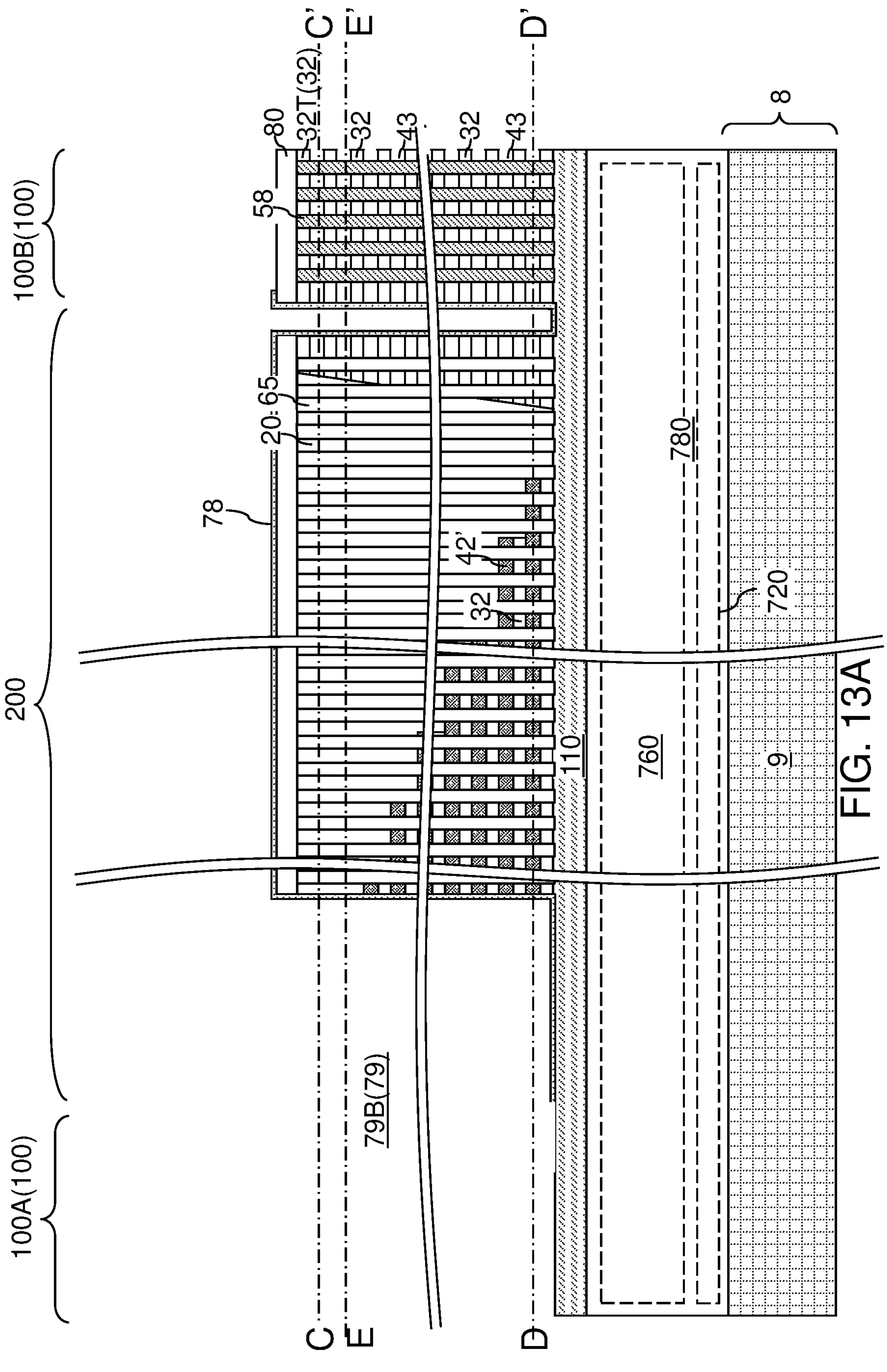
FIG. 13A is a vertical cross-sectional view of the first exemplary structure after formation of laterally-extending cavities according to the first embodiment of the present disclosure.
Figure 13B:
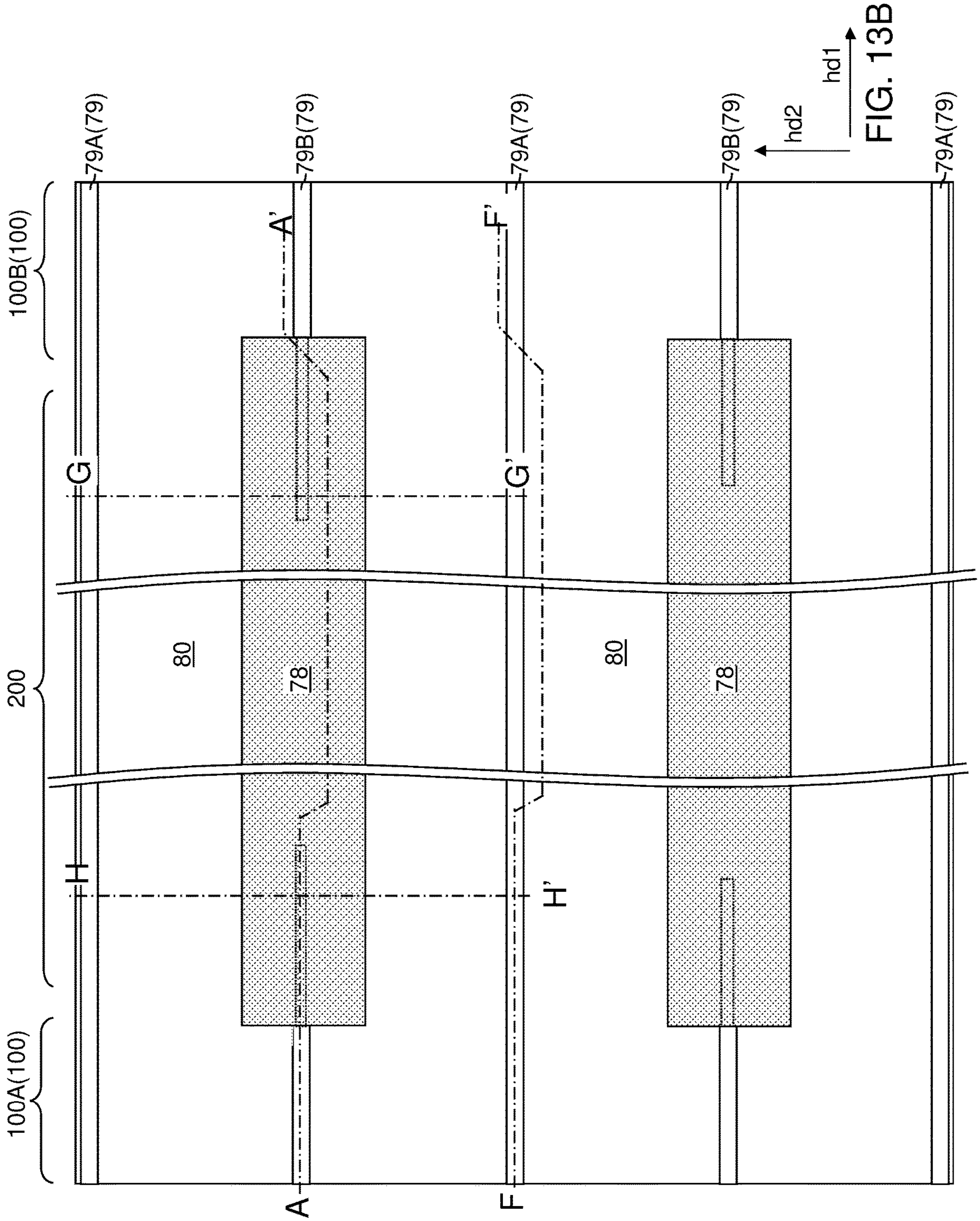
FIG. 13B is a top-down cross-sectional view of the first exemplary structure of FIG. 13A. The vertical plane A-A' is the cut plane of the vertical cross-sectional view of FIG. 13A.
Figure 13C:
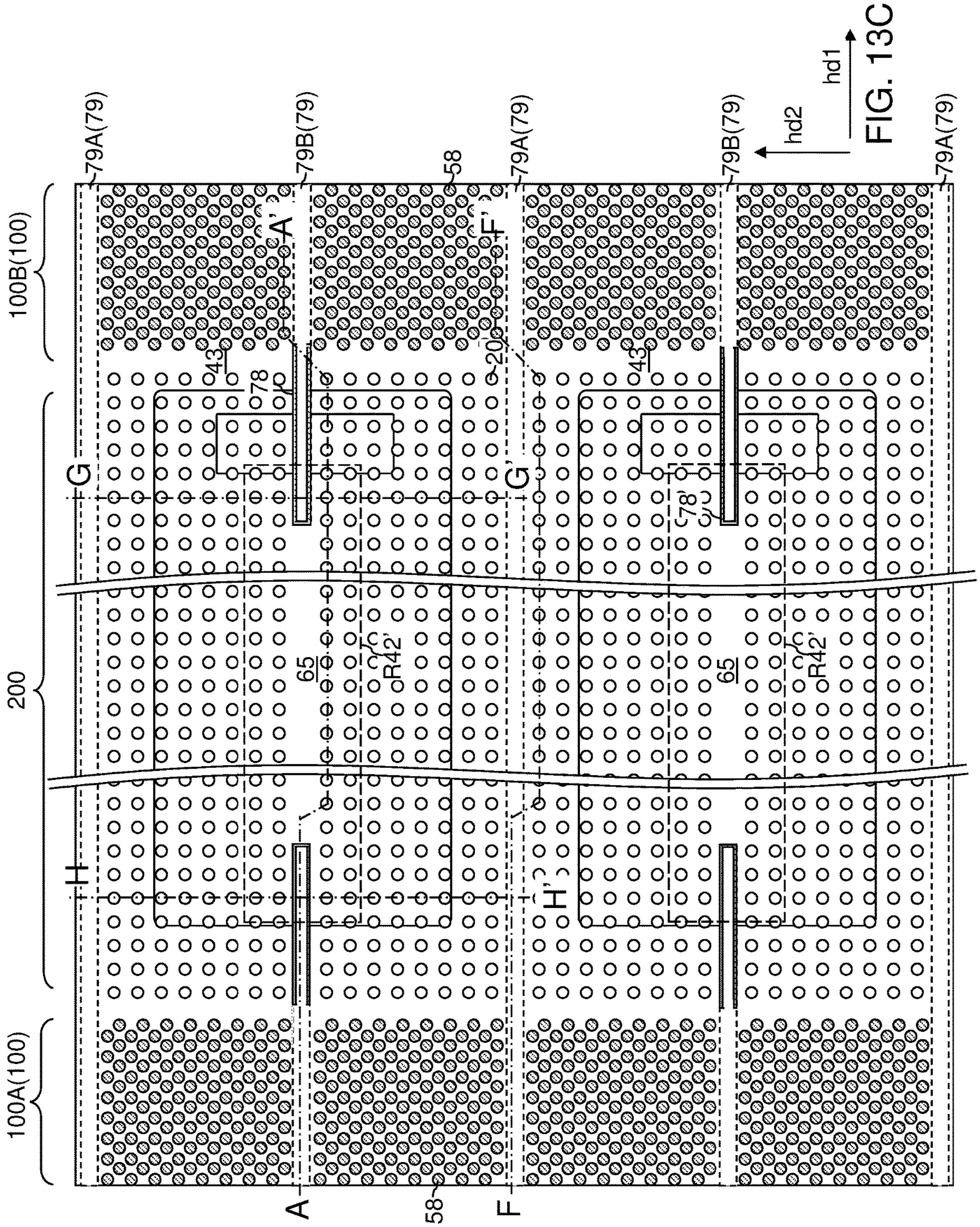
FIG. 13C is a horizontal cross-sectional view of the first exemplary structure along the horizontal plane C-C' of FIG. 13A.
Figure 13D:
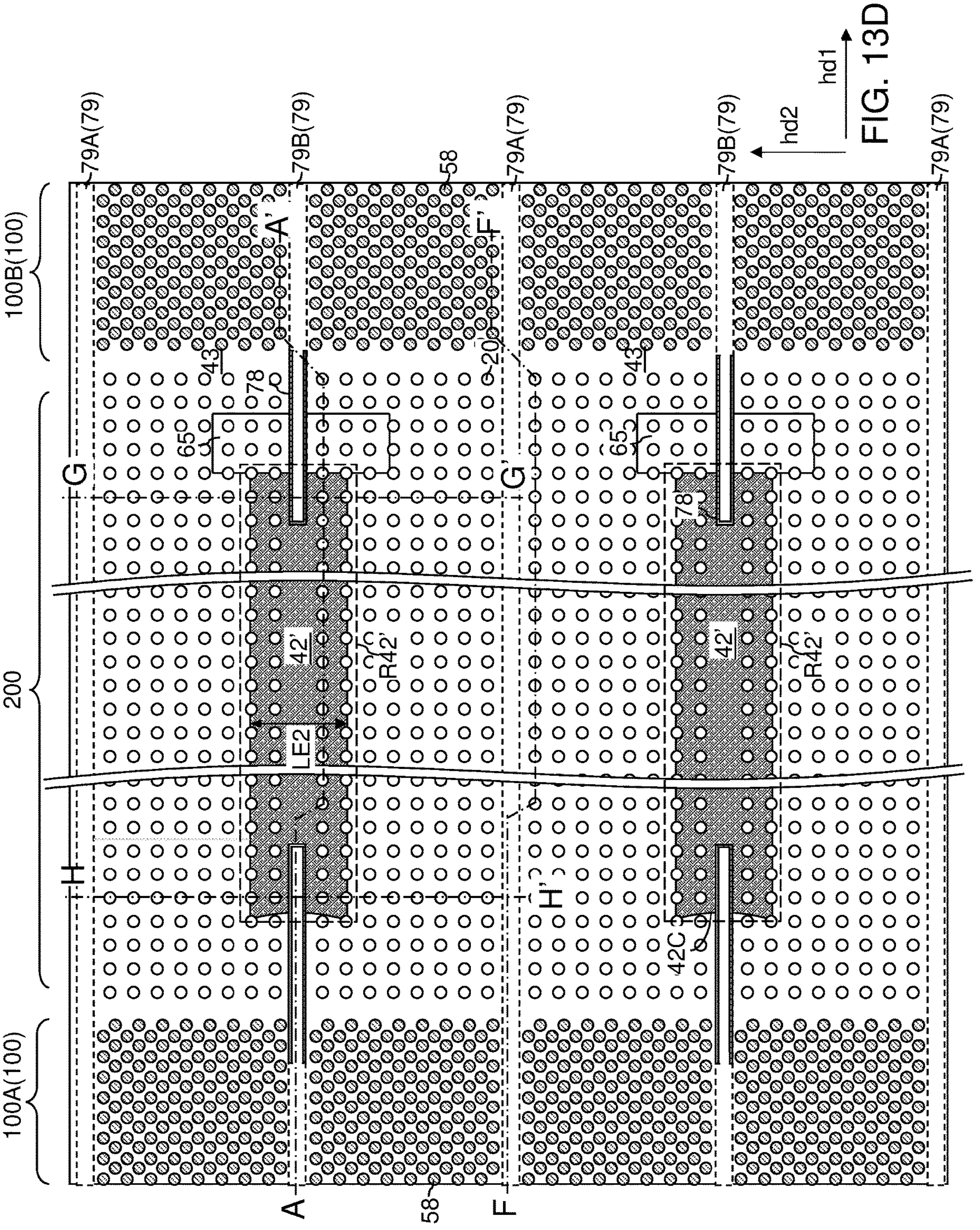
FIG. 13D is a horizontal cross-sectional view of the first exemplary structure along the horizontal plane D-D' of FIG. 13A.
Figure 13E:
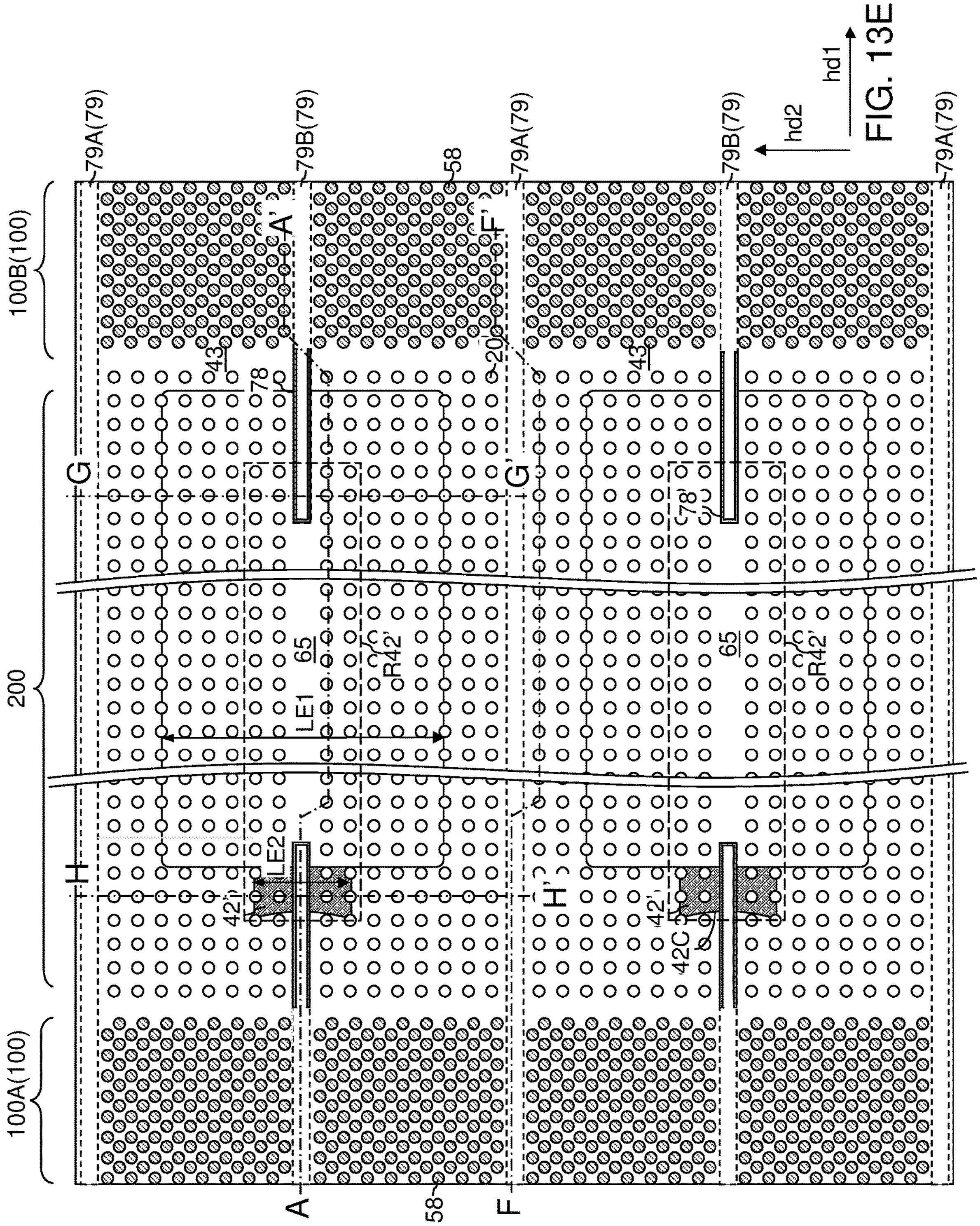
FIG. 13E is a horizontal cross-sectional view of the first exemplary structure along the horizontal plane E-E' of FIG. 13A.
Figure 13F:
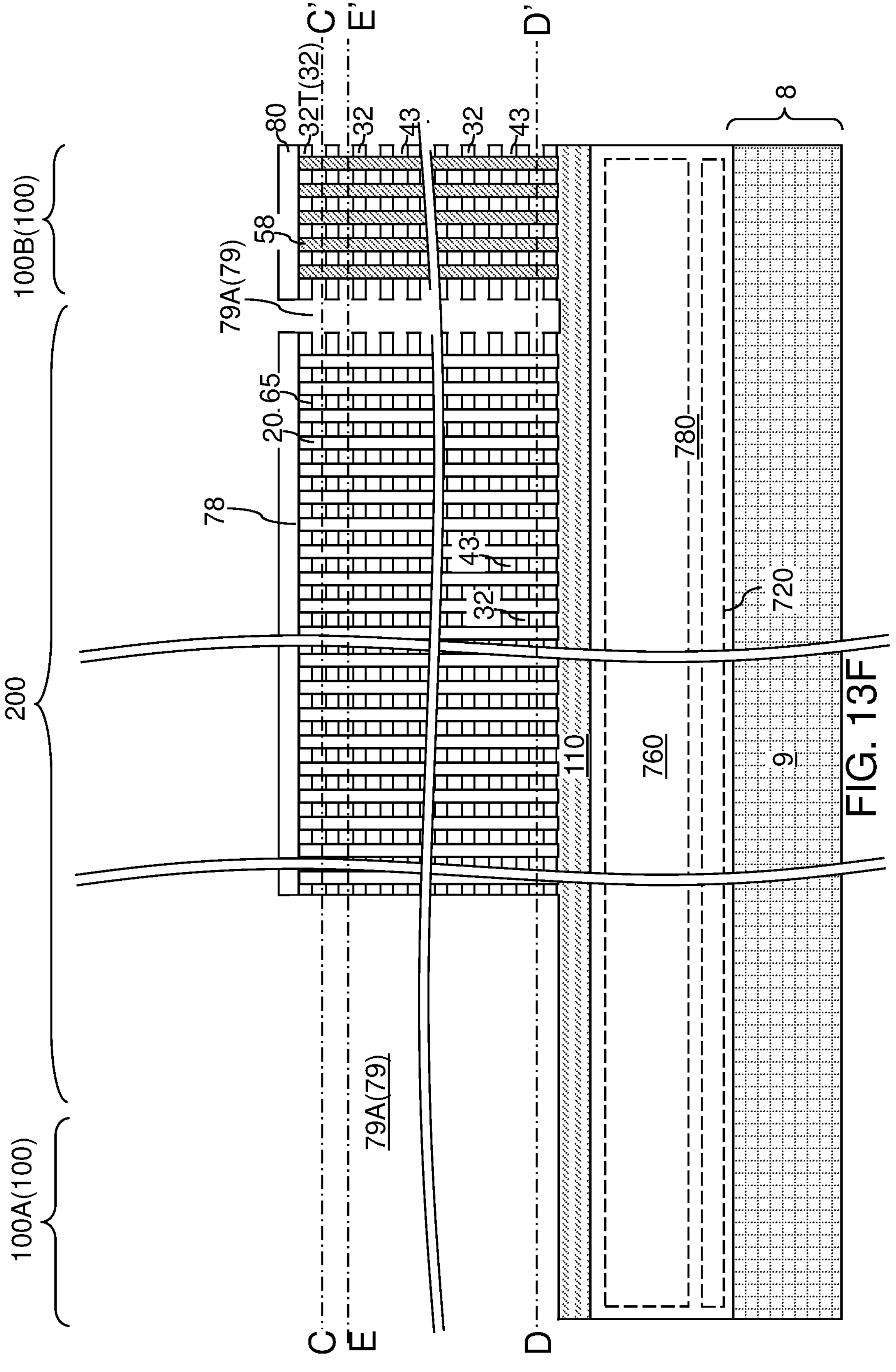
FIG. 13F is a vertical cross-sectional view of the first exemplary structure along the vertical plane F-F' of FIG. 13B.
Figure 13G:
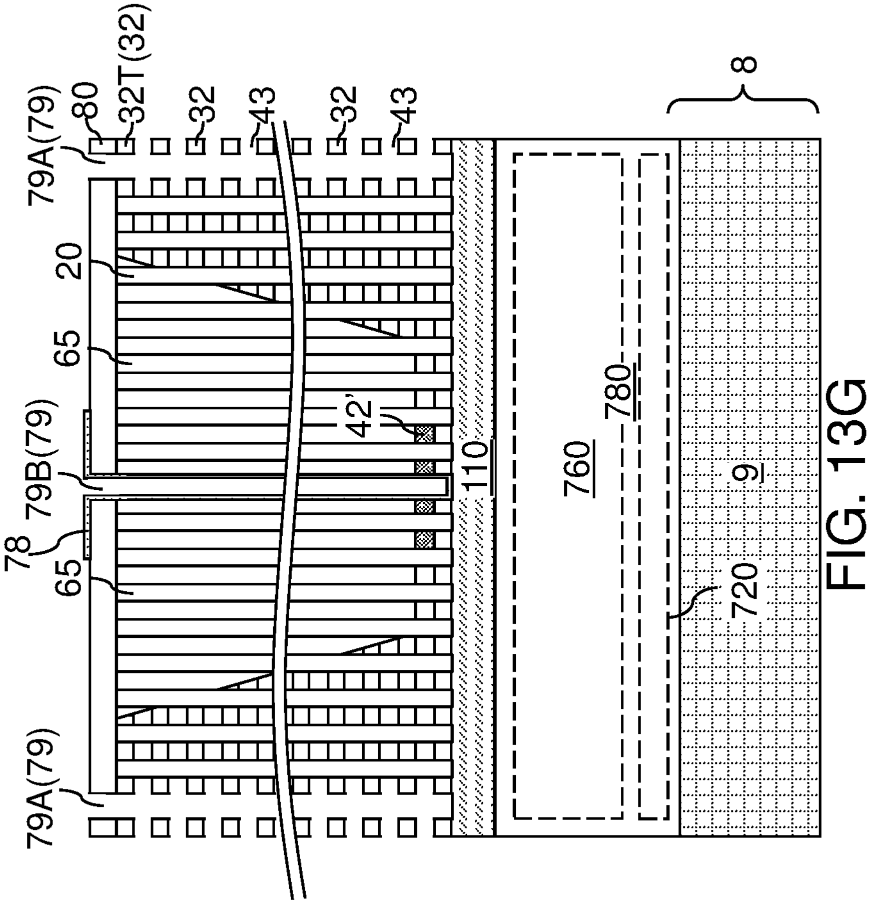
FIG. 13G is a vertical cross-sectional view of the first exemplary structure along the vertical plane G-G' of FIG. 13B.
Figure 13H:
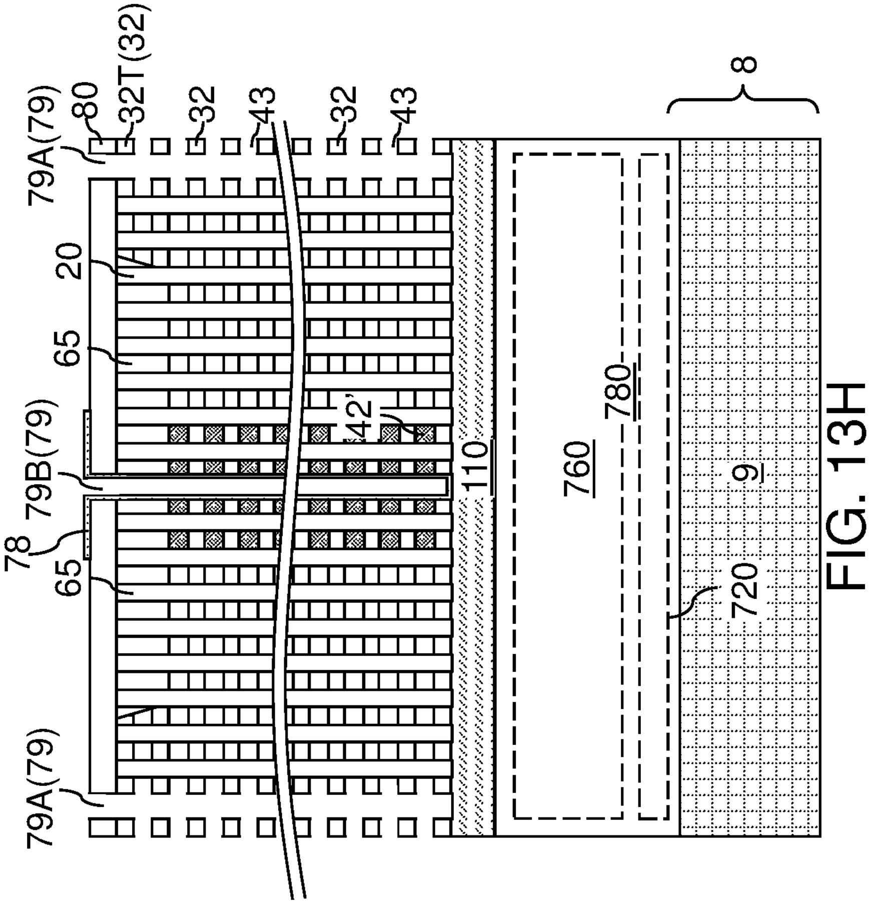
FIG. 13H is a vertical cross-sectional view of the first exemplary structure along the vertical plane H-H' of FIG. 13B.

Remaining portions of the sacrificial material layers 42 are present in each gap between the pairs of second-type lateral isolation trenches 79B after the isotropic etch process, as shown in FIGS. 13D and 13E. The remaining portions of the sacrificial material layers 42 constitute vertical stacks of dielectric material plates 42'. A vertical stack of dielectric material plates 42' can be formed underneath each retro-stepped dielectric material portion 65. In one embodiment, the retro-stepped dielectric material portions 65 may have a first lateral extent LE1 (shown in FIG. 13E) along the second horizontal direction hd2, and the dielectric material plates 42' in the vertical stacks of dielectric material plates 42' may have a second lateral extent LE2 along the second horizontal direction hd2 that is less than the first lateral extent LE1.

In one embodiment, a plurality of the dielectric material plates 42' within the vertical stack of dielectric material plates 42' may have a uniform width along the second horizontal direction hd2 that is less than a minimum lateral dimension of the retro-stepped dielectric material portion 65 along the second horizontal direction hd2. In one embodiment, the dielectric material plates 42' within each vertical stack of dielectric material plates 42' may have lateral extents along the first horizontal direction hd1 that decrease with a vertical distance from the substrate 8. In one embodiment, each dielectric material plate 42' within the vertical stack of dielectric material plates 42' may have a respective sidewall that is parallel to the second horizontal direction hd2 and contacts a respective vertical sidewall segment of the retro-stepped dielectric material portion 65.

In one embodiment, each dielectric material plate 42' within a vertical stack of dielectric material plates 42' may comprise a concave sidewall segment 42C located at a same level as a respective laterally-extending cavity 43. In one embodiment, each dielectric material plate 42' within a vertical stack of dielectric material plates 42' may comprise a first planar sidewall segment that contacts an etch stop liner 78, and a second planar sidewall segment that contacts another etch stop liner 78. A dielectric material plate region R42' can be formed between each pair of second-type lateral isolation trenches 79B that are laterally spaced apart from each other along the first horizontal direction hd1.

Figure 14A:
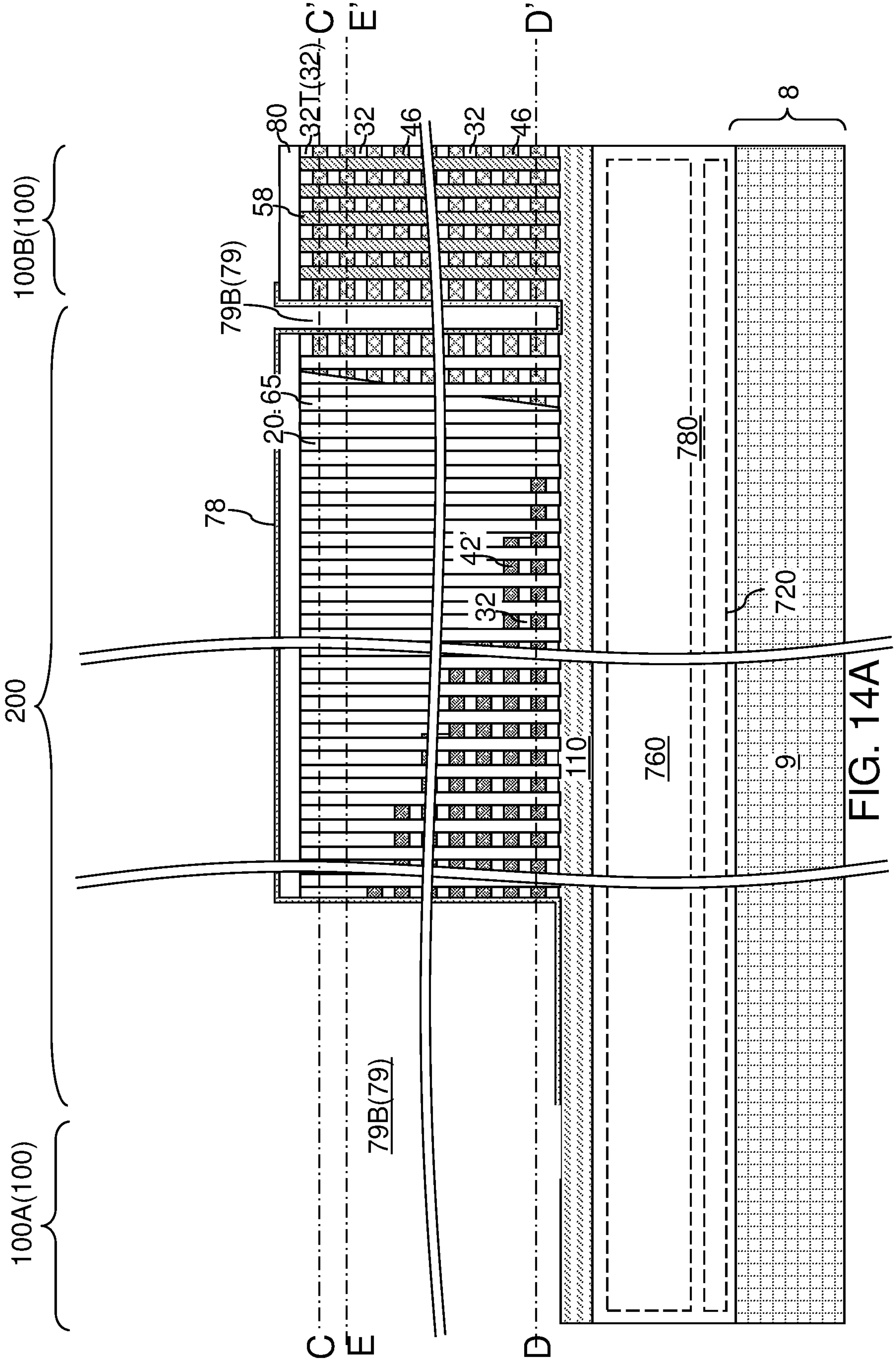
FIG. 14A is a vertical cross-sectional view of the first exemplary structure after formation of electrically conductive layers according to the first embodiment of the present disclosure.
Figure 14B:
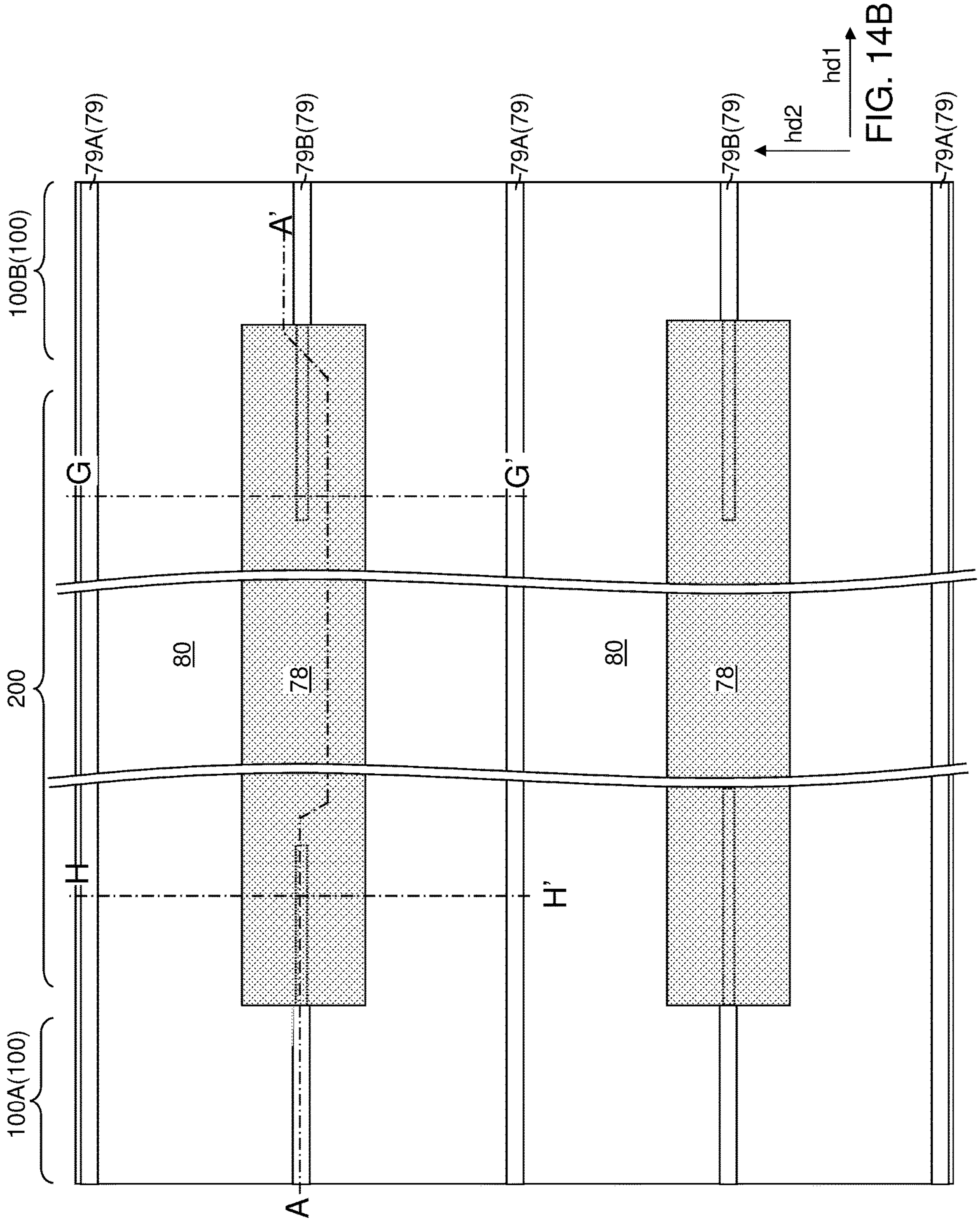
FIG. 14B is a top-down cross-sectional view of the first exemplary structure of FIG. 14A. The vertical plane A-A' is the cut plane of the vertical cross-sectional view of FIG. 14A.
Figure 14C:
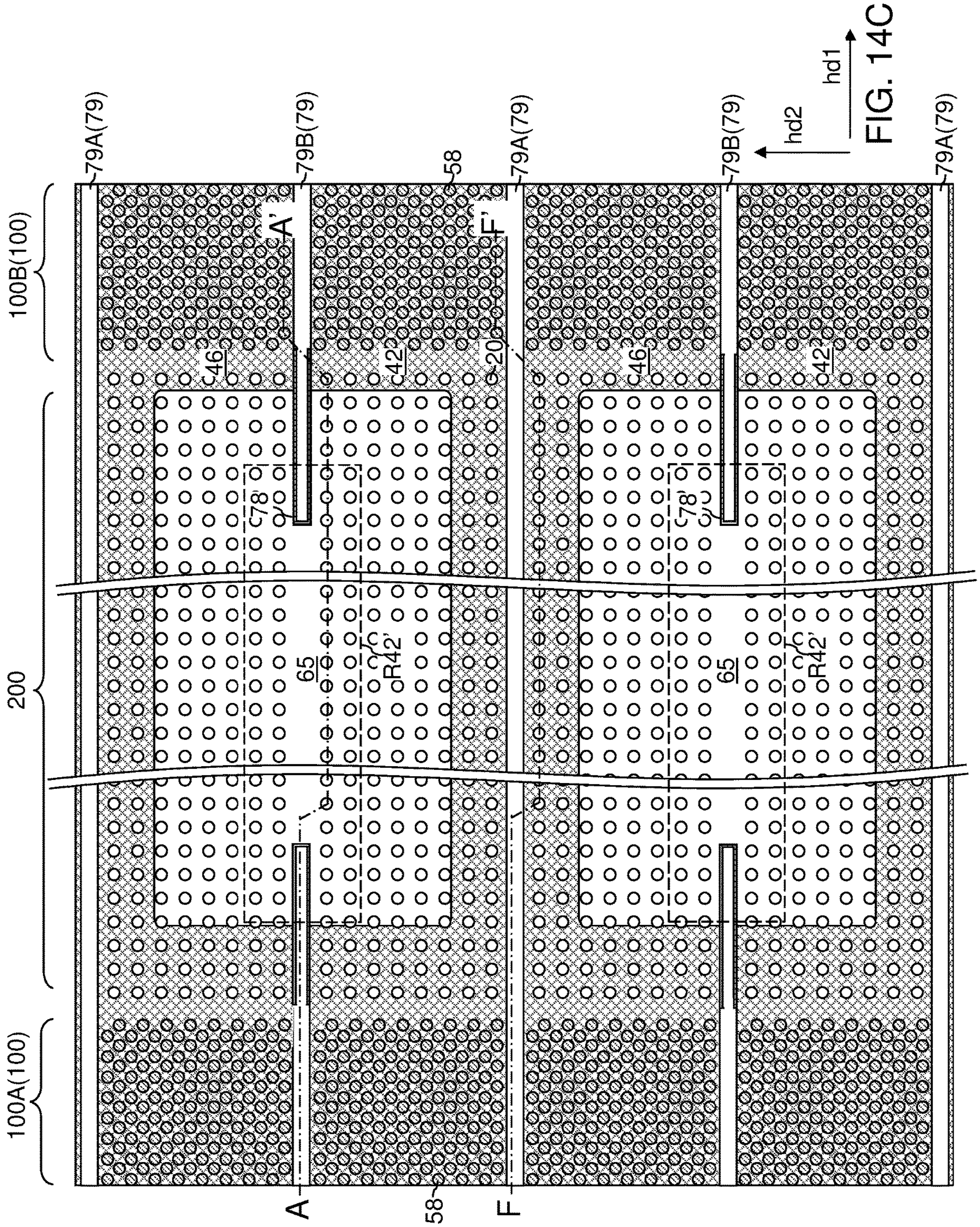
FIG. 14C is a horizontal cross-sectional view of the first exemplary structure along the horizontal plane C-C' of FIG. 14A.

Referring to FIGS. 14A-14H, a backside blocking dielectric layer 44 may be optionally deposited in the laterally-extending cavities 43 on the physically exposed surfaces of the retro-stepped dielectric material portions 65, the dielectric material plates 42', and the insulating layers 32 by a conformal deposition process, as shown in FIG. 14C. The backside blocking dielectric layer 44 comprises a dielectric material such as a dielectric metal oxide (such as an aluminum oxide) and/or silicon oxide. The thickness of the backside blocking dielectric layer 44 may be in a range from 3 nm to 12 nm, although lesser and greater thicknesses may also be employed.

At least one conductive material can be deposited in unfilled volumes of the laterally-extending cavities 43 by providing at least one reactant gas into the laterally-extending cavities 43 through the lateral isolation trenches 79. For example, the at least one conductive material may comprise a metallic barrier layer and a metallic fill material. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material can be deposited over the metallic barrier layer to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas, such as $WF_6$. In one embodiment, the metallic fill material layer can be a tungsten layer including a residual level of fluorine atoms as impurities. The metallic fill material layer is spaced from the insulating layers 32 and the memory opening fill structures 58 by the metallic barrier layer, which is a metallic barrier layer that blocks diffusion of fluorine atoms therethrough.

A plurality of electrically conductive layers 46 can be formed in the plurality of laterally-extending cavities 43, and a continuous metallic material layer can be formed on the sidewalls of each lateral isolation trench 79 and over the contact-level dielectric layer 80. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the lateral isolation trenches 79 or above the contact-level dielectric layer 80.

The deposited metallic material of the continuous electrically conductive material layer is etched back from the sidewalls of each lateral isolation trench 79 and from above the contact-level dielectric layer 80 by performing an etch process that etches the at least one conductive material of the continuous electrically conductive material layer. Each remaining portion of the deposited metallic material in the laterally-extending cavities 43 constitutes an electrically conductive layer 46. Each electrically conductive layer 46 can be a conductive line structure. Thus, the sacrificial material layers 42 are replaced with the electrically conductive layers 46.

The middle electrically conductive layers 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, the electrically conductive layer 46 can be a word line that functions as a common control gate electrode for the plurality of vertical memory devices. At least one upper most electrically conductive layer 46 may comprise a drain side select gate electrode. At least one lower most electrically conductive layer 46 may comprise a source side select gate electrode.

Generally, portions of the sacrificial material layers 42 are replaced with vertical stacks of electrically conductive layers 46. In one embodiment, each vertical stack of electrically conductive layers 46 is formed between and does not laterally extend along the second horizontal direction hd2 farther than a most proximal first-type lateral isolation trench 79A of the first-type lateral isolation trenches 79A and a most proximal pair of second-type lateral isolation trenches 79B of the pairs of second-type lateral isolation trenches 79B.

For each vertical stack of insulating layers 32 that laterally extend between a neighboring pair of first-type lateral isolation trenches 79A in the contact region 200, a vertical stack of first electrically conductive layers 46 can be located on a first side a vertical stack of dielectric material plates 42' and can be interlaced with the vertical stack of insulating layers 32, and a vertical stack of second electrically conductive layers 46 can be located on a second side of the vertical stack of dielectric material plates 42' and can be interlaced with the vertical stack of insulating layers 32.

The area extending in the second horizontal direction between laterally adjacent first-type lateral isolation trench 79A and second-type lateral isolation trench 79B comprises a memory block. The insulating layers 32 extend continuously in the second horizontal direction hd2 between the neighboring pair of first-type lateral isolation trenches 79A in the contact region 200. Thus, the insulating layers 32 extend continuously in the second horizontal direction hd2 between two neighboring memory blocks. The electrically conductive layers extend continuously in the first horizontal direction in each memory block between the memory regions (100A, 100B) through the contact region 200 in the spaces between vertical stack of dielectric material plates 42' and the respective first-type lateral isolation trench 79A.

The second-type lateral isolation trenches 79B extend through one of the memory regions 100A or 100B, but do not extend all the way through the contact region 200. Instead, the alternating stack of insulating layers 32 and dielectric material plates 42' located between the pair of second-type lateral isolation trenches 79B in the contact region 200 electrically isolates the electrically conductive layers 46 in adjacent memory blocks. The alternating stack of insulating layers 32 and dielectric material plates 42' prevents or reduces lateral collapse of insulating layers 32 into the lateral isolation trenches 79 during replacement of the sacrificial material layers 42 with the electrically conductive layers 46 because the cavities 43 are not formed in areas of the dielectric material plates 42'. Thus, word line staircases may be formed on opposite sides alternating stack of insulating layers 32 and dielectric material plates 42' with a reduced chance of lateral collapse of insulating layers 32 into the lateral isolation trenches 79. The etch stop liners 78 prevent formation of continuous cavities 43 between two adjacent memory blocks. Thus, the electrically conductive layers 46 are not shorted between two adjacent memory blocks.

Figure 15A:
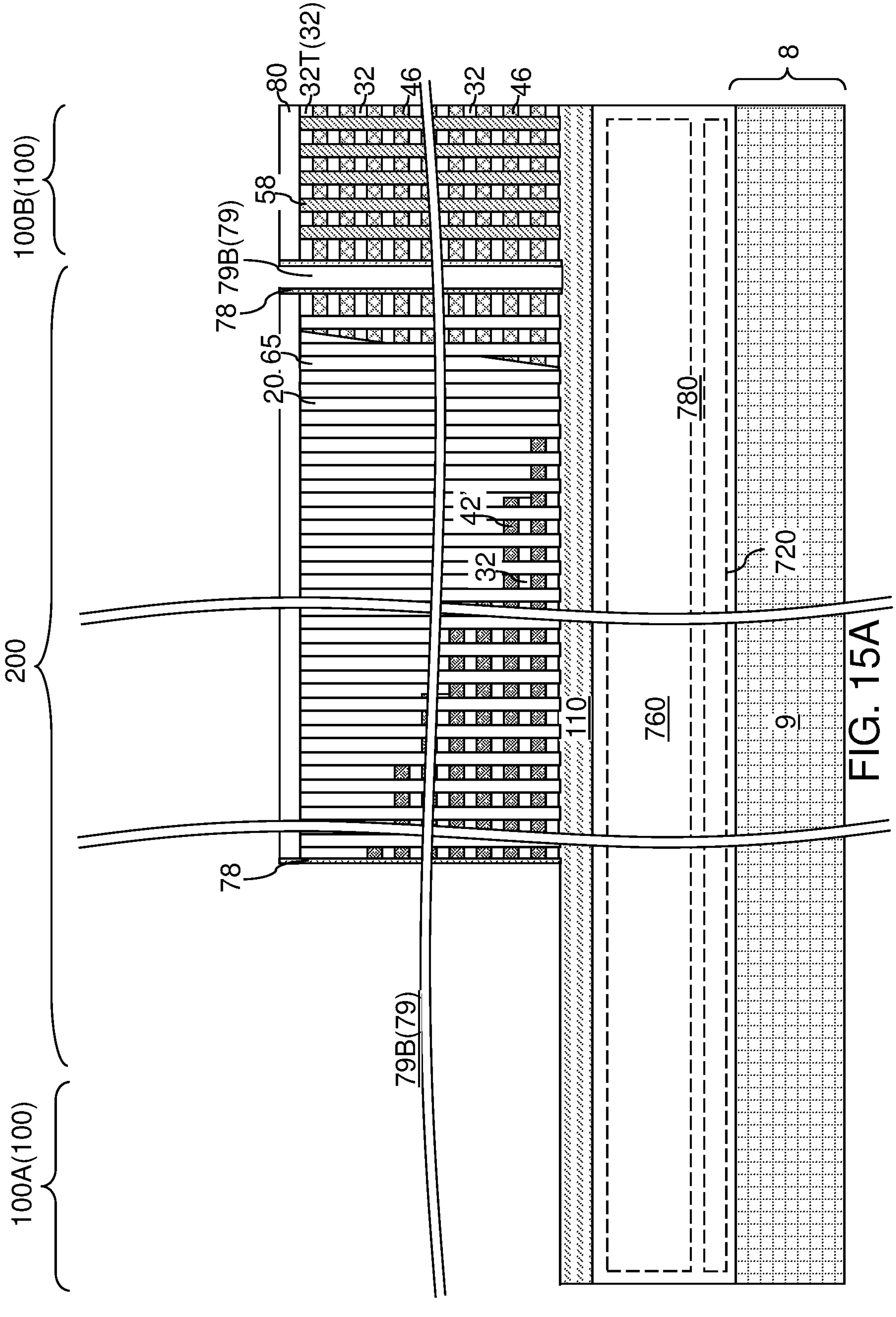
FIG. 15A is a vertical cross-sectional view of the first exemplary structure after removing horizontally-extending portions of the etch stop liners according to the first embodiment of the present disclosure.
Figure 15B:
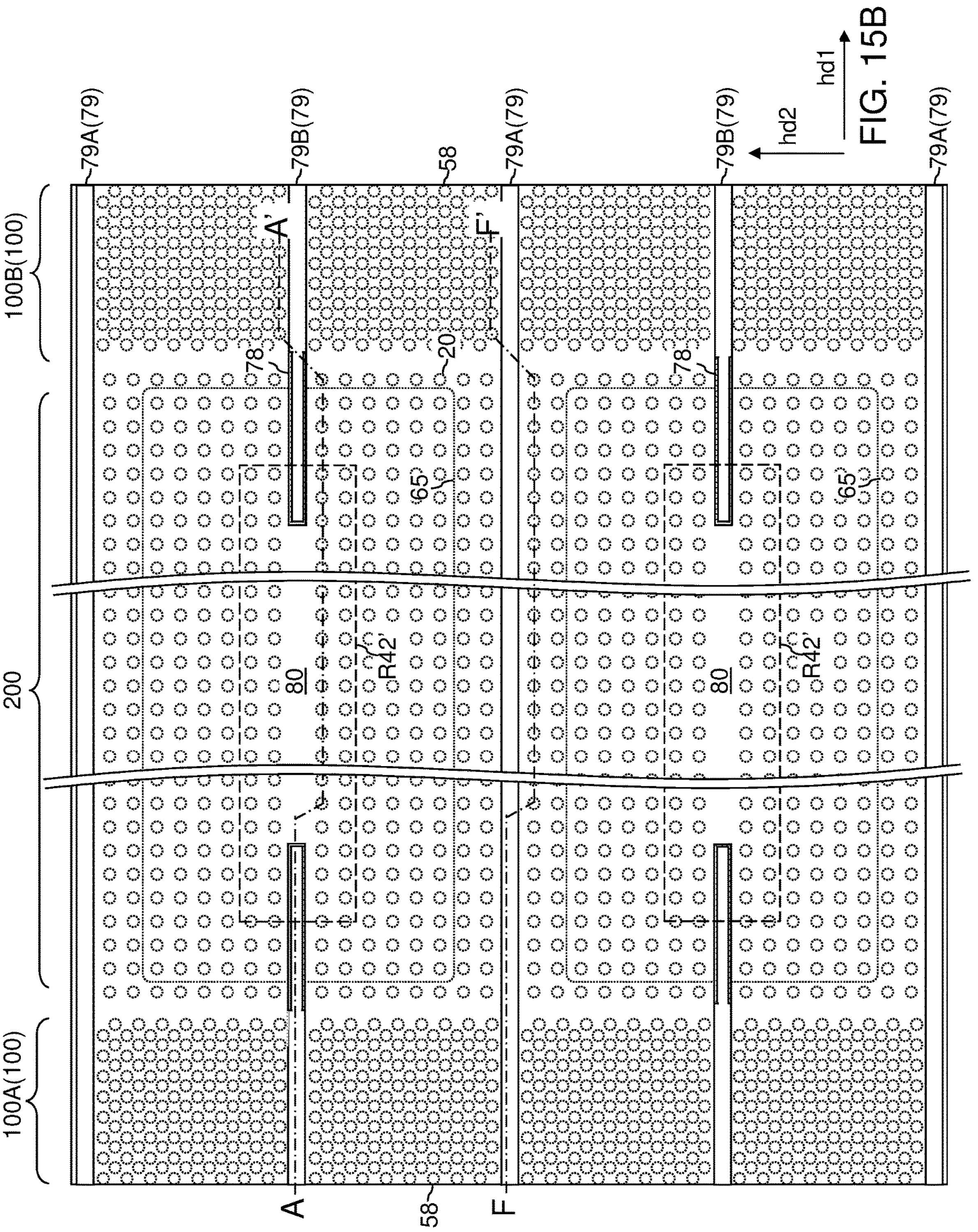
FIG. 15B is a top-down cross-sectional view of the first exemplary structure of FIG. 15A. The vertical plane A-A' is the cut plane of the vertical cross-sectional view of FIG. 15A.

Referring to FIGS. 15A and 15B, an optional anisotropic etch process may be performed to remove horizontally-extending portions of the etch stop liners 78 from above the contact-level dielectric layer 80 and from the bottom portions of the second-type lateral isolation trenches 79B. In one embodiment, each etch stop liner 78 may include only vertically-extending portions after the anisotropic etch process. Alternatively, the horizontally-extending portions of the etch stop liners 78 may be retained and the optional anisotropic etch process may be omitted.

Figure 16A:
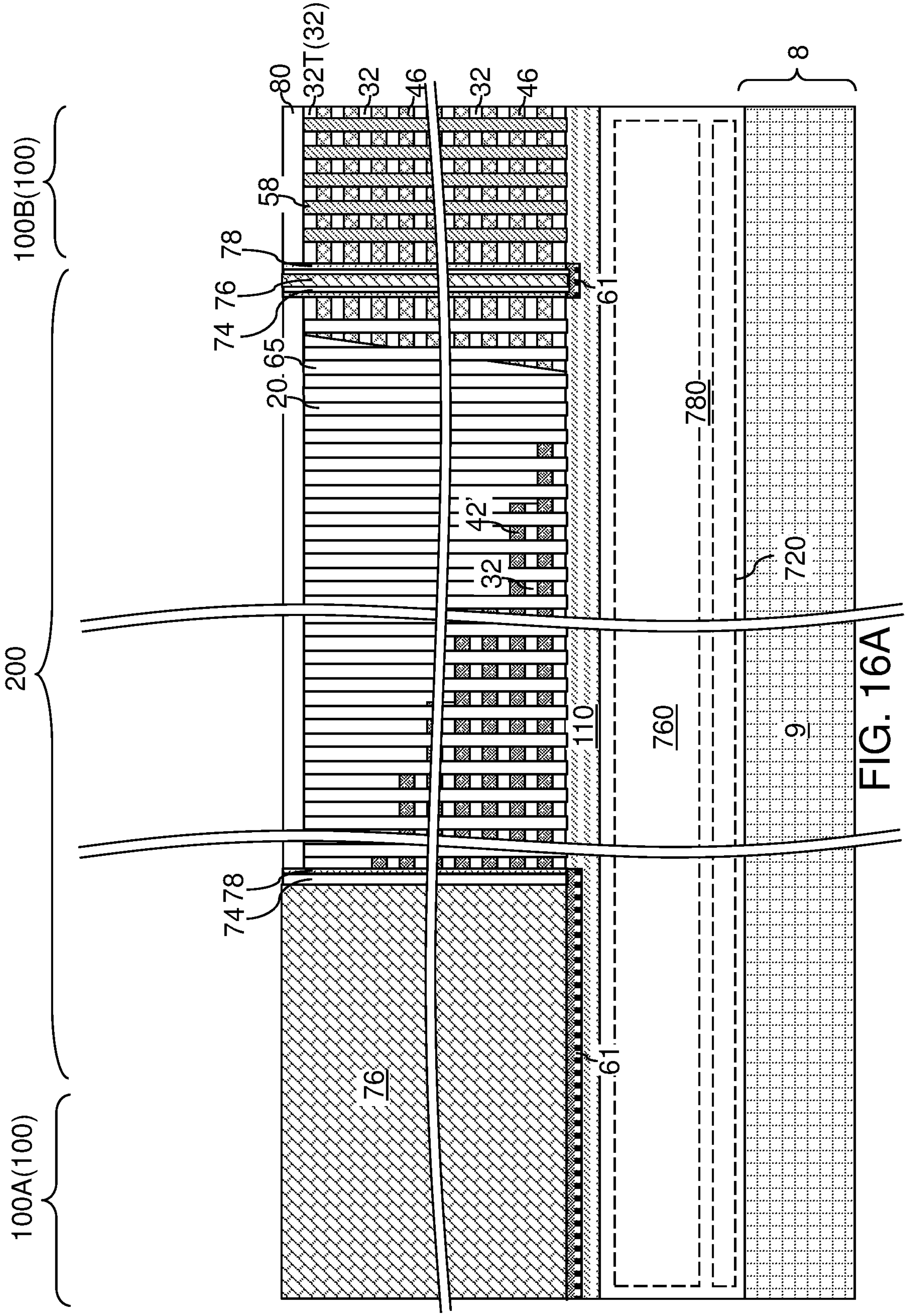
FIG. 16A is a vertical cross-sectional view of the first exemplary structure after formation of lateral isolation trench fill structures according to the first embodiment of the present disclosure.
Figure 16B:
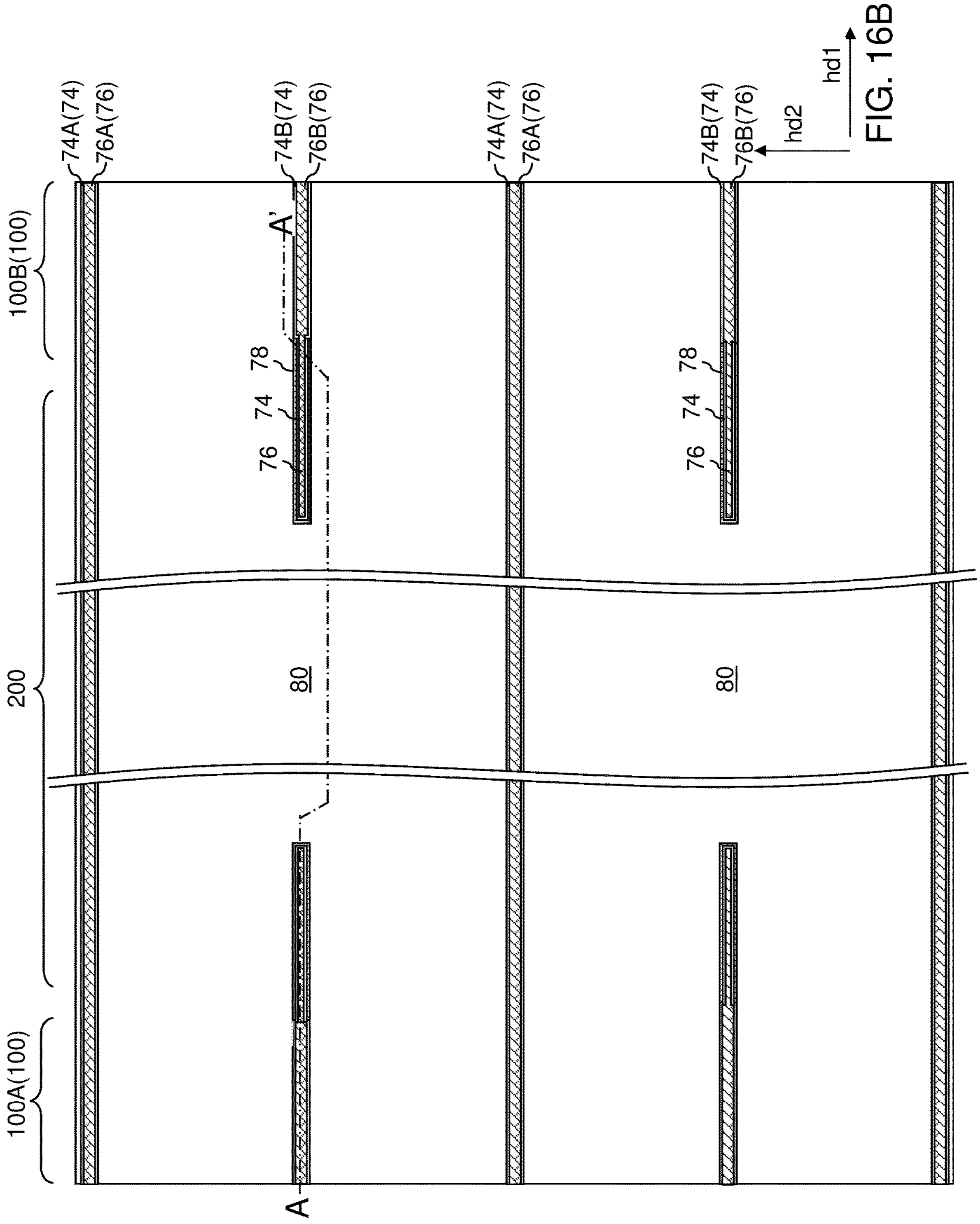
FIG. 16B is a top-down cross-sectional view of the first exemplary structure of FIG. 16A. The vertical plane A-A' is the cut plane of the vertical cross-sectional view of FIG. 16A.
Figure 17A:
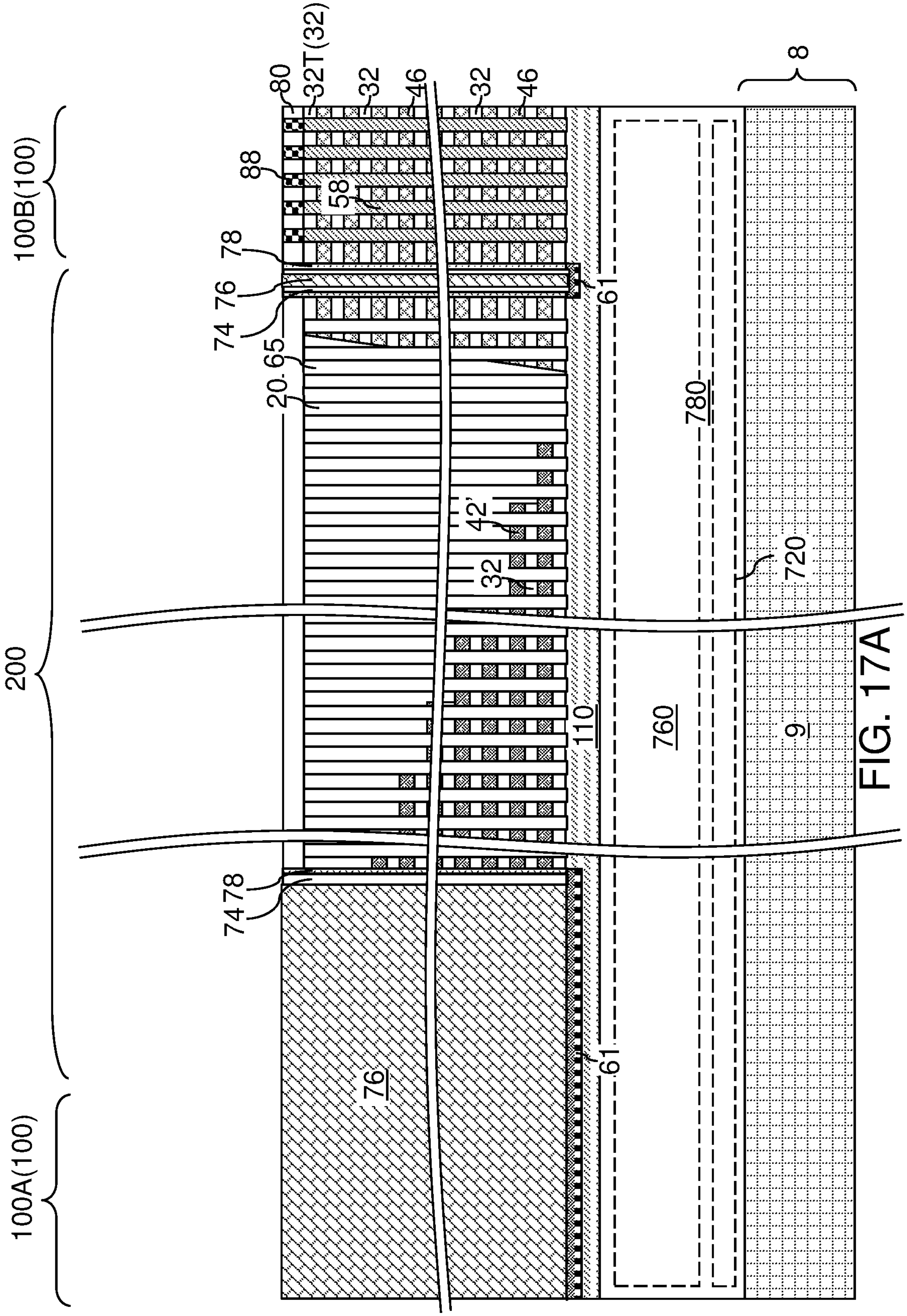
FIG. 17A is a vertical cross-sectional view of the first exemplary structure after formation of contact via structures according to the first embodiment of the present disclosure.
Figure 17B:
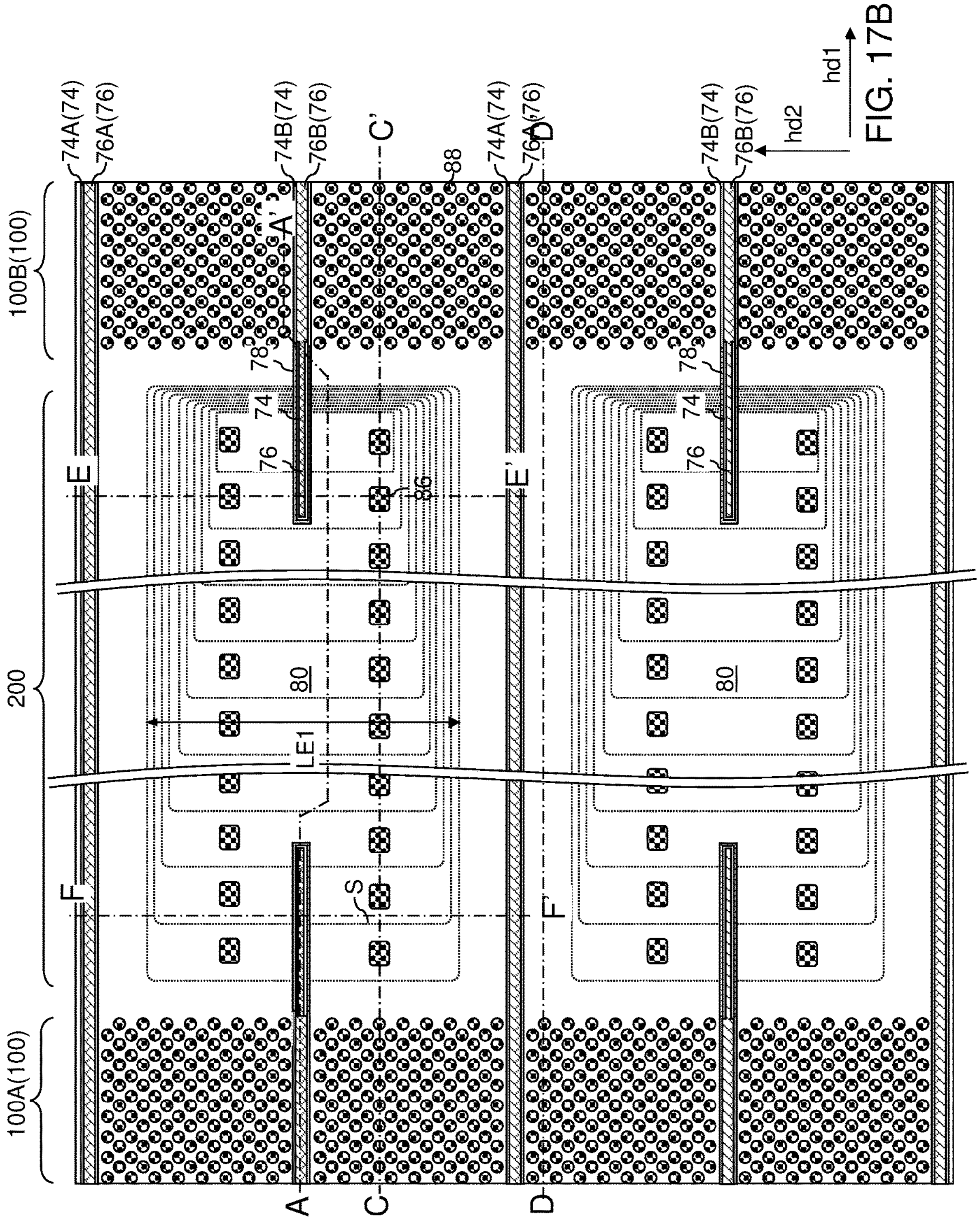
FIG. 17B is a top-down cross-sectional view of the first exemplary structure of FIG. 17A. The vertical plane A-A' is the cut plane of the vertical cross-sectional view of FIG. 17A.
Figure 17C:
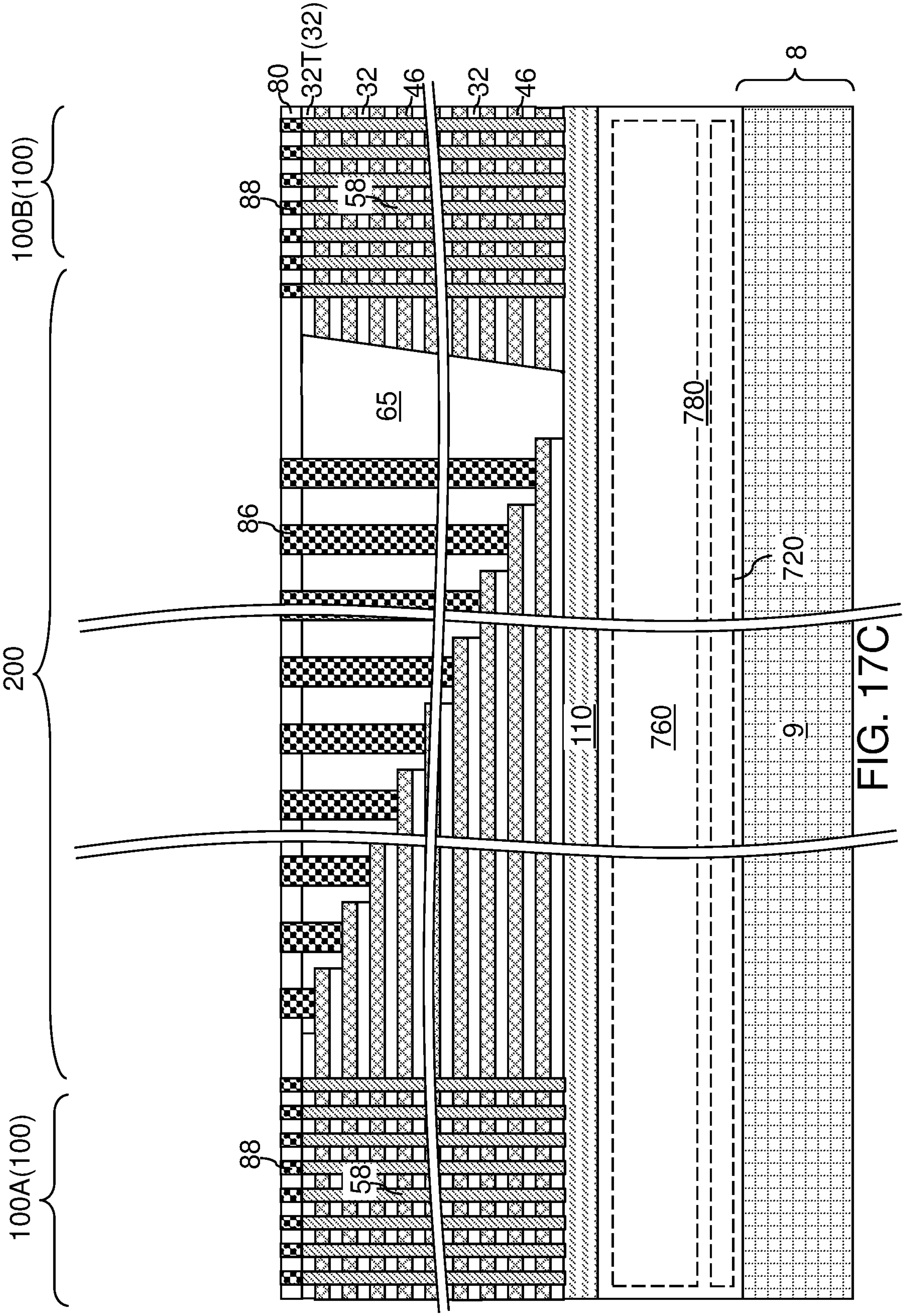
FIG. 17C is a vertical cross-sectional view of the first exemplary structure along the vertical plane C-C' of FIG. 17B.
Figure 17D:
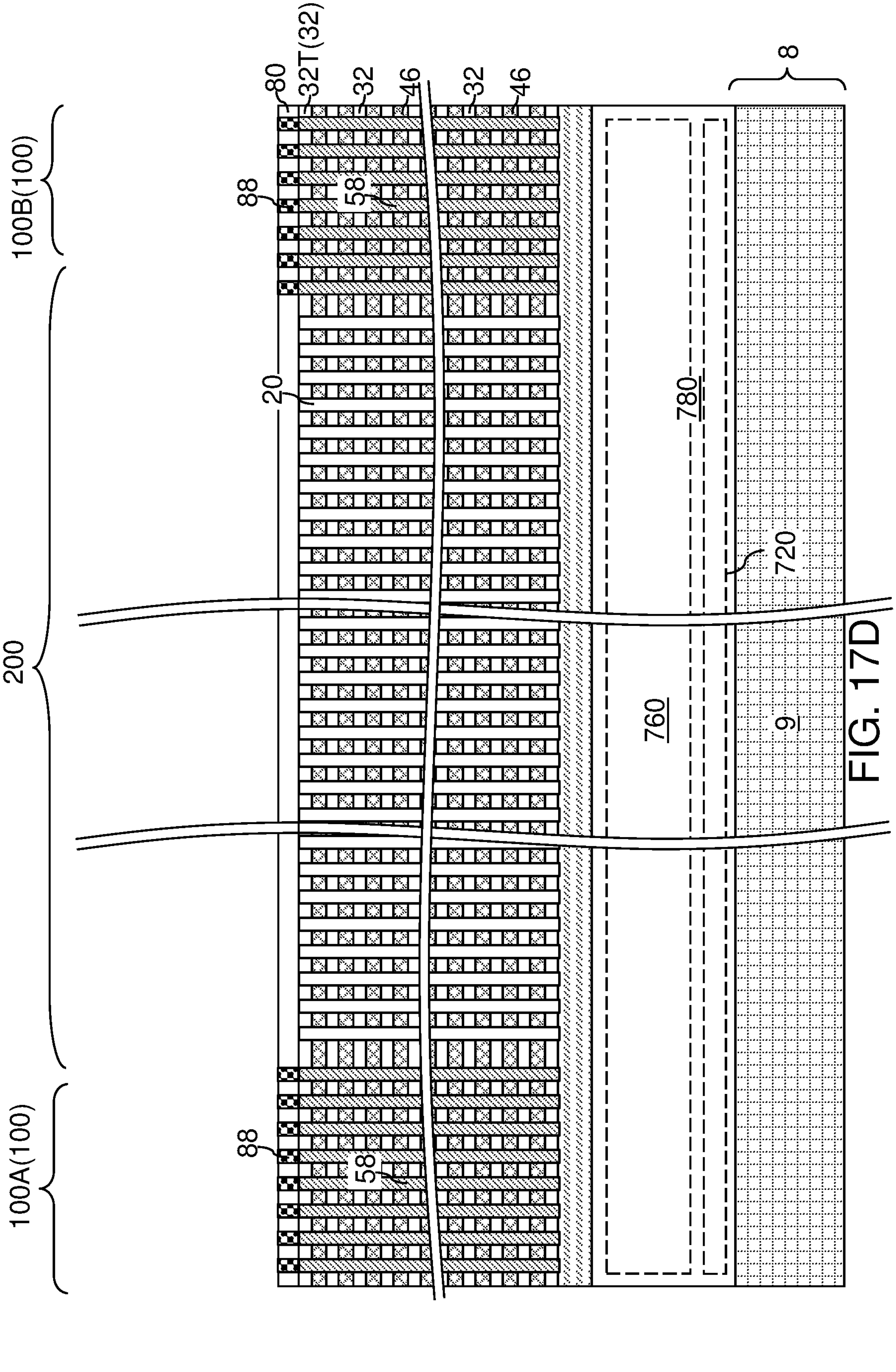
FIG. 17D is a vertical cross-sectional view of the first exemplary structure along the vertical plane D-D' of FIG. 17B.
Figure 17E:
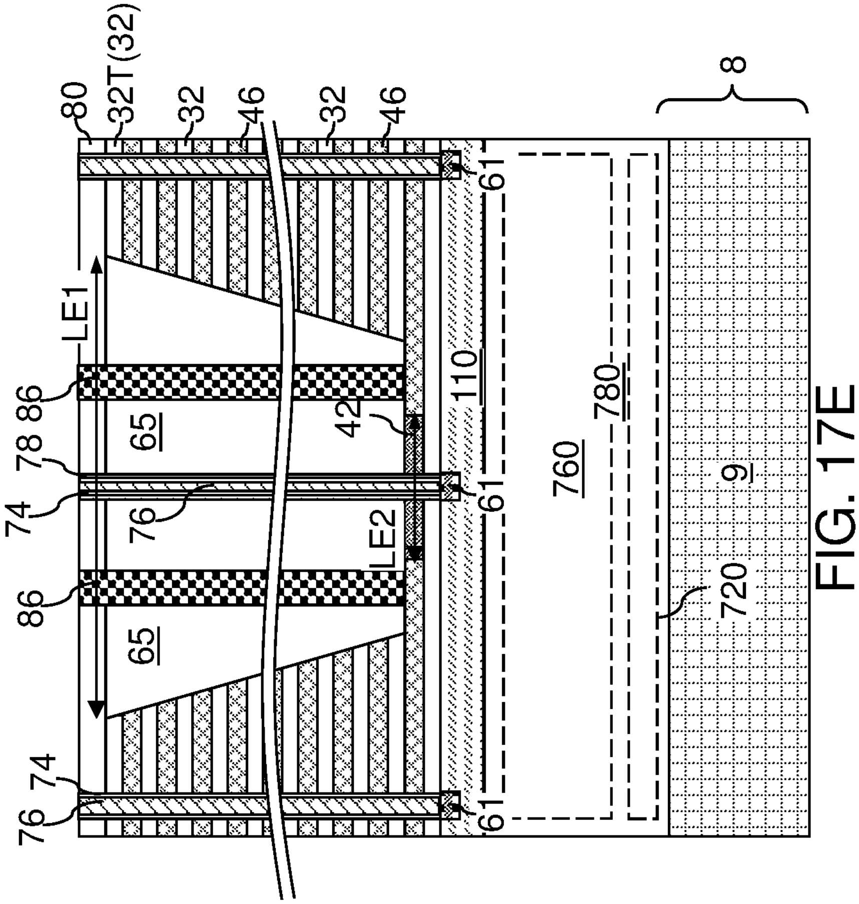
FIG. 17E is a vertical cross-sectional view of the first exemplary structure along the vertical plane E-E' of FIG. 17B.
Figure 17F:
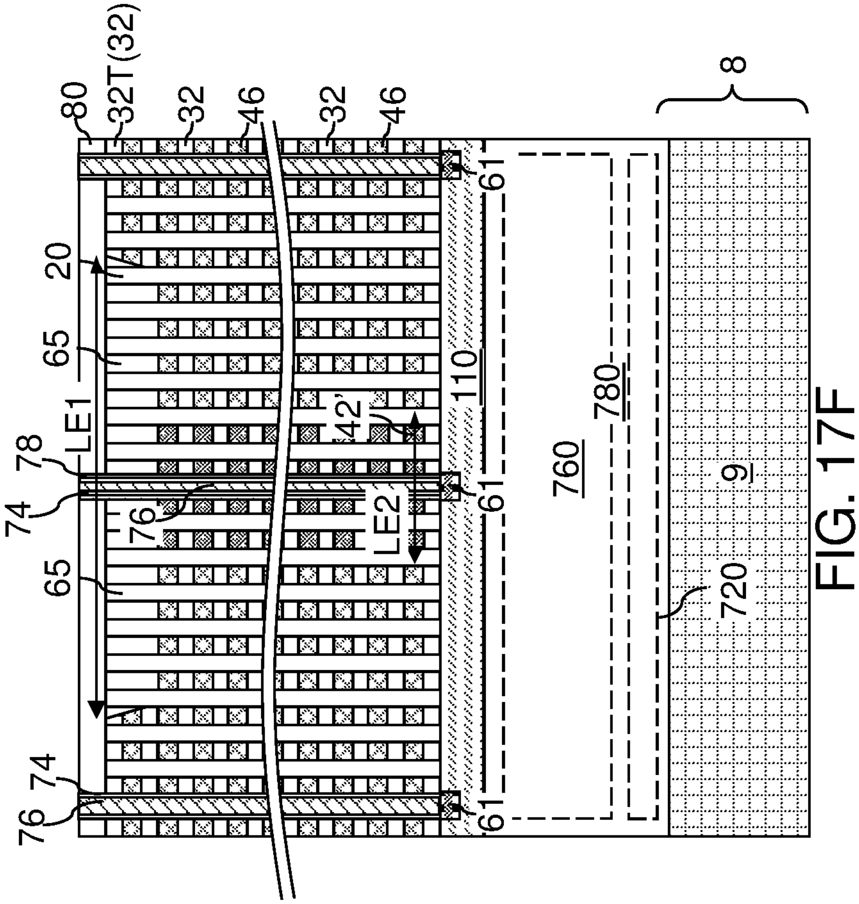
FIG. 17F is a vertical cross-sectional view of the first exemplary structure along the vertical plane F-F' of FIG. 17B.

Referring to FIGS. 16A and 16B, an ion implantation process can optionally be performed to implant dopants of the second conductivity type into surface portions of the semiconductor material layer 110 that underlie the lateral isolation trenches 79 to form optional source regions 61. Alternatively, a portion of the semiconductor material layer 110 may be replaced with a heavily doped semiconductor source strap which contacts a sidewall of the vertical semiconductor channels 60 instead.

An insulating material layer can be conformally deposited in the lateral isolation trenches 79 over the etch stop liners 78 and the contact-level dielectric layer 80. An anisotropic etch process can be performed to remove horizontally-extending portions of the insulating material layer. Each remaining vertically-extending portion of the insulating material layer constitutes an insulating spacer 74. The insulating spacers 74 comprise first insulating spacers 74A formed in the first-type lateral isolation trenches 79A, and second insulating spacers 74B formed in the second-type lateral isolation trenches 79B and contacting a respective one of the etch stop liners 78.

Optionally, at least one conducive material can be deposited in remaining unfilled volumes of the lateral isolation trenches 79 to form optional source contact via structures 76. The source contact via structures 76 may comprise first source contact via structures 76A that are formed in the first lateral isolation trenches 79A and second source contact via structures 76B that are formed in the second-type lateral isolation trenches 79B.

Each contiguous combination of an insulating spacer 74 and a source contact via structure 76 constitutes a lateral isolation trench fill structure (74, 76) that fills a respective lateral isolation trench 79. The lateral isolation trench fill structures (74, 76) comprise first lateral isolation trench fill structures (74A, 76A) formed in the first lateral isolation trenches 79A, and second-type lateral isolation trench fill structures (74B, 76B) formed in the second-type lateral isolation trenches 79B.

A composite dielectric isolation structure (65, 42', 74B, 78) can be formed between a vertical stack of first electrically conductive layers 46 and a vertical stack of second electrically conductive layers 46 located in adjacent memory blocks between a neighboring pair of first lateral isolation trench fill structures (74A, 76A). Thus, the composite dielectric isolation structure (65, 42', 74B, 78) electrically isolates the vertical stack of first electrically conductive layers 46 and the vertical stack of second electrically conductive layers 46 located in adjacent memory blocks.

In one embodiment, the composite dielectric isolation structure (65, 42', 74B, 78) comprises a retro-stepped dielectric material portion 65, a vertical stack of dielectric material plates 42', and a pair of second-type lateral isolation trench fill structures (74B, 76B) that are laterally spaced apart along the first horizontal direction hd1. In one embodiment, the insulating layers 32 can be vertically spaced apart from each other, and can be located over a substrate 8 between a first first-type lateral isolation trench fill structure (74A, 76A) and a second first-type lateral isolation trench fill structure (74A, 76A) that laterally extend along a first horizontal direction hd1 and laterally spaced apart from each other along a second horizontal direction hd2.

In one embodiment shown in FIG. 16B, each of the second-type lateral isolation trench fill structures (74B, 76B) has a respective first region in the memory region 100 having a first uniform width along the second horizontal direction hd2, and a respective second region in the contact region 200 having second uniform width and contacting a respective etch stop liner 78. In one embodiment, each of the second-type lateral isolation trench fill structures (74B, 76B) comprises a respective insulating liner 74B comprising a respective portion of an insulating liner material and contacting inner sidewalls of the respective etch stop liner 78, the first insulating layers 32 and the first electrically conductive layers 46 of the first alternating stack (32, 46), and the second insulating layers 32 and the second electrically conductive layers 46 of the second alternating stack (32, 46). In one embodiment, each of the first-type lateral isolation trench fill structures (74A, 76A) comprises a respective additional insulating liner 74A comprising a respective additional portion of the insulating liner material. In one embodiment, all surfaces of the first alternating stack (32, 46) and the second alternating stack (32, 46) that contact the pair of second-type lateral isolation trench fill structures (74B, 76B) contacts a respective surface of the insulting liner material.

Figure 14D:
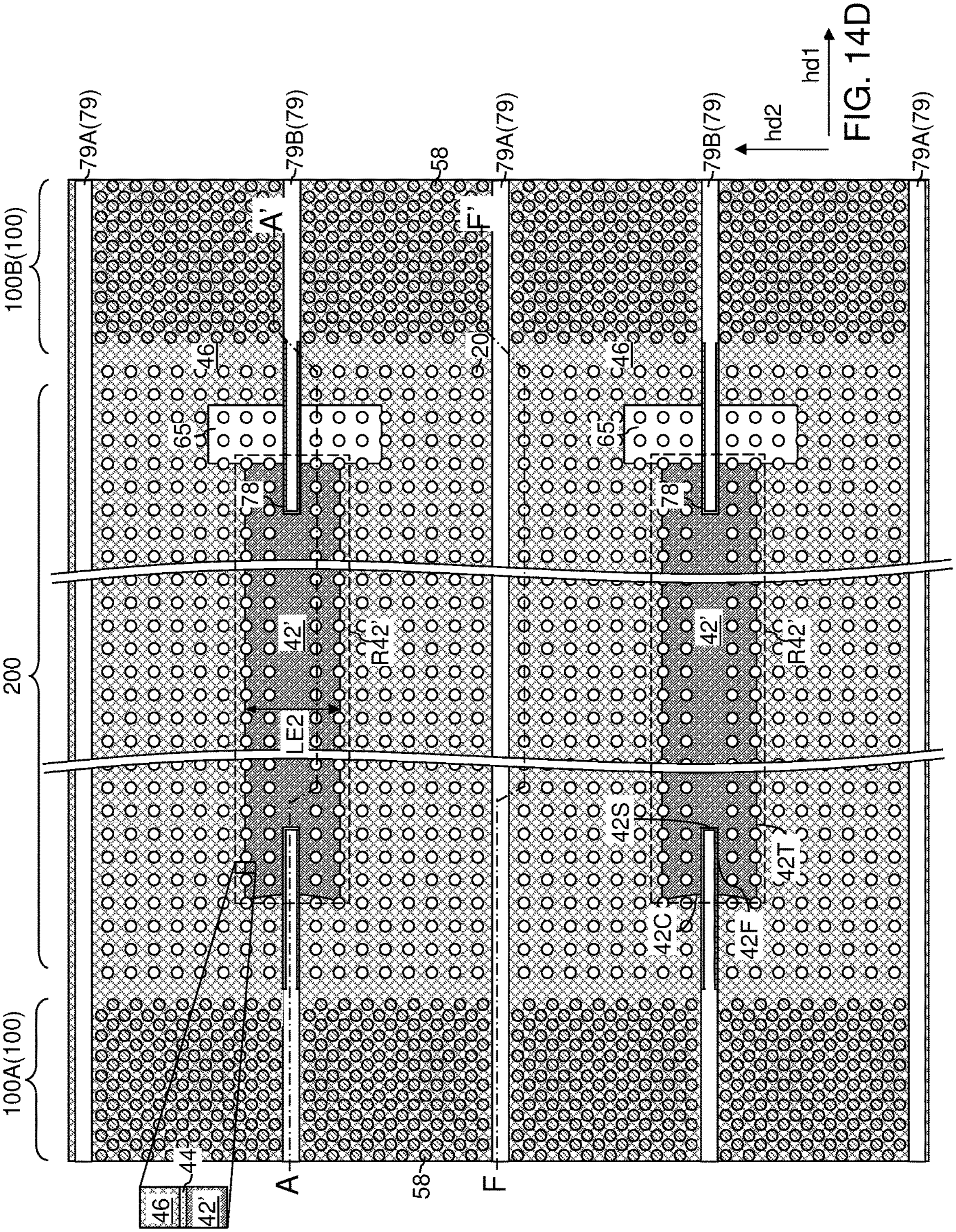
FIG. 14D is a horizontal cross-sectional view of the first exemplary structure along the horizontal plane D-D' of FIG. 14A.
Figure 14E:
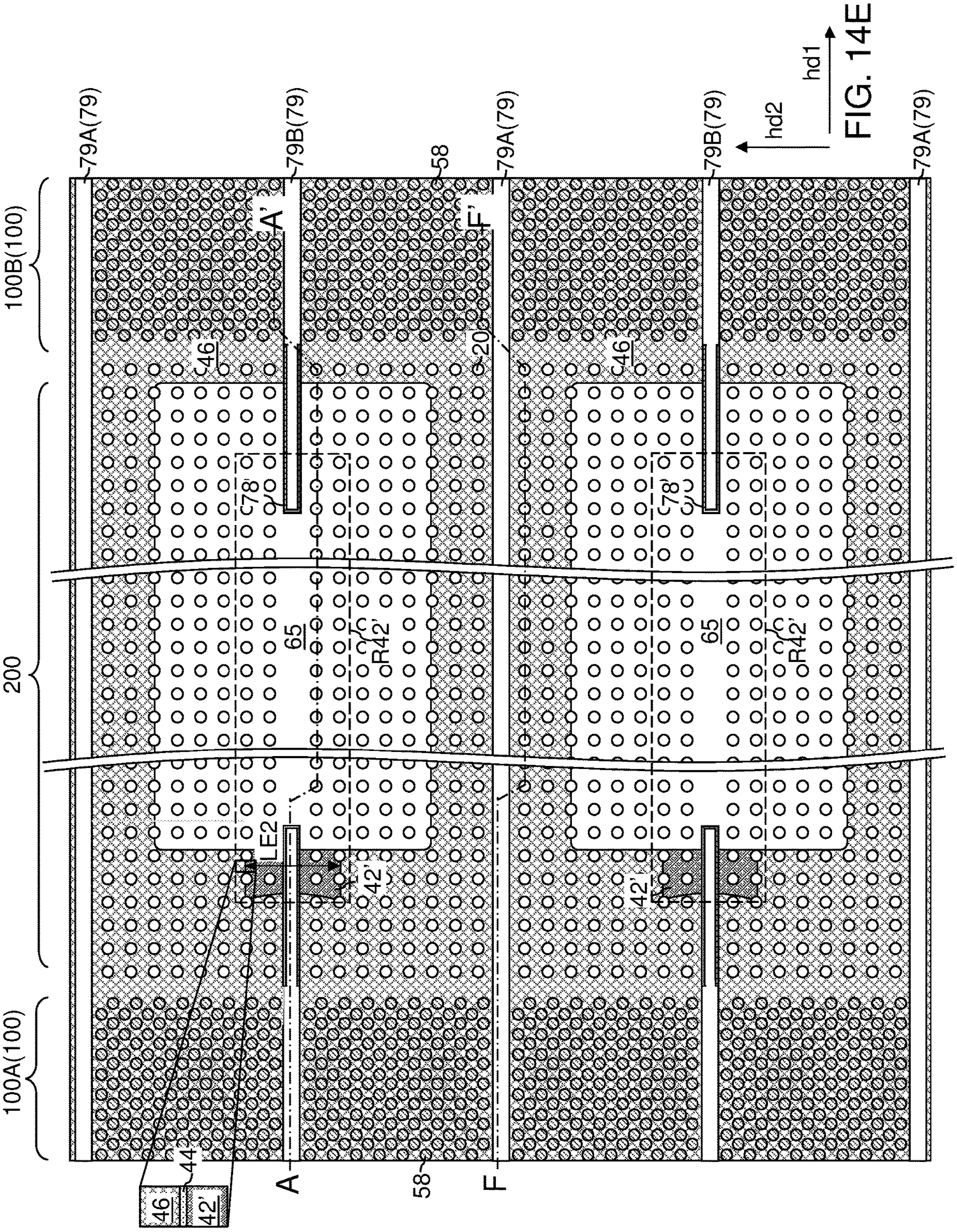
FIG. 14E is a horizontal cross-sectional view of the first exemplary structure along the horizontal plane E-E' of FIG. 14A.
Figure 14F:
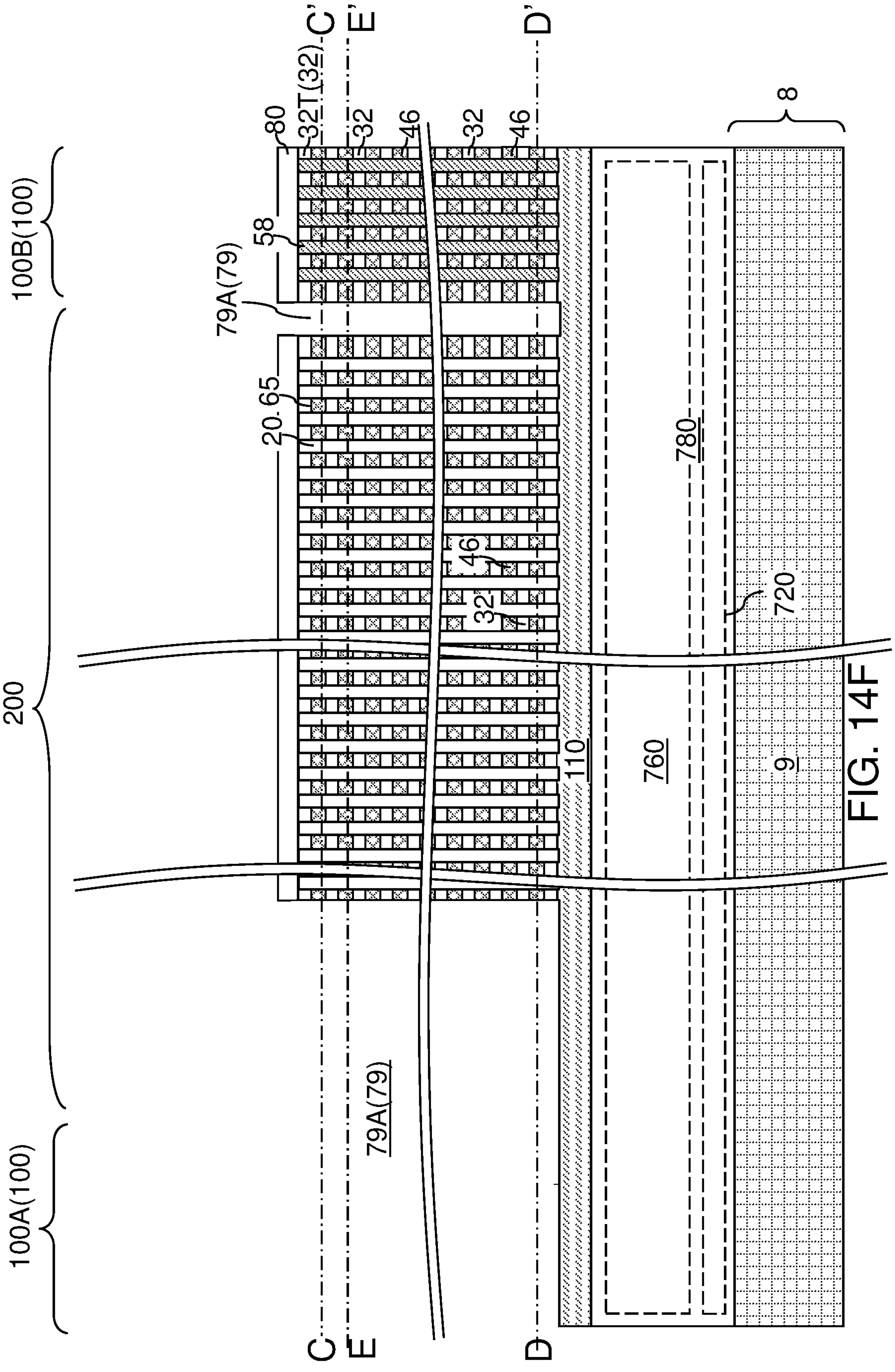
FIG. 14F is a vertical cross-sectional view of the first exemplary structure along the vertical plane F-F' of FIG. 14E.
Figure 14G:
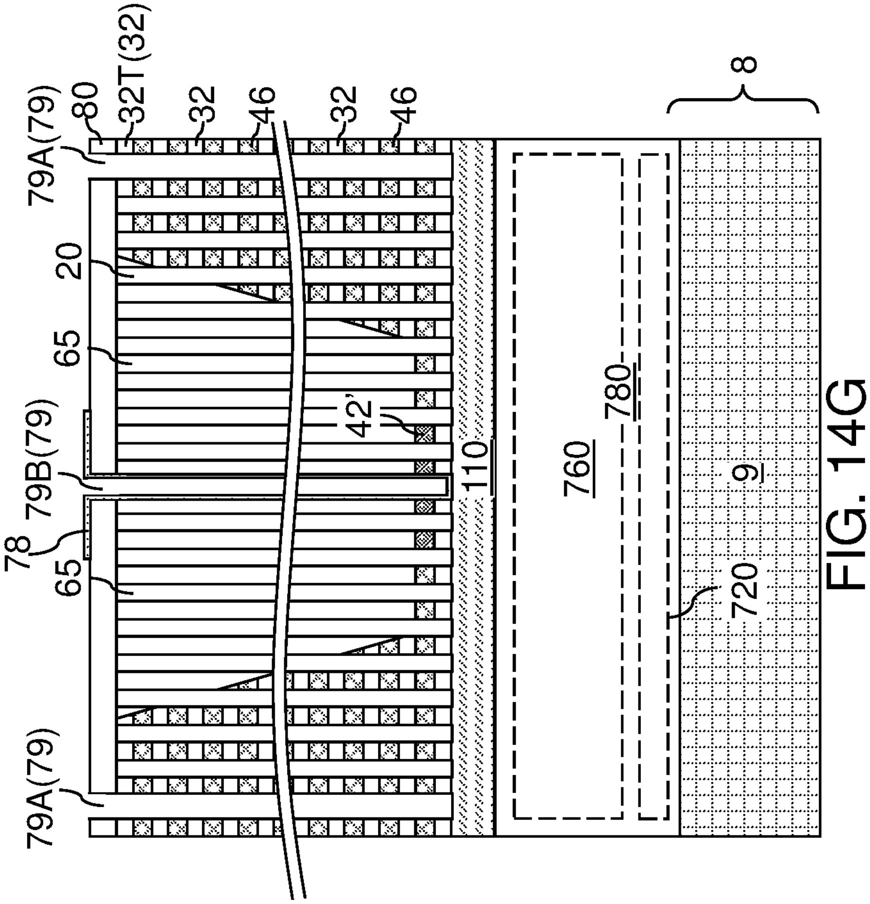
FIG. 14G is a vertical cross-sectional view of the first exemplary structure along the vertical plane G-G' of FIG. 14B.
Figure 14H:
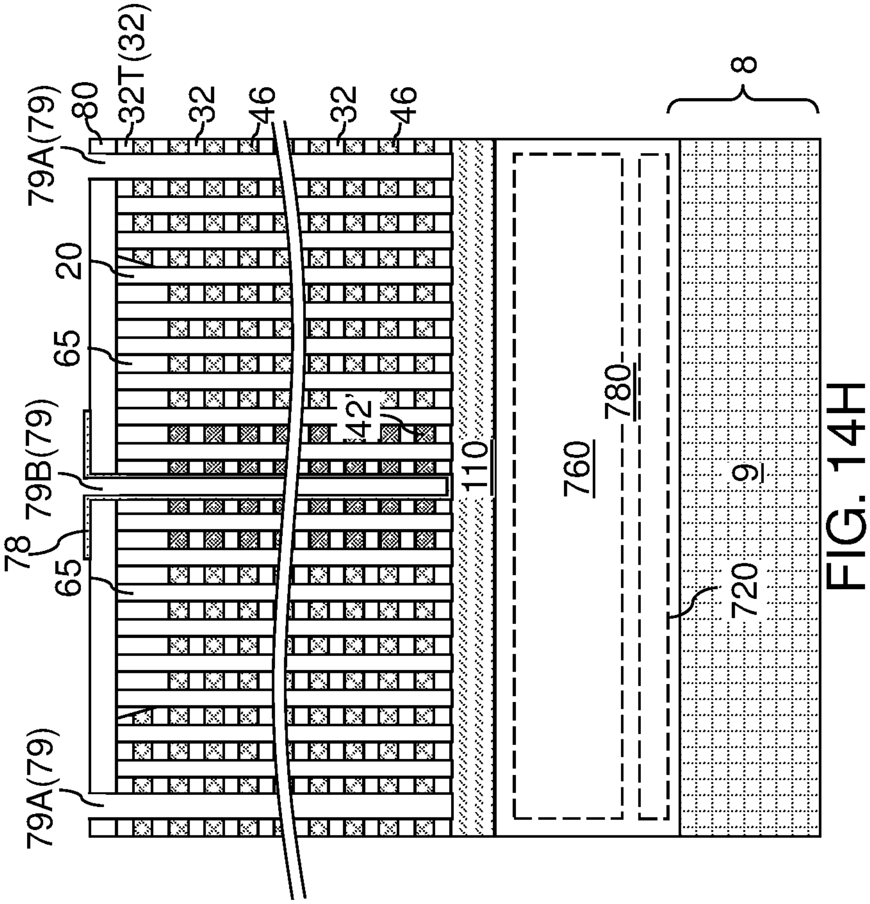
FIG. 14H is a vertical cross-sectional view of the first exemplary structure along the vertical plane H-H' of FIG. 14B.

In one embodiment shown in FIG. 14D, at least one dielectric material plate 42' within the vertical stack of dielectric material plates 42' comprises first sidewall segments 42F laterally extending along the first horizontal direction hd1 and contacting one of the second-type lateral isolation trench fill structures (74B, 76B) containing the etch stop liner 78; a second sidewall segment 42S laterally extending along the second horizontal direction hd2 and contacting the one of the second-type lateral isolation trench fill structures (74B, 76B) containing the etch stop liner 78; a first concave surface segment 42C located at a level of one of the first electrically conductive layers 46 and in contact with a convex sidewall of a first structural element (44 or 46) that is selected from one of the first electrically conductive layers 46 and a first blocking dielectric layer 44 that contacts the one of the first electrically conducive layers 46; and a third sidewall segment 42T laterally extending along the first horizontal direction hd1 and in contact with a planar sidewall of the second structural element (44 or 46).

Referring to FIGS. 17A-17F, a photoresist layer can be applied over the contact-level dielectric layer 80, and can be lithographically patterned to form openings over areas of the memory opening fill structures 58 and horizontally-extending portions of the electrically conductive layers 46 that underlie the stepped bottom surfaces of the retro-stepped dielectric material portions 65. An anisotropic etch process can be performed to form drain contact via cavities over the drain regions 63 of the memory opening fill structures 58, and to form layer contact via cavities over the horizontally-extending surfaces of the electrically conductive layers 46 underlying the retro-stepped dielectric material portions 65. At least one conductive material can be deposited in the drain contact via cavities to form drain contact via structures 88, and can be deposited in the layer contact via cavities to form layer contact via structures 86.

Figure 18A:
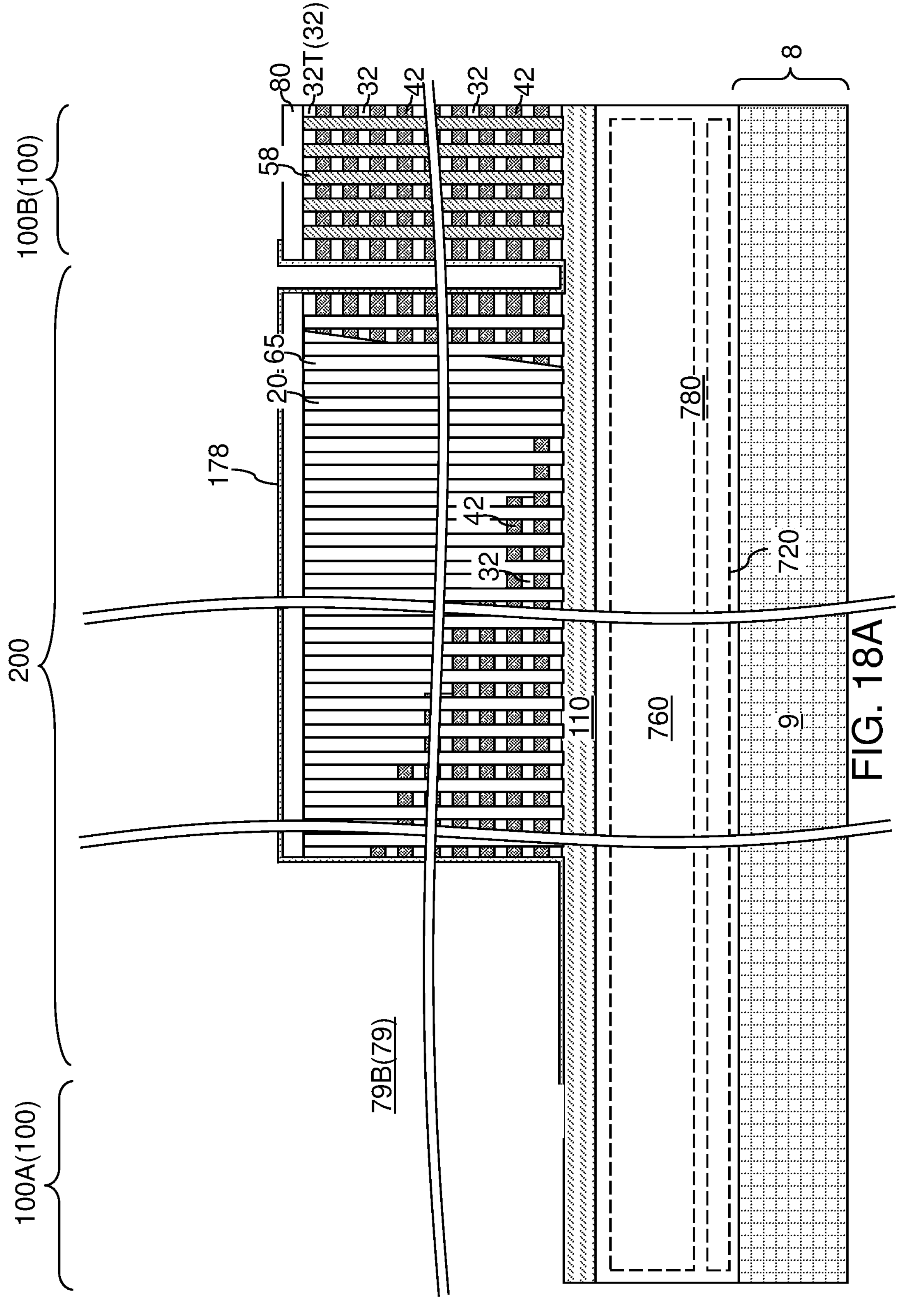
FIG. 18A is a vertical cross-sectional view of an alternative configuration of the first exemplary structure after patterning an etch stop liner according to the first embodiment of the present disclosure.
Figure 18B:
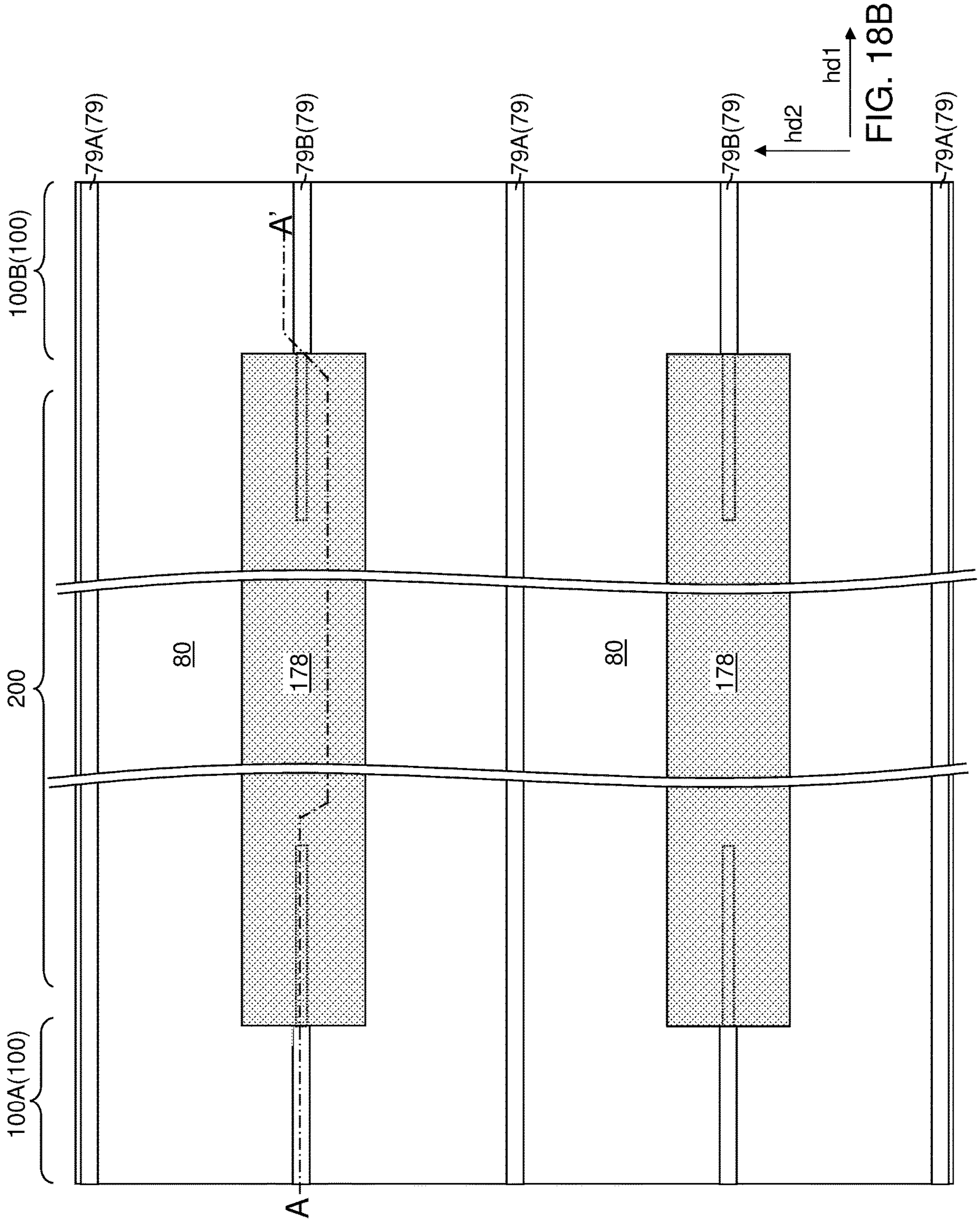
FIG. 18B is a top-down cross-sectional view of the alternative configuration of the first exemplary structure of FIG. 18A. The vertical plane A-A' is the cut plane of the vertical cross-sectional view of FIG. 18A.
Figure 19A:
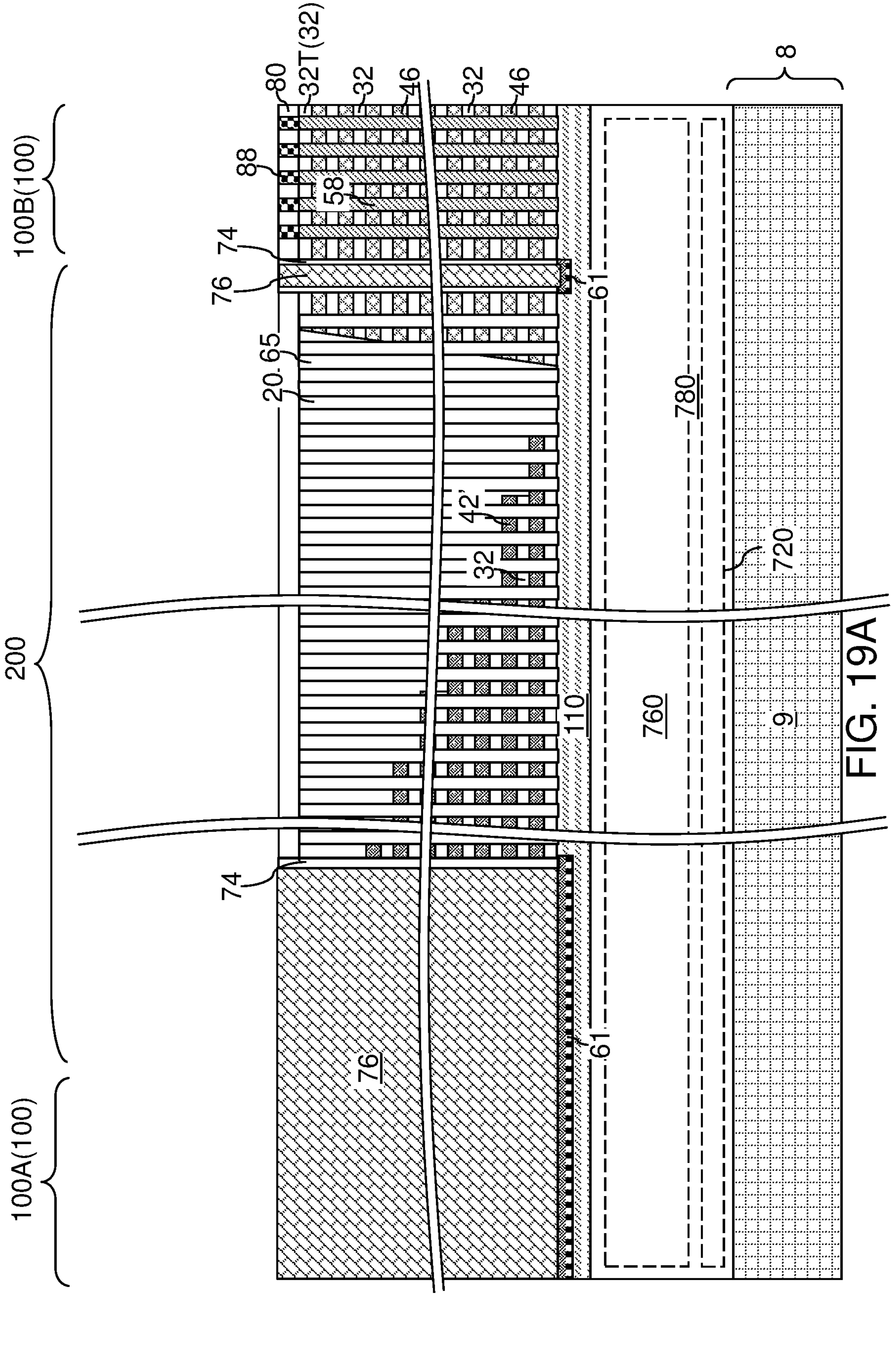
FIG. 19A is a vertical cross-sectional view of the alternative configuration of the first exemplary structure after formation of contact via structures according to the first embodiment of the present disclosure.
Figure 19B:
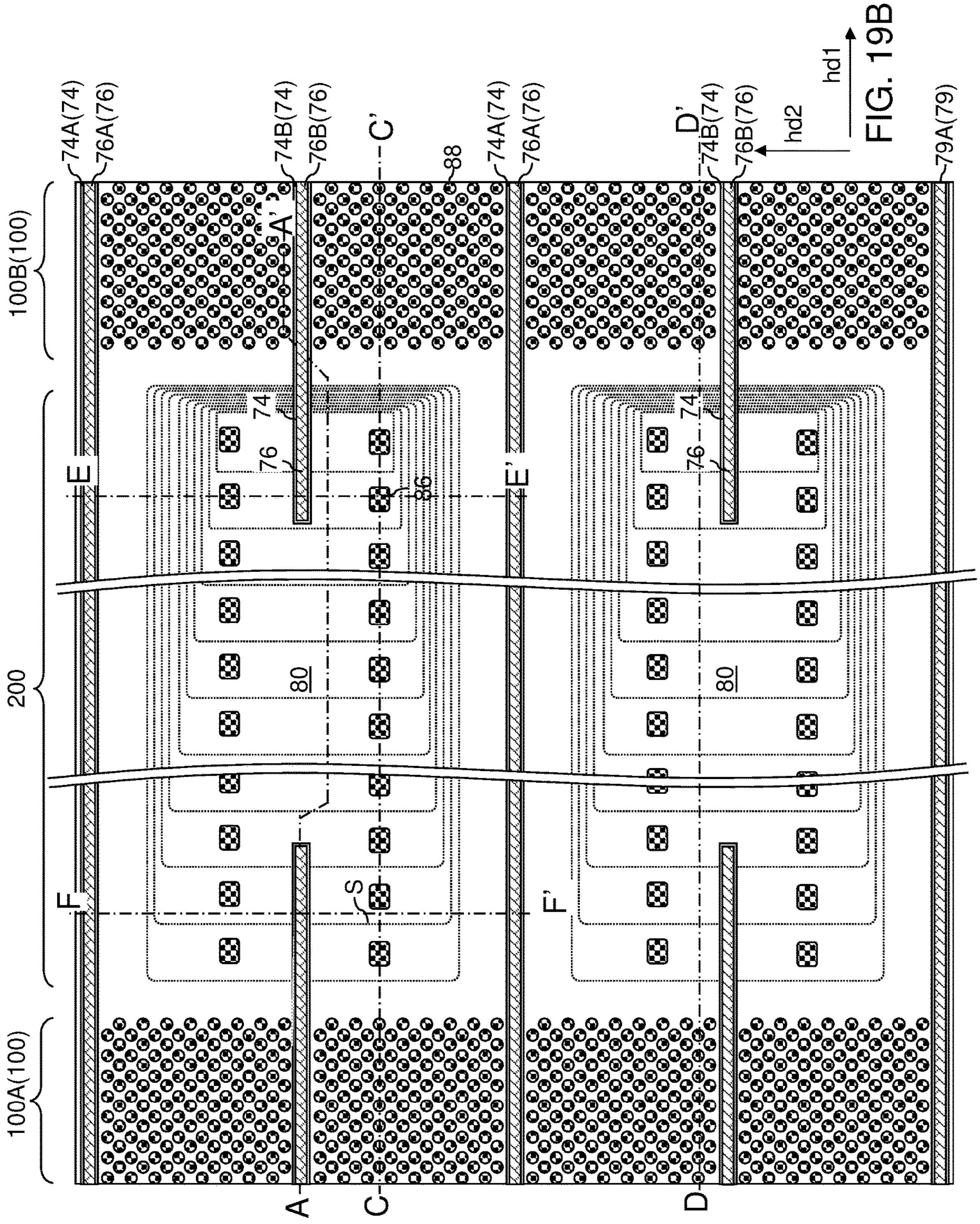
FIG. 19B is a top-down cross-sectional view of the first exemplary structure of FIG. 19A. The vertical plane A-A' is the cut plane of the vertical cross-sectional view of FIG. 19A.
Figure 19C:
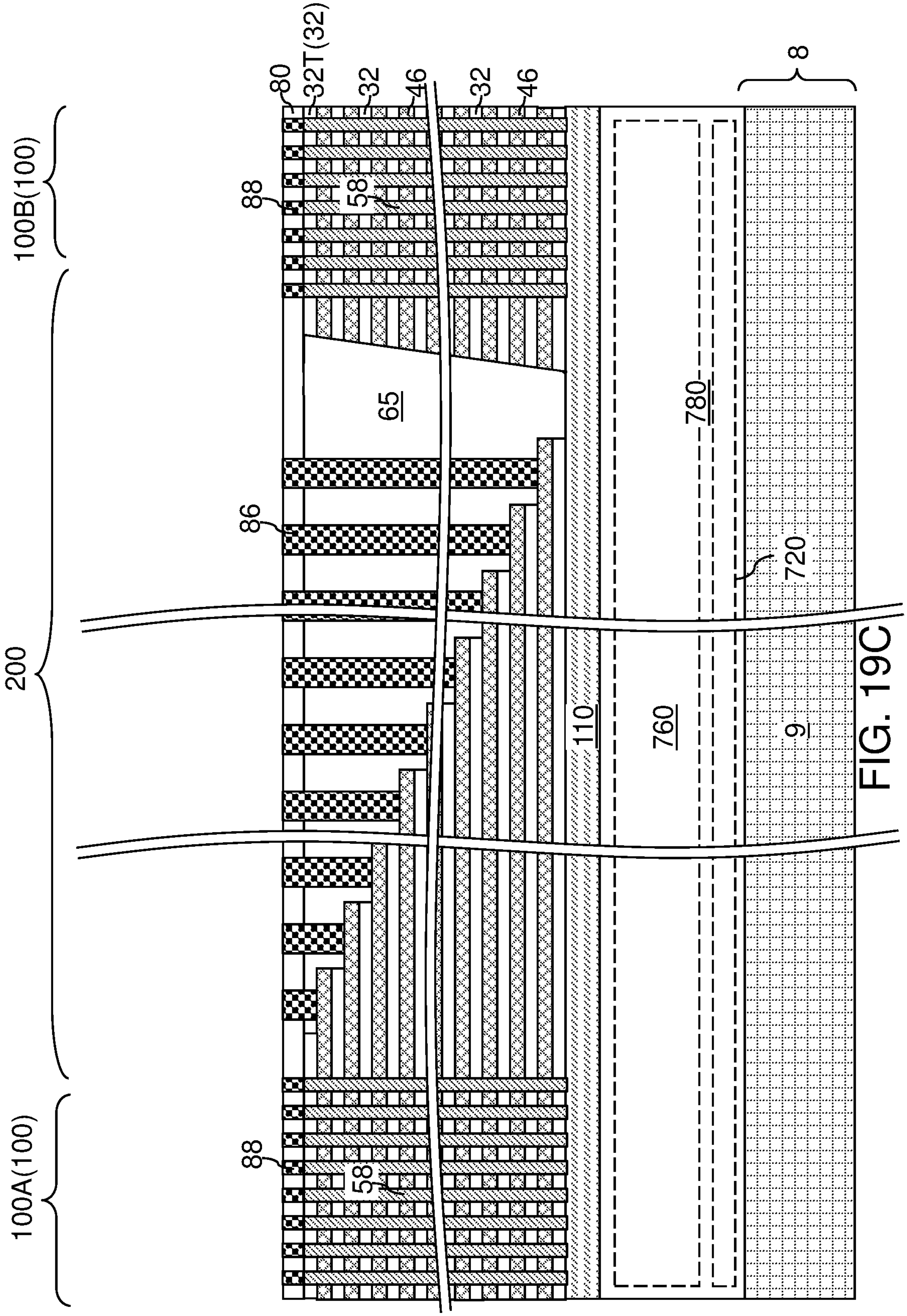
FIG. 19C is a vertical cross-sectional view of the first exemplary structure along the vertical plane C-C' of FIG. 19B.
Figure 19D:
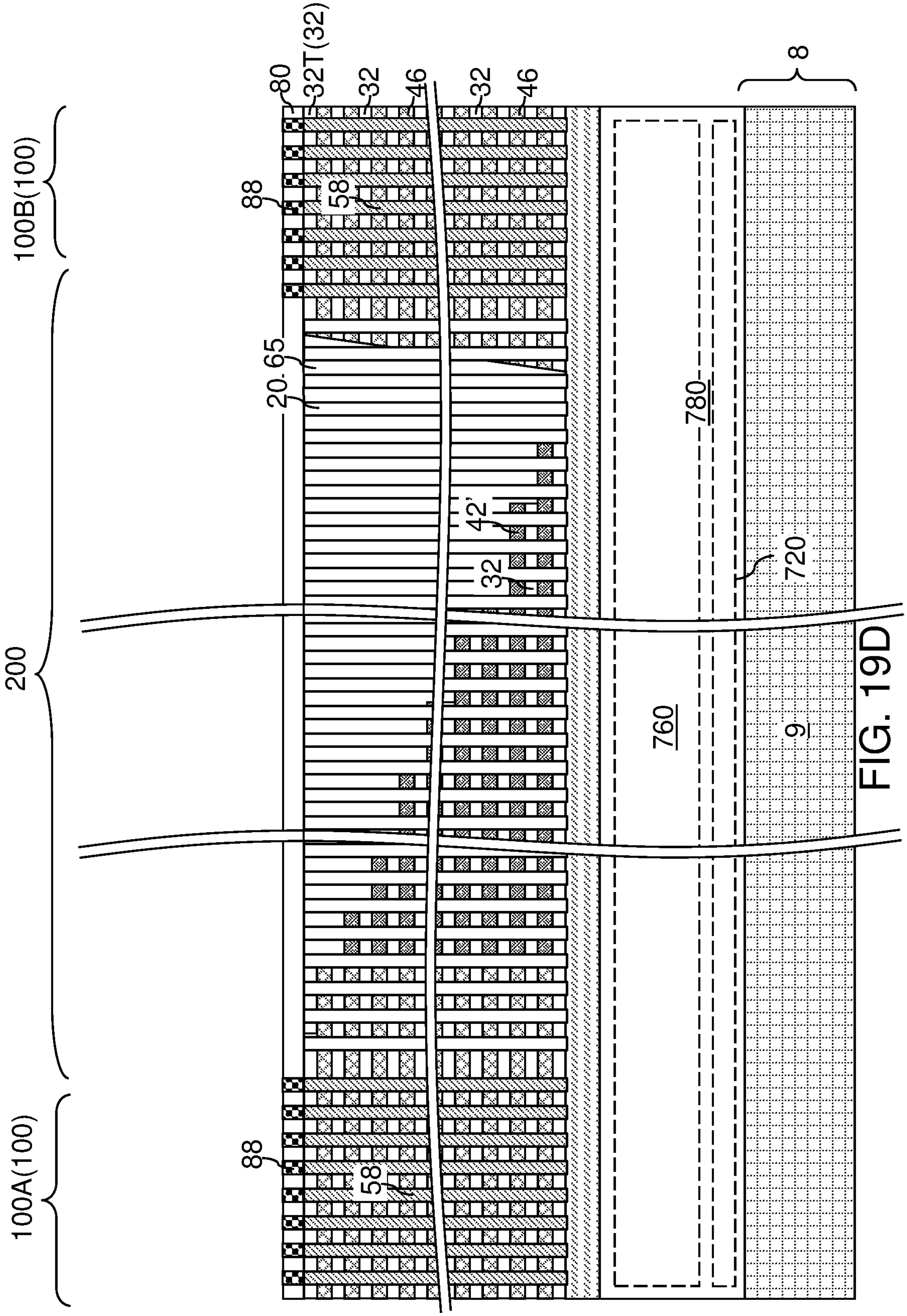
FIG. 19D is a vertical cross-sectional view of the first exemplary structure along the vertical plane D-D' of FIG. 19B.
Figure 19E:
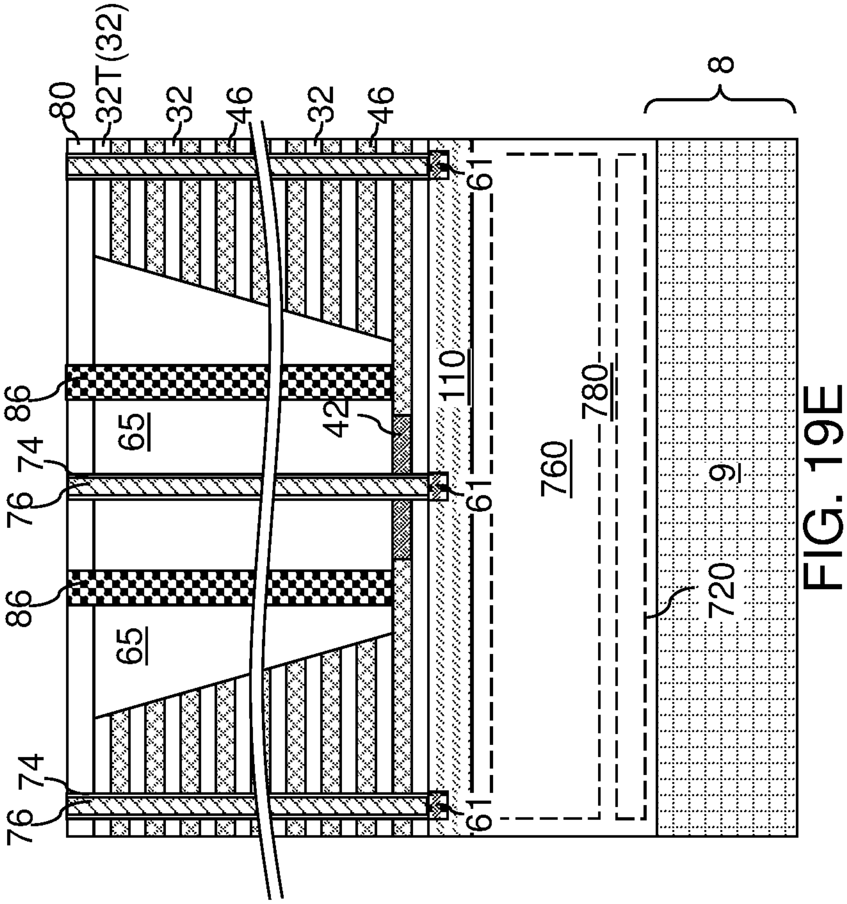
FIG. 19E is a vertical cross-sectional view of the first exemplary structure along the vertical plane E-E' of FIG. 19B.
Figure 19F:
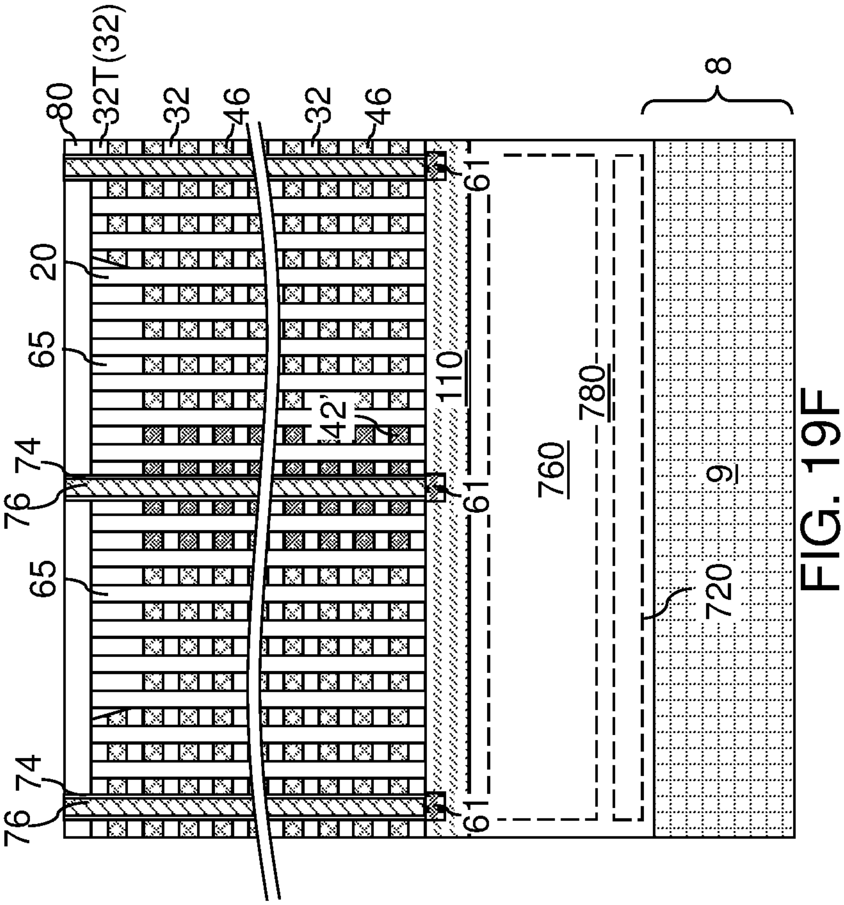
FIG. 19F is a vertical cross-sectional view of the first exemplary structure along the vertical plane F-F' of FIG. 19B.

Referring to FIGS. 18A and 18B, an alternative configuration of the first exemplary structure can be derived from the first exemplary structure illustrated in FIGS. 9A-9C by performing the processing steps described with reference to FIGS. 10A and 10B, 11A and 11B, and 12A-12D with the modification that the etch stop liner 78 is replaced with a sacrificial etch stop liner 178 that may be subsequently removed selective to materials of the insulating layers 32 and the electrically conductive layers 46. The sacrificial etch stop liner 178 comprises a material that can function as an etch stop material during a subsequent isotropic etch step that isotropically etches the sacrificial material layers 42. In one embodiment, the sacrificial etch stop liner 178 comprises a semiconductor material such as polysilicon, a carbon-based material such as amorphous carbon, or an organic material that may be subsequently removed by ashing. The sacrificial etch stop liner 178 may be deposited by a conformal or non-conformal deposition process. The thickness of the sacrificial etch stop liner 178 may be in a range from 10 nm 100 nm, such as from 20 nm to 60 nm, although lesser and greater thicknesses may also be employed. The patterning processes described with reference to FIGS. 11A and 11B and 12A-12D can be performed to provide the alternative configuration of the first exemplary structure illustrated in FIGS. 18A and 18B.

Referring to FIGS. 19A-19F, the processing steps described with reference to FIGS. 13A-13H, and 14A-14H can be performed. Subsequently, the sacrificial etch stop liners 178 can be removed selective to the insulating layers 32 and the electrically conductive layers 46. The processing steps described with reference to FIGS. 15A and 15B, 16A and 16B, and 17A-17F can be performed to provide the alternative configuration of the first exemplary structure illustrated in FIGS. 19A-19F.

Referring to FIGS. 1-19F and according to the first embodiment of the present disclosure, a three-dimensional memory device comprises: insulating layers 32 that are vertically spaced apart from each other and that continuously laterally extend between a first first-type lateral isolation trench fill structure (74A, 76A) and a second first-type lateral isolation trench fill structure (74A, 76A) that laterally extend along a first horizontal direction hd1 and laterally spaced apart from each other along a second horizontal direction hd2; first electrically conductive layers 46 vertically interlaced with the insulating layers 32 and contacting the first first-type lateral isolation trench fill structure (74A, 76A); second electrically conductive layers 46 vertically interlaced with the insulating layers 32 and contact the second first-type lateral isolation trench fill structure (74A, 76A); and a composite dielectric isolation structure {65, 42', 74B, optionally 78} located between the first electrically conductive layers 46 and the second electrically conductive layers 46 and comprising a retro-stepped dielectric material portion 65, a vertical stack of dielectric material plates 42', and a pair of second-type lateral isolation trench fill structures (74B, 76B) that are laterally spaced apart along the first horizontal direction hd1.

In one embodiment, the retro-stepped dielectric material portion 65 has a first lateral extent LE1 along the second horizontal direction hd2; and each dielectric material plate 42' in the vertical stack of dielectric material plates 42' has a second lateral extent LE2 along the second horizontal direction hd2 that is less than the first lateral extent LE1.

In one embodiment, the dielectric material plates 42' within the vertical stack of dielectric material plates 42' have lateral extents along the first horizontal direction hd1 that decrease with a vertical distance from the substrate 8.

In one embodiment, each dielectric material plate 42' within the vertical stack of dielectric material plates 42' has a respective sidewall that is parallel to the second horizontal direction hd2 and contacts a respective vertical sidewall segment of the retro-stepped dielectric material portion 65.

In one embodiment, each dielectric material plate 42' within the vertical stack of dielectric material plates 42' comprises a concave sidewall segment located at a same level as a respective electrically conductive layer 46 selected from the first electrically conductive layers 46 and the second electrically conductive layers 46, and is in contact with a convex sidewall segment of a structural element (44 or 46) selected from the respective electrically conductive layer 46 or a backside blocking dielectric layer 44 that contacts the respective electrically conductive layer 46.

In one embodiment, each dielectric material plate 42' within the vertical stack of dielectric material plates 42' further comprises: a first planar sidewall segment in contact with a planar sidewall segment of an etch stop liner 78 that contacts a second-type lateral isolation trench fill structure (74B, 76B) of the pair of second-type lateral isolation trench fill structures (74B, 76B); and a second planar sidewall segment in contact with a planar sidewall segment of the structural element (44 or 46).

Alternatively, each dielectric material plate 42' within the vertical stack of dielectric material plates 42' further comprises: a first planar sidewall segment in contact with a planar sidewall segment of a second-type lateral isolation trench fill structure (74B, 76B) of the pair of second-type lateral isolation trench fill structures (74B, 76B); and a second planar sidewall segment in contact with a planar sidewall segment of the structural element (44 or 46).

In one embodiment, each of the second-type lateral isolation trench fill structures (74B, 76B) has a uniform width along the second horizontal direction hd2, and contacts a respective etch stop liner 78 having a lateral thickness that is less than one half of the uniform width. In one embodiment, each of the second-type lateral isolation trench fill structures (74B, 76B) comprises a respective insulating liner 74B comprising a respective portion of an insulating liner material and contacting inner sidewalls of the respective etch stop liner 78, the first insulating layers 32, the second insulating layers 32, the first electrically conductive layers 46, and the second electrically conductive layers 46; and each of the first-type lateral isolation trench fill structures (74A, 76A) comprises a respective additional insulating liner 74A comprising a respective additional portion of the insulating liner material, wherein all surfaces of the first alternating stack (32, 46) and the second alternating stack (32, 46) that contact the pair of second-type lateral isolation trench fill structures (74B, 76B) contact a respective surface of the insulting liner material.

In one embodiment, the retro-stepped dielectric material portion 65 has a first variable lateral extent along the first horizontal direction hd1 that increases stepwise with a vertical distance from the substrate 8. In one embodiment, the retro-stepped dielectric material portion 65 has a second variable lateral extent along the second horizontal direction hd2 that increases gradually without any step along the second horizontal direction hd2.

In one embodiment, a dielectric material plate 42' within the vertical stack of dielectric material plates 42' comprises: first sidewall segments laterally extending along the first horizontal direction hd1 and contacting one of the second-type lateral isolation trench fill structures (74B, 76B); a second sidewall segment laterally extending along the second horizontal direction hd2 and contacting the one of the second-type lateral isolation trench fill structures (74B, 76B); a first concave surface segment located at a level of one of the first electrically conductive layers 46 and in contact with a convex sidewall of a first structural element (44 or 46) that is selected from the one of the first electrically conductive layers 46 and a first blocking dielectric layer that contacts the one of the first electrically conducive layers; and a third sidewall segment laterally extending along the first horizontal direction hd1 and in contact with a planar sidewall of the first structural element (44 or 46).

In one embodiment, a plurality of dielectric material plates 42' within the vertical stack of dielectric material plates 42' has a uniform width along the second horizontal direction hd2 that is less than a minimum lateral dimension of the retro-stepped dielectric material portion 65 along the second horizontal direction hd2.

Figure 20A:
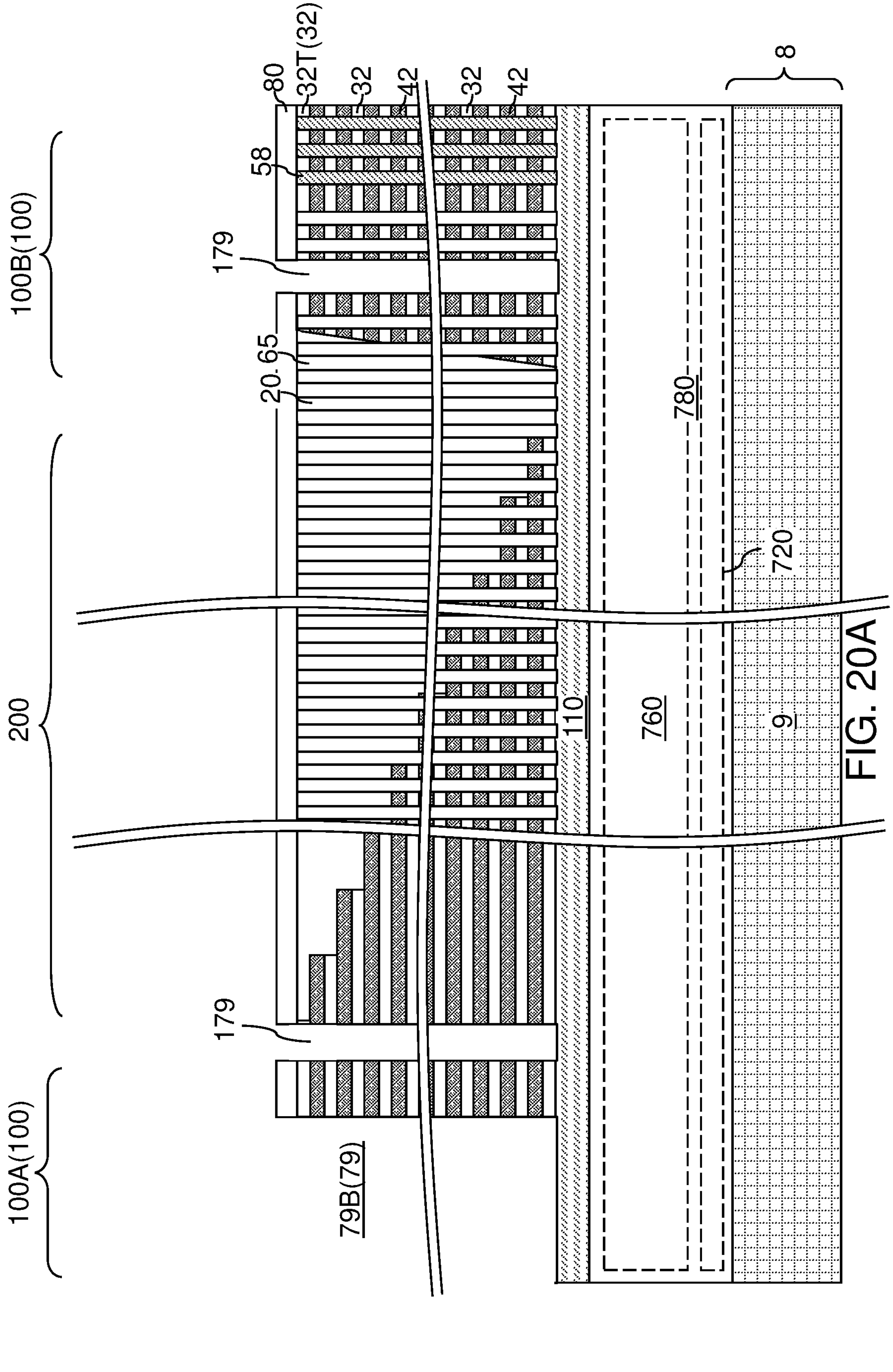
FIG. 20A is a vertical cross-sectional view of a second exemplary structure after formation of lateral isolation trenches and access cavities according to the second embodiment of the present disclosure.
Figure 20B:
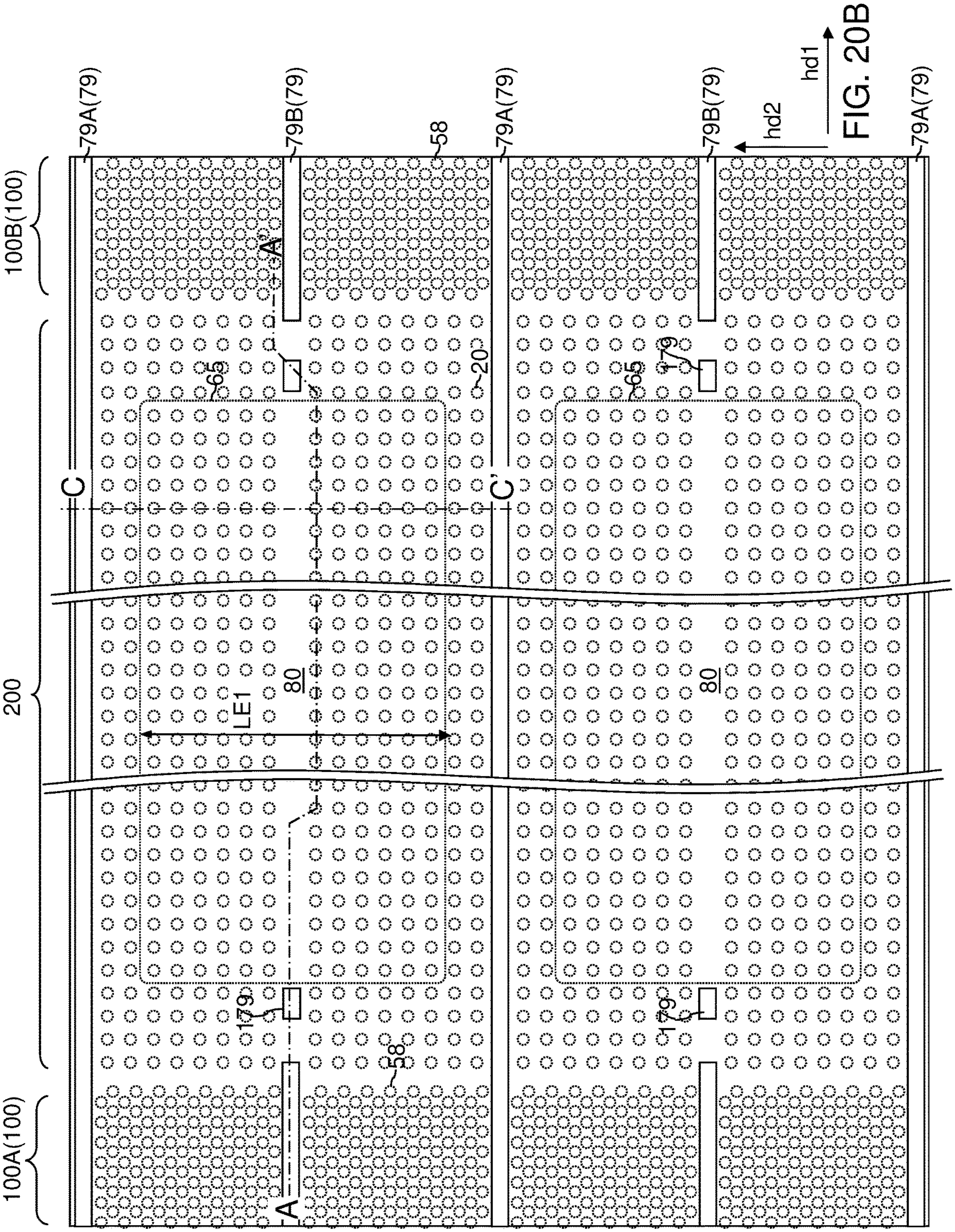
FIG. 20B is a top-down cross-sectional view of the second exemplary structure of FIG. 20A. The vertical plane A-A' is the cut plane of the vertical cross-sectional view of FIG. 20A.
Figure 20C:
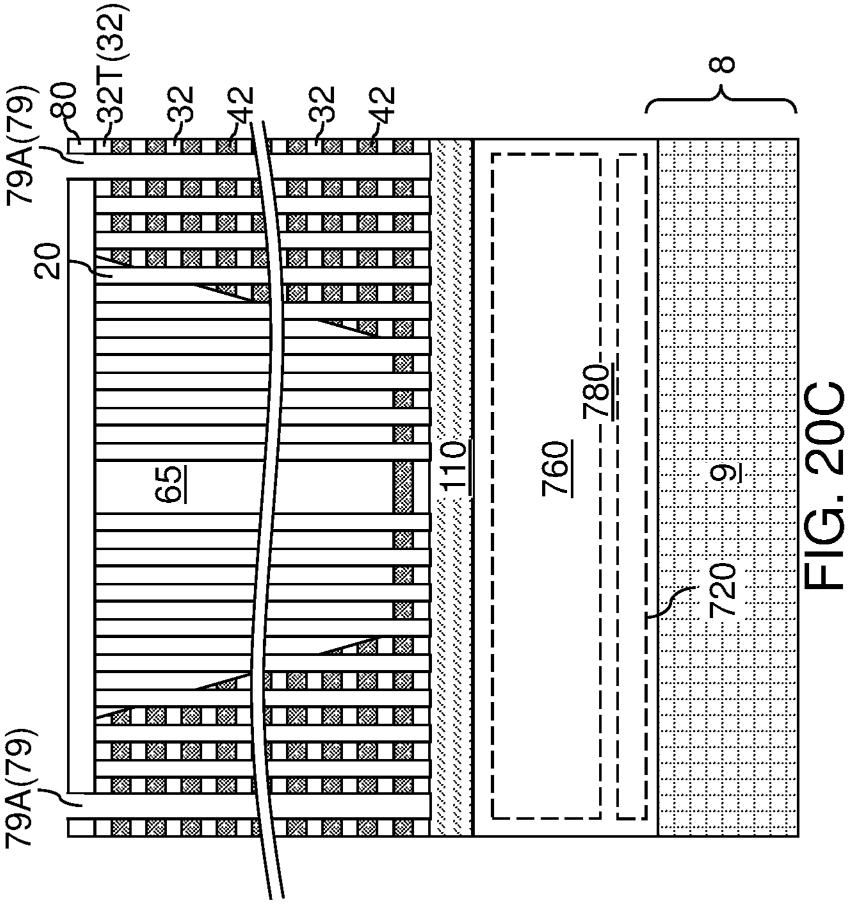
FIG. 20C is a vertical cross-sectional view of the second exemplary structure along the vertical plane C-C' of FIG. 20B.

Referring to FIGS. 20A-20C, a second exemplary structure according to a second embodiment of the present disclosure can be derived from the first exemplary structure illustrated in FIGS. 9A-9C by changing the pattern of the openings in the photoresist layer prior to performing the anisotropic etch process that forms the lateral isolation trenches 79. Specifically, access cavities 179 can be formed in addition to first-type lateral isolation trenches 79A and second-type lateral isolation trenches 79B. In one embodiment, a pair of access cavities 179 can be formed between each pair of second-type lateral isolation trenches 79B that are laterally spaced from each other along the first horizontal direction hd1. Each pair of access cavities 179 may be formed "in-line" with a respective pair of second-type lateral isolation trenches 79B. In other words, the lateral extent of each pair of access cavities 179 along the second horizontal direction hd2 may be the same as the lateral extent of a respective pair of second-type lateral isolation trenches 79B along the second horizontal direction hd2.

In one embodiment, each access cavity 179 can be formed in the contact region 200 outside the areas of the retro-stepped dielectric material portions 65. In this case, the access cavities 179 do not cut through any of the retro-stepped dielectric material portions 65. The lateral extent of each access cavity 179 along the first horizontal direction hd1 may be less than the width of a gap along the first horizontal direction hd1 between a most proximal retro-stepped dielectric material portion 65 and a most proximal memory array region 100.

Each second-type lateral isolation trench 79B may be formed entirely within a memory array region 100 (i.e., does not extend into a contact region 200), or may extend through a memory array region 100 and laterally protrude into a peripheral portion of the contact region 200 such that the second-type lateral isolation trench 79B is laterally spaced from a most proximal retro-stepped dielectric material portion 65 by a respective access cavity 179.

The combination of a pair of second-type lateral isolation trenches 79B and a pair of access cavities 179 formed between a neighboring pair of first-type lateral isolation trenches 79A constitutes a trench cluster (79B, 179). The first-type lateral isolation trenches 79A and the trench clusters (79B, 179) are interlaced along the second horizontal direction hd2. In this case, a unit repetition structure including a first-type lateral isolation trench 79A, a pair of second-type lateral isolation trenches 79B in combination with a pair of access cavities 179 can be repeated along the second horizontal direction hd2 with a uniform periodicity. Each of the first-type lateral isolation trenches 79A laterally extends continuously through the contact region 200, the first memory array region 100A, and the second memory array region 100B along the first horizontal direction hd1. Each second-type lateral isolation trench 79B laterally extends through a respective one of the memory regions 100, and optionally into a peripheral portion of the contact region 200 without extending into a center portion of the contact region 200. In one embodiment, each pair of second-type lateral isolation trenches 79B can be laterally spaced apart from each other along the second horizontal direction hd2 by a gap located within the contact region 200 and containing a retro-stepped dielectric material portion 65 and a pair of access cavities 179. In one embodiment, each pair of second-type lateral isolation trenches 79B may be aligned to each other along the second horizontal direction hd2 with a respective pair of access cavities 179. In this case, each lengthwise sidewall of a second-type lateral isolation trench 79B may be formed within a vertical plane that is parallel to the first horizontal direction hd1. The vertical plane can contain a lengthwise sidewall of another second-type lateral isolation trench 79B within a respective pair of second-type lateral isolation trenches 79B, and contains lengthwise sidewalls of a pair of access cavities 179. In one embodiment, each pair of second-type lateral isolation trenches 79B may be positioned midway between a neighboring pair of first-type lateral isolation trenches 79A.

The width of the lateral isolation trenches 79 can be greater than the thickness of each sacrificial material layer 42. For example, the ratio of the width of the lateral isolation trenches 79 along the second horizontal direction hd2 to the thickness of each sacrificial material layer 42 may be in a range from 2 to 30, such as from 4 to 15, although lesser and greater ratios may also be employed. According to an aspect of the present disclosure, the first-tier lateral isolation trenches 79A may be formed between neighboring pairs of retro-stepped dielectric material portions 65, and each pair of second-type lateral isolation trenches 79B may be laterally located at a level of a respective one of the retro-stepped dielectric material portions 65 along the first horizontal direction hd1.

Generally, lateral isolation trenches 79 laterally extending along the first horizontal direction hd1 can be formed through the contact-level dielectric layer 80 and the alternating stack (32, 42). The alternating stack (32, 42) is divided into multiple alternating stacks (32, 42) that are laterally spaced apart along the second horizontal direction hd2 by the first-type lateral isolation trenches 79A. Layer stacks (32, 42, 80) are formed, each of which includes a respective patterned portion of the contact-level dielectric layer 80 and a respective alternating stack (32, 42) and laterally spaced from each other by the lateral isolation trenches 79. In one embodiment, each pair of second-type lateral isolation trenches 79B is laterally spaced from a respective one of the retro-stepped dielectric material portions 65 by a respective pair of access cavities 179. Each pair of access cavities 179 is laterally spaced apart along the first horizontal direction hd1 by a respective one of the retro-stepped dielectric material portions 65.

Figure 21A:
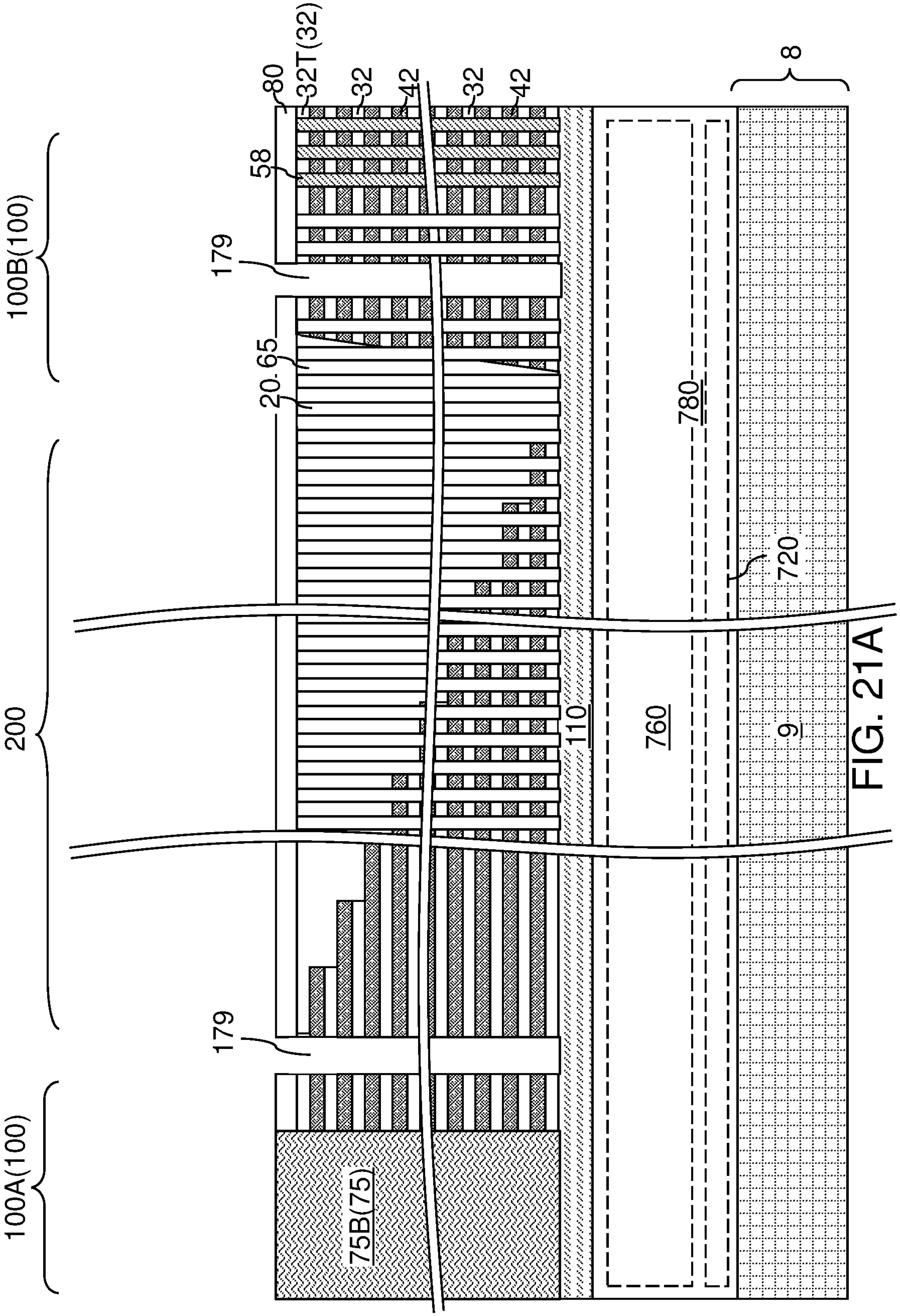
FIG. 21A is a vertical cross-sectional view of the second exemplary structure after formation of sacrificial lateral isolation trench fill structures according to the second embodiment of the present disclosure.
Figure 21B:
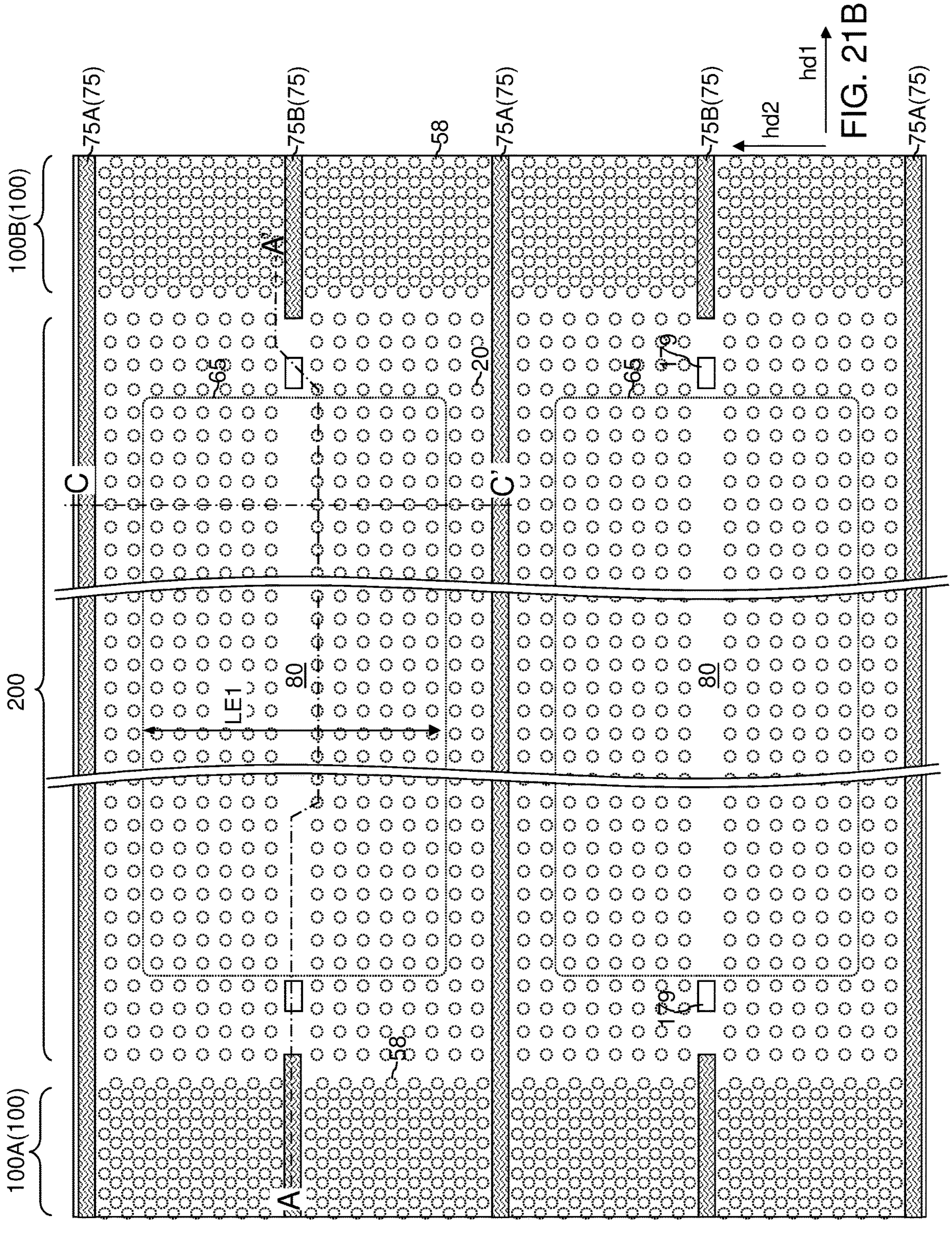
FIG. 21B is a top-down cross-sectional view of the second exemplary structure of FIG. 21A. The vertical plane A-A' is the cut plane of the vertical cross-sectional view of FIG. 21A.
Figure 21C:
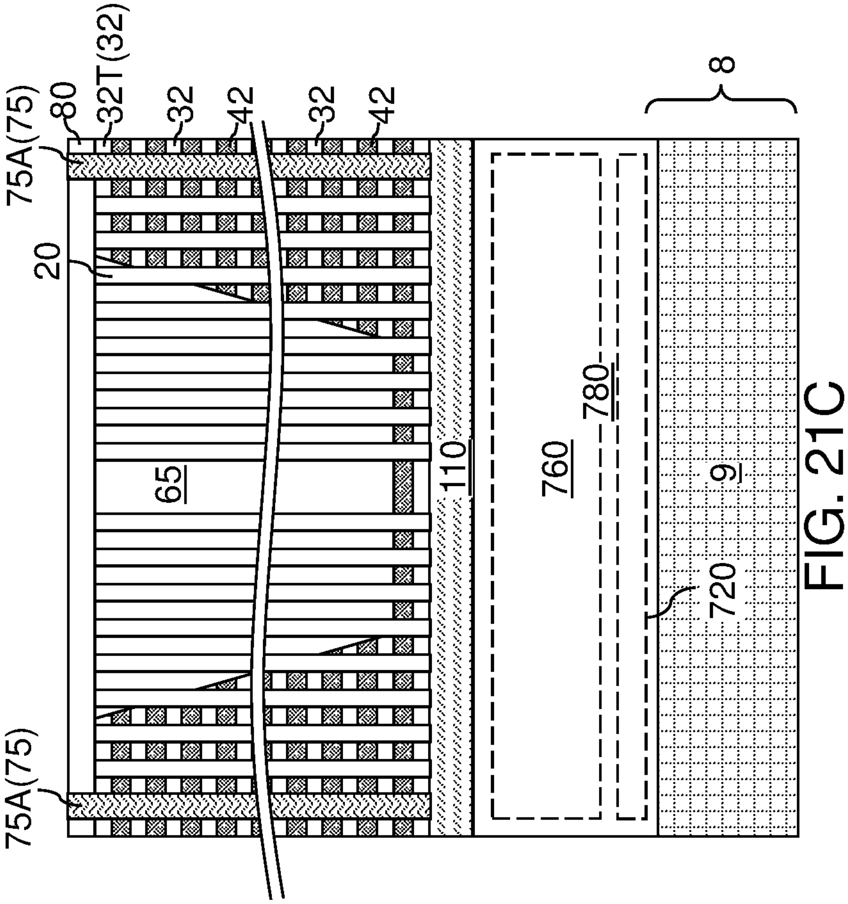
FIG. 21C is a vertical cross-sectional view of the second exemplary structure along the vertical plane C-C' of FIG. 21B.
Figure 22A:
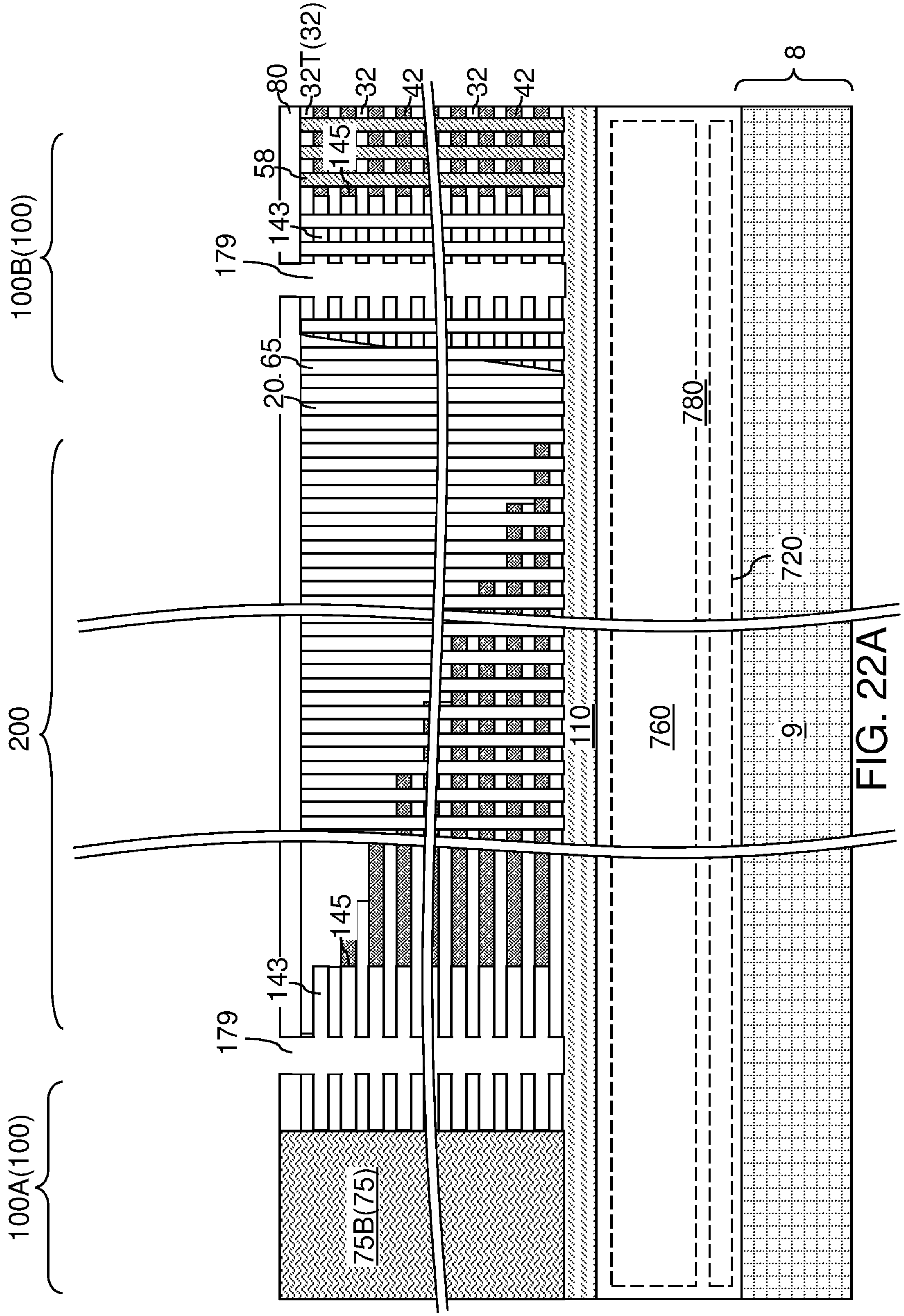
FIG. 22A is a vertical cross-sectional view of the second exemplary structure after formation of fin recesses according to the second embodiment of the present disclosure.
Figure 22B:
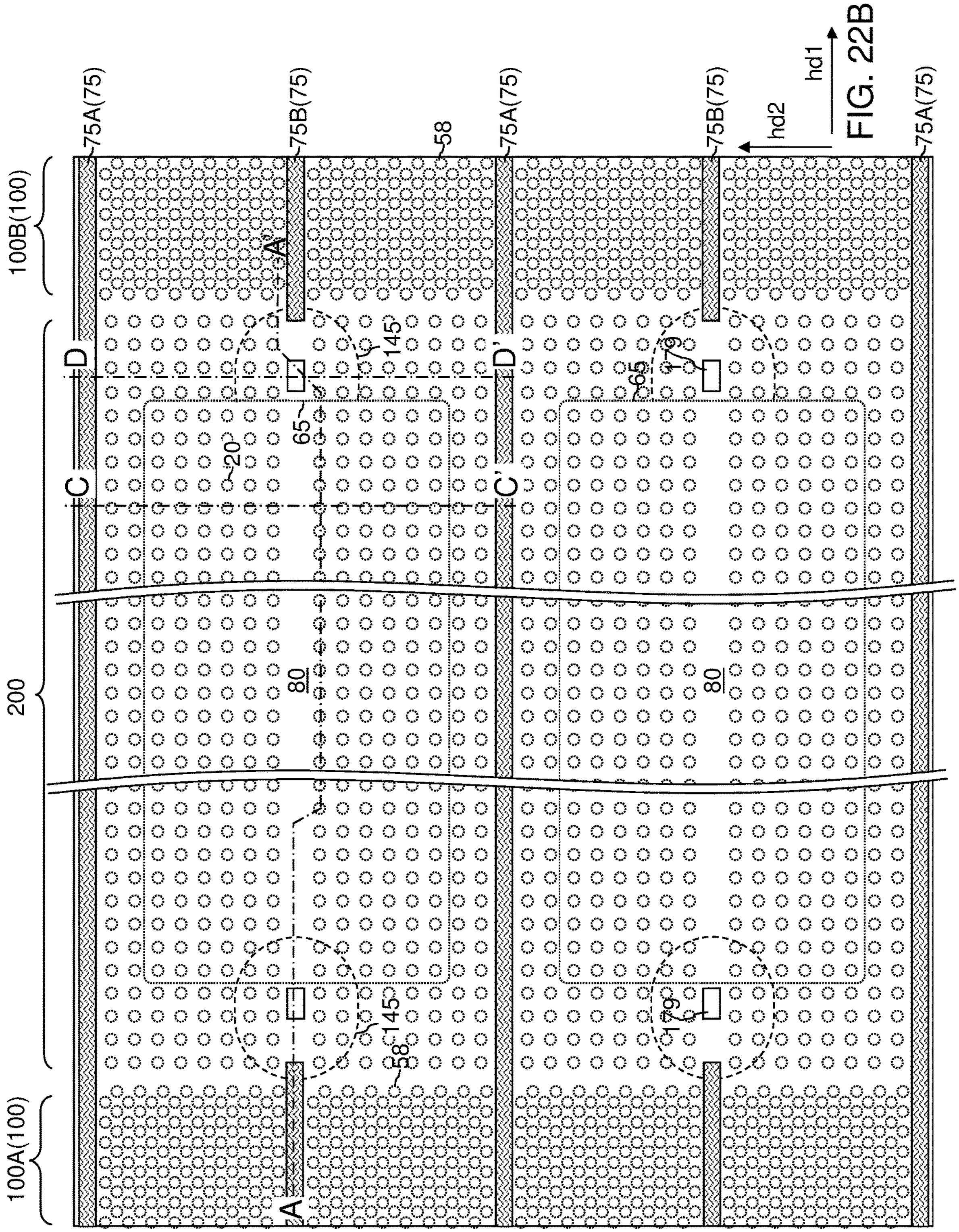
FIG. 22B is a top-down cross-sectional view of the second exemplary structure of FIG. 22A. The vertical plane A-A' is the cut plane of the vertical cross-sectional view of FIG. 22A.
Figure 22C:
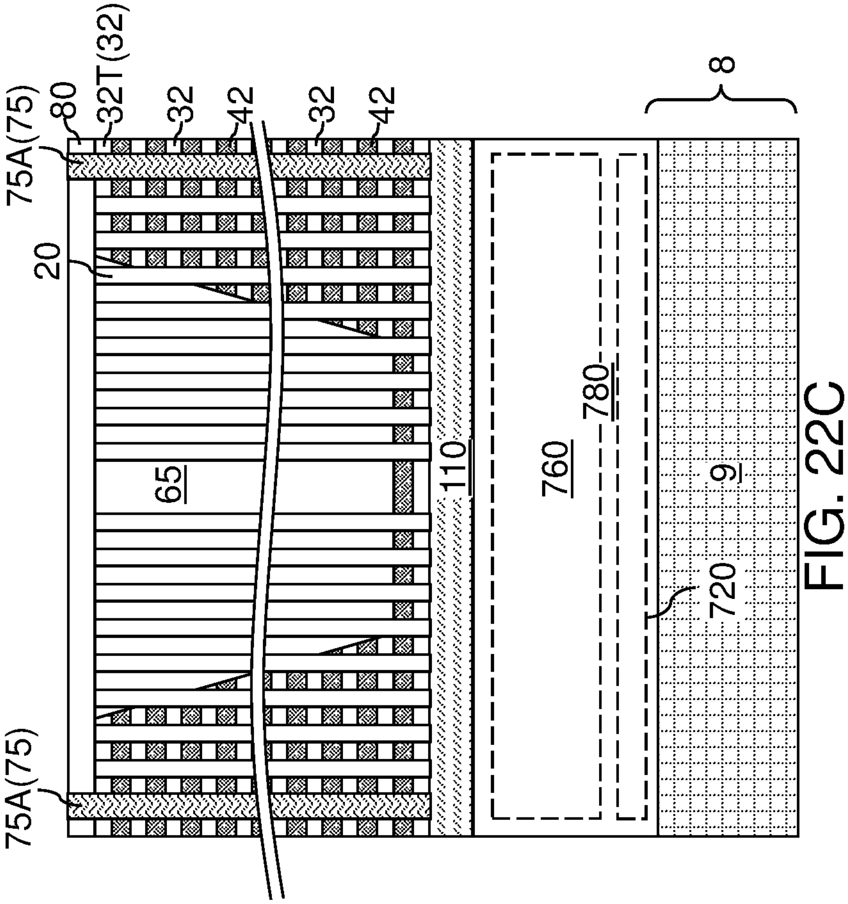
FIG. 22C is a vertical cross-sectional view of the second exemplary structure along the vertical plane C-C' of FIG. 22B.
Figure 22D:
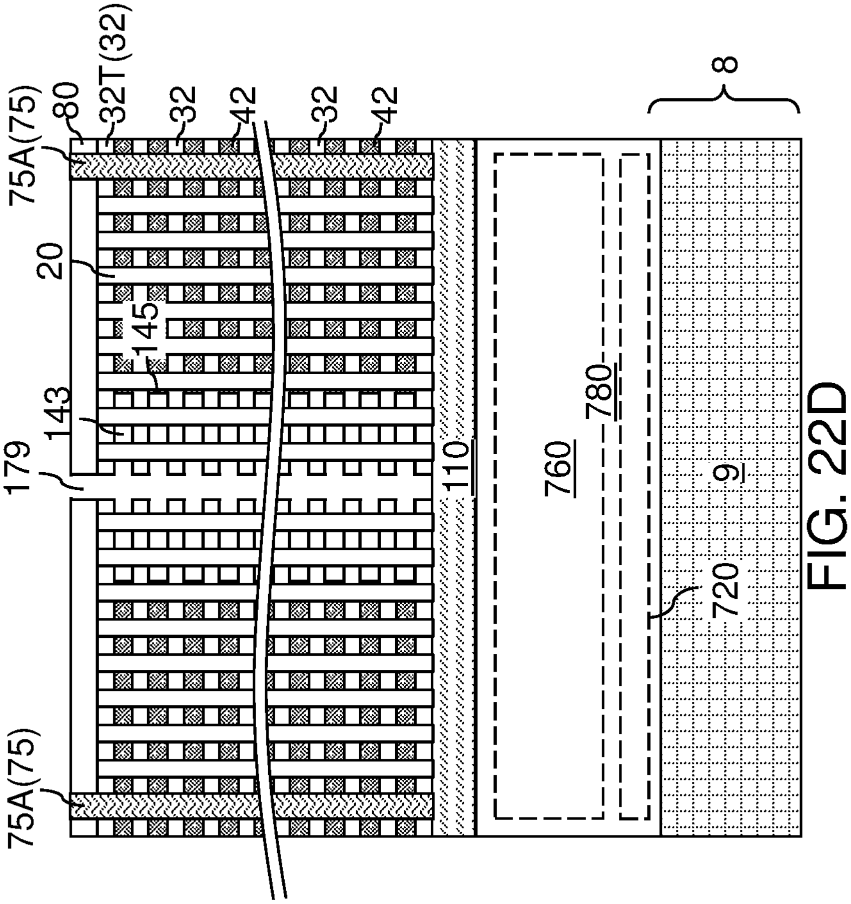
FIG. 22D is a vertical cross-sectional view of the second exemplary structure along the vertical plane D-D' of FIG. 22B.
Figure 23A:
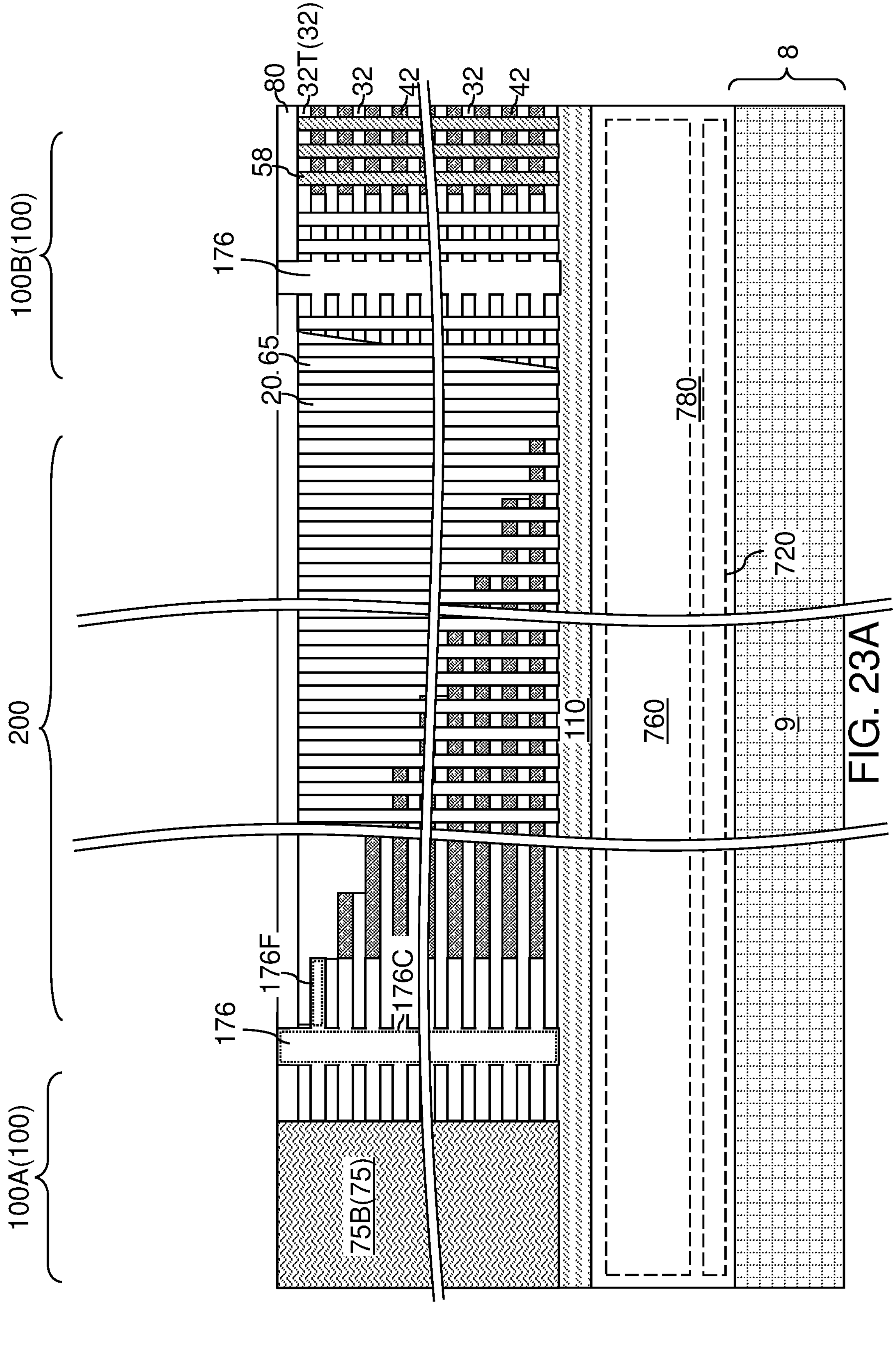
FIG. 23A is a vertical cross-sectional view of the second exemplary structure after formation of finned insulating support structures according to the second embodiment of the present disclosure.
Figure 23B:
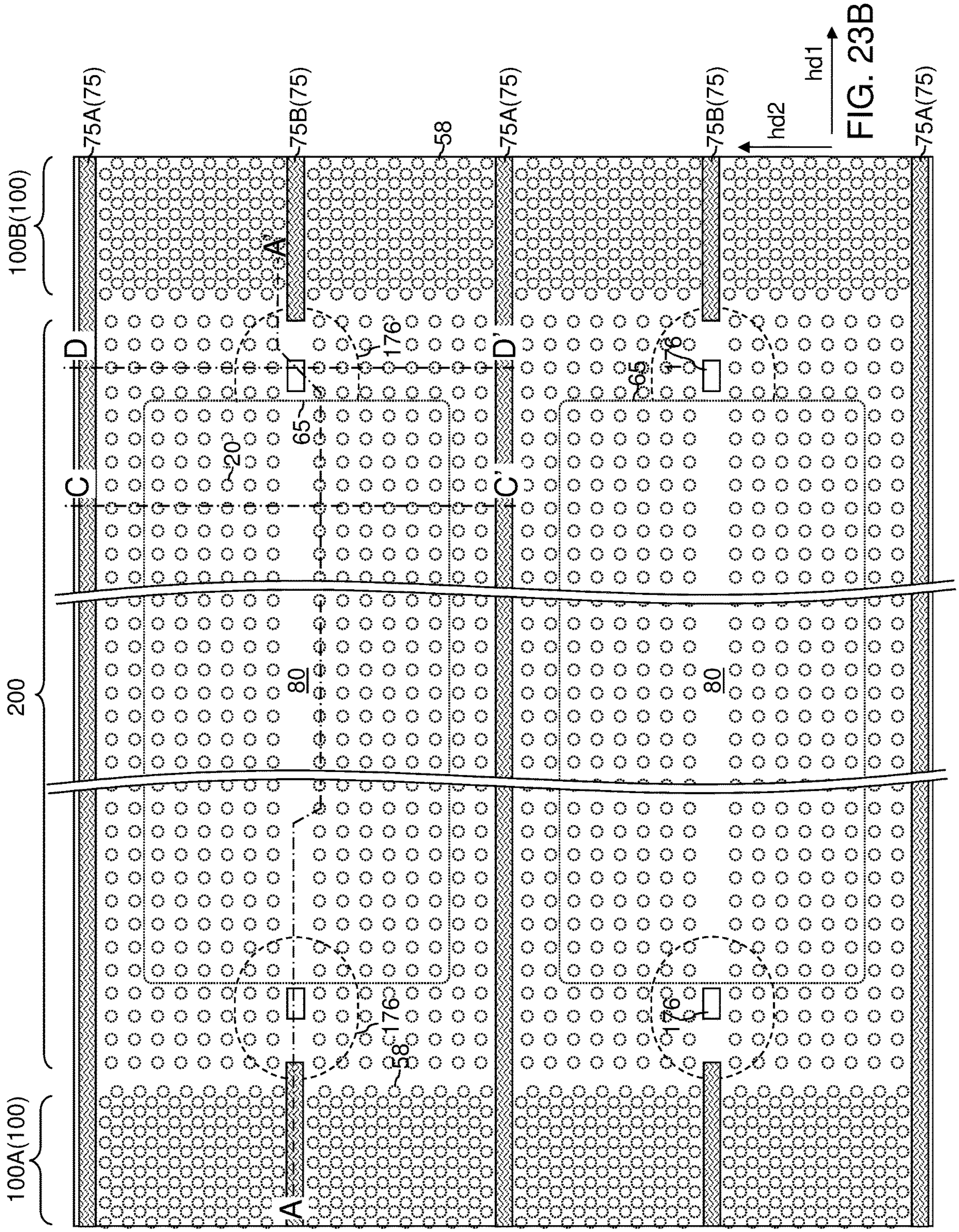
FIG. 23B is a top-down cross-sectional view of the second exemplary structure of FIG. 23A. The vertical plane A-A' is the cut plane of the vertical cross-sectional view of FIG. 23A.
Figure 23C:
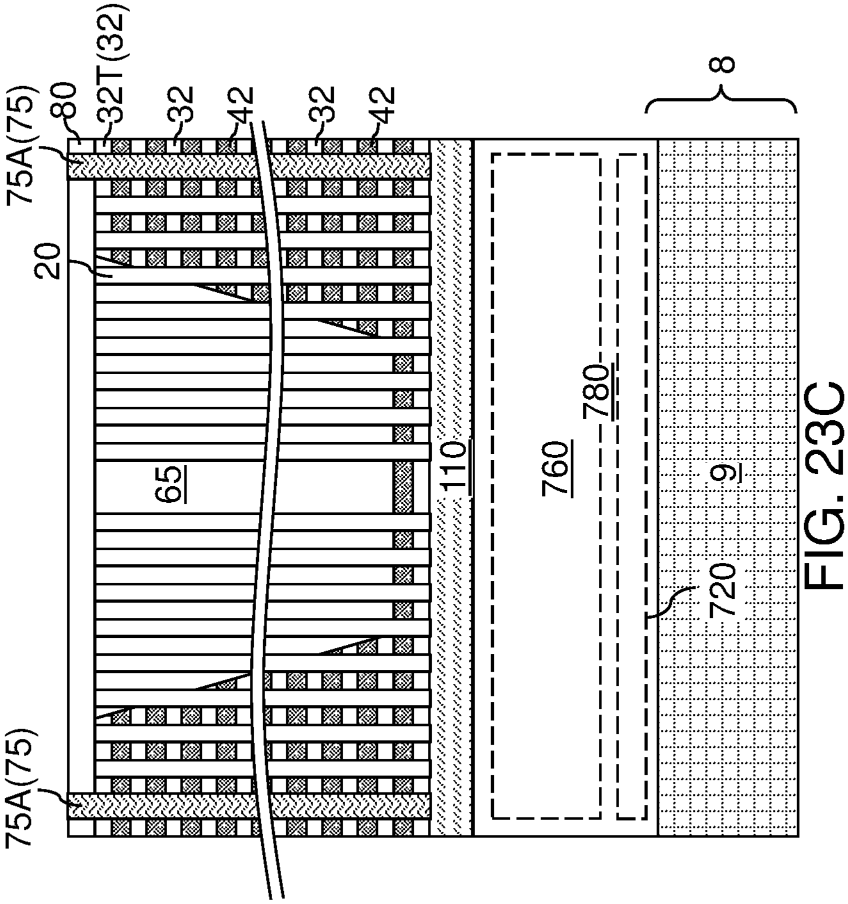
FIG. 23C is a vertical cross-sectional view of the second exemplary structure along the vertical plane C-C' of FIG. 23B.
Figure 23D:
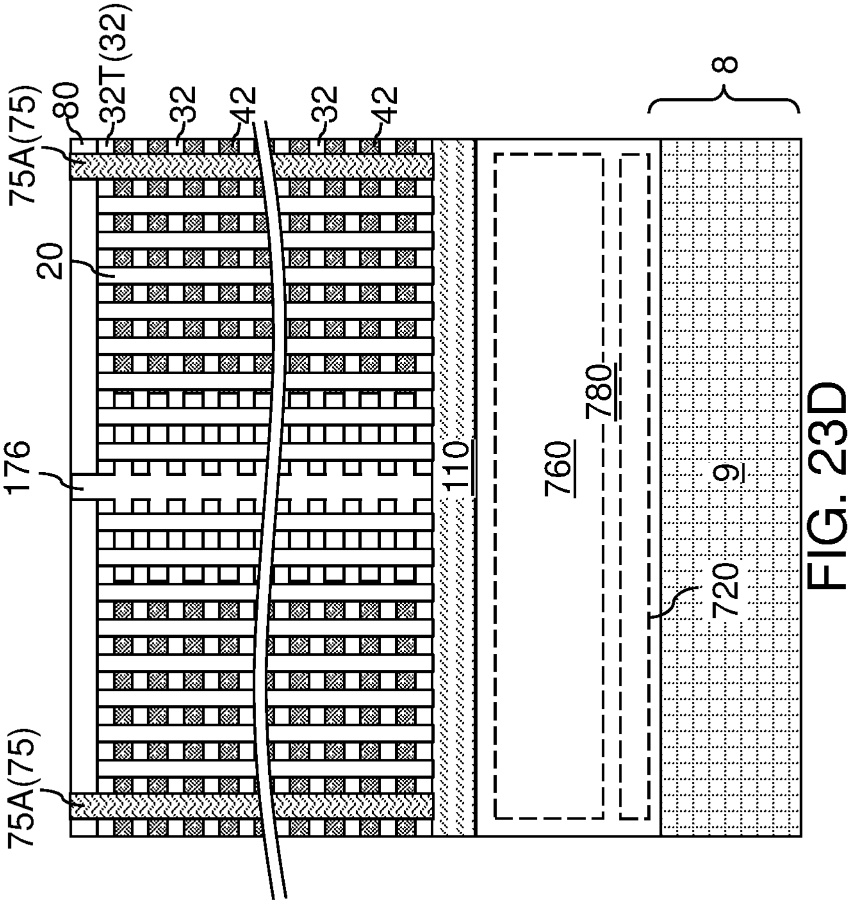
FIG. 23D is a vertical cross-sectional view of the second exemplary structure along the vertical plane D-D' of FIG. 23B.

Referring to FIGS. 21A-21C, a sacrificial fill material that can be subsequently removed selective to materials of the insulating layers 32 and sacrificial material layers 42 can be deposited in the lateral isolation trenches 79 and the access cavities 179. The sacrificial fill material may comprise, for example, a carbon-based material (such as amorphous carbon or diamond-like carbon) or a semiconductor material (such as amorphous silicon). Optionally, a thin sacrificial liner (not shown) such as a silicon oxide liner or a silicon nitride liner may be deposited in the lateral isolation trenches 79 and the access cavities 179 prior to deposition of the sacrificial fill material. Excess portions of the sacrificial fill material may be removed from above the horizontal plane including the top surface of the contact-level dielectric layer 80 by performing a planarization process such as a chemical mechanical planarization (CMP) process. Each portion of the sacrificial fill material that fills a first-type lateral isolation trench 79A constitutes a first-type sacrificial lateral isolation trench fill structure 75A, each portion of the sacrificial fill material portion that fills a second-type lateral isolation trench 79B constitutes a second-type sacrificial lateral isolation trench fill structure 75B, and each portion of the sacrificial fill material portion that fills an access cavity 179 constitutes a sacrificial access cavity fill structure (not shown).

A photoresist layer (not shown) can be applied over the contact-level dielectric layer 80, and can be lithographically patterned to form openings in areas overlying the access cavities 179 while covering areas of the laterally isolation trenches 79. A selective etch process can be performed to remove the sacrificial access cavity fill structures from the access cavities 179. Voids are formed in the access cavities 179, which includes empty volumes from which the sacrificial access cavity fill structures are removed. The photoresist layer can be subsequently removed, for example, by ashing. The first-type sacrificial lateral isolation trench fill structure 75A are present in the first-type lateral isolation trenches 79A, and the second-type sacrificial lateral isolation trench fill structures 75B are present in the second-type lateral isolation trenches 79B.

Referring to FIGS. 22A-22D, an isotropic etch process can be performed to laterally recess the sacrificial material layers 42 from around the access cavities 179. For example, if the sacrificial material layers 42 comprise silicon nitride, a wet etch process employing hot phosphoric acid can be performed to laterally recess the sacrificial material layers 42 around each of the access cavities 179. The first-type sacrificial lateral isolation trench fill structures 75A and the second-type sacrificial lateral isolation trench fill structures 75B prevent the isotropic etchant of the isotropic etch process from entering the lateral isolation trenches 79.

Recess cavities are formed in volumes from which the material of the sacrificial material layers 42 is removed. A vertical stack of recess cavities can be formed around each access cavity 179. The recess cavities laterally protrude outward from a respective access cavity 179 in the shapes of laterally-protruding fins, and thus, are herein referred to as fin recesses 143. Generally, fin recesses 143 can be around each of the access cavities 179 by isotropically laterally recessing the sacrificial material layers 42. Each contiguous combination of an access cavity 179 and a vertical stack of finned recesses 143 is herein referred to as a finned cavity (179, 143).

The etch distance of the isotropic etch process that forms the fin recesses 143 is less than the lateral spacing between neighboring pairs of a first-type lateral isolation trench 79A and a second-type lateral isolation trench 79B along the second horizontal direction hd2 in a memory array region 100. According to an aspect of the present disclosure, the etch distance of the isotropic etch process is greater than the lateral distance of any gap between an access cavity 179 and a neighboring second-type lateral isolation trench 79B, and is greater than the lateral distance of any gap between an access cavity 179 and a neighboring retro-stepped dielectric material portion 65. The ratio of the etch distance of the isotropic etch process to the lateral spacing between neighboring pairs of a first-type lateral isolation trench 79A and a second-type lateral isolation trench 79B along the second horizontal direction hd2 in a memory array region 100 may be in a range from 0.1 to 0.7, such as from 0.15 to 0.4, although lesser and greater ratios may also be employed. Each of the finned recesses 143 may be laterally bounded by a sidewall segment 145 of a respective sacrificial material layer 42.

Referring to FIGS. 23A-23D, a dielectric fill material can be deposited in the finned cavities (179, 143). The dielectric fill material may comprise, for example, silicon oxide, silicon carbonitride, silicon oxynitride, and/or a dielectric metal oxide. In one embodiment, the dielectric fill material may comprise silicon oxide. Excess portions of the dielectric fill material can be removed from above the horizontal plane including the top surface of the contact-level dielectric layer 80 by a planarization process such as a recess etch process. Each remaining portion of the dielectric fill material that fills a respective finned cavity (179, 143) constitutes a finned insulating support structure 176.

Generally, finned insulating support structures 176 can be formed in volumes of the fin recesses 143 and the access cavities 179. Each of the finned insulating support structures 176 comprises a respective vertically-extending insulating core 176C and a respective vertical stack of insulating fins 176F that laterally extend outward from the respective vertically-extending insulating core 176C. Each pair of second-type lateral isolation trenches 79B is laterally spaced apart from each other along the first horizontal direction hd1 by a respective set of two finned insulating support structures 176 and the retro-stepped dielectric material portion 65. In one embodiment, each interface between a finned insulating support structure 176 and a sacrificial material layer 42 comprises a respective convex sidewall segment of the insulating fins 176F of the finned insulating support structure 176 in contact with a respective concave sidewall segment of the sacrificial material layer 42. In one embodiment, each interface between a pair finned insulating support structures 176 and a retro-stepped dielectric material portion 65 comprise a respective planar sidewall segment of the insulating fins 176F of the pair finned insulating support structures 176 in contact with a respective planar sidewall segment of the retro-stepped dielectric material portion 65.

Referring to FIGS. 24A-24I, the sacrificial lateral isolation trench fill structures (75A, 75B) can be removed selective to materials of the alternating stacks (32, 42) and the finned insulating support structures 176. Voids are formed in the volumes of the lateral isolation trenches 79.

An isotropic etch process can be performed to introduce an isotropic etchant that etches a material of the sacrificial material layers 42 into the lateral isolation trenches 79. For example, if the sacrificial material layers 42 comprise silicon nitride, the isotropic etch process may comprise a wet etch process employing hot phosphoric acid. Laterally-extending cavities 43 are formed in volumes from which portions of the sacrificial material layers 42 are removed by the isotropic etch process. Generally, the laterally-extending cavities 43 can be formed by performing an isotropic etch process in which an isotropic etchant is provided into the first-type lateral isolation trenches 79A and the pairs of second-type lateral isolation trenches 79B.

According to an aspect of the present disclosure, the isotropic etch process has an etch distance that is greater than the lateral spacing along the second horizontal direction hd2 between a first-type lateral isolation trench 79A and a most proximal one of the finned insulating support structures 176. In one embodiment, the etch distance is less than the lateral distance between a neighboring pair of a first-type lateral isolation trench 79A and a second-type lateral isolation trench 79B. In one embodiment, the isotropic etch process has an etch distance that is greater than one half of a lateral distance between a first-type lateral isolation trench 79A and a pair of second-type lateral isolation trenches 79B that is most proximal to the first-type lateral isolation trench 79A. In one embodiment, the etch distance is less than a lateral dimension of one of finned insulating support structures 176 along the first horizontal direction hd1.

Remaining portions of the sacrificial material layers 42 are present between pairs of finned insulating support structures 176 that are laterally spaced apart from each other along the first horizontal direction hd1 after the isotropic etch process. The remaining portions of the sacrificial material layers 42 constitute vertical stacks of dielectric material plates 42'. A vertical stack of dielectric material plates 42' can be formed underneath each retro-stepped dielectric material portion 65. In one embodiment shown in FIGS. 24B and 24H, the retro-stepped dielectric material portions 65 may have a first lateral extent LE1 along the second horizontal direction hd2, and the dielectric material plates 42' in the vertical stacks of dielectric material plates 42' may have a second lateral extent LE2 along the second horizontal direction hd2 that is less than the first lateral extent LE1.

In one embodiment, a plurality of dielectric material plates 42' within the vertical stack of dielectric material plates 42' may have a uniform width along the second horizontal direction hd2 that is less than a minimum lateral dimension of the retro-stepped dielectric material portion 65 along the second horizontal direction hd2. In one embodiment, the dielectric material plates 42' within each vertical stack of dielectric material plates 42' may have lateral extents along the first horizontal direction hd1 that decrease with a vertical distance from the substrate 8. In one embodiment, each dielectric material plate 42' within the vertical stack of dielectric material plates 42' may have a respective sidewall that is parallel to the second horizontal direction hd2 and contacts a respective vertical sidewall segment of the retro-stepped dielectric material portion 65.

Figure 24A:
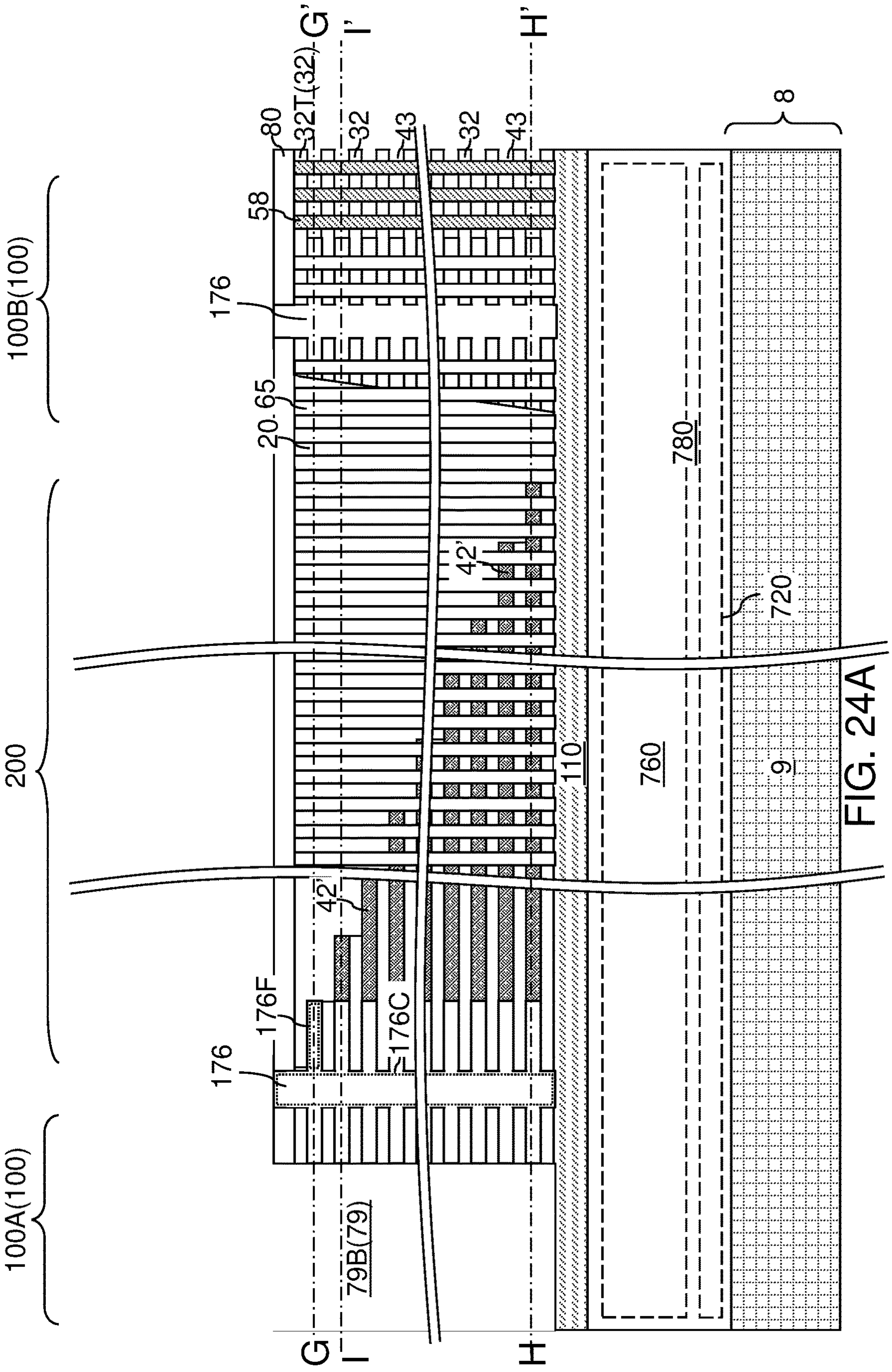
FIG. 24A is a vertical cross-sectional view of the second exemplary structure after removal of sacrificial lateral isolation trench fill structures and formation of laterally-extending cavities according to the second embodiment of the present disclosure.
Figure 24B:
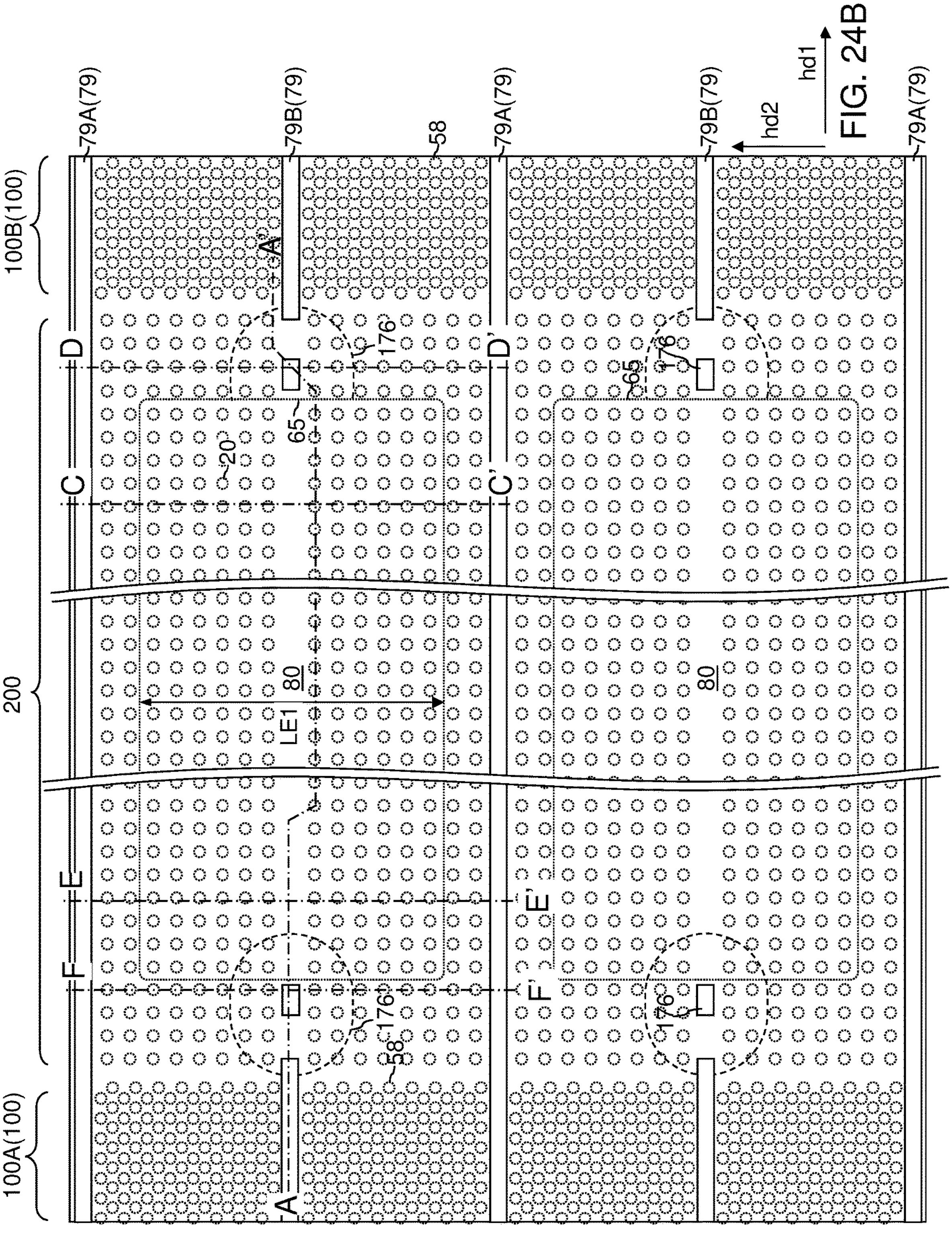
FIG. 24B is a top-down cross-sectional view of the second exemplary structure of FIG. 24A. The vertical plane A-A' is the cut plane of the vertical cross-sectional view of FIG. 24A.
Figure 24C:
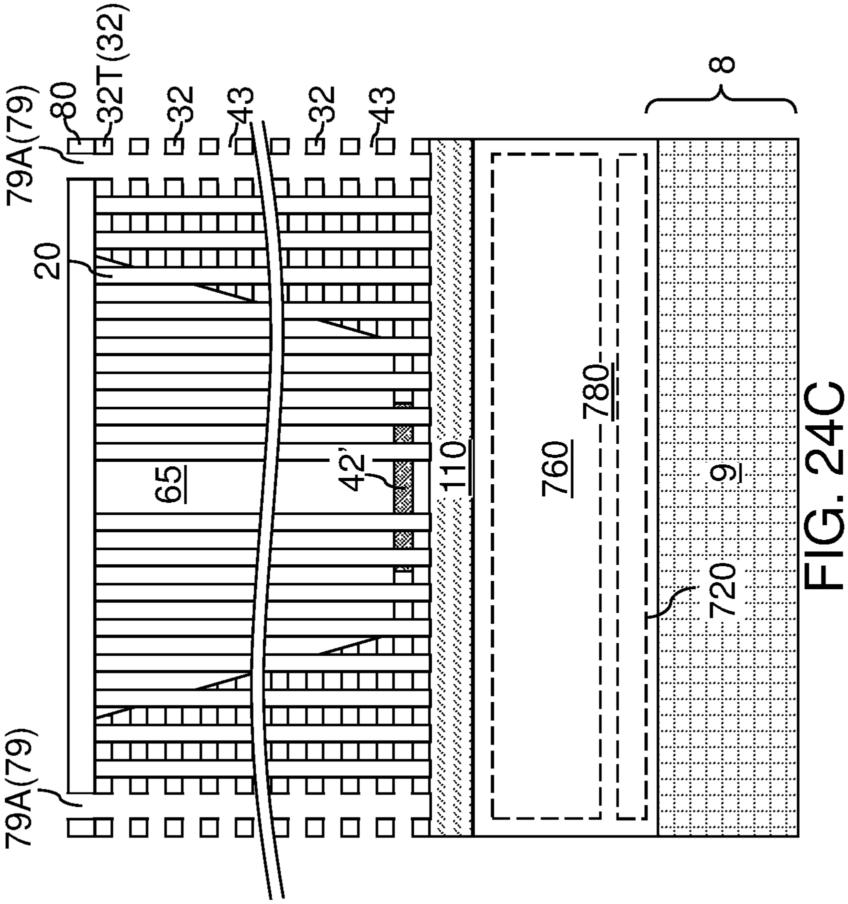
FIG. 24C is a vertical cross-sectional view of the second exemplary structure along the vertical plane C-C' of FIG. 24B.
Figure 24D:
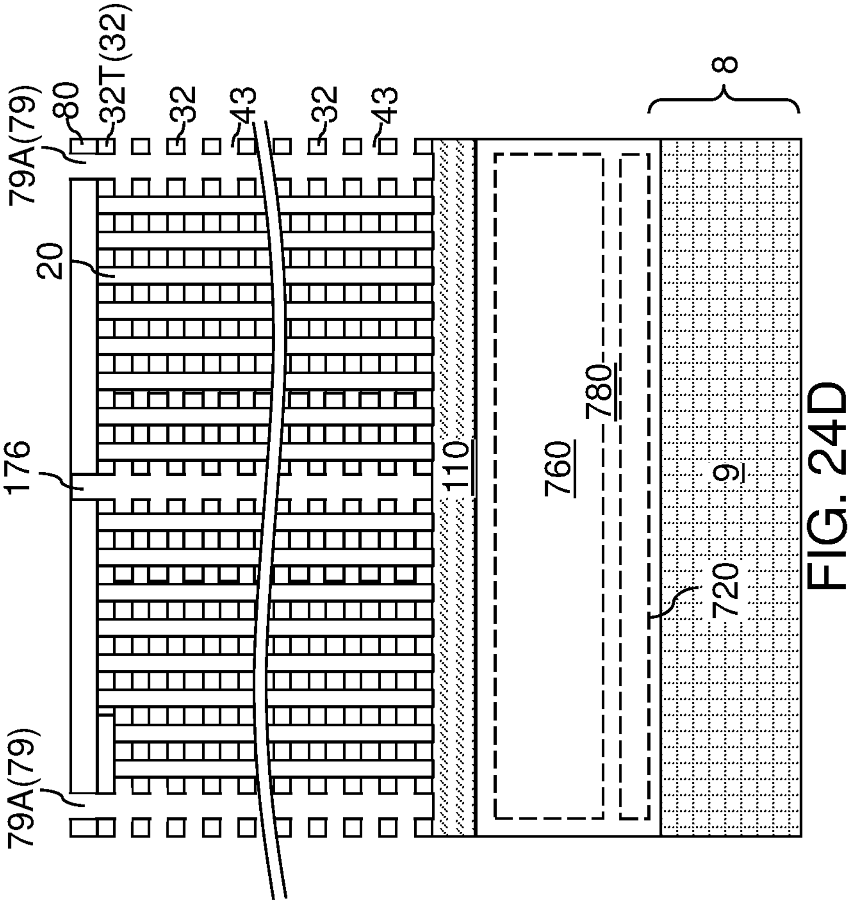
FIG. 24D is a vertical cross-sectional view of the second exemplary structure along the vertical plane D-D' of FIG. 24B.
Figure 24E:
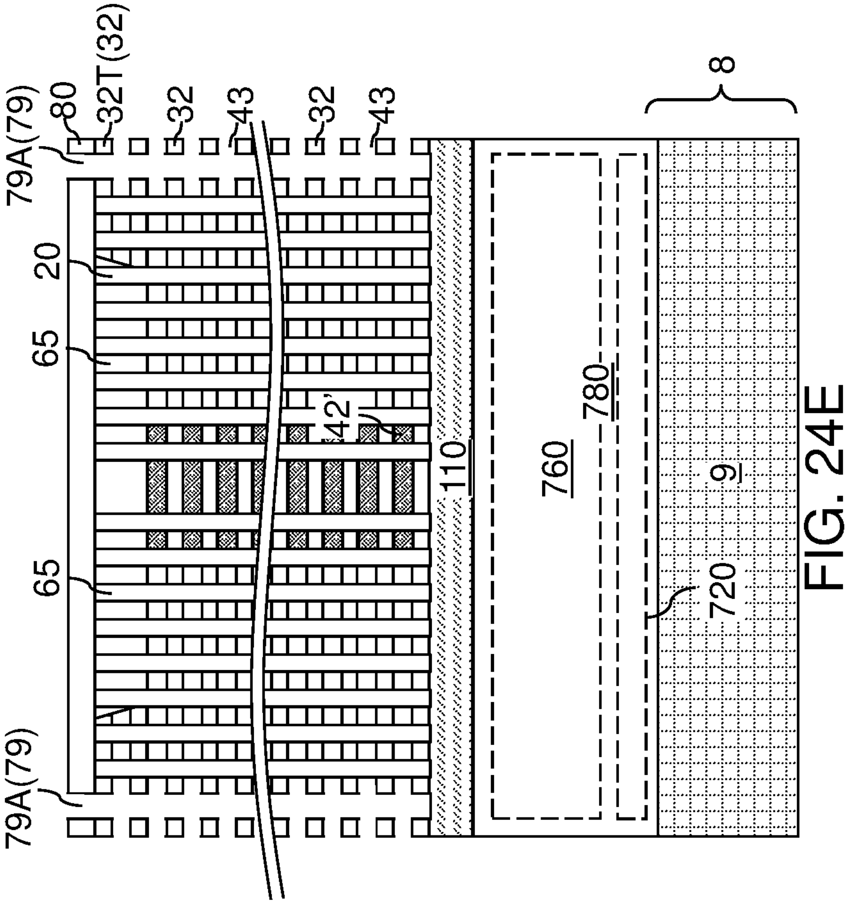
FIG. 24E is a vertical cross-sectional view of the second exemplary structure along the vertical plane E-E' of FIG. 24B.
Figure 24F:
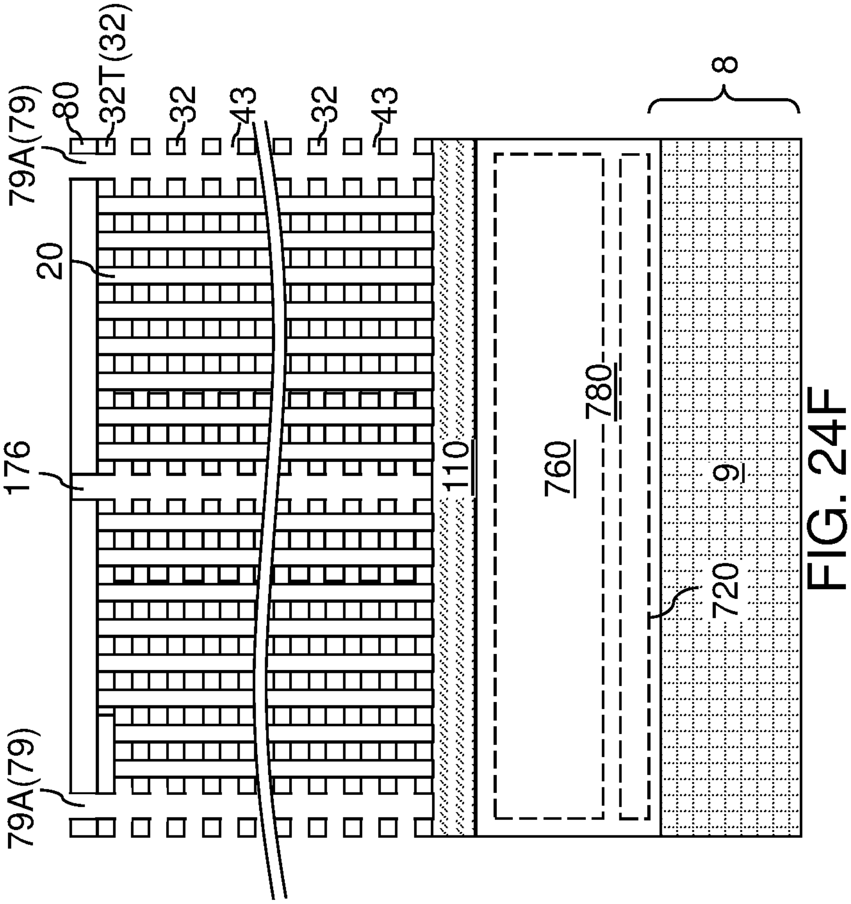
FIG. 24F is a vertical cross-sectional view of the second exemplary structure along the vertical plane F-F' of FIG. 24B.
Figure 24G:
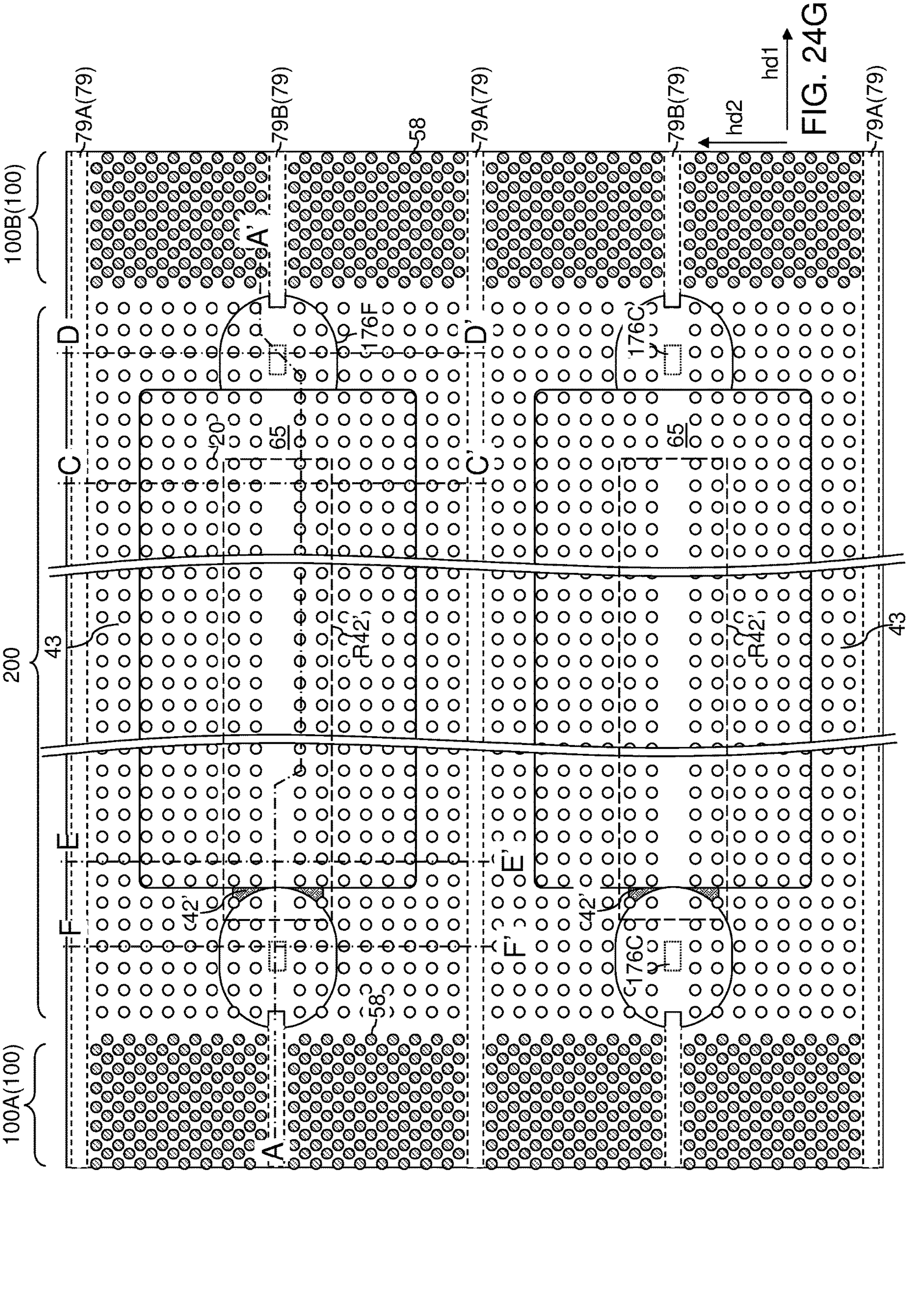
FIG. 24G is a horizontal cross-sectional view of the second exemplary structure along the horizontal plane G-G' of FIG. 24A.
Figure 24H:
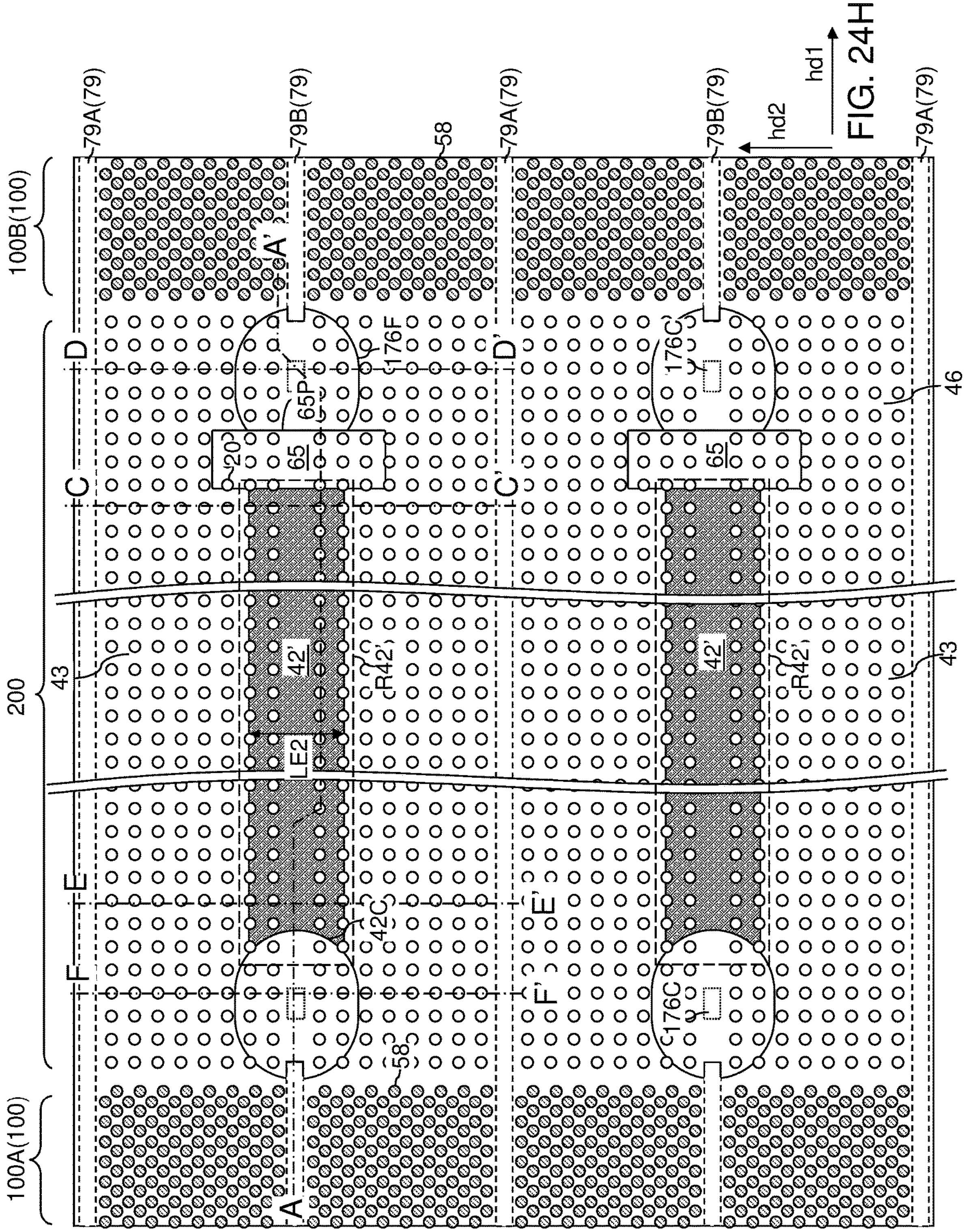
FIG. 24H is a horizontal cross-sectional view of the second exemplary structure along the horizontal plane H-H' of FIG. 24A.
Figure 24I:
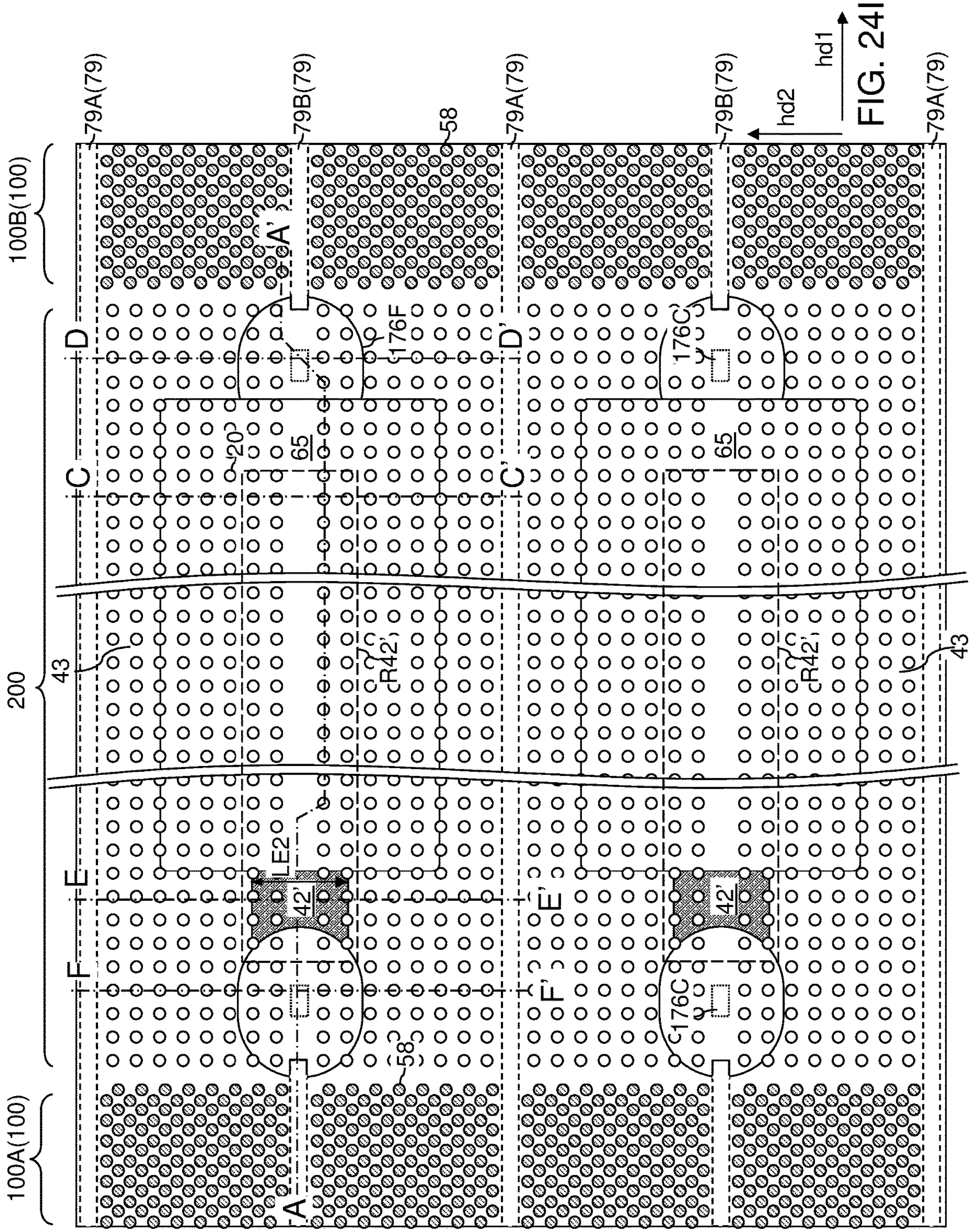
FIG. 24I is a horizontal cross-sectional view of the second exemplary structure along the horizontal plane I-I' of FIG. 24A.
Figure 25A:
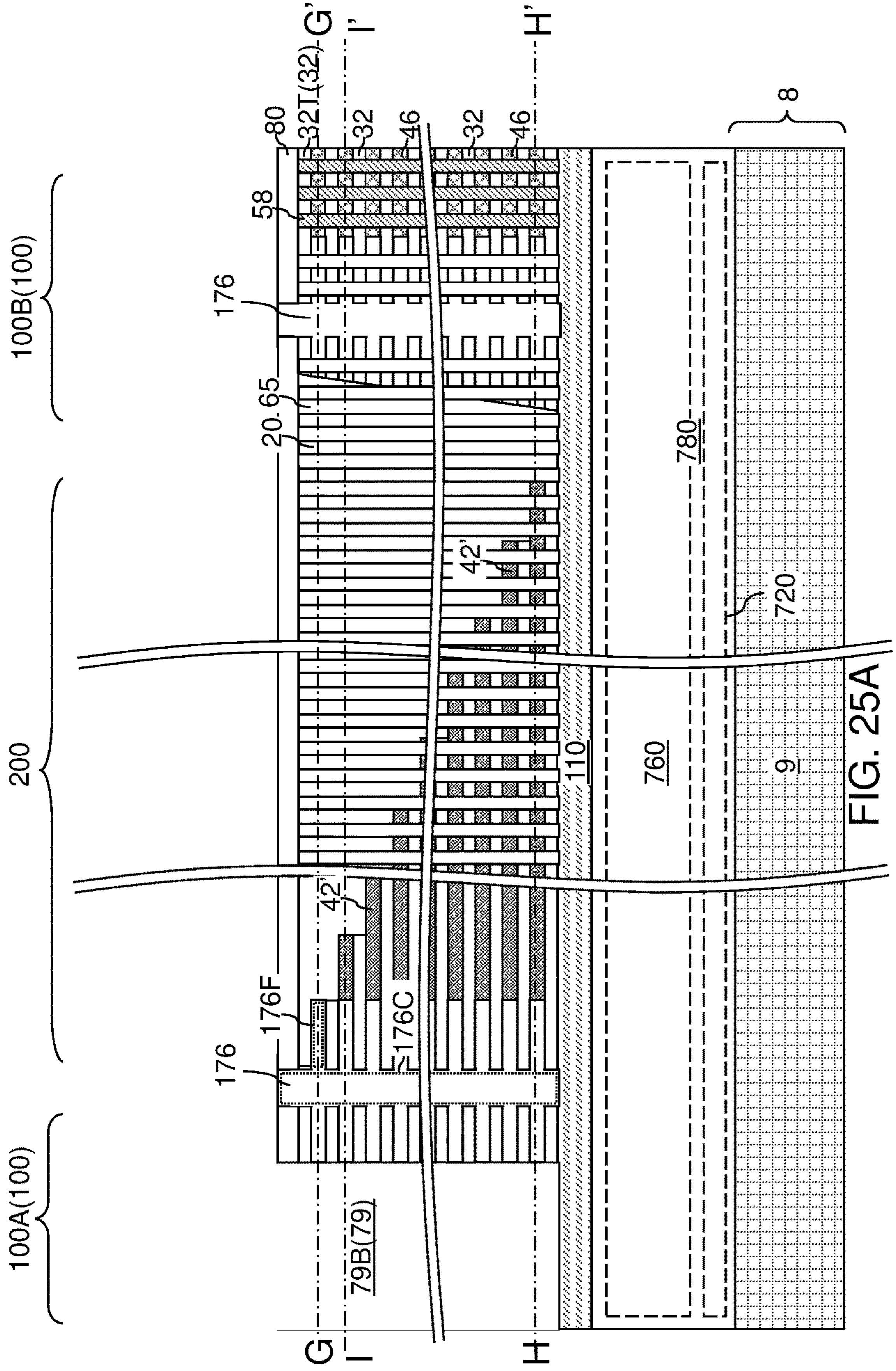
FIG. 25A is a vertical cross-sectional view of the second exemplary structure after formation of electrically conductive layers according to the second embodiment of the present disclosure.
Figure 25B:
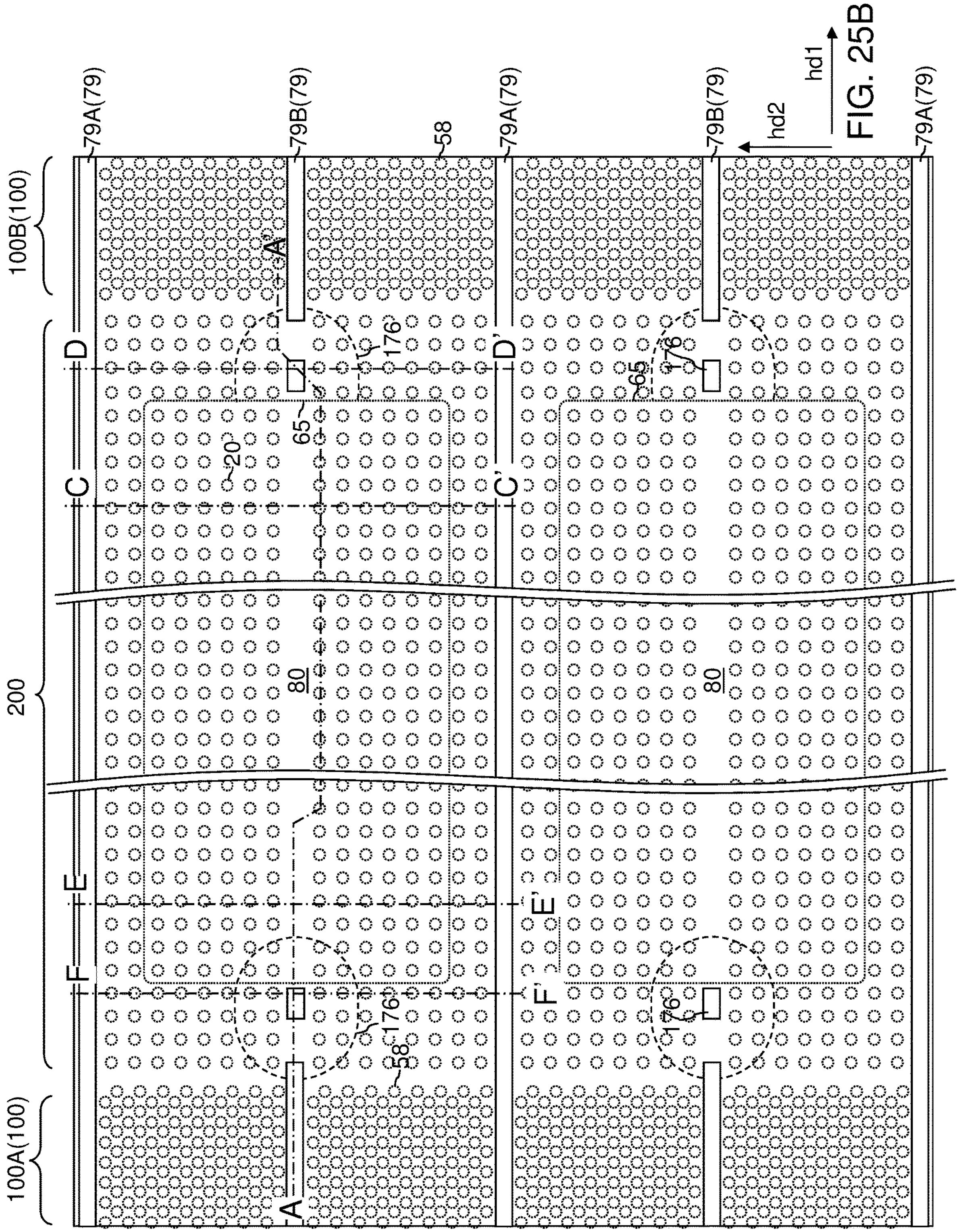
FIG. 25B is a top-down cross-sectional view of the second exemplary structure of FIG. 25A. The vertical plane A-A' is the cut plane of the vertical cross-sectional view of FIG. 25A.
Figure 25C:
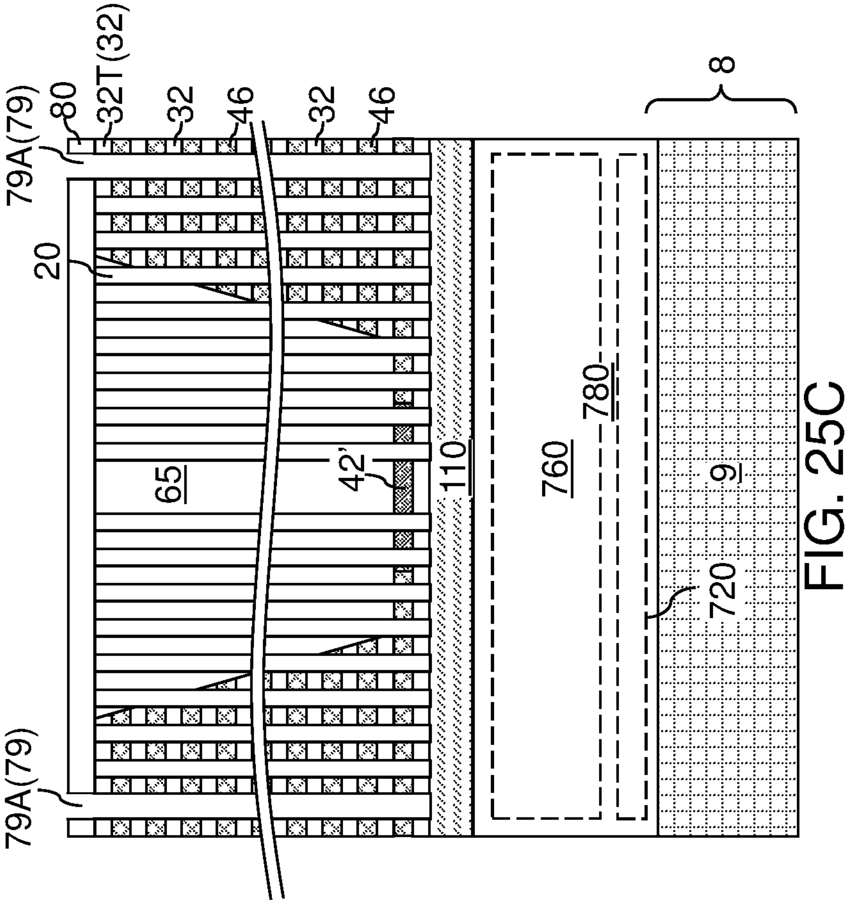
FIG. 25C is a vertical cross-sectional view of the second exemplary structure along the vertical plane C-C' of FIG. 25B.
Figure 25D:
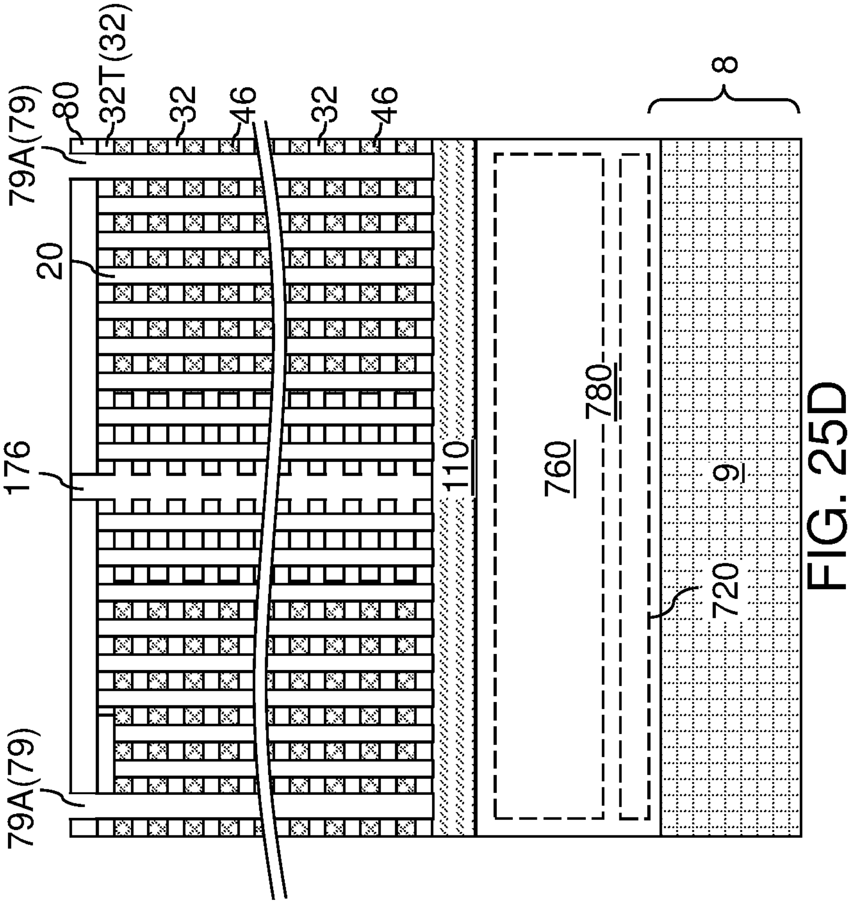
FIG. 25D is a vertical cross-sectional view of the second exemplary structure along the vertical plane D-D' of FIG. 25B.
Figure 25E:
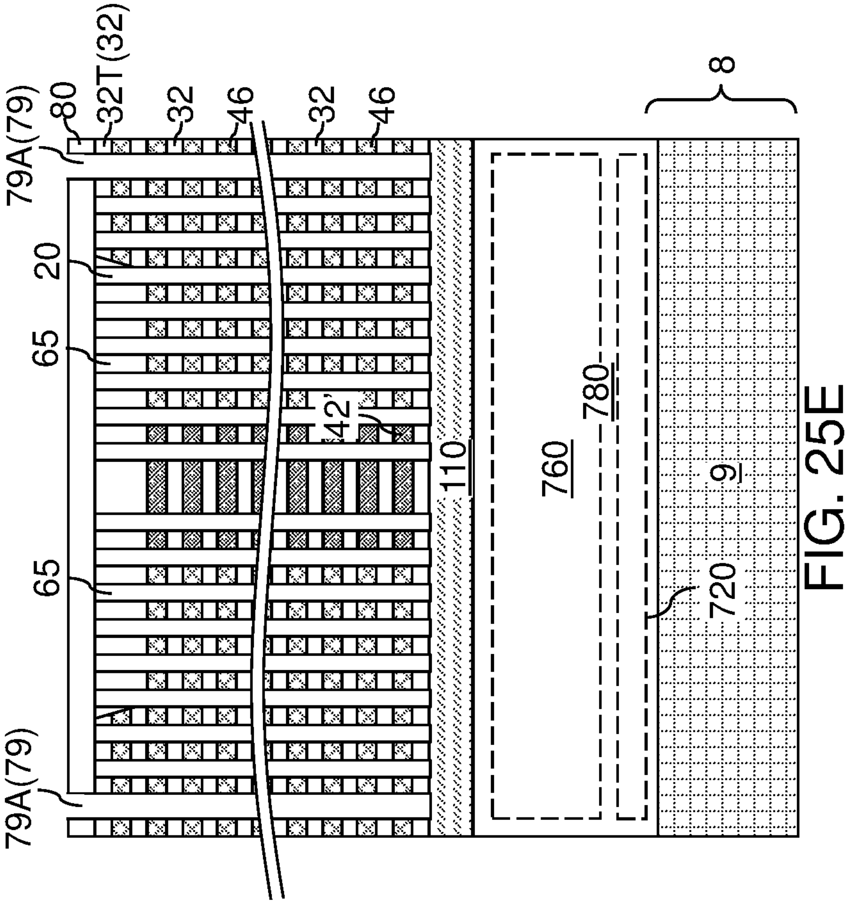
FIG. 25E is a vertical cross-sectional view of the second exemplary structure along the vertical plane E-E' of FIG. 25B.
Figure 25F:
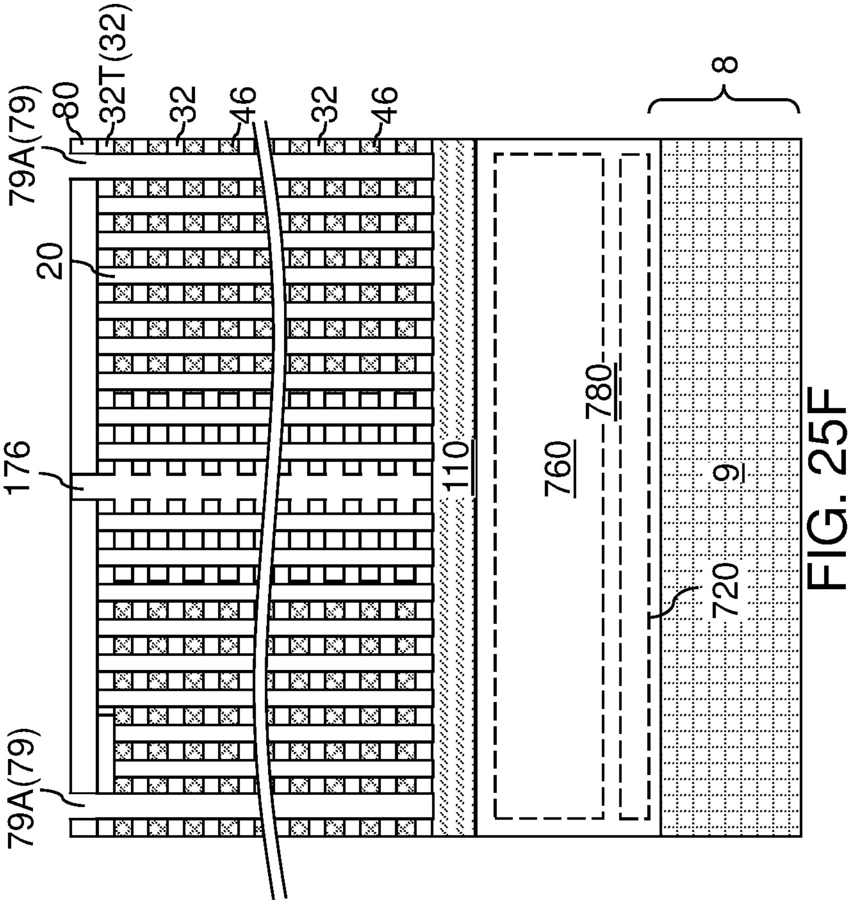
FIG. 25F is a vertical cross-sectional view of the second exemplary structure along the vertical plane F-F' of FIG. 25B.
Figure 25G:
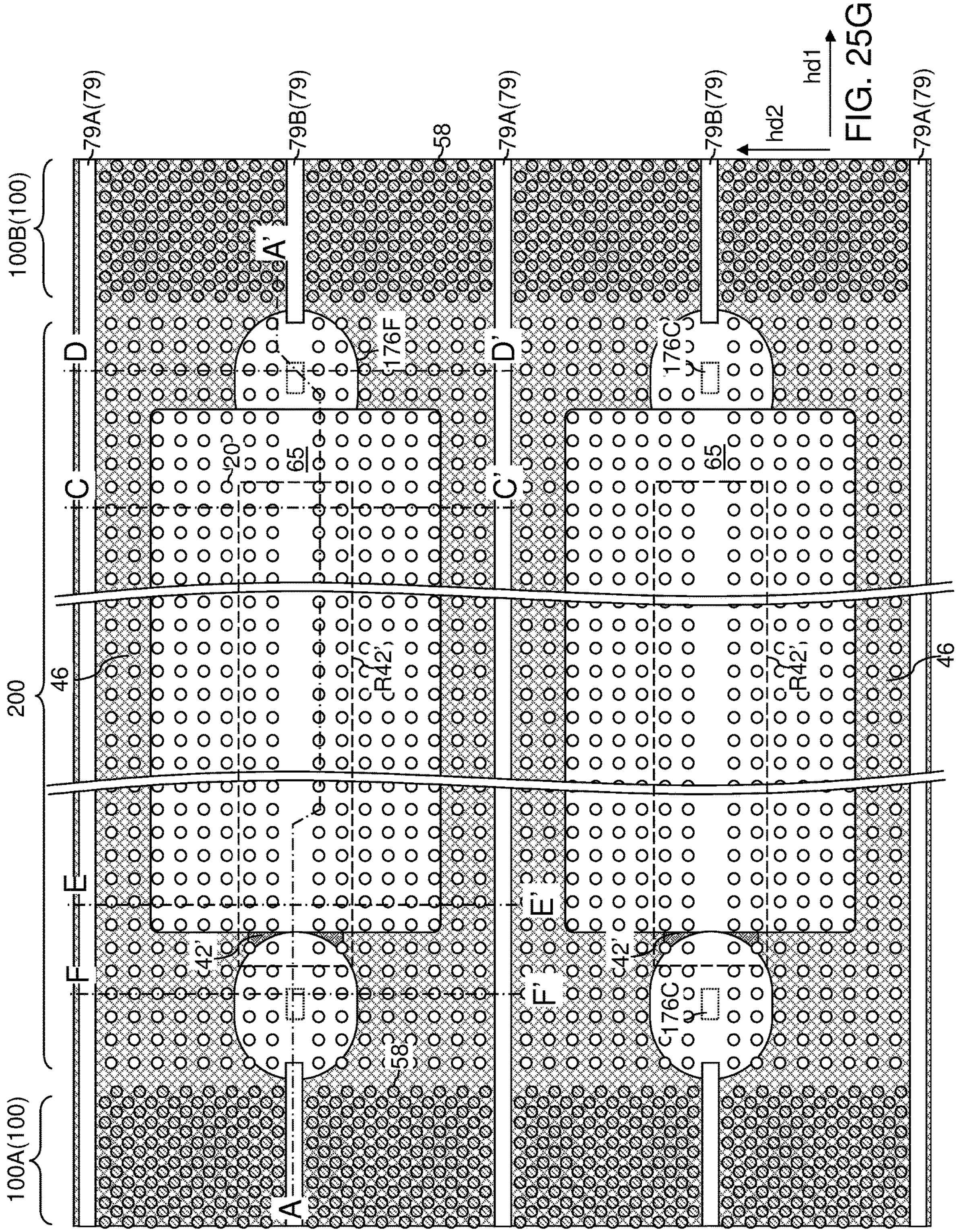
FIG. 25G is a horizontal cross-sectional view of the second exemplary structure along the horizontal plane G-G' of FIG. 25A.
Figure 25H:
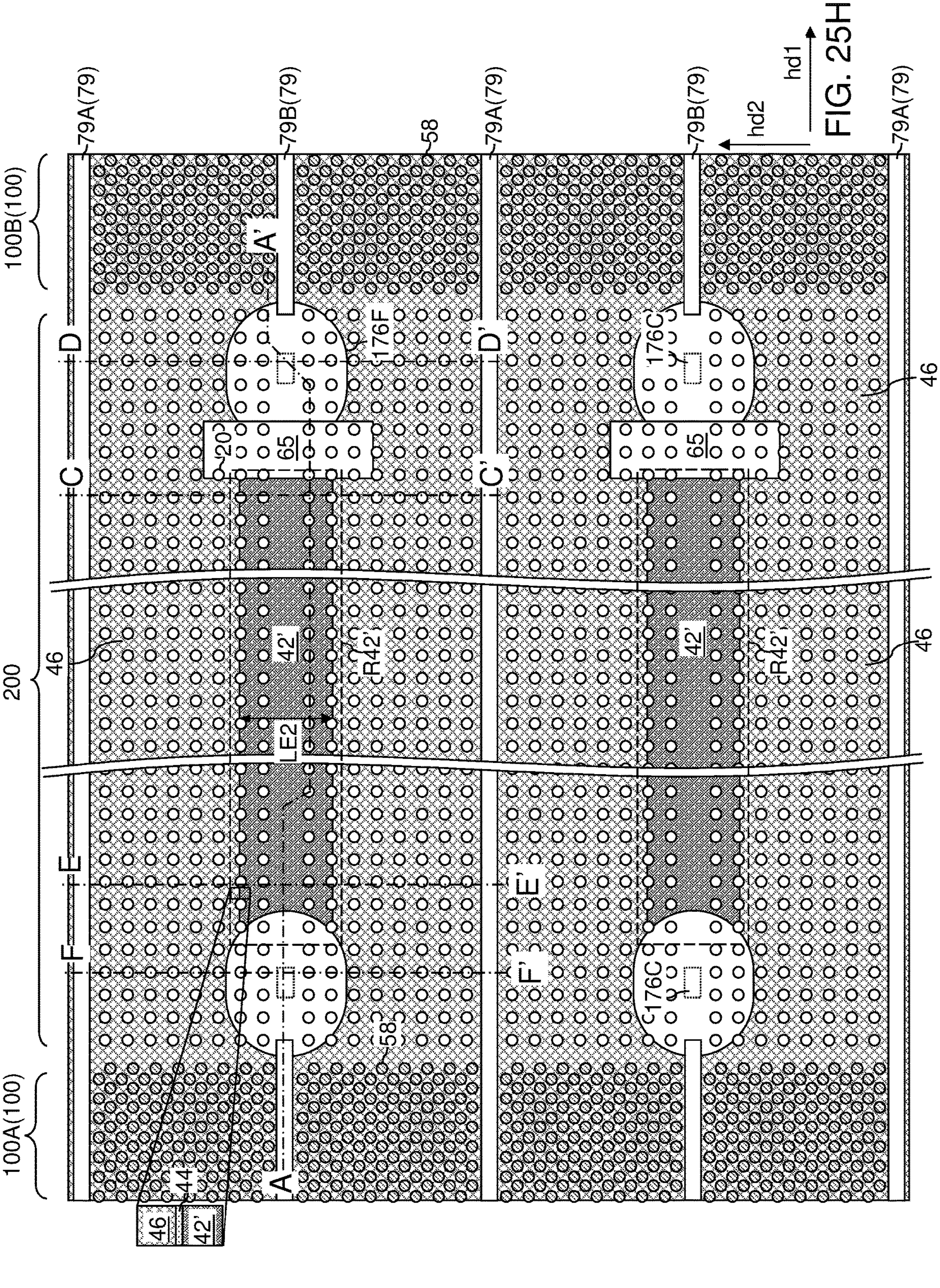
FIG. 25H is a horizontal cross-sectional view of the second exemplary structure along the horizontal plane H-H' of FIG. 25A.
Figure 25I:
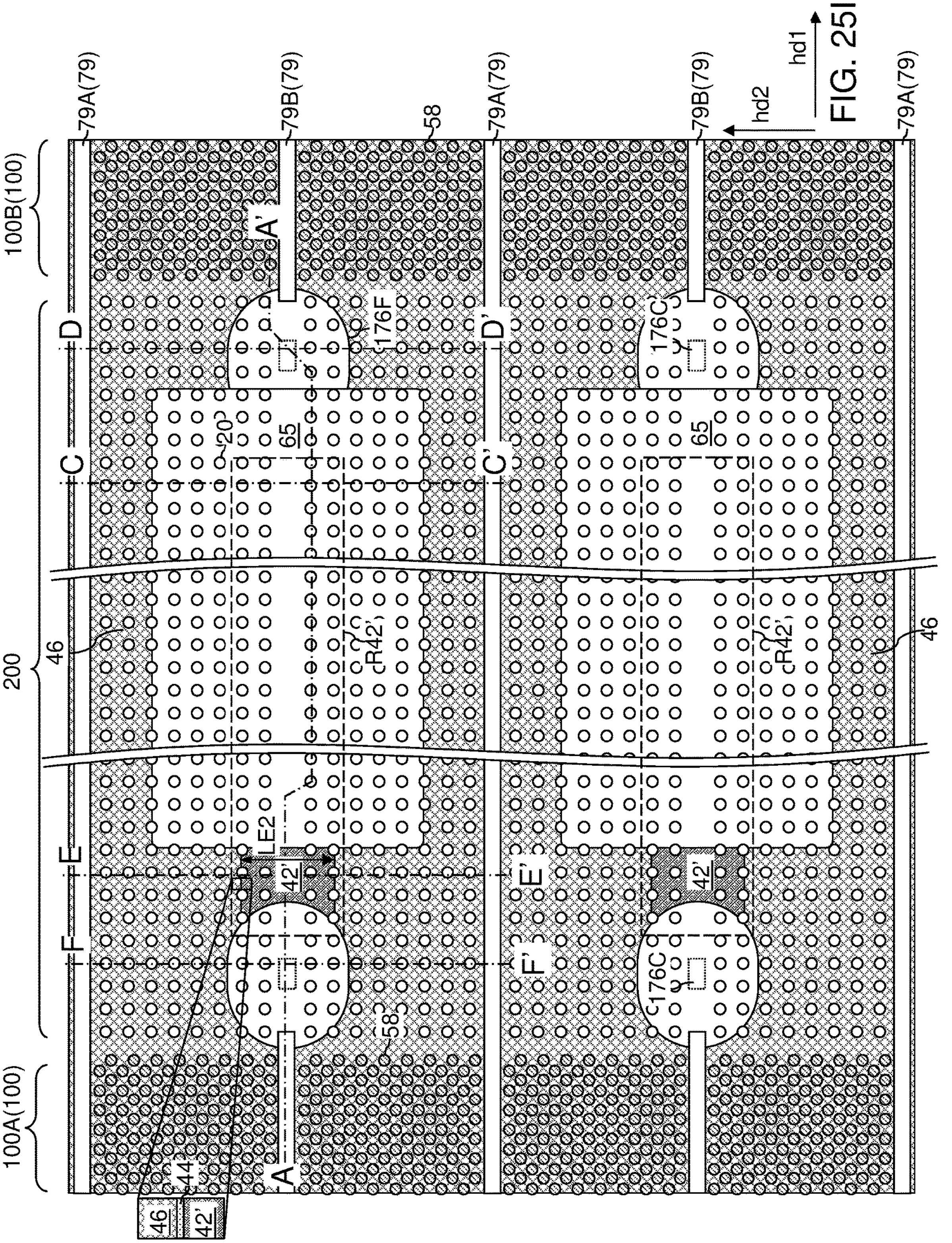
FIG. 25I is a horizontal cross-sectional view of the second exemplary structure along the horizontal plane I-I' of FIG. 25A.

In one embodiment shown in FIG. 24H, one or more dielectric material plates 42' within a vertical stack of dielectric material plates 42' may comprise a concave sidewall segment 42C located at a same level as a respective laterally-extending cavity 43. A dielectric material plate region R42' can be formed between each pair of second-type lateral isolation trenches 79B that are laterally spaced apart from each other along the first horizontal direction hd1.

In one embodiment shown in FIG. 24H, each interface between the pair of finned insulating support structures 176 and the vertical stack of dielectric material plates 42' comprises a respective convex sidewall segment of the insulating fins 176F in contact with a respective concave sidewall segment 42C of the vertical stack of dielectric material plates 42'. In one embodiment, each interface between the pair finned insulating support structures 176 and the retro-stepped dielectric material portion 65 comprise a respective planar sidewall segment of the insulating fins 176F in contact with a respective planar sidewall segment 65P of the retro-stepped dielectric material portion 65.

Referring to FIGS. 25A-25I, a backside blocking dielectric layer 44 may be optionally deposited in the laterally-extending cavities 43 on the physically exposed surfaces of the retro-stepped dielectric material portions 65, the dielectric material plates 42', and the insulating layers 32 by a conformal deposition process. The backside blocking dielectric layer 44 comprises a dielectric material, such as a dielectric metal oxide (e.g., aluminum oxide) and/or silicon oxide. The thickness of the backside blocking dielectric layer 44 may be in a range from 3 nm to 12 nm, although lesser and greater thicknesses may also be employed.

At least one conductive material can be deposited in unfilled volumes of the laterally-extending cavities 43 by providing at least one reactant gas into the laterally-extending cavities 43 through the lateral isolation trenches 79. For example, the at least one conductive material may comprise a metallic barrier layer and a metallic fill material. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material can be deposited over the metallic barrier layer to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory opening fill structures 58 by the metallic barrier layer, which is a metallic barrier layer that blocks diffusion of fluorine atoms therethrough.

A plurality of electrically conductive layers 46 can be formed in the plurality of laterally-extending cavities 43, and a continuous metallic material layer can be formed on the sidewalls of each lateral isolation trench 79 and over the contact-level dielectric layer 80. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the lateral isolation trenches 79 or above the contact-level dielectric layer 80.

The deposited metallic material of the continuous electrically conductive material layer is etched back from the sidewalls of each lateral isolation trench 79 and from above the contact-level dielectric layer 80 by performing an etch process that etches the at least one conductive material of the continuous electrically conductive material layer. Each remaining portion of the deposited metallic material in the laterally-extending cavities 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting. i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Generally, portions of the sacrificial material layers 42 are replaced with vertical stacks of electrically conductive layers 46. In one embodiment, each vertical stack of electrically conductive layers 46 is formed between and does not laterally extend along the second horizontal direction hd2 farther than a most proximal first-type lateral isolation trench 79A and a most proximal pair of second-type lateral isolation trenches 79B.

In one embodiment, the insulating layers 32 can be vertically spaced apart from each other, and can extend continuously between a pair of first-type lateral isolation trenches 79A. For each vertical stack of insulating layers 32 that laterally extend between a neighboring pair of first-type lateral isolation trenches 79A, a vertical stack of first electrically conductive layers 46 can be located on a first side a vertical stack of dielectric material plates 42' and can be interlaced with the vertical stack of insulating layers 32, and a vertical stack of second electrically conductive layers 46 can be located on a second side of the vertical stack of dielectric material plates 42' and can be interlaced with the vertical stack of insulating layers 32.

Each finned insulating support structures 176 includes a respective vertically-extending insulating core 176C that vertically extends through each layer within the first alternating stack (32, 46) and the second alternating stack (32, 46), and further includes a respective vertical stack of insulating fins 176F that laterally extend outward from the respective vertically-extending insulating core 176C.

Figure 26A:
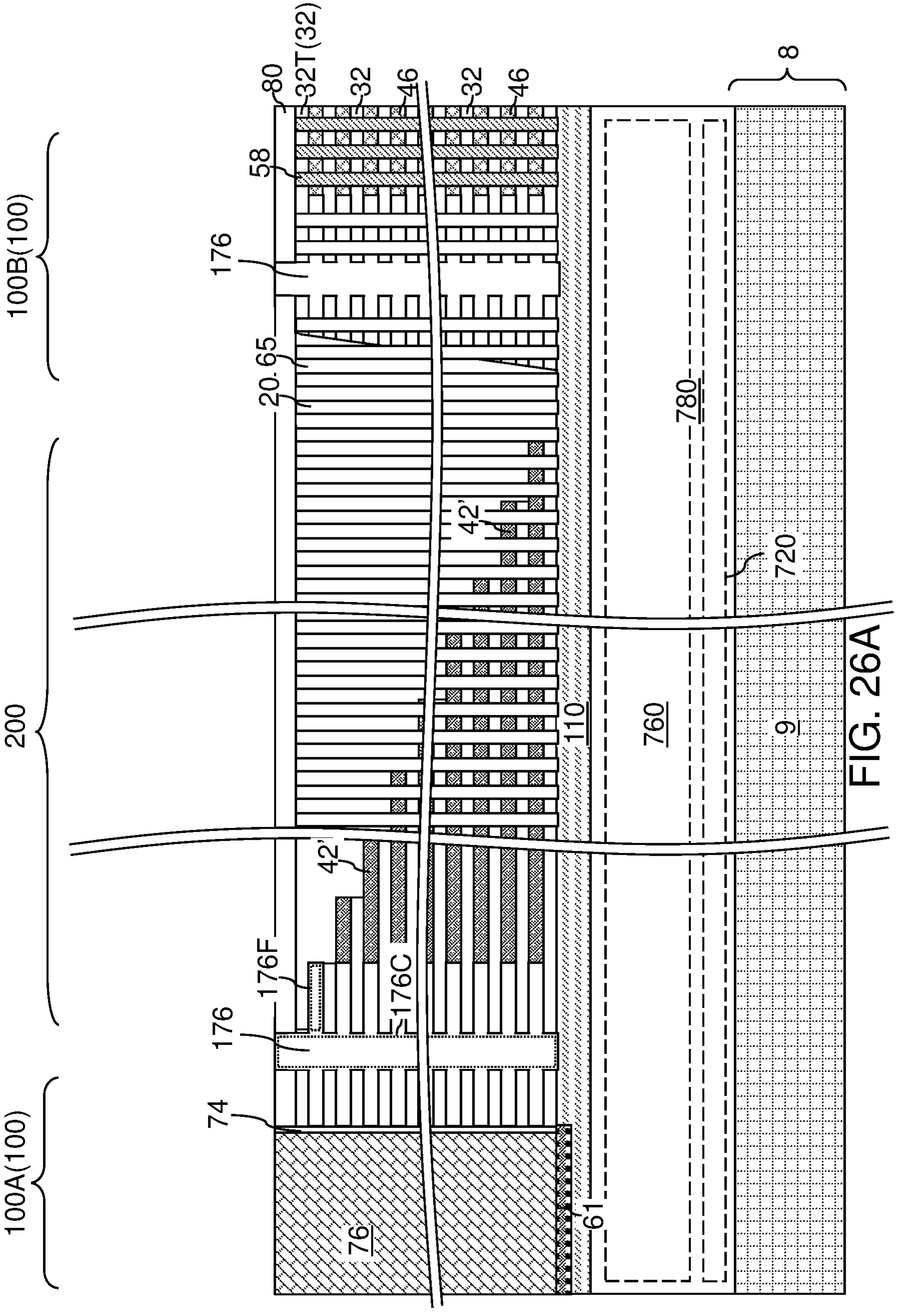
FIG. 26A is a vertical cross-sectional view of the second exemplary structure after formation of lateral isolation trench fill structures according to the second embodiment of the present disclosure.
Figure 26B:
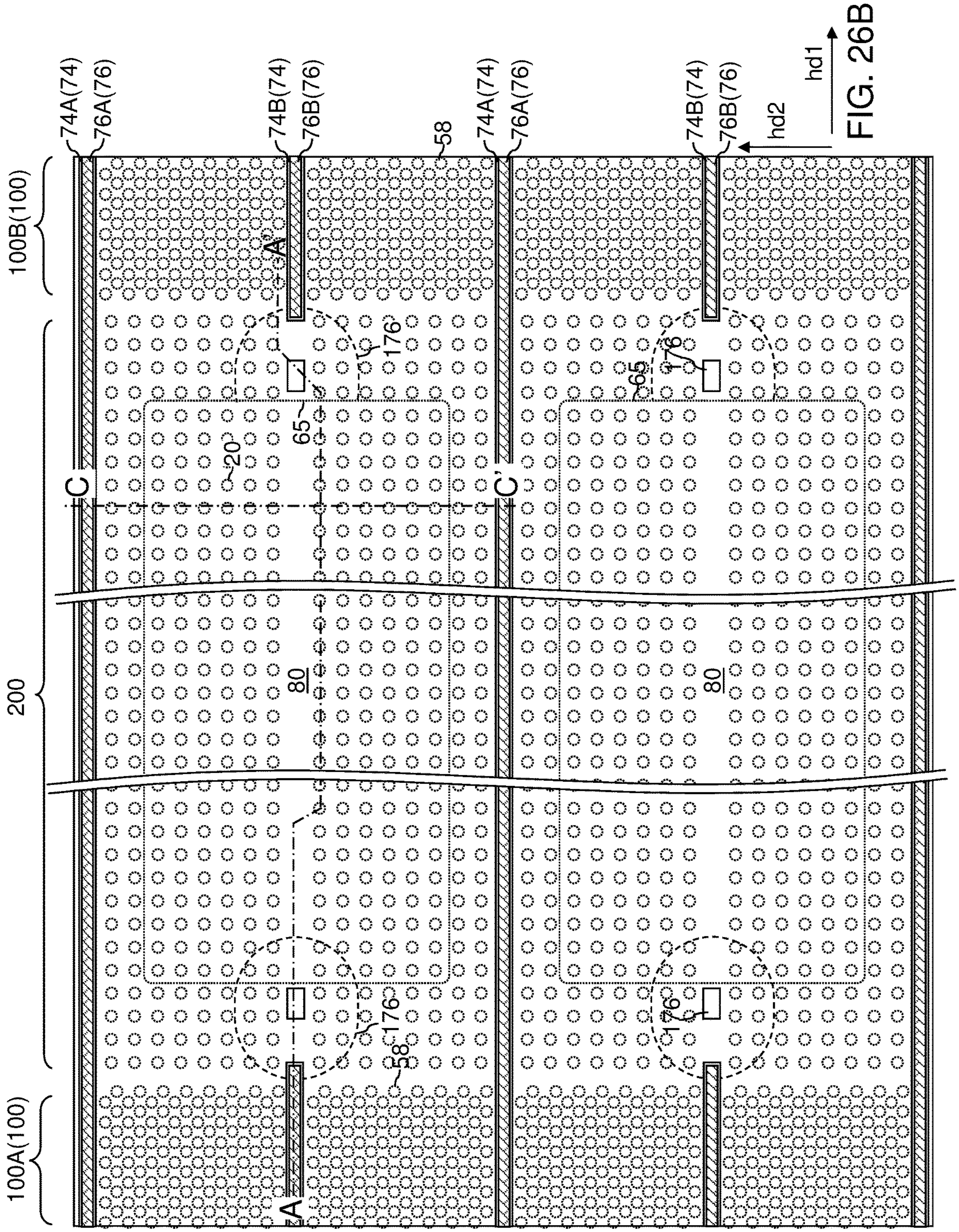
FIG. 26B is a top-down cross-sectional view of the second exemplary structure of FIG. 26A. The vertical plane A-A' is the cut plane of the vertical cross-sectional view of FIG. 26A.
Figure 26C:
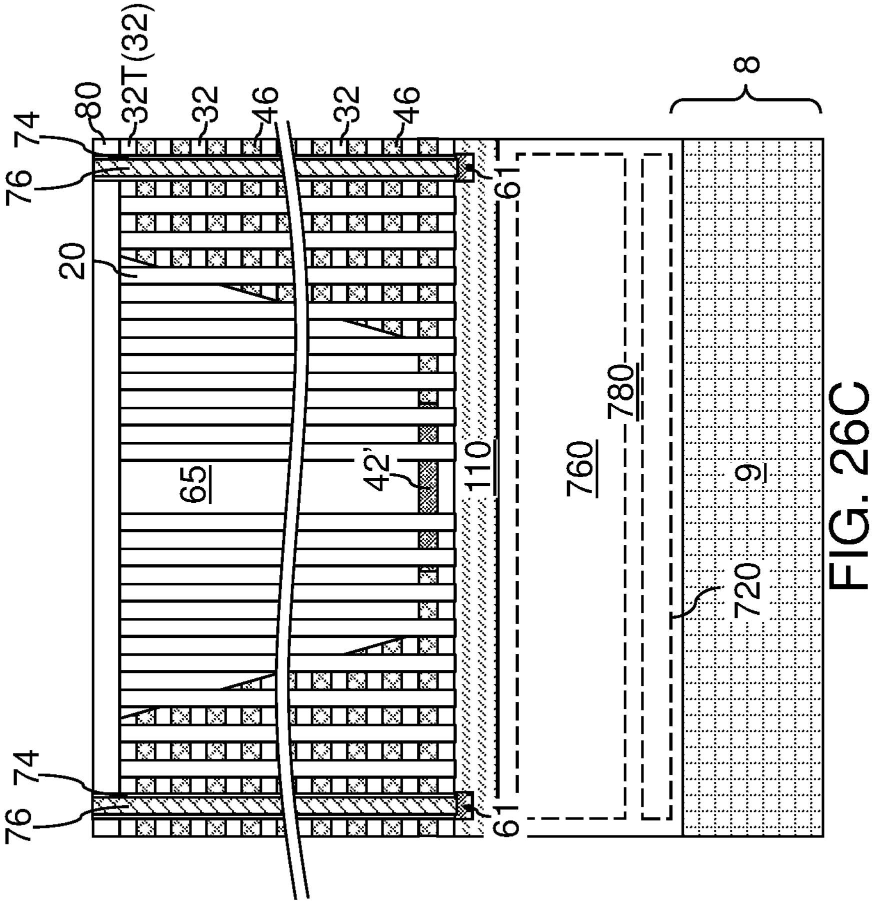
FIG. 26C is a vertical cross-sectional view of the second exemplary structure along the vertical plane C-C' of FIG. 26B.
Figure 27A:
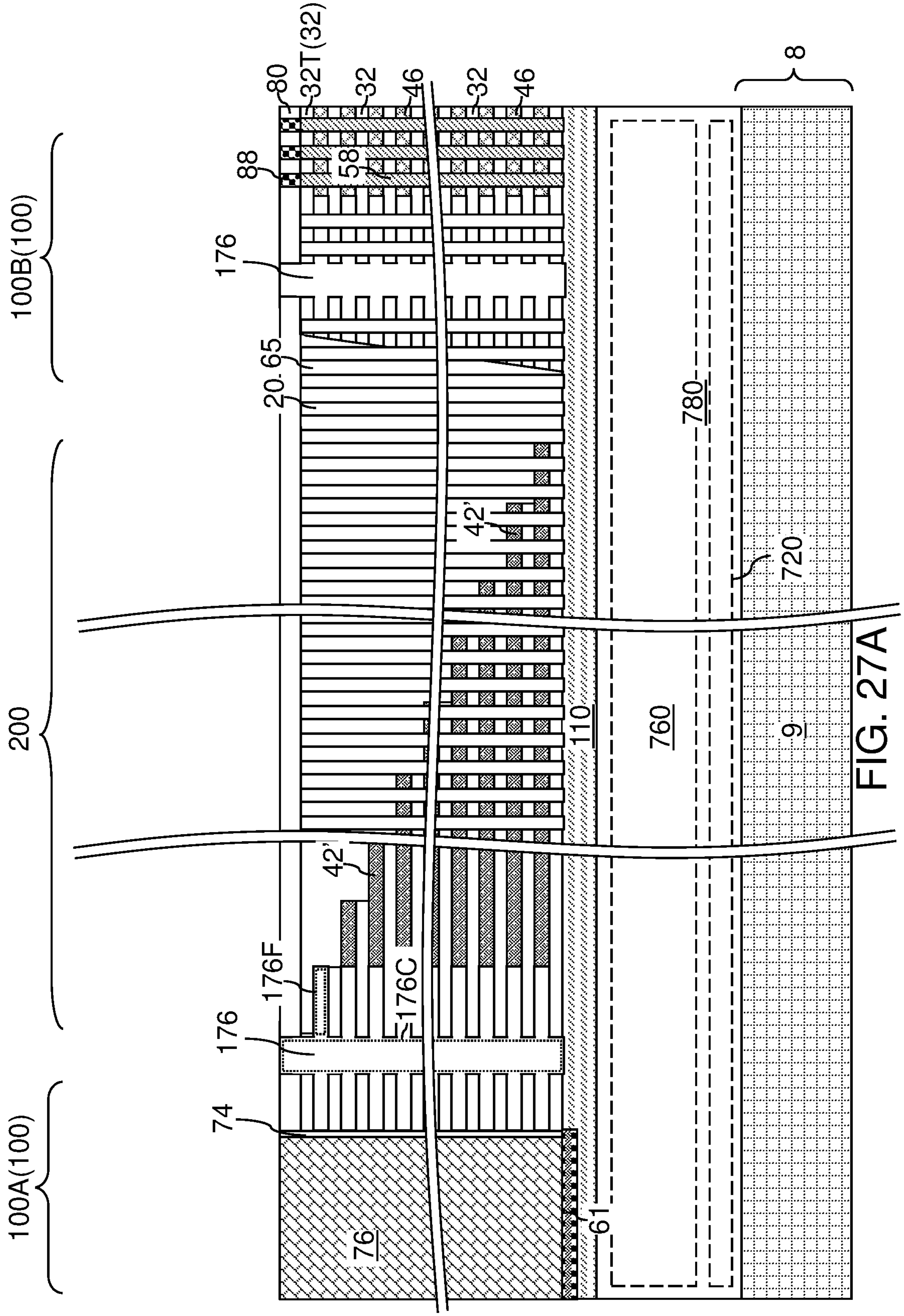
FIG. 27A is a vertical cross-sectional view of the second exemplary structure after formation of contact via structures according to the second embodiment of the present disclosure.
Figure 27B:
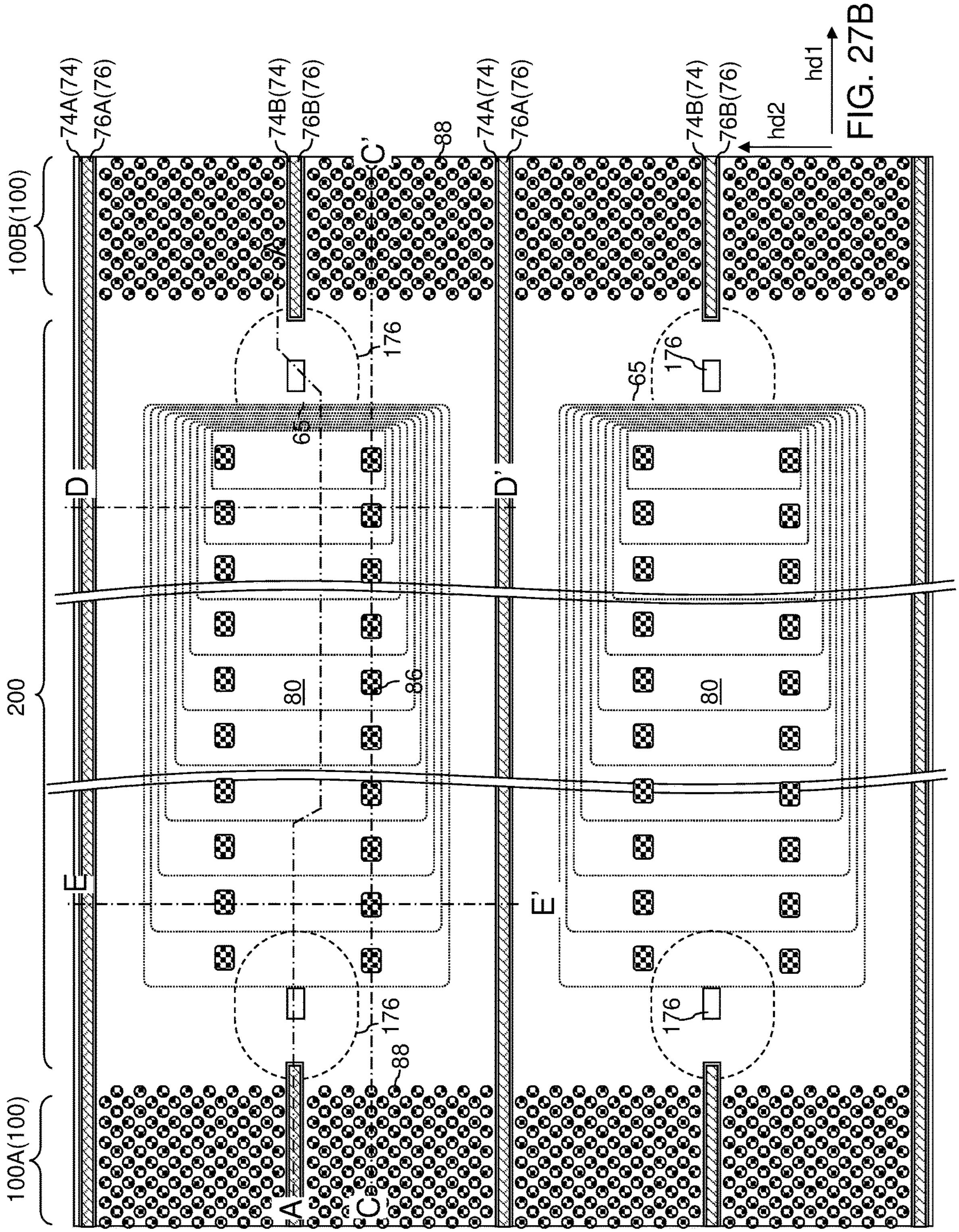
FIG. 27B is a top-down cross-sectional view of the second exemplary structure of FIG. 27A. The vertical plane A-A' is the cut plane of the vertical cross-sectional view of FIG. 27A.
Figure 27C:
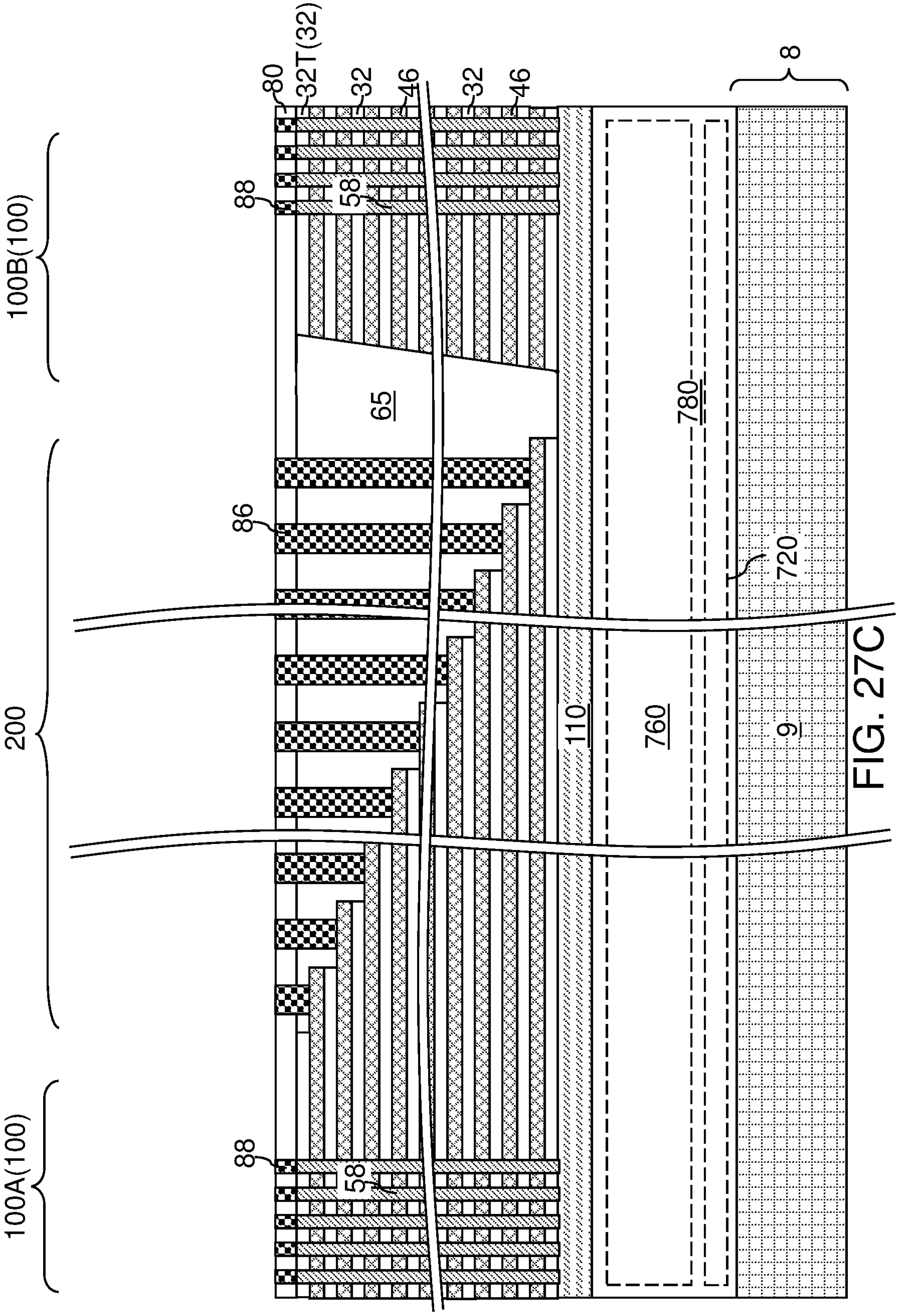
FIG. 27C is a vertical cross-sectional view of the second exemplary structure along the vertical plane C-C' of FIG. 27B.
Figure 27D:
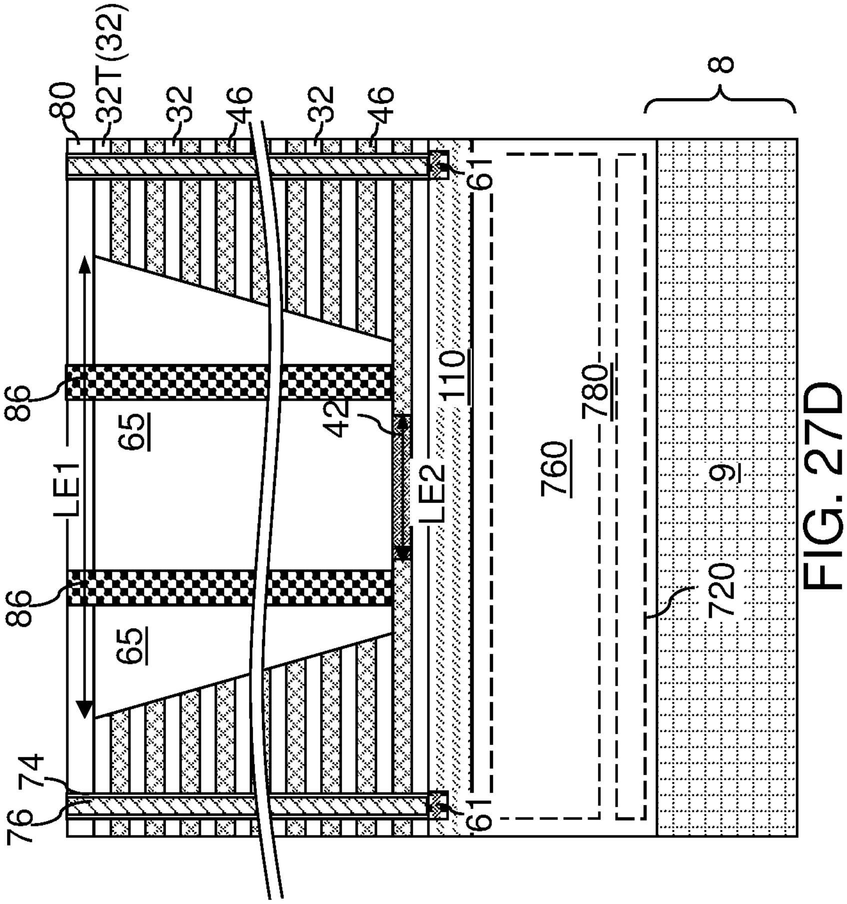
FIG. 27D is a vertical cross-sectional view of the second exemplary structure along the vertical plane D-D' of FIG. 27B.
Figure 27E:
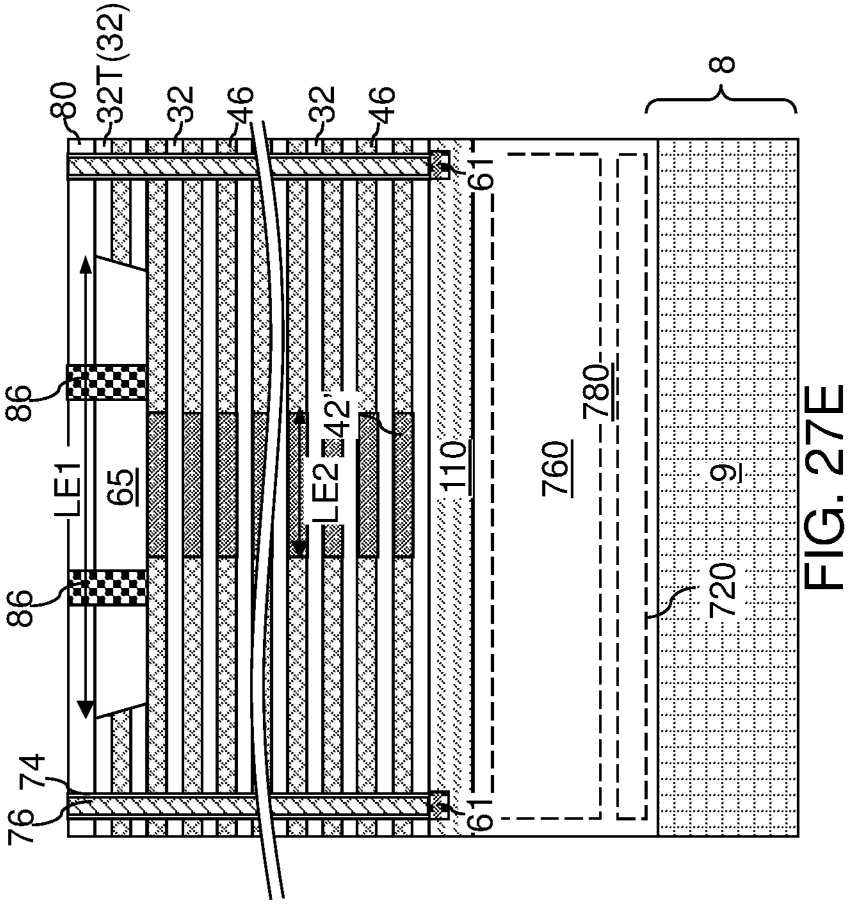
FIG. 27E is a vertical cross-sectional view of the second exemplary structure along the vertical plane E-E' of FIG. 27B.

Referring to FIGS. 26A-26C, the processing steps described with reference to FIGS. 16A and 16B can be performed to form source regions 61 underneath the lateral isolation trenches 79, and to fill the lateral isolation trenches 79 with lateral isolation trench fill structures (74, 76). The lateral isolation trench fill structures (74, 76) may comprise first lateral isolation trench fill structures (74A, 76A) that fill the first lateral isolation trenches 79A, and second-type lateral isolation trench fill structures (74B, 76B) that fill the second-type lateral isolation trenches 79B.

Insulating layers 32 can be vertically spaced apart from each other, and can be located over a substrate 8 between a first first-type lateral isolation trench fill structure (74A, 76A) and a second first-type lateral isolation trench fill structure (74A, 76A) that laterally extend along a first horizontal direction hd1 and laterally spaced apart from each other along a second horizontal direction hd2. First electrically conductive layers 46 can be vertically interlaced with the insulating layers 32, and can contact the first first-type lateral isolation trench fill structure (74A, 76A). Second electrically conductive layers 46 can be vertically interlaced with the insulating layers 32, and can contact the second first-type lateral isolation trench fill structure (74A, 76A).

A composite dielectric isolation structure {65, 42', 176, 74B} can be formed between, and can provide electrical isolation between, a vertical stack of first electrically conductive layers 46 and a vertical stack of second electrically conductive layers 46 located between a neighboring pair of first lateral isolation trench fill structures (74A, 76A). In one embodiment, the composite dielectric isolation structure comprises a retro-stepped dielectric material portion 65 having a first lateral extent LE1 along the second horizontal direction hd2, and a pair of finned insulating support structures 176 each including a respective vertically-extending insulating core 176C that vertically extends through each layer within the first alternating stack (32, 46) and the second alternating stack (32, 46) and each further including a respective vertical stack of insulating fins 176F that laterally extend outward from the respective vertically-extending insulating core 176C.

In one embodiment, the composite dielectric isolation structure further comprises a pair of second-type lateral isolation trench fill structures (74B, 76B) that are laterally spaced apart along the first horizontal direction hd1. In one embodiment, each second-type lateral isolation trench fill structure (74B, 76B) of the pair of second-type lateral isolation trench fill structures (74B, 76B) is in direct contact with a respective one of the pair of finned insulating support structures 176. In one embodiment, the retro-stepped dielectric material portion 65 is laterally spaced apart from the pair of second-type lateral isolation trench fill structures (74B, 76B) by the pair of finned insulating support structures 176.

Referring to FIGS. 27A-27E, a photoresist layer can be applied over the contact-level dielectric layer 80, and can be lithographically patterned to form openings over areas of the memory opening fill structures 58 and horizontally-extending portions of the electrically conductive layers 46 that underlie the stepped bottom surfaces of the retro-stepped dielectric material portions 65. An anisotropic etch process can be performed to form drain contact via cavities over the drain regions 63 of the memory opening fill structures 58, and to form layer contact via cavities over the horizontally-extending surfaces of the electrically conductive layers 46 underlying the retro-stepped dielectric material portions 65. At least one conductive material can be deposited in the drain contact via cavities to form drain contact via structures 88, and can be deposited in the layer contact via cavities to form layer contact via structures 86.

Referring to FIGS. 1-8B and 20A-27E and according to the second embodiment of the present disclosure, a three-dimensional memory device is provided, which comprises: insulating layers 32 that are vertically spaced apart from each other and that continuously laterally extend between a first first-type lateral isolation trench fill structure (74A, 76A) and a second first-type lateral isolation trench fill structure (74A, 76A) that laterally extend along a first horizontal direction hd1 and laterally spaced apart from each other along a second horizontal direction hd2; first electrically conductive layers 46 vertically interlaced with the insulating layers 32 and contacting the first first-type lateral isolation trench fill structure (74A, 76A); second electrically conductive layers 46 vertically interlaced with the insulating layers 32 and contact the second first-type lateral isolation trench fill structure (74A, 76A); and a composite dielectric isolation structure {65, 42', 176, 74B} located between the first electrically conductive layers 46 and the second electrically conductive layers 46, wherein the composite dielectric isolation structure comprises a retro-stepped dielectric material portion 65, and a pair of finned insulating support structures 176 each including a respective vertically-extending insulating core 176C and a respective vertical stack of insulating fins 176F that laterally extend outward from the respective vertically-extending insulating core 176C.

In one embodiment, the composite dielectric isolation structure {65, 42', 176, (74B, 76B)} further comprises a pair of second-type lateral isolation trench fill structures (74B, 76B) that are laterally spaced apart along the first horizontal direction hd1. In one embodiment, each second-type lateral isolation trench fill structure (74B, 76B) of the pair of second-type lateral isolation trench fill structures (74B, 76B) is in direct contact with a respective one of the pair of finned insulating support structures 176. In one embodiment, the retro-stepped dielectric material portion 65 is laterally spaced apart from the pair of second-type lateral isolation trench fill structures (74B. 76B) by the pair of finned insulating support structures 176. In one embodiment, the vertically-extending insulating core 176C vertically extends through each layer within the first and the second alternating stacks (32, 46).

In one embodiment, the retro-stepped dielectric material portion 65 has a first lateral extent LE1 along the second horizontal direction hd2; and the composite dielectric isolation structure {65, 42', 176, 74B} further comprises a vertical stack of dielectric material plates 42' each having a second lateral extent LE2 along the second horizontal direction hd2 that is less than the first lateral extent LE1. In one embodiment, the dielectric material plates 42' within the vertical stack of dielectric material plates 42' have lateral extents along the first horizontal direction hd1 that decrease with a vertical distance from the substrate 8. In one embodiment, each dielectric material plate 42' within the vertical stack of dielectric material plates 42' has a respective sidewall that is parallel to the second horizontal direction hd2 and contacts a respective vertical sidewall segment of the retro-stepped dielectric material portion 65.

In one embodiment, each interface between the pair of finned insulating support structures 176 and the vertical stack of dielectric material plates 42' comprises a respective convex sidewall segment of the insulating fins 176F in contact with a respective concave sidewall segment of the vertical stack of dielectric material plates 42'; and each interface between the pair finned insulating support structures 176 and the retro-stepped dielectric material portion 65 comprise a respective planar sidewall segment of the insulating fins 176F in contact with a respective planar sidewall segment of the retro-stepped dielectric material portion 65.

Figure 28A:
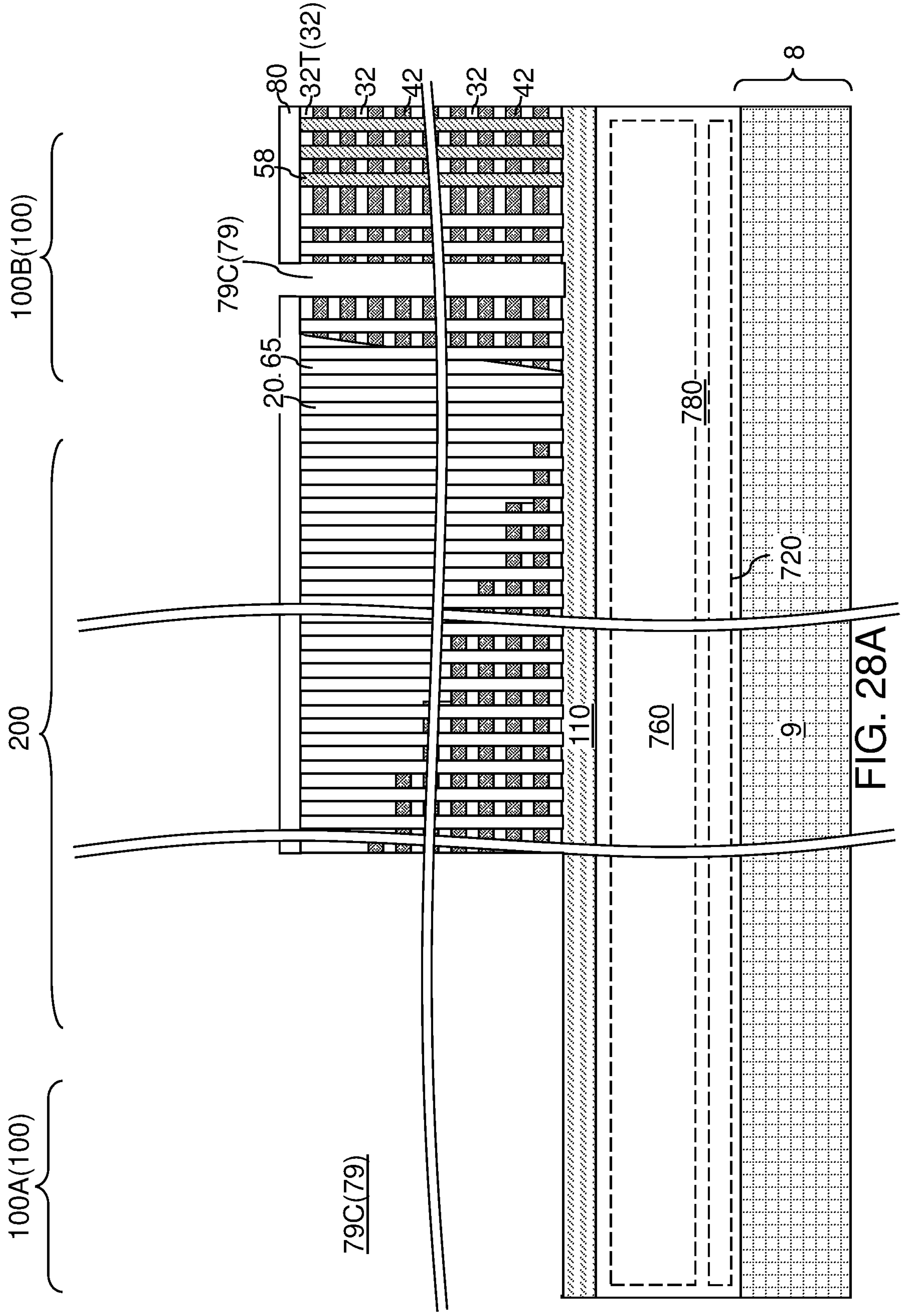
FIG. 28A is a vertical cross-sectional view of a third exemplary structure after formation of lateral isolation trenches according to the third embodiment of the present disclosure.
Figure 28B:
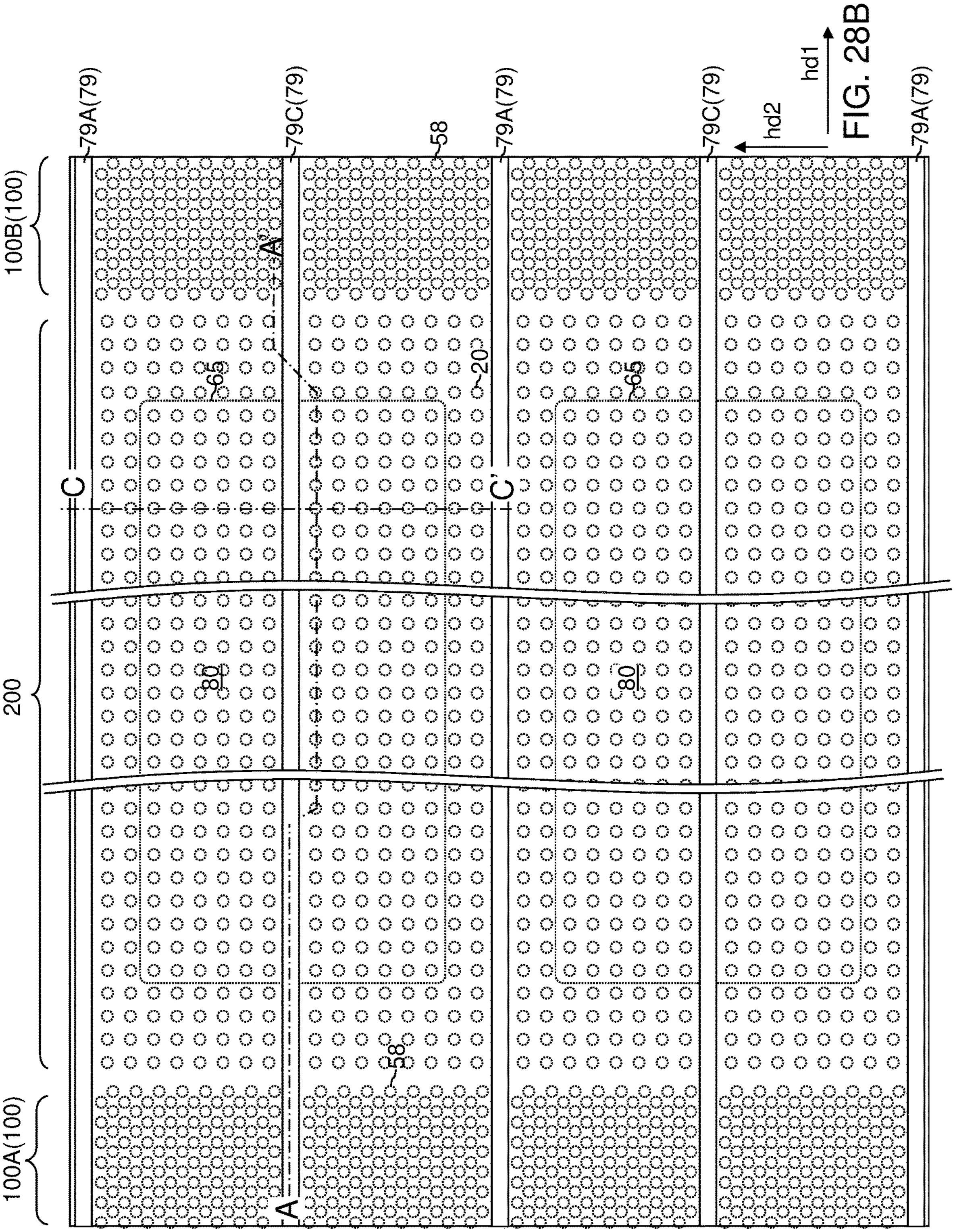
FIG. 28B is a top-down cross-sectional view of the third exemplary structure of FIG. 28A. The vertical plane A-A' is the cut plane of the vertical cross-sectional view of FIG. 28A.
Figure 28C:
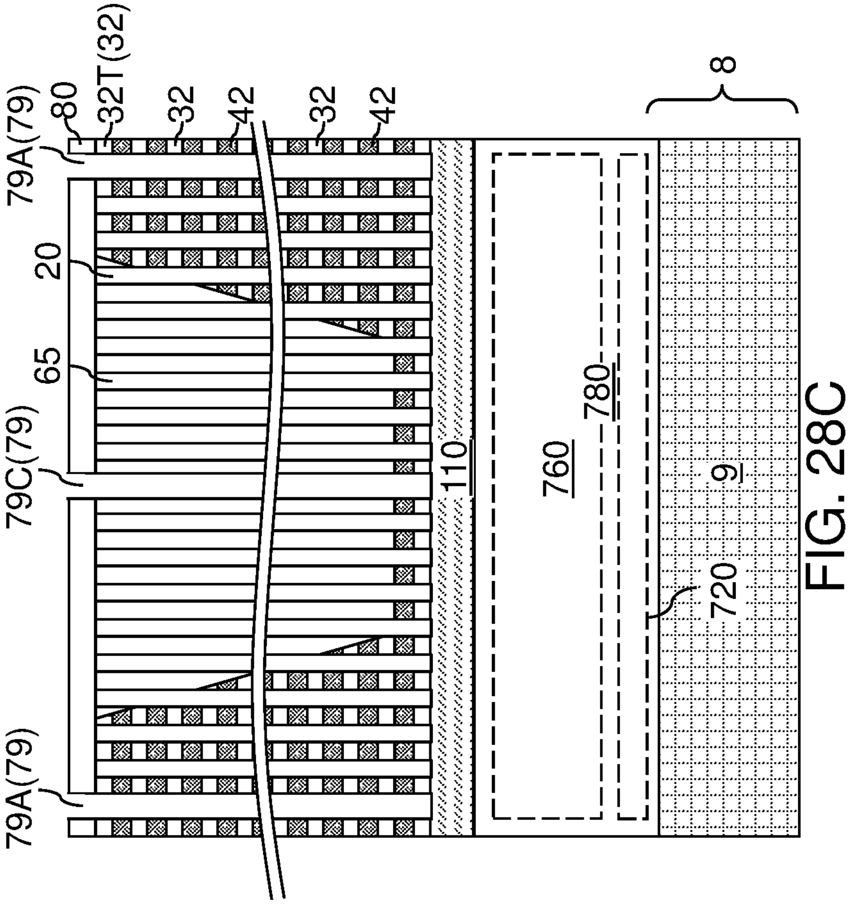
FIG. 28C is a vertical cross-sectional view of the third exemplary structure along the vertical plane C-C' of FIG. 28B.

Referring to FIGS. 28A-28C, a third exemplary structure according to a third embodiment of the present disclosure can be derived from the first exemplary structure illustrated in FIGS. 9A-9C by changing the pattern of the openings in the photoresist layer prior to performing the anisotropic etch process that forms the lateral isolation trenches 79. Specifically, each pattern for a pair of second-type lateral isolation trenches 79B located between a respective neighboring pair of first-type lateral isolation trenches 79A can be merged with each other by laterally extending the pair of second-type lateral isolation trenches 79B through the contact region 200, thereby forming a second-type lateral isolation trench 79C that laterally extends through the first memory array region 100A, the contact region 200, and the second memory array region 100B.

Each of the lateral isolation trenches 79 laterally extends along the first horizontal direction hd1 through the alternating stack (32, 46). Each first-type lateral isolation trench 79A is formed between a respective neighboring pair of retro-stepped dielectric material portions 65, and does not cut any of the retro-stepped dielectric material portions 65. Each of the second-type lateral isolation trench 79C cuts through a respective one of the retro-stepped dielectric material portions 65 and divides the respective one of the retro-stepped dielectric material portions 65 into a respective pair of retro-stepped dielectric material portions 65, which are spaced from each other along the second horizontal direction hd2. The first-type lateral isolation trenches 79A and second-type lateral isolation trenches 79C are interlaced along the second horizontal direction hd2. The first-type lateral isolation trenches 79A are laterally interlaced with pairs of the retro-stepped dielectric material portions 65 along the second horizontal direction hd2.

The width of the lateral isolation trenches 79 can be greater than the thickness of each sacrificial material layer 42. For example, the ratio of the width of the lateral isolation trenches 79 along the second horizontal direction hd2 to the thickness of each sacrificial material layer 42 may be in a range from 2 to 30, such as from 4 to 15, although lesser and greater ratios may also be employed. According to an aspect of the present disclosure, the first-tier lateral isolation trenches 79A may be formed between neighboring pairs of retro-stepped dielectric material portions 65, and each pair of second-type lateral isolation trenches 79C may cut through a respective one of the retro-stepped dielectric material portions 65.

Generally, lateral isolation trenches 79 laterally extending along the first horizontal direction hd1 can be formed through the contact-level dielectric layer 80 and the alternating stack (32, 42). The alternating stack (32, 42) is divided into multiple alternating stacks (32, 42) that are laterally spaced apart along the second horizontal direction hd2 by the lateral isolation trenches 79. Layer stacks (32, 42, 80) are formed, each of which includes a respective patterned portion of the contact-level dielectric layer 80 and a respective alternating stack (32, 42) and laterally spaced among one another by the lateral isolation trenches 79.

Multiple alternating stacks of insulating layers 32 and sacrificial material layers 42 can be formed over the semiconductor material layer 110. Each alternating stack of insulating layers 32 and sacrificial material layers 42 can be formed between a respective neighboring pair of a first-type lateral isolation trench 79A and a second-type lateral isolation trench 79C. Each of retro-stepped dielectric material portions 65 has a respective first variable lateral extent along the first horizontal direction hd1 that increases stepwise with a vertical distance from the horizontal plane including the bottommost surfaces of the alternating stacks (32, 42). Each of the retro-stepped dielectric material portions 65 has a respective second variable lateral extent along the second horizontal direction hd2 that increases gradually without any step with the vertical distance from the horizontal plane including the bottommost surfaces of the alternating stacks (32, 42).

Figure 29A:
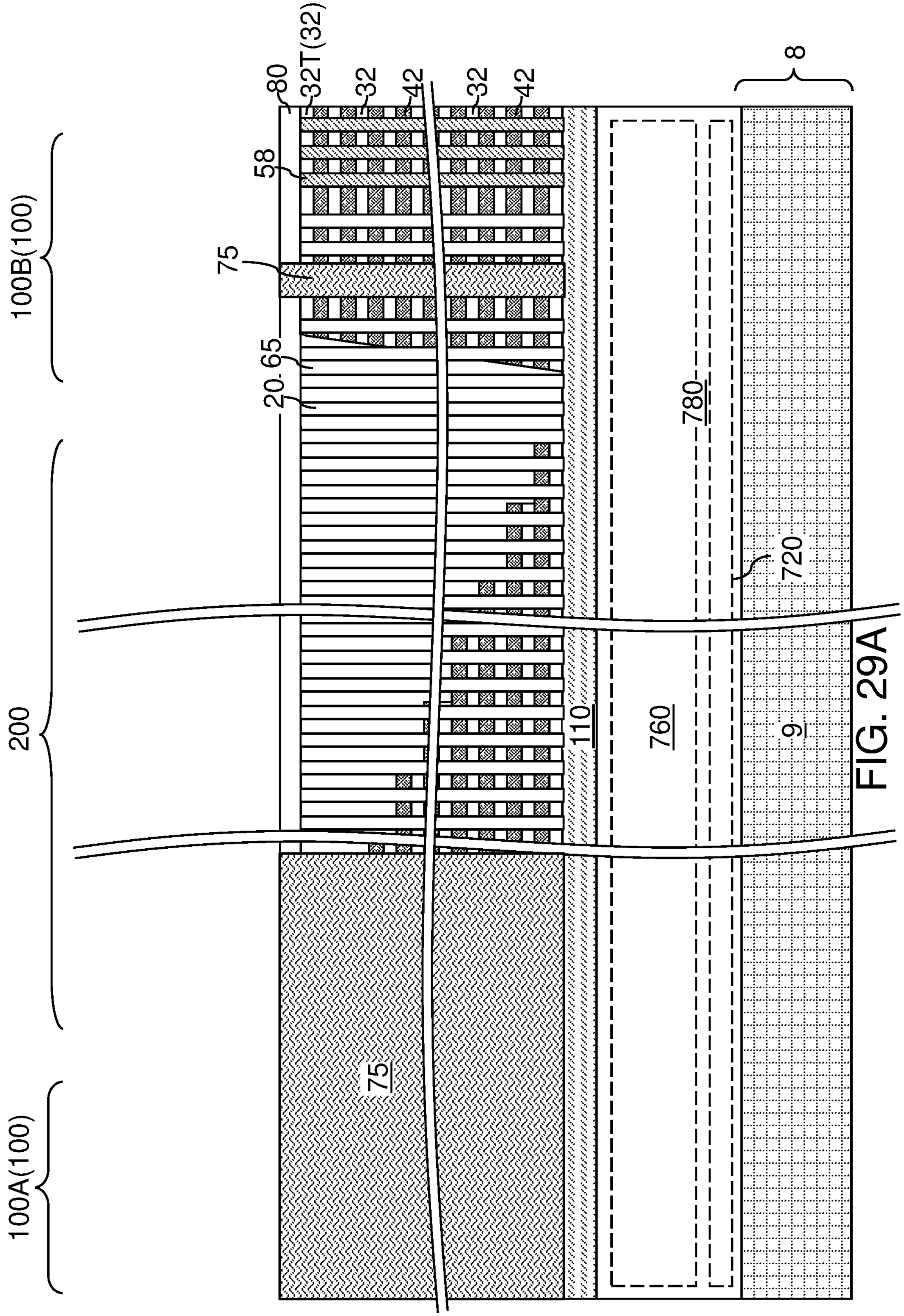
FIG. 29A is a vertical cross-sectional view of the third exemplary structure after formation of sacrificial lateral isolation trench fill structures according to the third embodiment of the present disclosure.
Figure 29B:
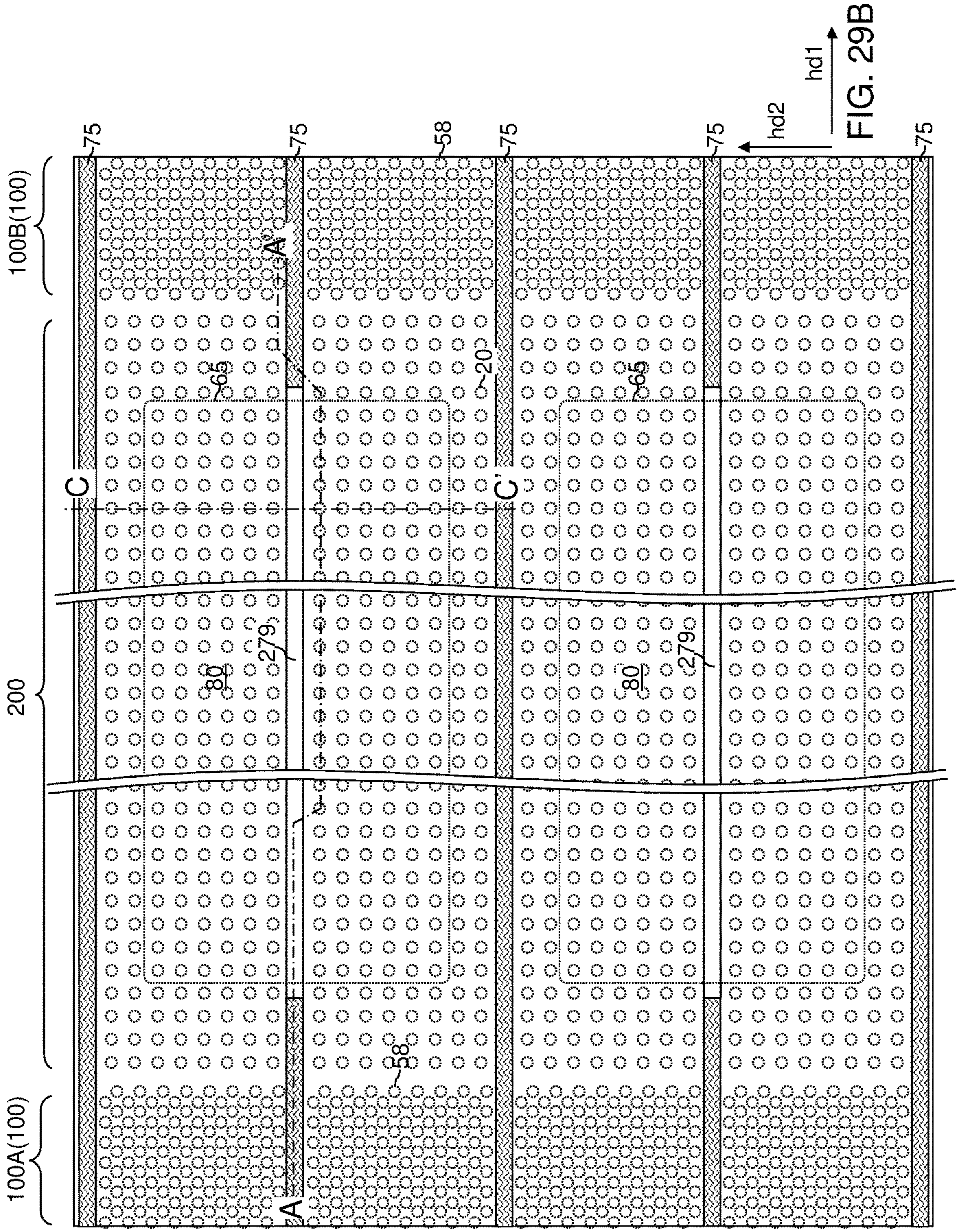
FIG. 29B is a top-down cross-sectional view of the third exemplary structure of FIG. 29A. The vertical plane A-A' is the cut plane of the vertical cross-sectional view of FIG. 29A.
Figure 29C:
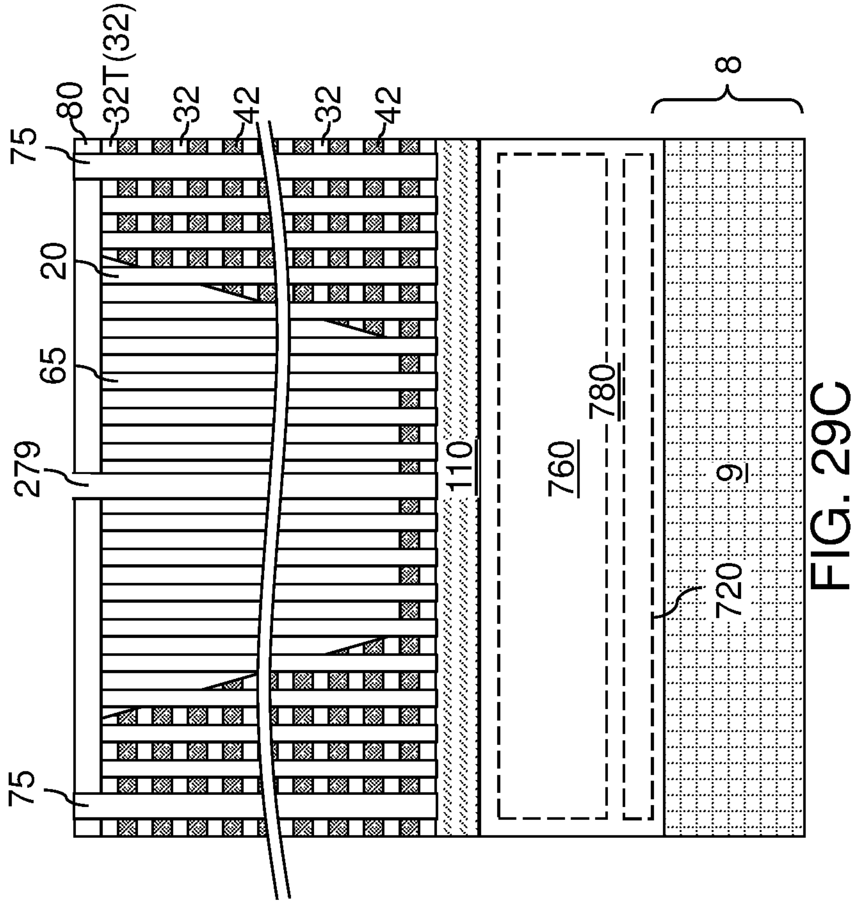
FIG. 29C is a vertical cross-sectional view of the third exemplary structure along the vertical plane C-C' of FIG. 29B.
Figure 30A:
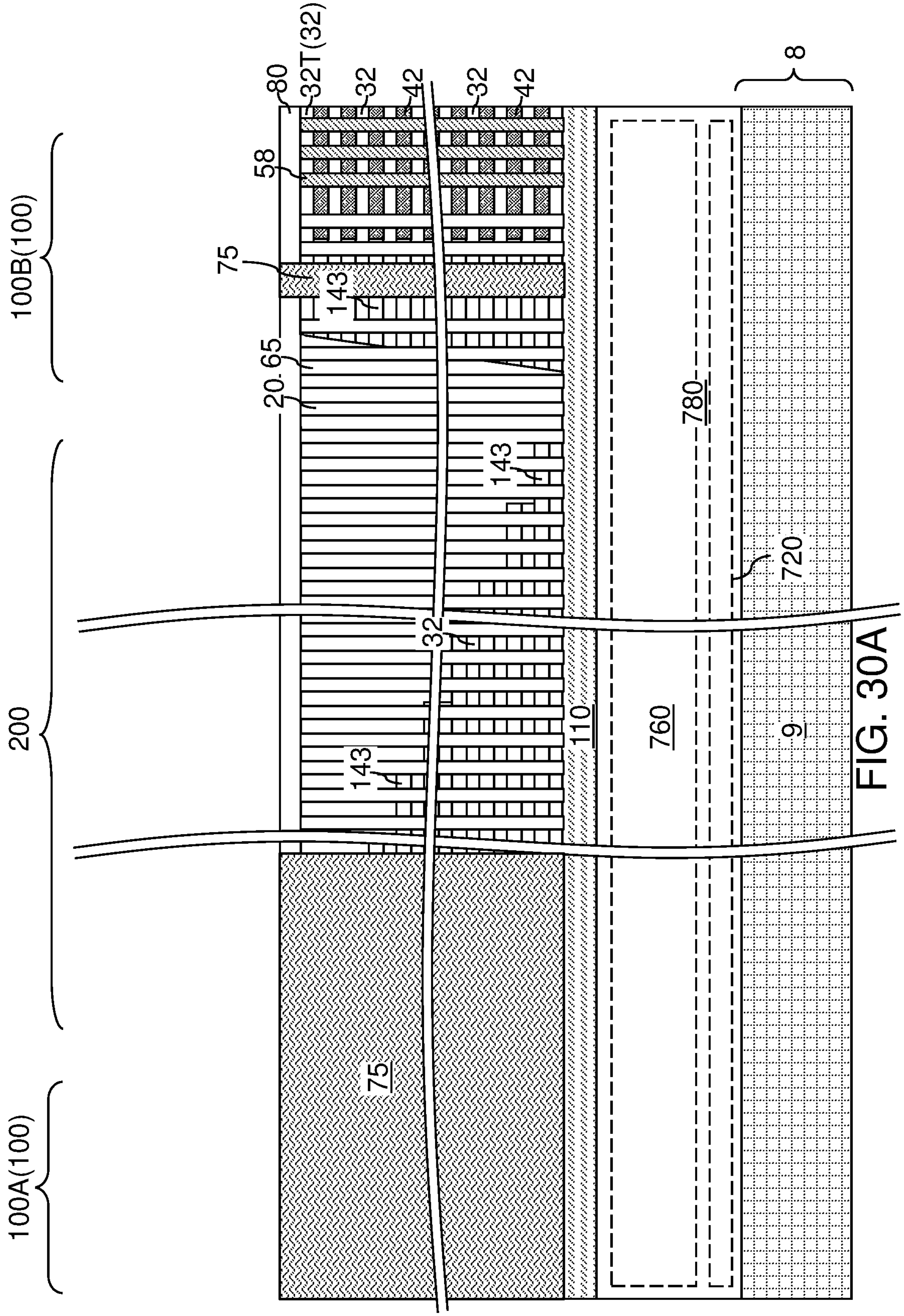
FIG. 30A is a vertical cross-sectional view of the third exemplary structure after formation of fin recesses according to the third embodiment of the present disclosure.
Figure 30B:
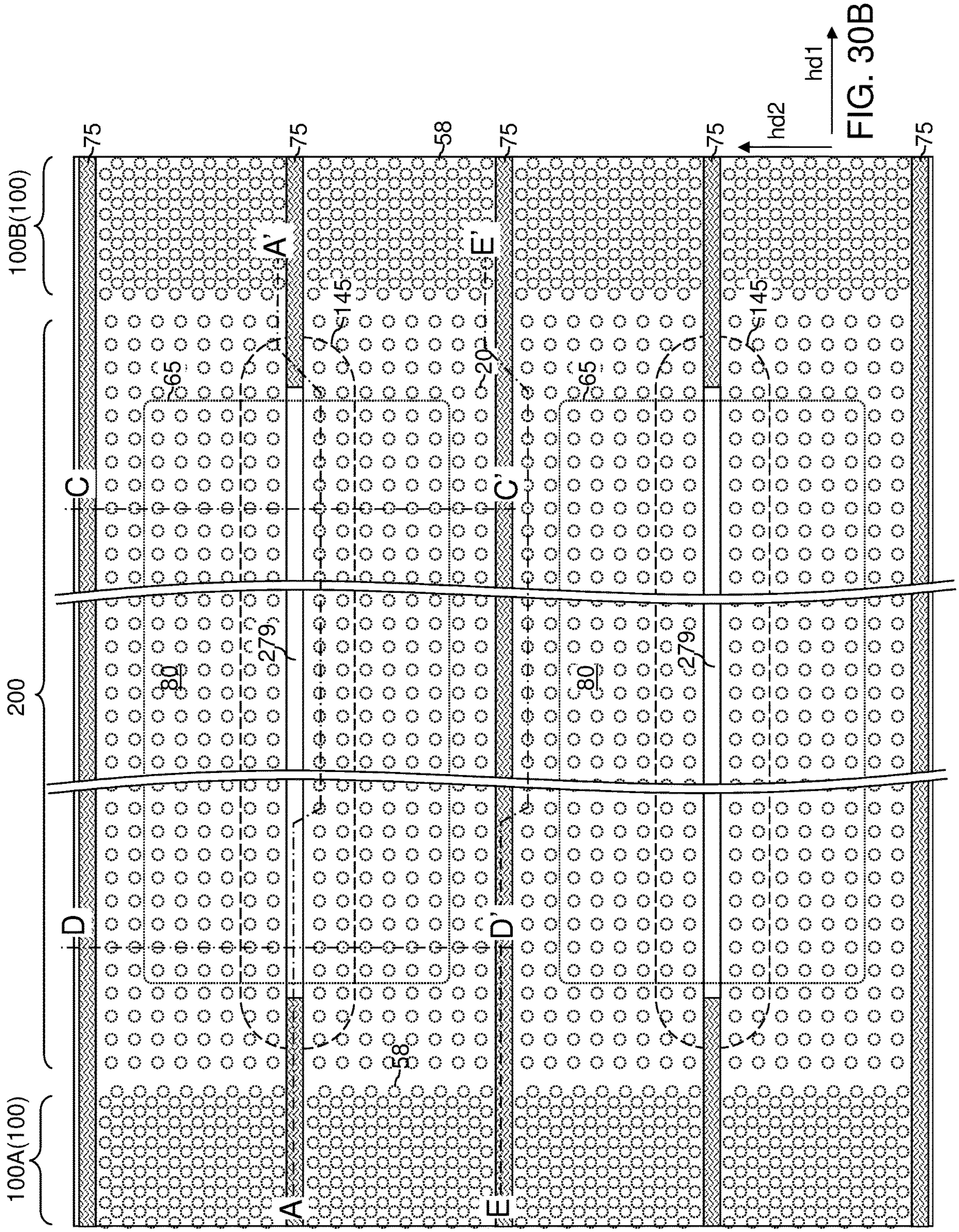
FIG. 30B is a top-down cross-sectional view of the third exemplary structure of FIG. 30A. The vertical plane A-A' is the cut plane of the vertical cross-sectional view of FIG. 30A.
Figure 30C:
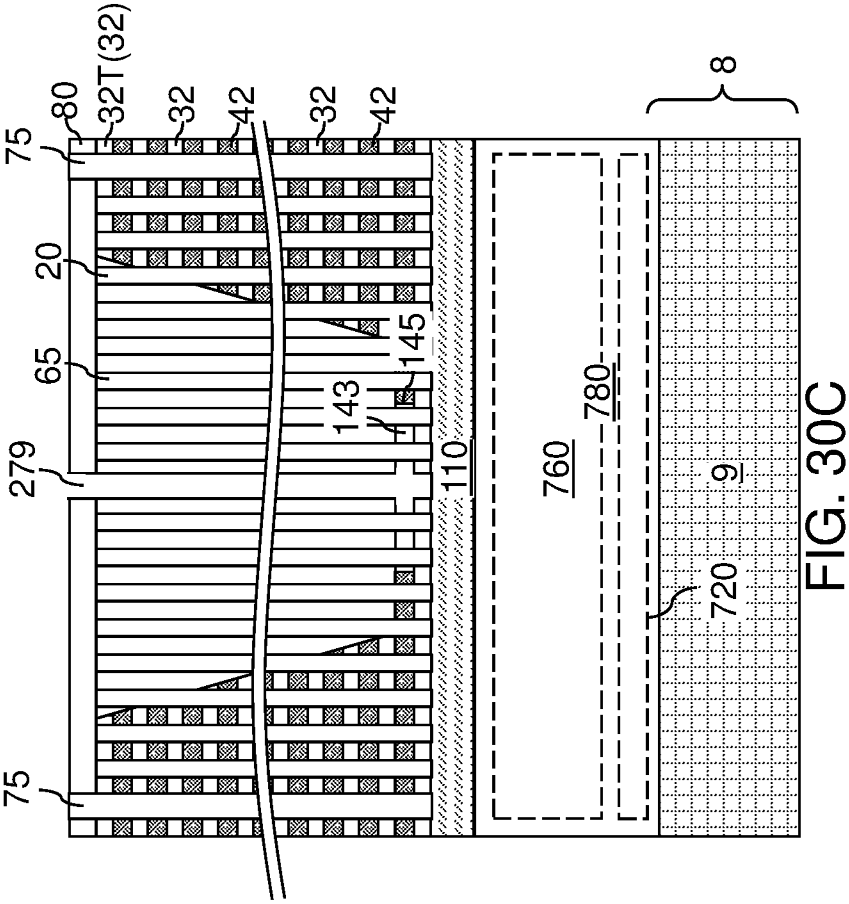
FIG. 30C is a vertical cross-sectional view of the third exemplary structure along the vertical plane C-C' of FIG. 30B.
Figure 30D:
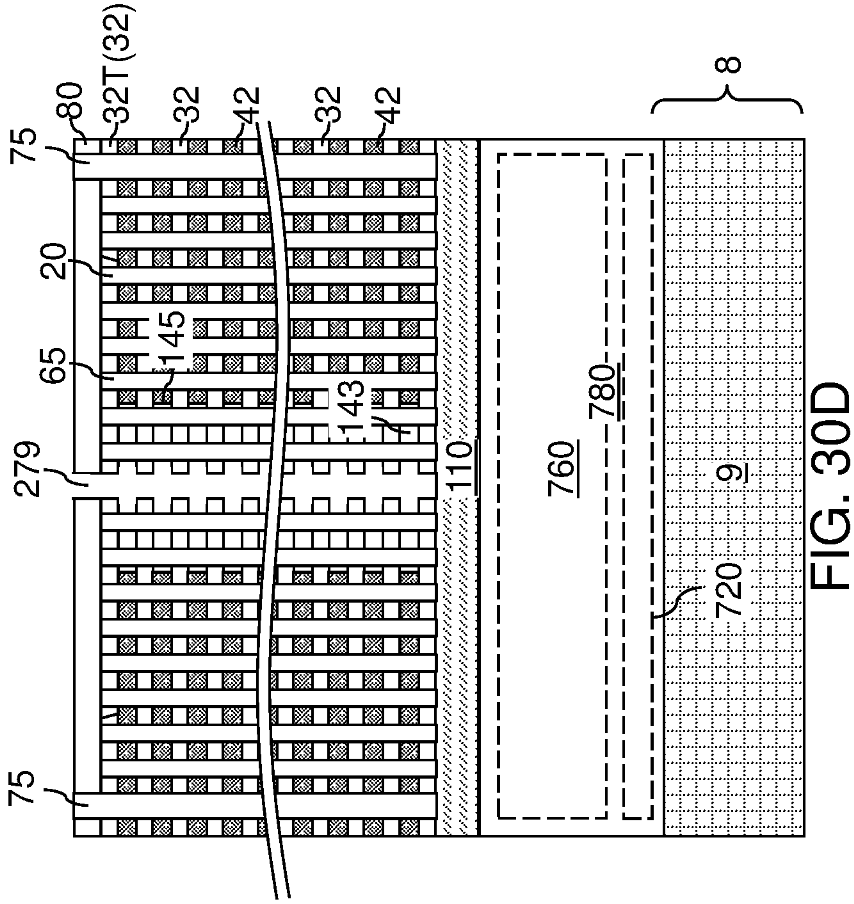
FIG. 30D is a vertical cross-sectional view of the third exemplary structure along the vertical plane D-D' of FIG. 30B.
Figure 30E:
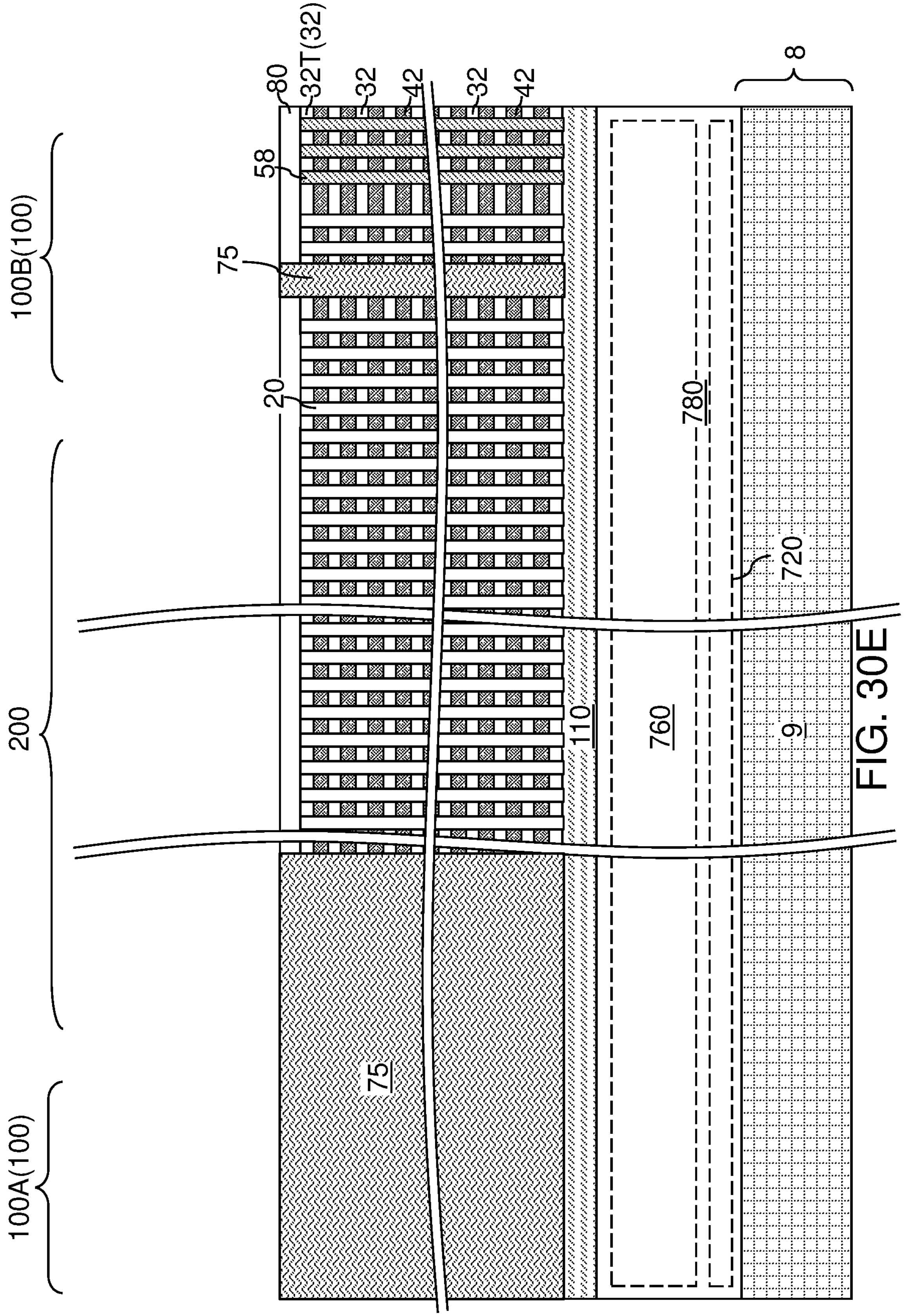
FIG. 30E is a vertical cross-sectional view of the third exemplary structure along the vertical plane E-E' of FIG. 30B.
Figure 31A:
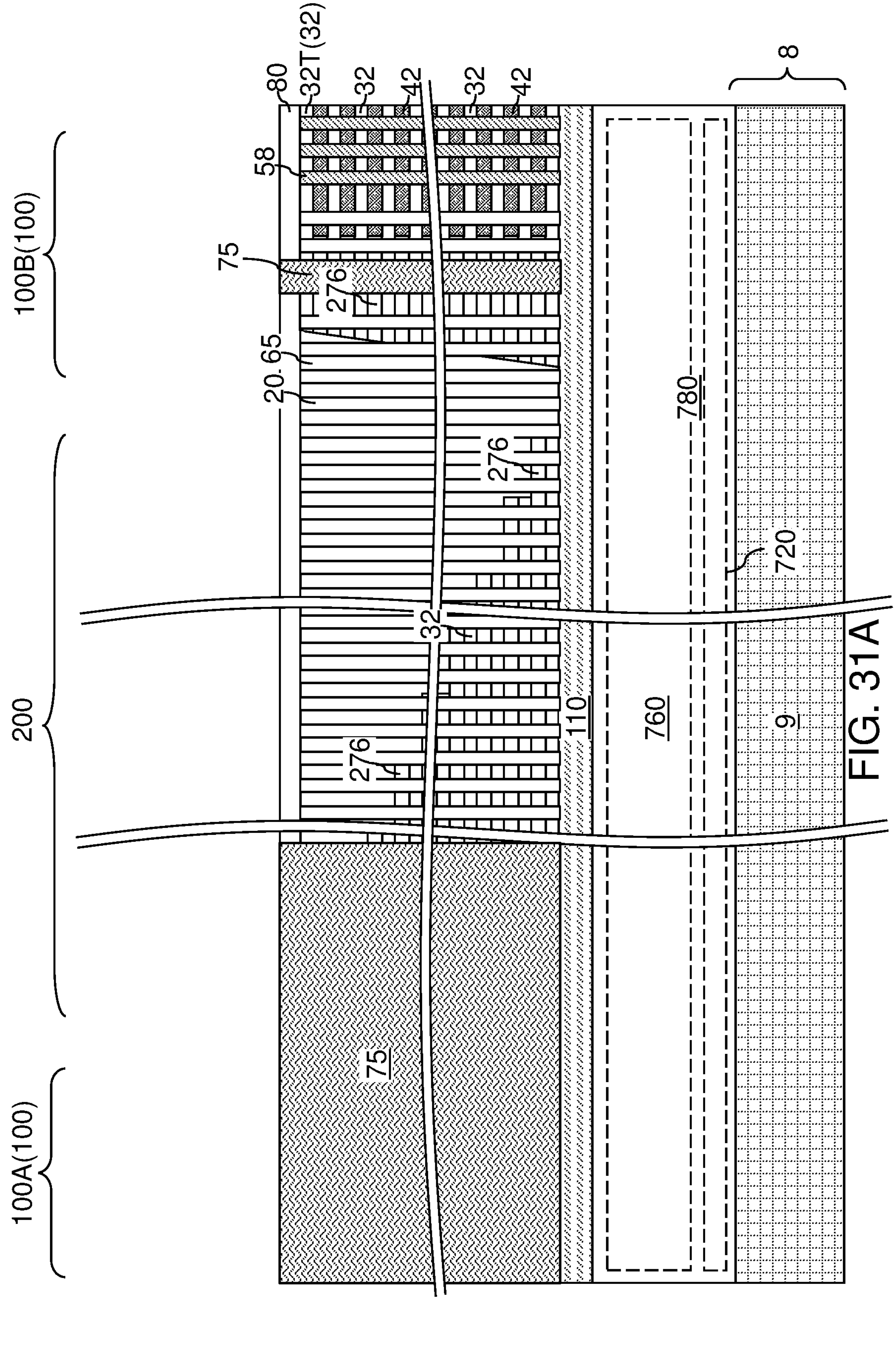
FIG. 31A is a vertical cross-sectional view of the third exemplary structure after formation of finned insulating support structures according to the third embodiment of the present disclosure.
Figure 31B:
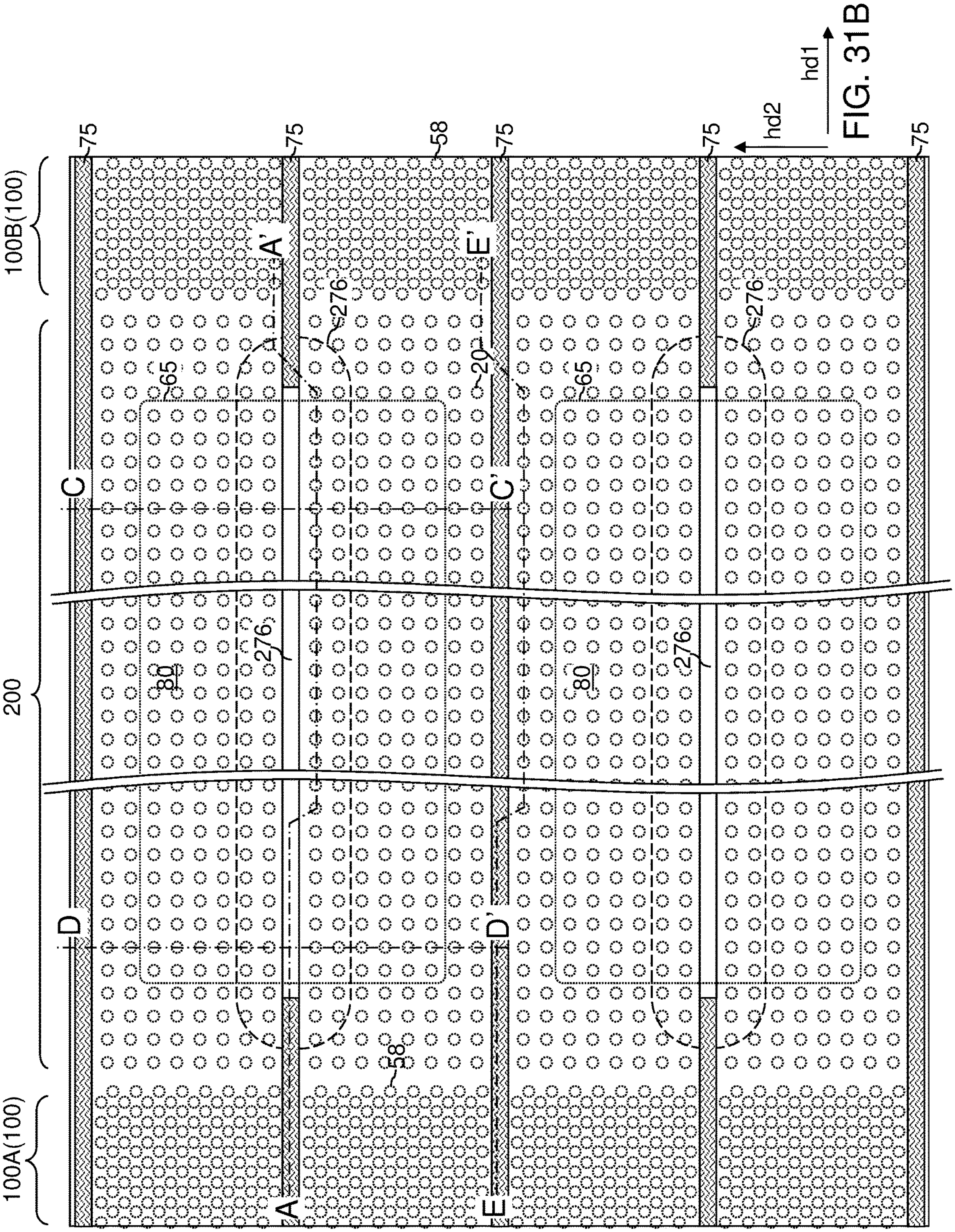
FIG. 31B is a top-down cross-sectional view of the third exemplary structure of FIG. 31A. The vertical plane A-A' is the cut plane of the vertical cross-sectional view of FIG. 31A.
Figure 31C:
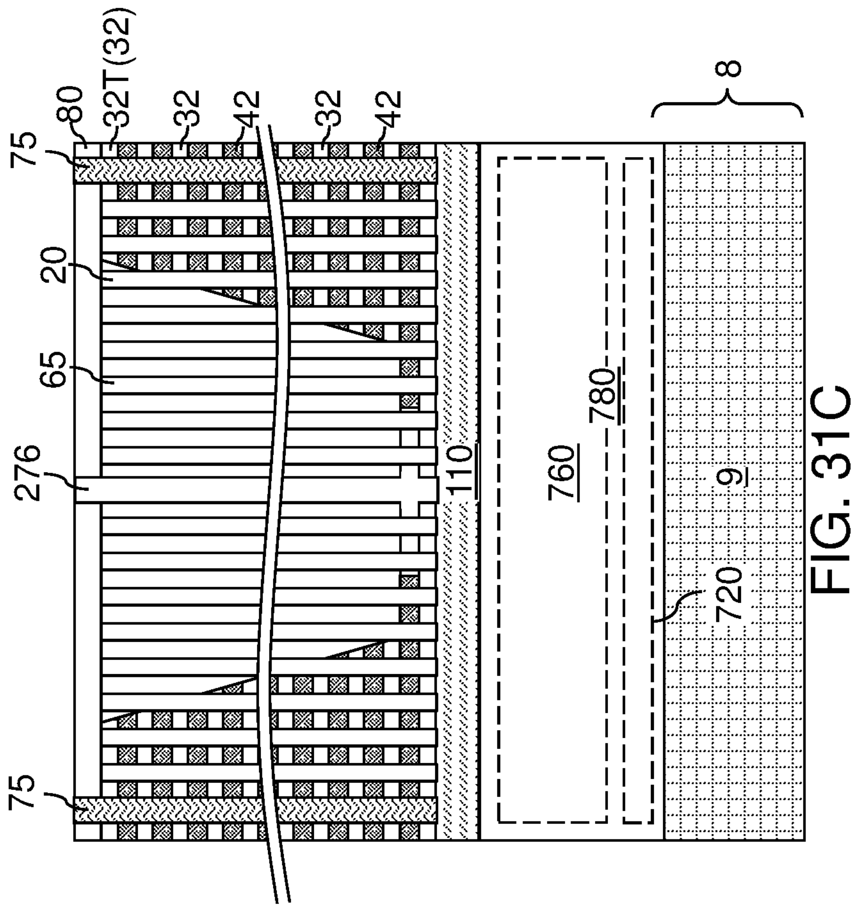
FIG. 31C is a vertical cross-sectional view of the third exemplary structure along the vertical plane C-C' of FIG. 31B.
Figure 31D:
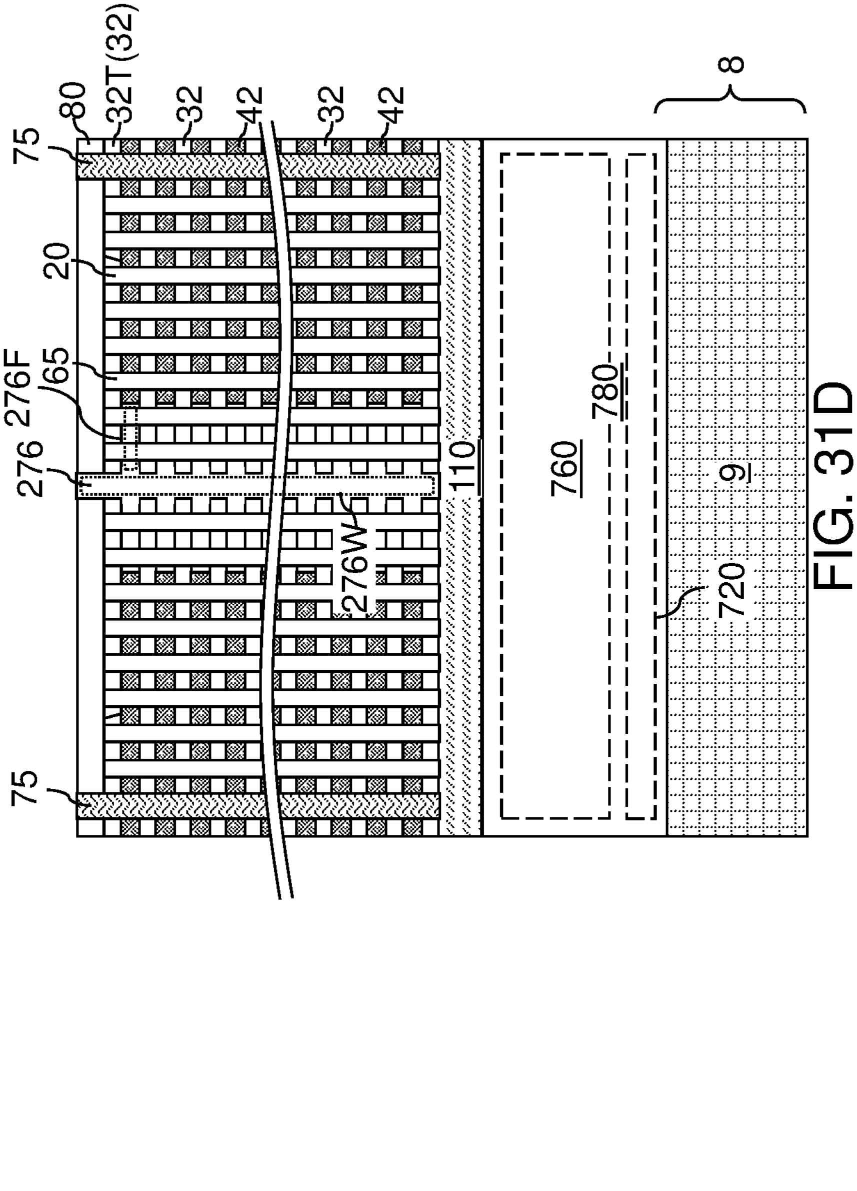
FIG. 31D is a vertical cross-sectional view of the third exemplary structure along the vertical plane D-D' of FIG. 31B.
Figure 31E:
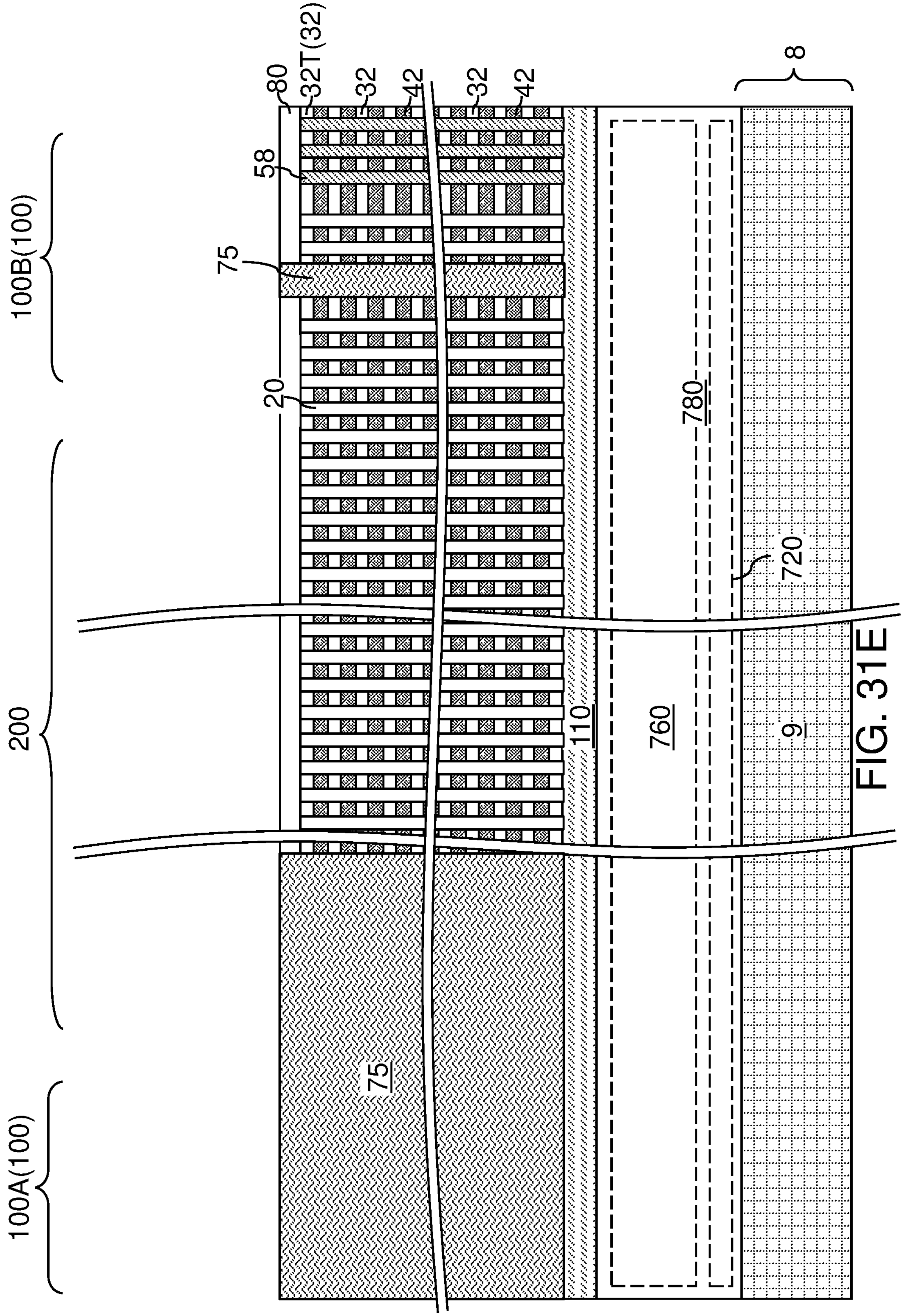
FIG. 31E is a vertical cross-sectional view of the third exemplary structure along the vertical plane E-E' of FIG. 31B.
Figure 32A:
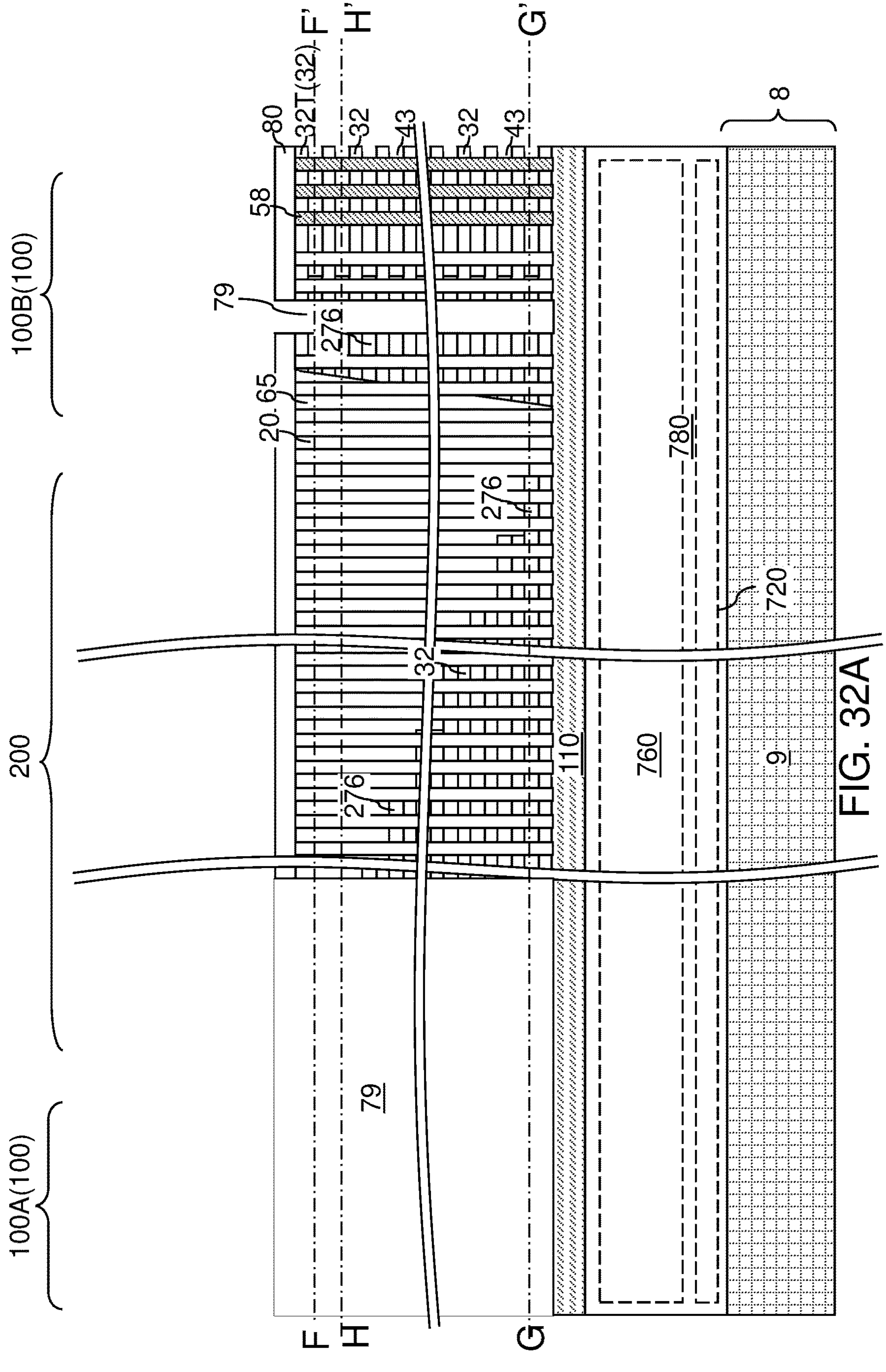
FIG. 32A is a vertical cross-sectional view of the third exemplary structure after removal of sacrificial lateral isolation trench fill structures and formation of laterally-extending cavities according to the third embodiment of the present disclosure.
Figure 32B:
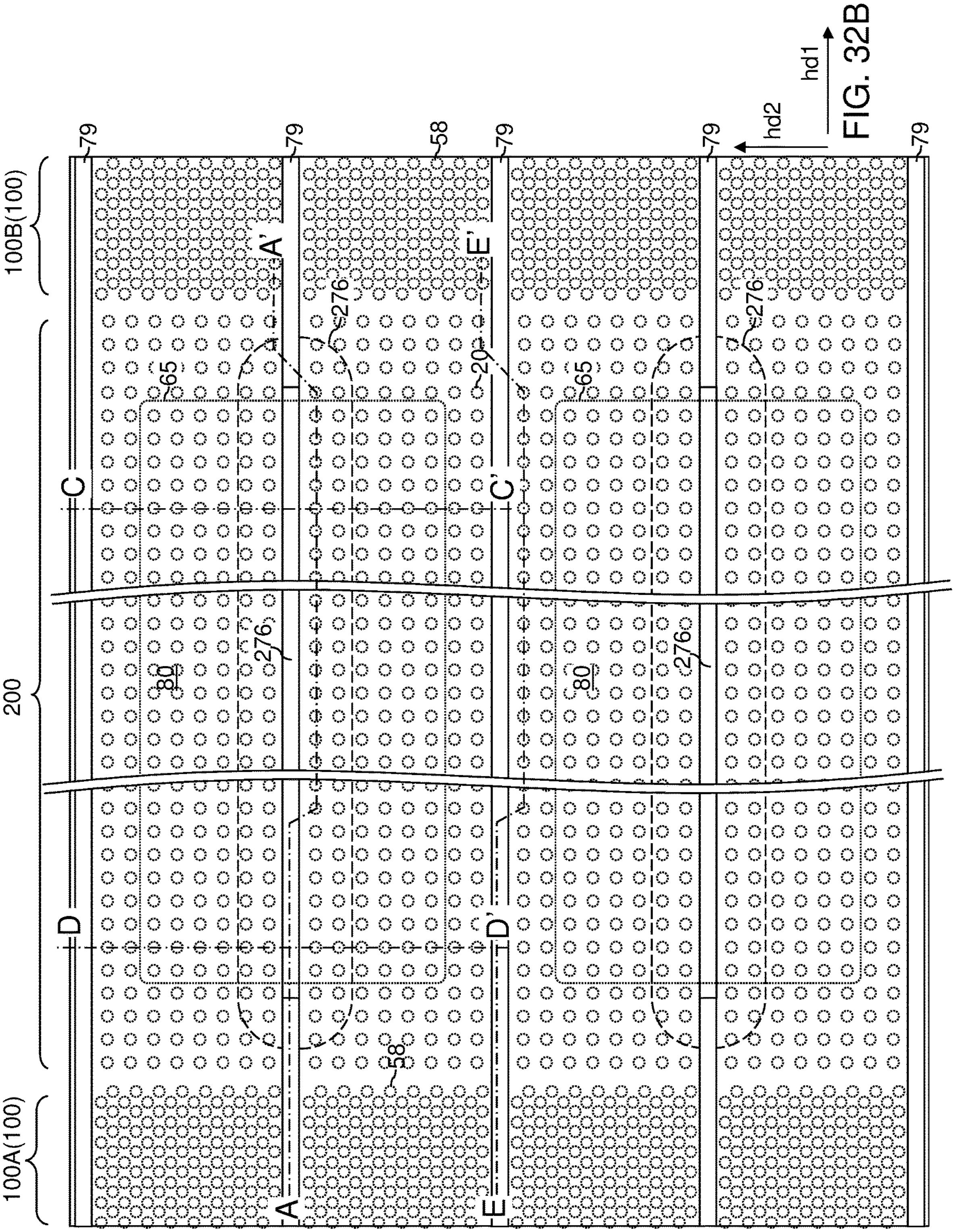
FIG. 32B is a top-down cross-sectional view of the third exemplary structure of FIG. 32A. The vertical plane A-A' is the cut plane of the vertical cross-sectional view of FIG. 32A.
Figure 32C:
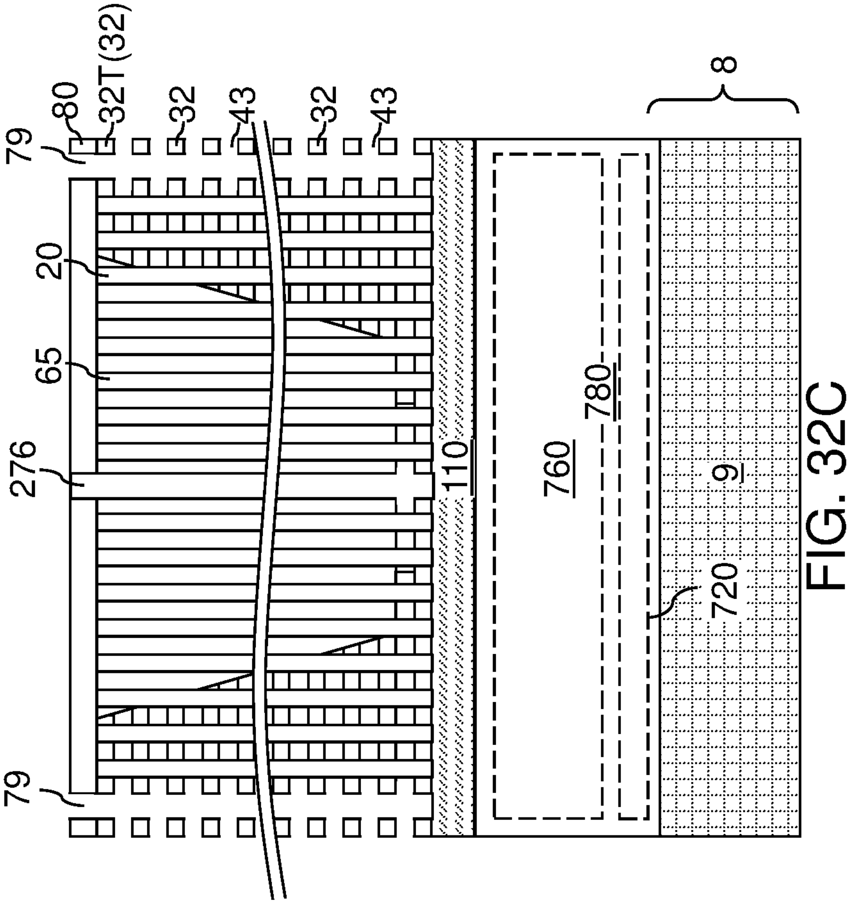
FIG. 32C is a vertical cross-sectional view of the third exemplary structure along the vertical plane C-C' of FIG. 32B.
Figure 32D:
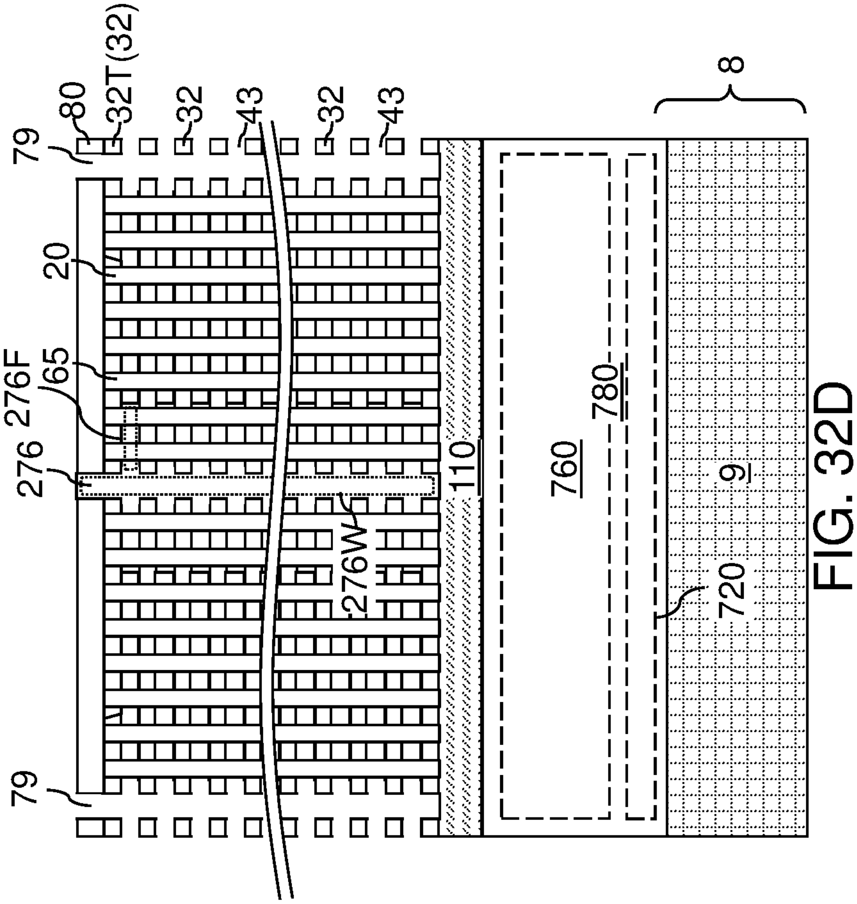
FIG. 32D is a vertical cross-sectional view of the third exemplary structure along the vertical plane D-D' of FIG. 32B.
Figure 32E:
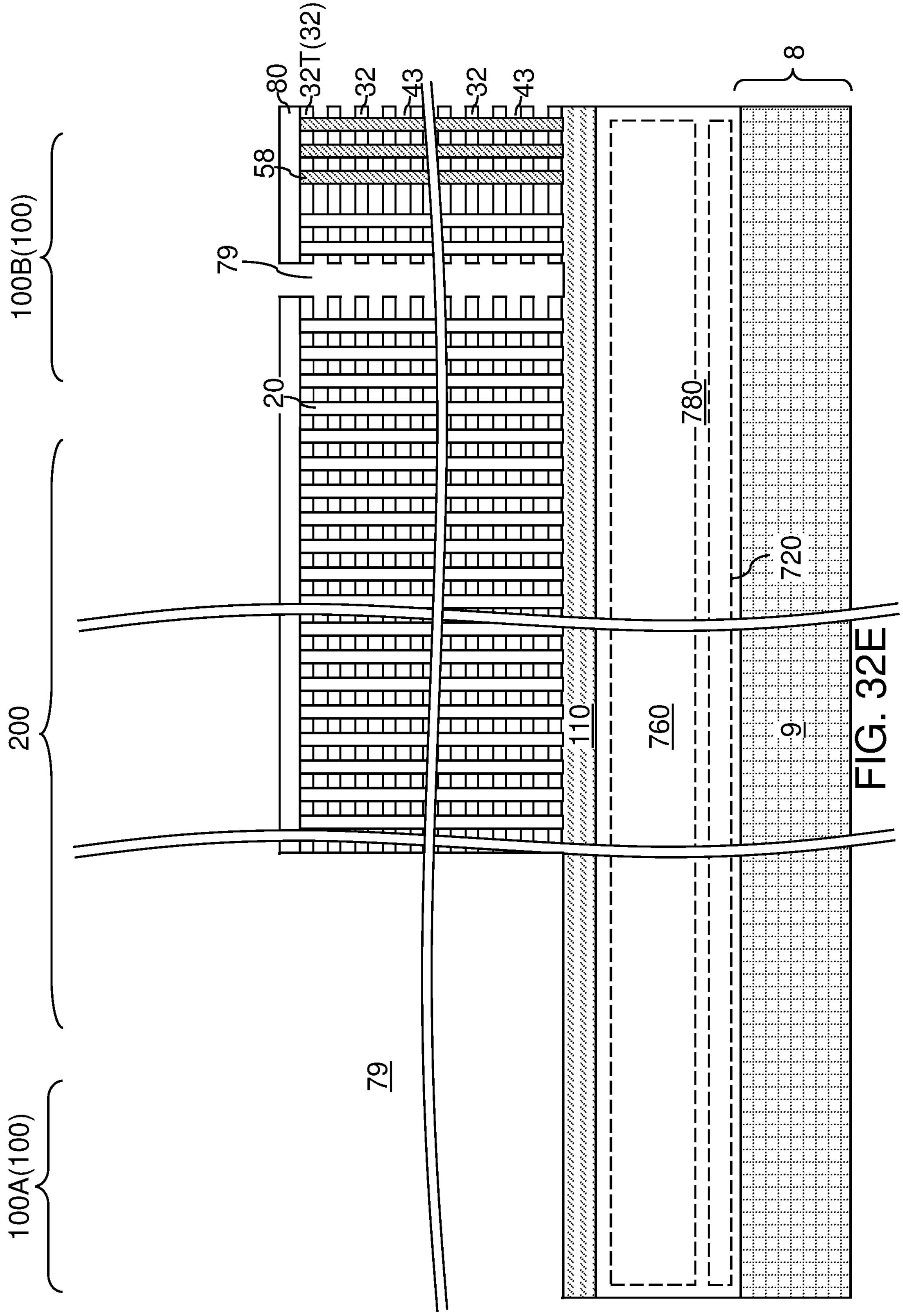
Figure 32F:
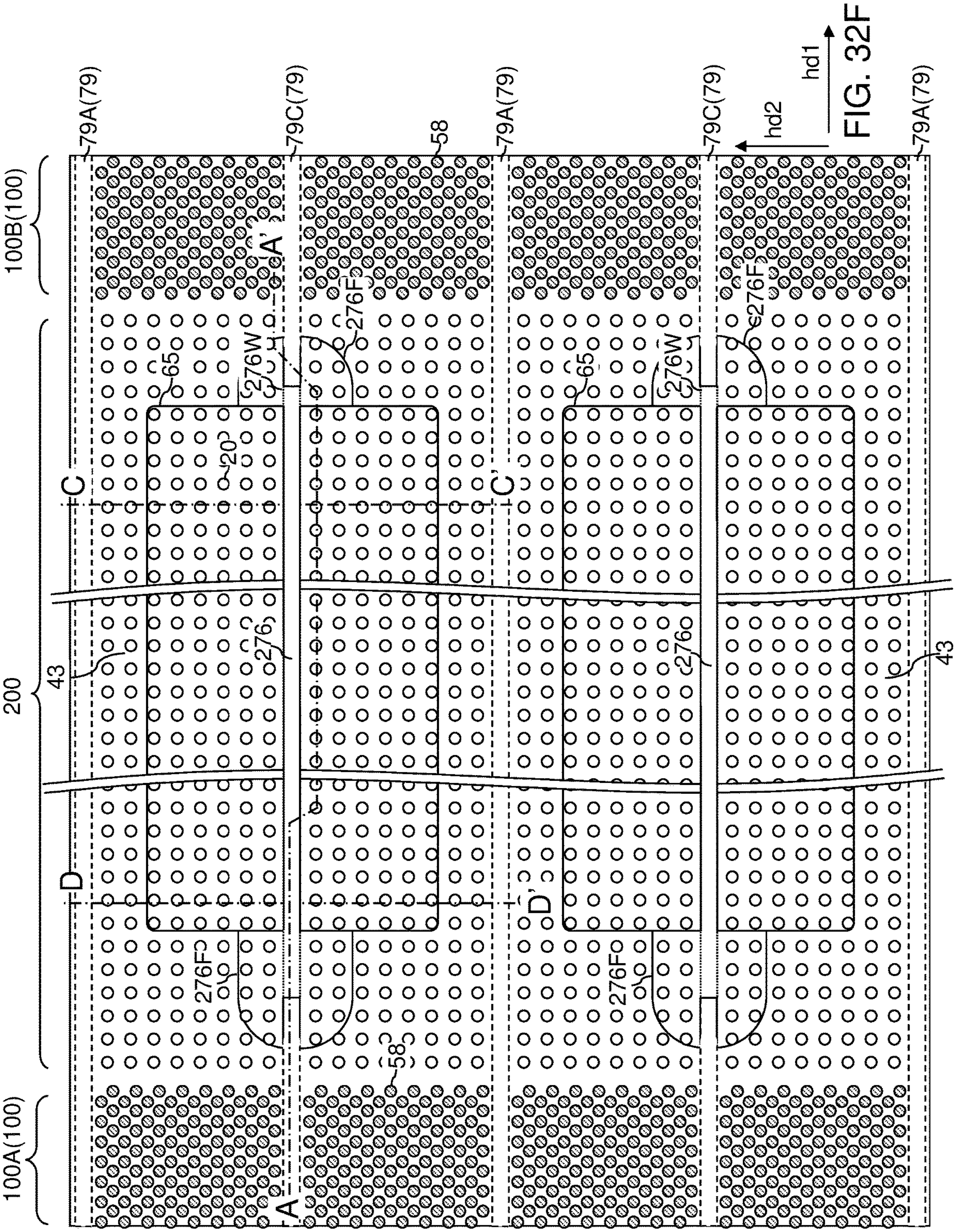
Figure 32G:
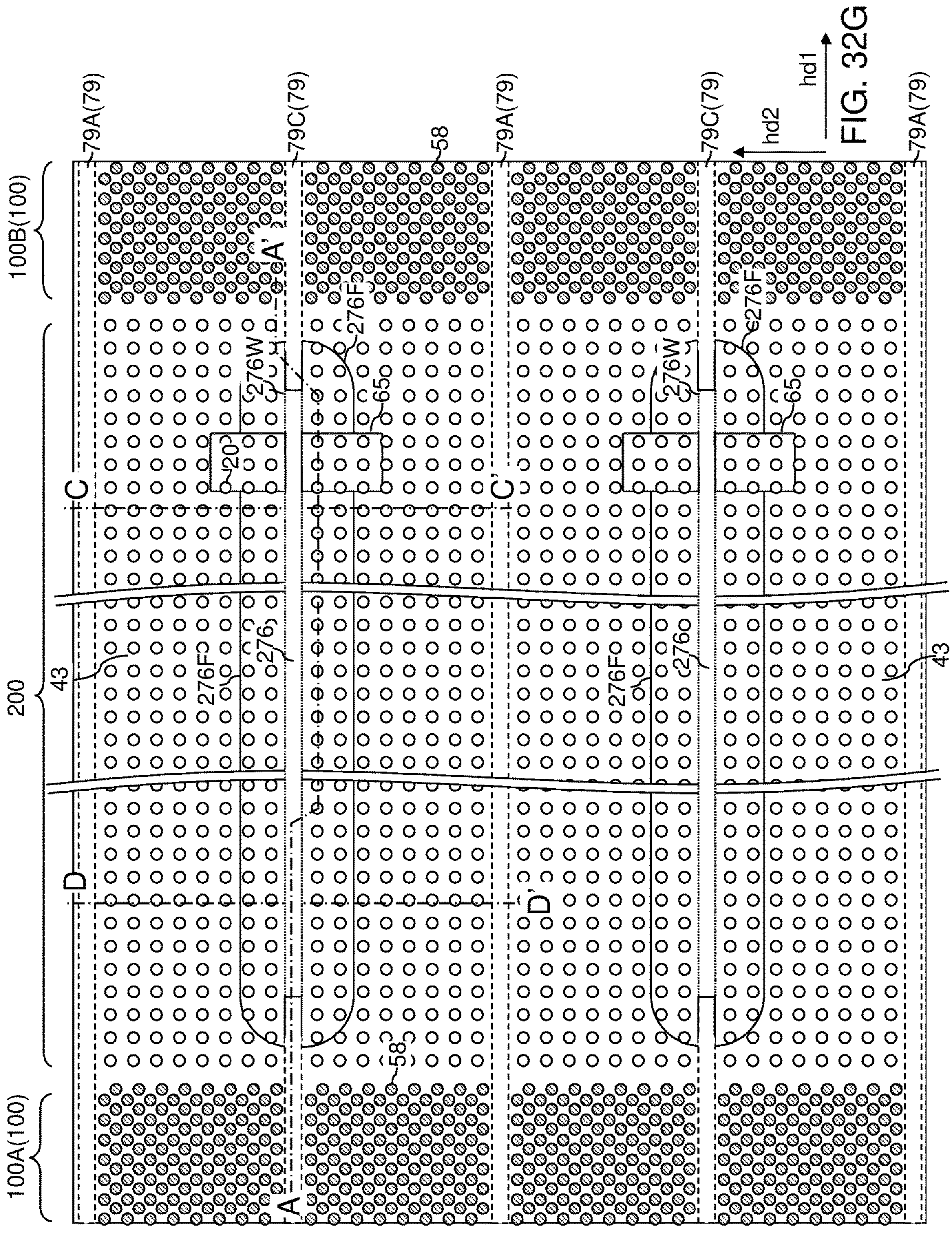
Figure 32H:
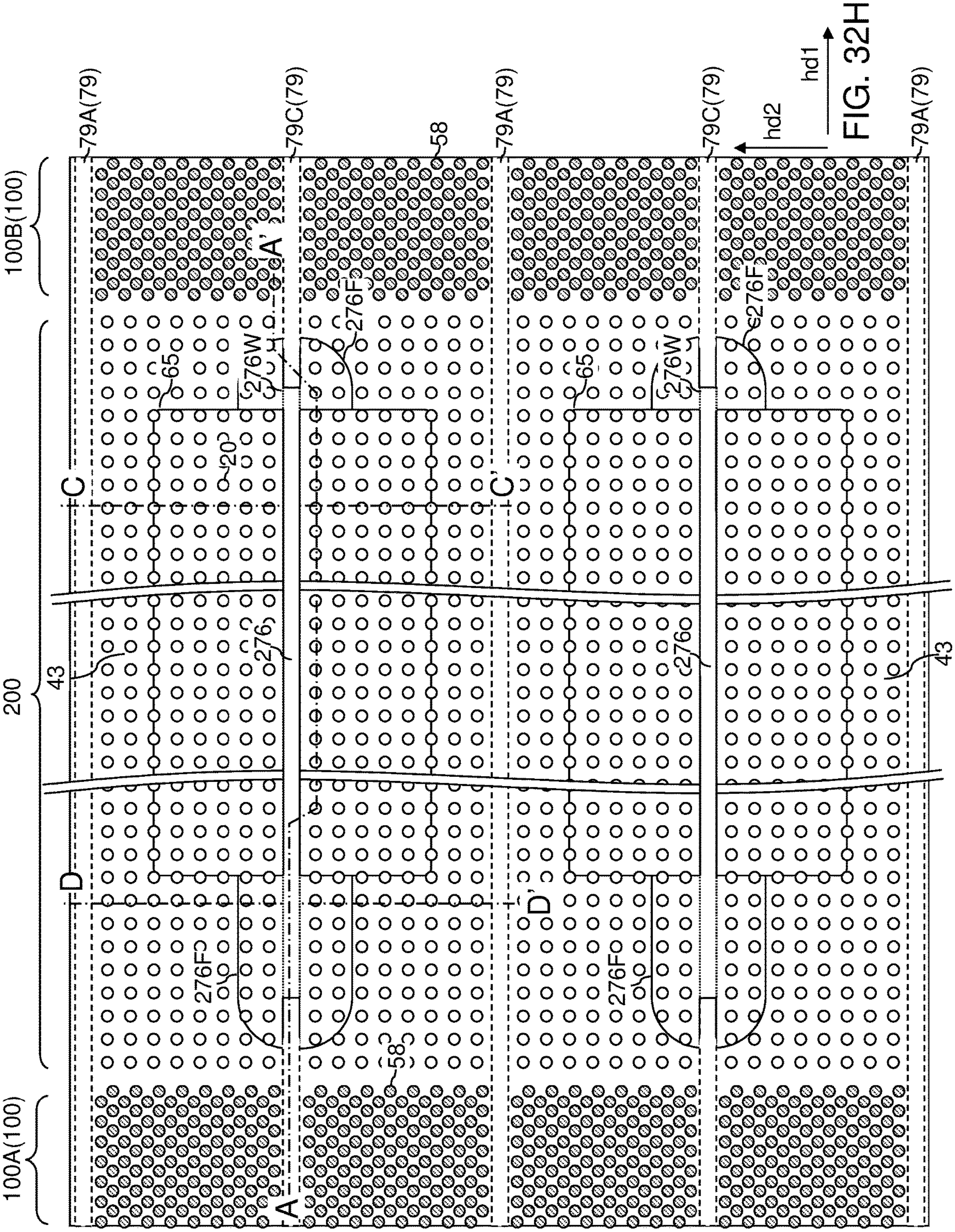
Figure 33A:
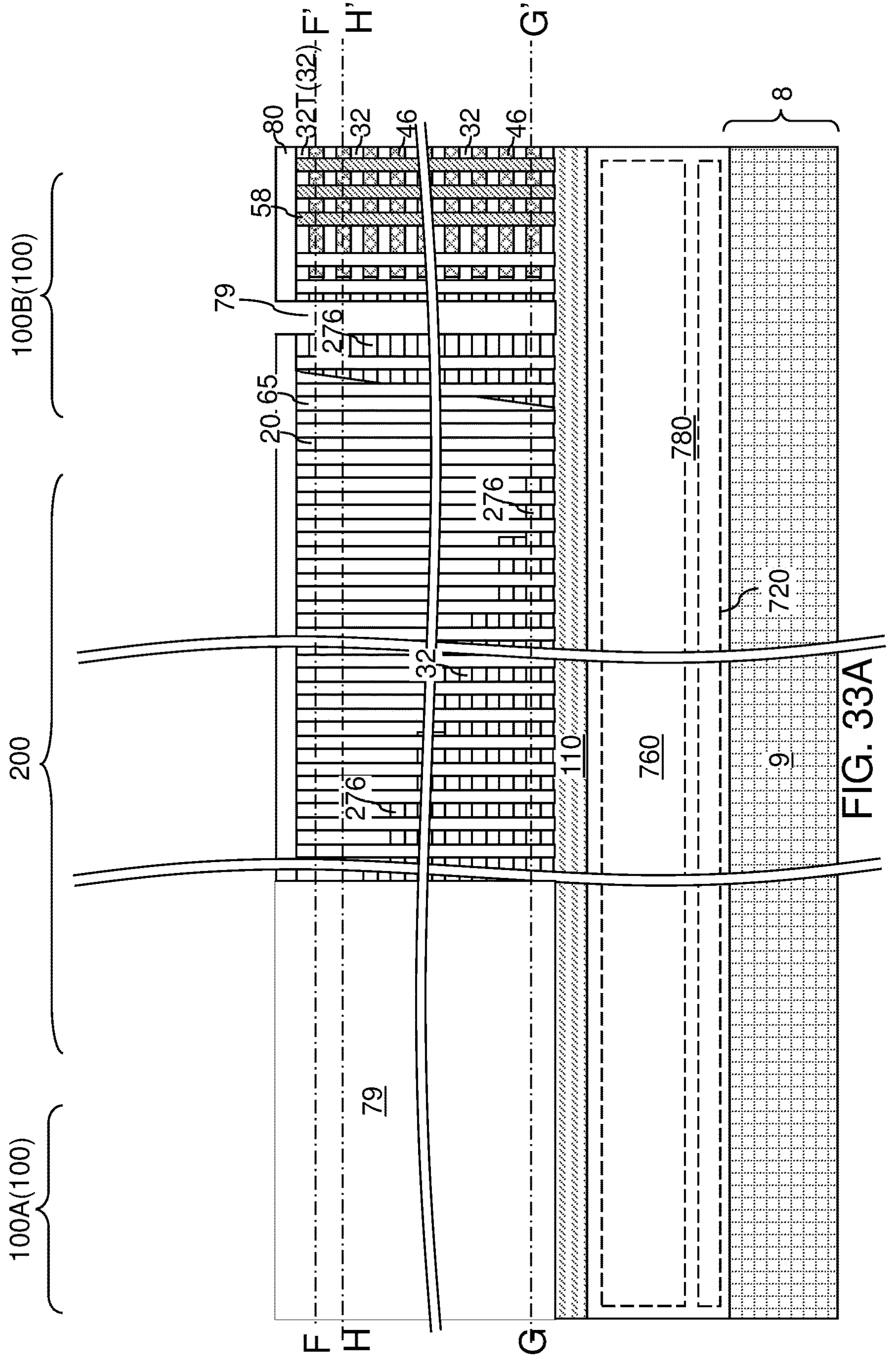
Figure 33B:
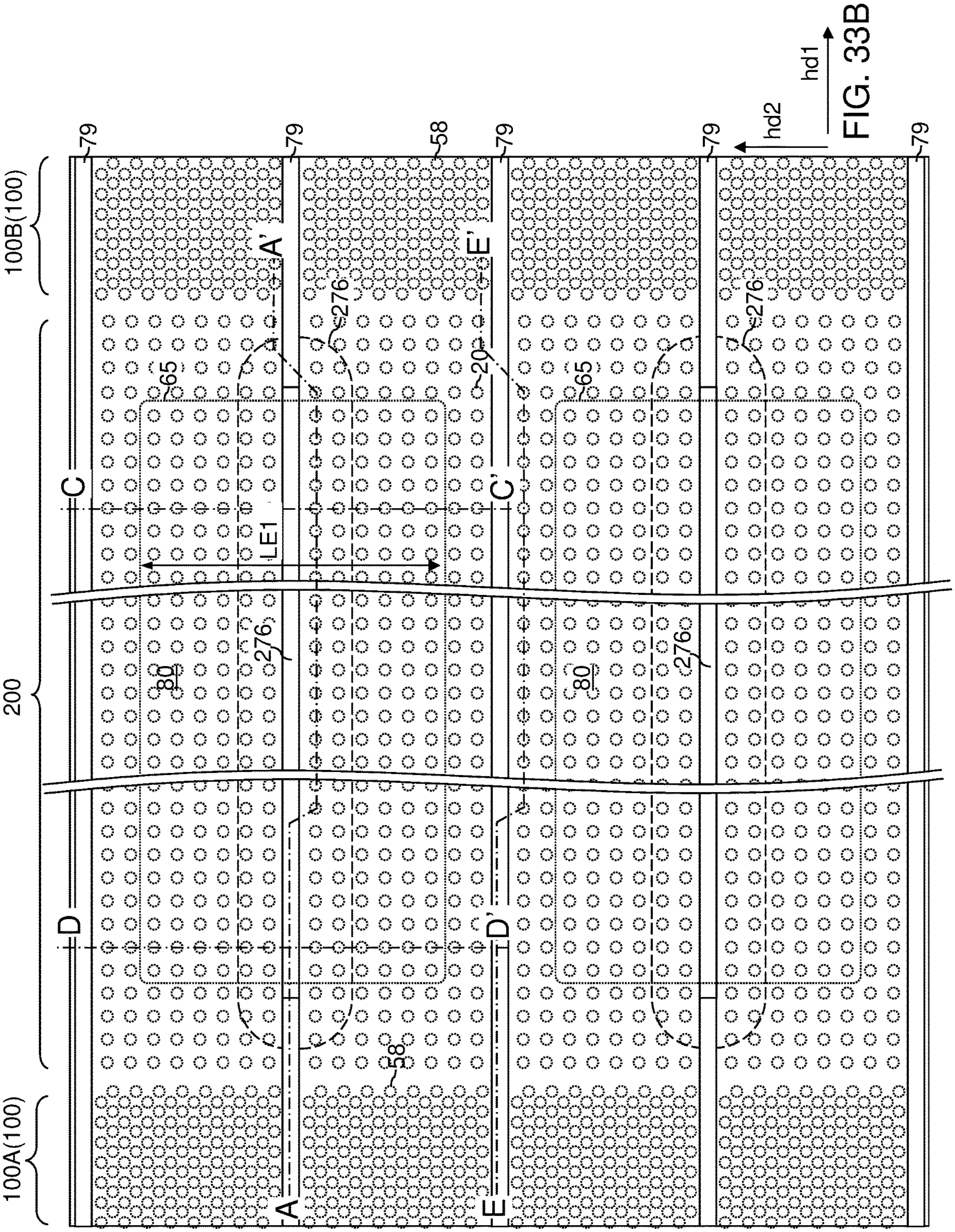
Figure 33C:
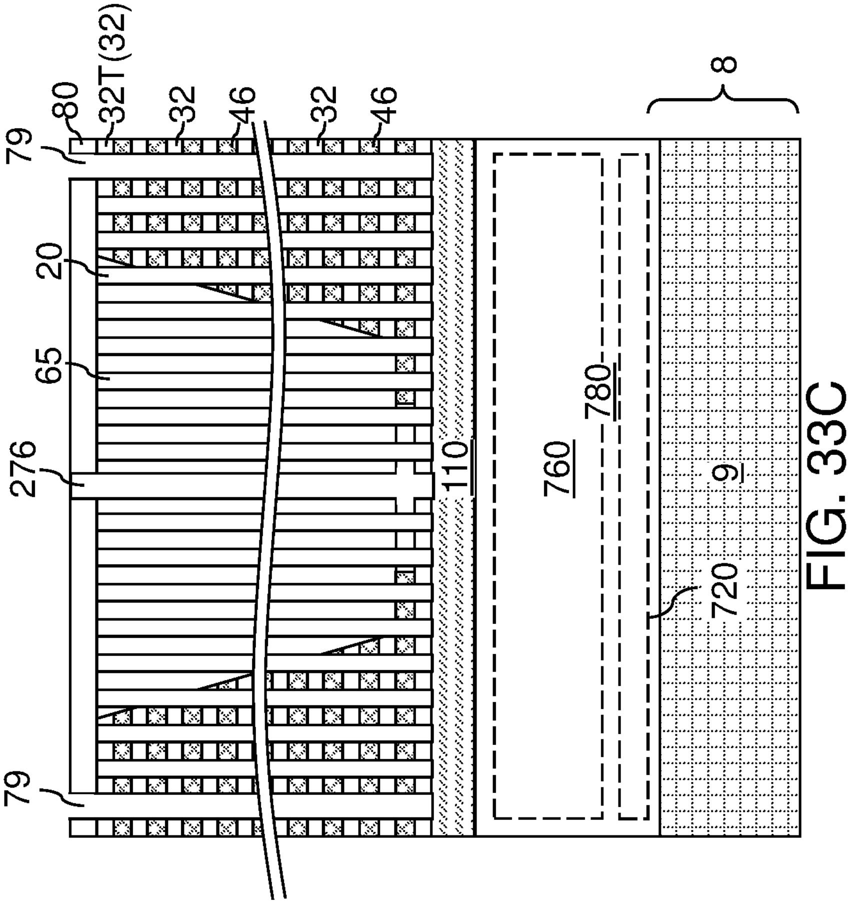
Figure 33D:
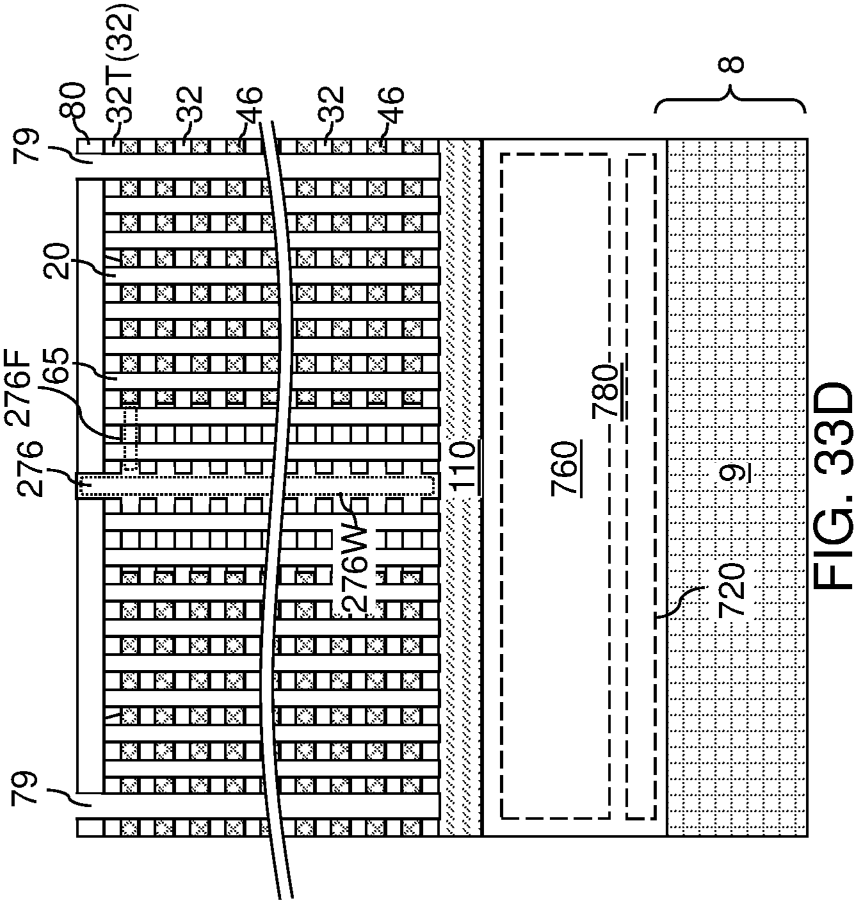
Figure 33E:
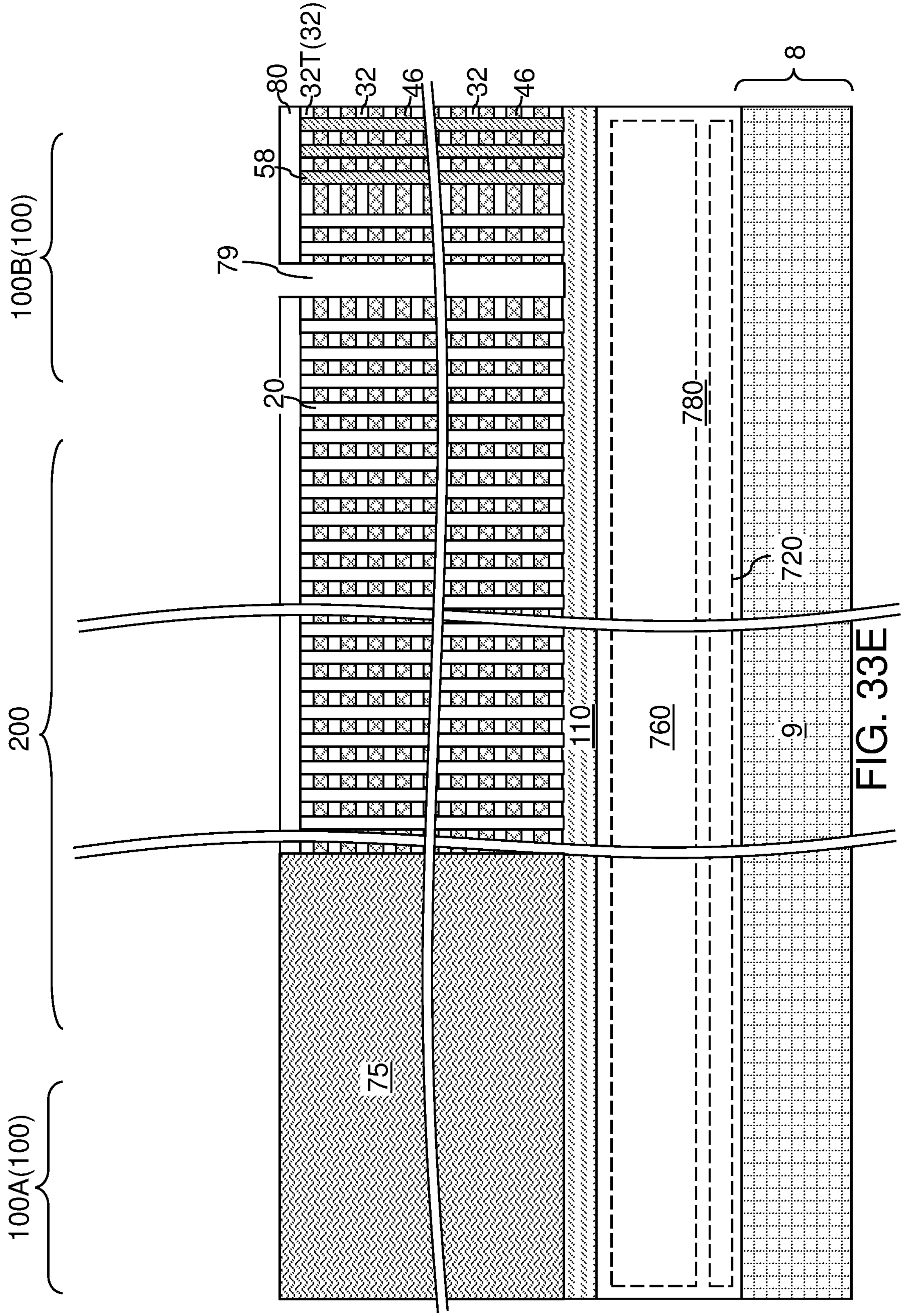
Figure 33F:
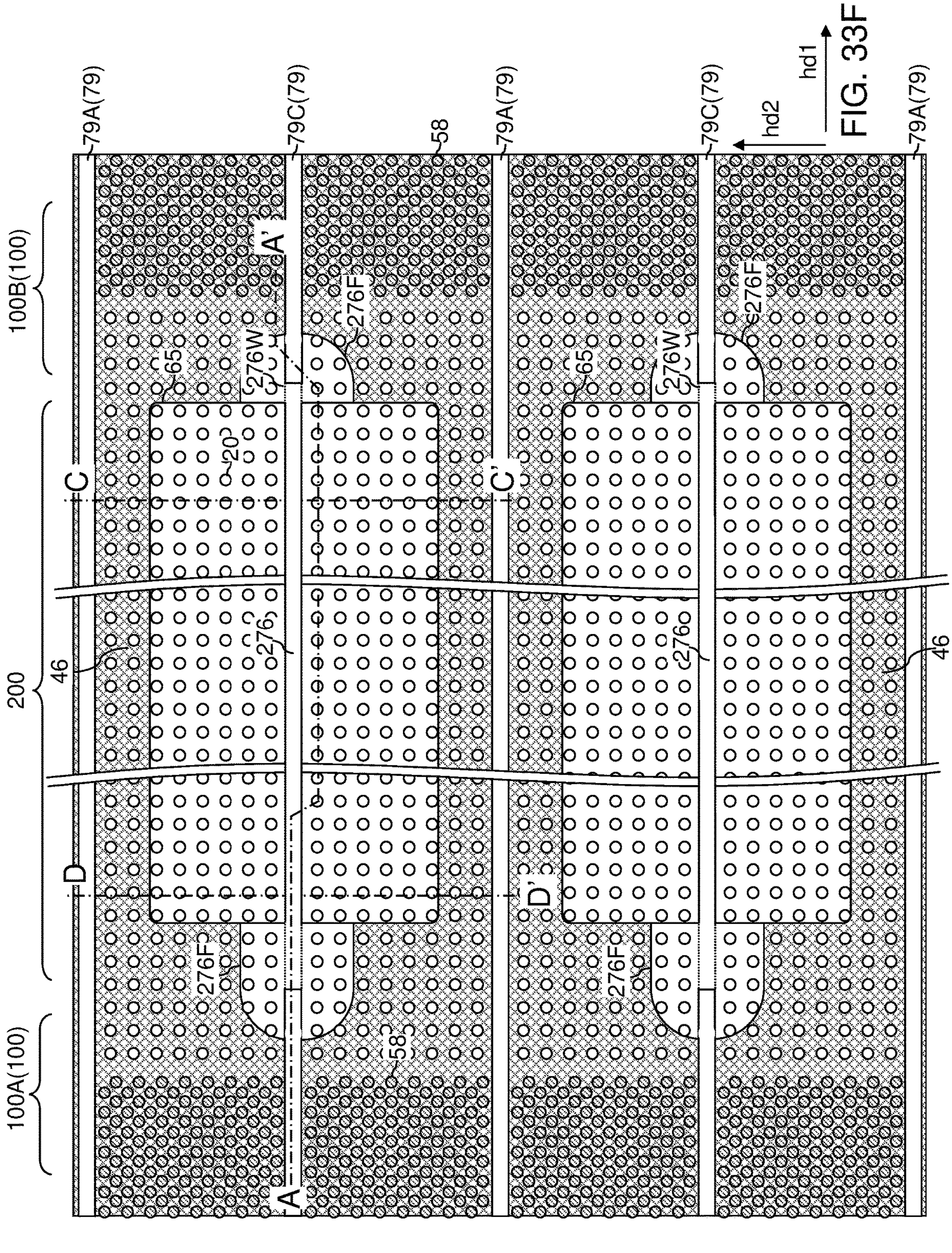
Figure 33G:
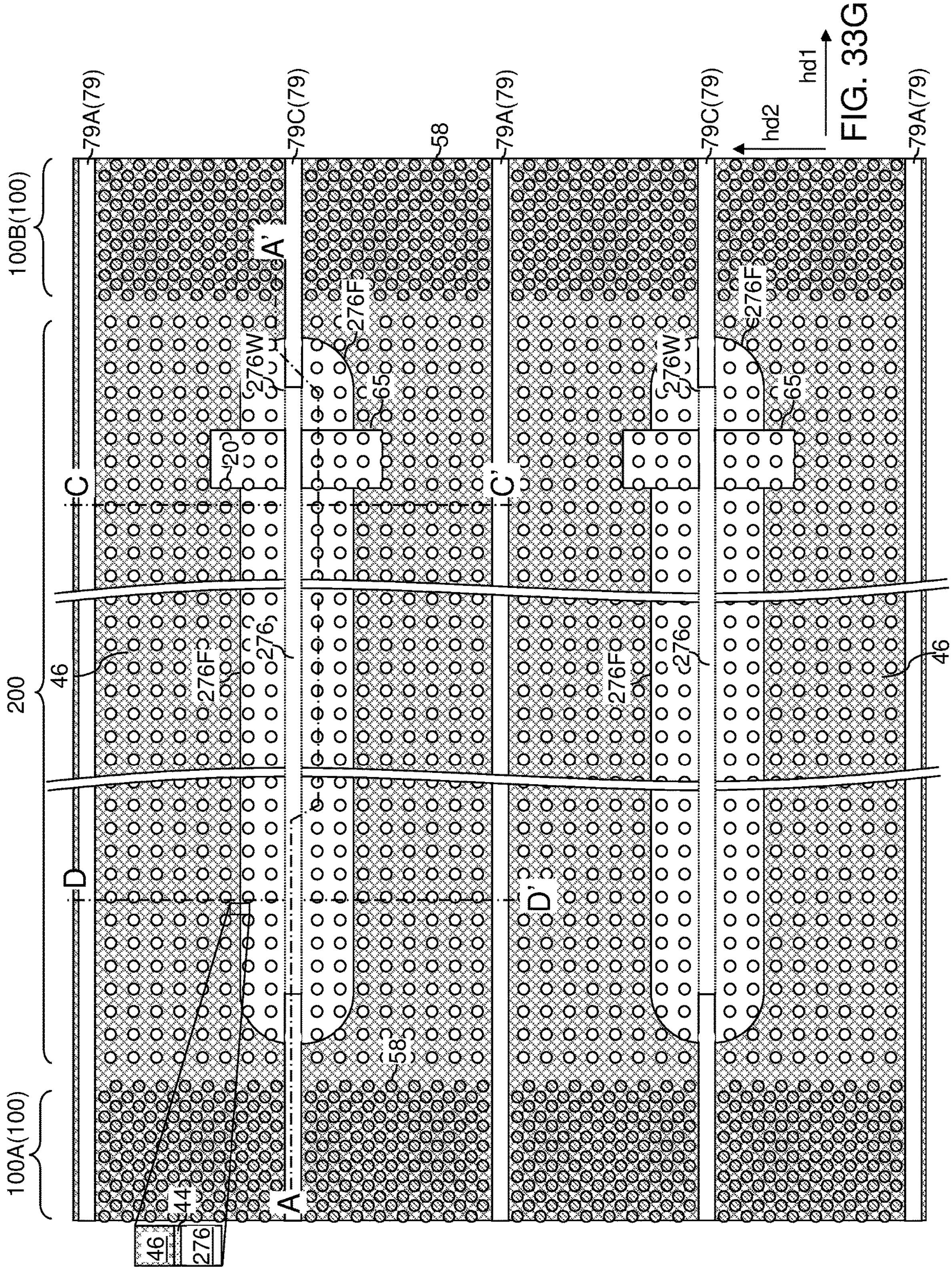
Figure 33H:
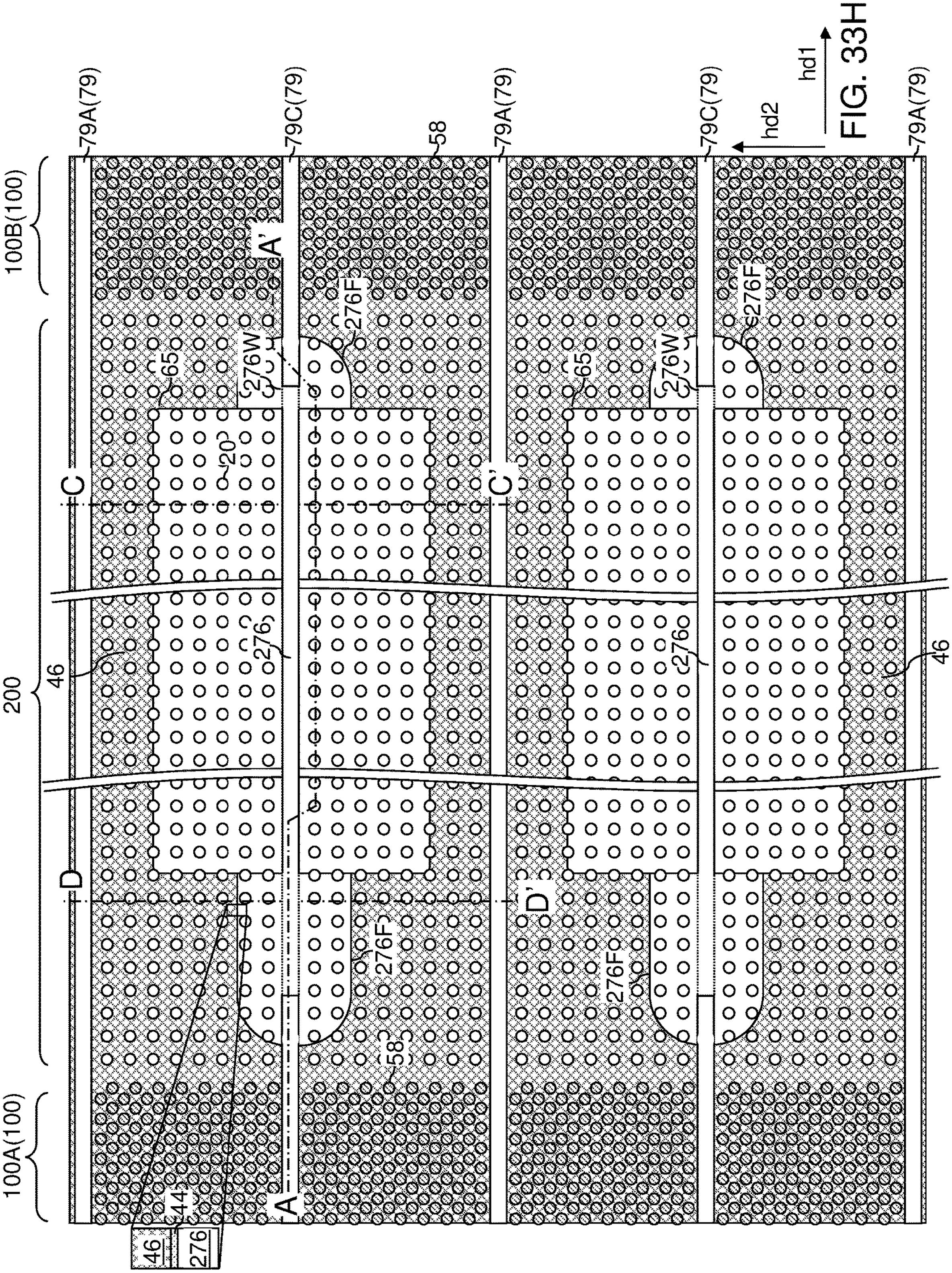

Referring to FIGS. 29A-29C, a sacrificial fill material that can be subsequently removed selective to materials of the insulating layers 32 and sacrificial material layers 42 can be deposited in the lateral isolation trenches 79. The sacrificial fill material may comprise, for example, a carbon-based material (such as amorphous carbon or diamond-like carbon) or a semiconductor material (such as amorphous silicon). Optionally, a thin sacrificial liner (not shown) such as a silicon oxide liner or a silicon nitride liner may be deposited in the lateral isolation trenches 79 prior to deposition of the sacrificial fill material. Excess portions of the sacrificial fill material may be removed from above the horizontal plane including the top surface of the contact-level dielectric layer 80 by performing a planarization process such as a chemical mechanical planarization (CMP) process. Sacrificial lateral isolation trench fill structures 75 are formed in the lateral isolation trenches 79.

A photoresist layer (not shown) can be applied over the contact-level dielectric layer 80, and can be lithographically patterned to form openings in areas overlying portions of the second-type lateral isolation trenches 79C that are located within the contact region 200, while covering all areas of the first-type lateral isolation trenches 79A and areas of portions of the second-type lateral isolation trenches 79C located within the memory array regions 100. Optionally, areas of peripheral portions of the second-type lateral isolation trenches 79C located in the contact region 200 proximal to a memory array region 100 may be covered by the photoresist layer. An etch process can be performed to remove the sacrificial lateral isolation trench fill structures 75 in areas that are not covered by the patterned photoresist layer. Voids are formed in volumes from which portions of the sacrificial lateral isolation trench fill structures 75 are removed. The voids are herein referred to as isolation cavities 279, which includes empty volumes from which portions of the sacrificial lateral isolation trench fill structures 75 are removed. The photoresist layer can be subsequently removed, for example, by ashing.

Generally, the entirety of each of the first lateral isolation trenches 79A and first portions of the second-type lateral isolation trenches 79C that are located outside the contact region 200 can be filled with a sacrificial trench fill material to provide sacrificial lateral isolation trench fill structures 75. Second portions of the second-type lateral isolation trenches 79C located in the contact region 200 are not filled with the sacrificial trench fill material to provide the isolation cavities 279. In one embodiment, each of the isolation cavities 279 may have a greater lateral extent along the first horizontal direction hd1 than any of the retro-stepped dielectric material portions 65. In this case, each retro-stepped dielectric material portion 65 may have a lengthwise sidewall that is entirely physically exposed to a respective one of the isolation cavities 279.

Referring to FIGS. 30A-30E, an optional first isotropic etch process can be performed to laterally recess the sacrificial material layers 42 from around the isolation cavities 279. For example, if the sacrificial material layers 42 comprise silicon nitride, a wet etch process employing hot phosphoric acid can be performed to laterally recess the sacrificial material layers 42 around each of the isolation cavities 279. The sacrificial lateral isolation trench fill structures 75 prevent the isotropic etchant of the isotropic etch process from entering the portions of the lateral isolation trenches 79 that are filled by the sacrificial lateral isolation trench fill structures 75.

Recess cavities are formed in volumes from which the material of the sacrificial material layers 42 is removed. A vertical stack of recess cavities can be formed around each isolation cavity 279. The recess cavities laterally protrude outward from a respective isolation cavity 279 in the shapes of laterally-protruding fins, and thus, are herein referred to as fin recesses 143. Generally, fin recesses 143 can be formed around each of the isolation cavities 279 by performing a first isotropic etch process that etches first portions of the sacrificial material layers 42 selective to the insulating layers 32. The first isotropic etch process laterally recesses the sacrificial material layers 42 isotropically to form the fin recesses 143. Each contiguous combination of an isolation cavity 279 and a vertical stack of finned recesses 143 is herein referred to as a finned cavity (279, 143). Generally, the fin recesses 143 can be formed around the isolation cavities 279 by performing a first isotropic etch process that etches first portions of the sacrificial material layers 42 selective to the insulating layers 32.

The etch distance of the isotropic etch process that forms the fin recesses 143 is less than the lateral spacing between neighboring pairs of a first-type lateral isolation trench 79A and a second-type lateral isolation trench 79C along the second horizontal direction hd2. The ratio of the etch distance of the isotropic etch process to the lateral spacing between neighboring pairs of a first-type lateral isolation trench 79A and a second-type lateral isolation trench 79C along the second horizontal direction hd2 may be in a range from 0.1 to 0.7, such as from 0.15 to 0.4, although lesser and greater ratios may also be employed. Each of the finned recesses 143 may be laterally bounded by a sidewall segment 145 of a respective sacrificial material layer 42. Alternatively, the formation of the finned recesses 143 may be omitted.

Referring to FIGS. 31A-31E, a dielectric fill material can be deposited in the finned cavities (279, 143). If the finned recesses 143 are omitted, then the dielectric fill material is deposited only in the isolation cavities 279. The dielectric fill material may comprise, for example, silicon oxide, silicon carbonitride, silicon oxynitride, and/or a dielectric metal oxide. In one embodiment, the dielectric fill material may comprise silicon oxide. Excess portions of the dielectric fill material can be removed from above the horizontal plane including the top surface of the contact-level dielectric layer 80 by a planarization process such as a recess etch process. Each remaining portion of the dielectric fill material that fills a respective finned cavity (279, 143) constitutes a finned insulating support structure 276. If the finned cavities 143 are omitted, then each remaining portion of the dielectric fill material that fills a respective isolation cavity 279 constitutes an insulating support structure 276.

Generally, finned insulating support structures 276 can be formed in volumes of the fin recesses 143 and the isolation cavities 279. Each of the insulating support structures (e.g., finned insulating support structures) 276 comprises a respective vertical insulating wall portion 276W and optionally a respective vertical stack of insulating fins 276F that laterally extend outward from the respective vertical insulating wall portion 276W. In one embodiment, each interface between a finned insulating support structure 276 and a sacrificial material layer 42 comprises a respective convex sidewall segment of the insulating fins 276F of the finned insulating support structure 276 in contact with a respective concave sidewall segment of the sacrificial material layer 42, and further comprises a respective planar sidewall segment of the insulating fins 276F of in contact with a respective planar surface segment of the sacrificial material layer 42 which is parallel to the first horizontal direction hd1. In one embodiment, each interface between a pair finned insulating support structures 276 and a retro-stepped dielectric material portion 65 comprise a respective planar sidewall segment of the insulating fins 276F of the pair finned insulating support structures 276 in contact with a respective planar sidewall segment of the retro-stepped dielectric material portion 65 (which is parallel to the second horizontal direction hd2).

In one embodiment, each finned insulating support structure 276 comprises a vertical insulating wall portion 276W located between a pair of retro-stepped dielectric material portions 65, and optionally further comprises vertical stacks of insulating fins 276F that laterally extend outward from the vertical insulating wall portion 276W. In one embodiment, the vertical insulating wall portion 276W comprises a first lengthwise sidewall that laterally extends along the first horizontal direction hd1 and contacts a first retro-stepped dielectric material portion 65 of the pair of retro-stepped dielectric material portions 65, and a second lengthwise sidewall that laterally extends along the first horizontal direction hd1 and contact a second retro-stepped dielectric material portion 65 of the pair of retro-stepped dielectric material portions 65.

In one embodiment, within each finned insulating support structure 276, each vertical stack of insulating fins 276F has a variable lateral extent along the first horizontal direction hd1 that decreases with a vertical distance from the horizontal plane including bottommost surfaces of the alternating stacks (32, 42). In one embodiment, within each finned insulating support structure 276, each vertical stack of insulating fins 276F has a same lateral extent along the second horizontal direction hd2 that is invariant with the vertical distance from the horizontal plane including bottommost surfaces of the alternating stacks (32, 42).

Referring to FIGS. 32A-32H, the sacrificial lateral isolation trench fill structures 75 can be removed selective to materials of the alternating stacks (32, 42) and the finned insulating support structures 276. Voids are formed in the volumes of the lateral isolation trenches 79.

A second isotropic etch process can be performed to introduce an isotropic etchant that etches a material of the sacrificial material layers 42 into the voids in the lateral isolation trenches 79 (which are formed by removal of the sacrificial lateral isolation trench fill structures 75). For example, if the sacrificial material layers 42 comprise silicon nitride, the second isotropic etch process may comprise a wet etch process employing hot phosphoric acid. Laterally-extending cavities 43 are formed in volumes from which portions of the sacrificial material layers 42 are removed by the second isotropic etch process. Generally, the laterally-extending cavities 43 can be formed by performing an isotropic etch process in which an isotropic etchant is provided into the first-type lateral isolation trenches 79A and the second-type lateral isolation trenches 79C.

According to an aspect of the present disclosure, the isotropic etch process has an etch distance that is greater than the lateral spacing along the second horizontal direction hd2 between a first-type lateral isolation trench 79A and a most proximal one of the finned insulating support structures 276. In one embodiment, the etch distance is less than the lateral distance between a neighboring pair of a first-type lateral isolation trench 79A and a second-type lateral isolation trench 79C. In one embodiment, the isotropic etch process has an etch distance that is greater than one half of a lateral distance between a neighboring pair of a first-type lateral isolation trench 79A and a second-type lateral isolation trenches 79C. In one embodiment, the etch distance is less than a lateral dimension of a finned insulating support structures 276 along the first horizontal direction hd1. In one embodiment, each interface between the pair finned insulating support structures 276 and the retro-stepped dielectric material portion 65 comprise a respective planar sidewall segment of the insulating fins 276F in contact with a respective planar sidewall segment of the retro-stepped dielectric material portion 65.

Referring to FIGS. 33A-33H, a backside blocking dielectric layer 44 may be optionally deposited in the laterally-extending cavities 43 on the physically exposed surfaces of the retro-stepped dielectric material portions 65, the finned insulating support structures 276, and the insulating layers 32 by a conformal deposition process. The backside blocking dielectric layer 44 comprises a dielectric material, such as a dielectric metal oxide (such as aluminum oxide) and/or silicon oxide. The thickness of the backside blocking dielectric layer 44 may be in a range from 3 nm to 12 nm, although lesser and greater thicknesses may also be employed.

At least one conductive material can be deposited in unfilled volumes of the laterally-extending cavities 43 by providing at least one reactant gas into the laterally-extending cavities 43 through the lateral isolation trenches 79. For example, the at least one conductive material may comprise a metallic barrier layer and a metallic fill material, as described above.

A plurality of electrically conductive layers 46 can be formed in the plurality of laterally-extending cavities 43, and a continuous metallic material layer can be formed on the sidewalls of each lateral isolation trench 79 and over the contact-level dielectric layer 80. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the lateral isolation trenches 79 or above the contact-level dielectric layer 80.

The deposited metallic material of the continuous electrically conductive material layer is etched back from the sidewalls of each lateral isolation trench 79 and from above the contact-level dielectric layer 80 by performing an etch process that etches the at least one conductive material of the continuous electrically conductive material layer. Each remaining portion of the deposited metallic material in the laterally-extending cavities 43 constitutes an electrically conductive layer 46. Each electrically conductive layer 46 can be a conductive line structure. Thus, the sacrificial material layers 42 are replaced with the electrically conductive layers 46.

In one embodiment, each vertical stack of electrically conductive layers 46 is formed between and does not laterally extend along the second horizontal direction hd2 farther than a most proximal first-type lateral isolation trench 79A and a most proximal second-type lateral isolation trench 79C.

In one embodiment, the insulating layers 32 can be vertically spaced apart from each other, and can be located between a first-type lateral isolation trench 79A and a pair of second-type lateral isolation trench 79C that laterally extend along a first horizontal direction hd1 and laterally spaced apart from each other along a second horizontal direction hd2. A first alternating stack of first insulating layers 32 and first electrically conductive layers 46 can be formed on one side of each finned insulating support structures 276, and a second insulating stack of second insulating layers 32 and second electrically conductive layers 46 can be formed on another side of each finned insulating support structure 276.

Each finned insulating support structures 276 includes a respective vertical insulating wall portion 276W that vertically extends through each layer within the first alternating stack (32, 46) and the second alternating stack (32, 46) and optionally further includes a respective vertical stack of insulating fins 276F that laterally extend outward from the respective vertical insulating wall portion 276W.

Referring to FIGS. 34A-34C, the processing steps described with reference to FIGS. 16A and 16B can be performed to form source regions 61 underneath the lateral isolation trenches 79, and to fill the lateral isolation trenches 79 with lateral isolation trench fill structures (74, 76). The lateral isolation trench fill structures (74, 76) may comprise first lateral isolation trench fill structures (74A, 76A) that fill the first lateral isolation trenches 79A, and second lateral isolation trench fill structures (74B, 76B) that fill the second lateral isolation trenches 79C.

A first alternating stack of first insulating layers 32 and second electrically conductive 46 and a second alternating stack of second insulating layers 32 and second electrically conductive layers 46 can be formed between a neighboring pair of first-type lateral isolation trench fill structures (74A, 76A). A composite dielectric isolation structure {65, 276, 74B} can be formed between the first alternating stack (32, 46) and the second alternating stack (32, 46). The composite dielectric isolation structure comprises a pair of retro-stepped dielectric material portions 65, an insulating support structure (e.g., a finned insulating support structure) 276 comprising a vertical insulating wall portion 276W located between the pair of retro-stepped dielectric material portions 65 and optionally further comprising vertical stacks of insulating fins 276F that laterally extend outward from the vertical insulating wall portion 276W, and a pair of second-type lateral isolation trench fill structures (74B, 76B) that are laterally spaced apart along the first horizontal direction hd1. In one embodiment, the vertical insulating wall portion 276W comprises a first end wall in contact with one of the pair of second-type lateral isolation trench fill structures (74B, 76B), and a second end wall in contact with another of the pair of second-type lateral isolation trench fill structures (74B, 76B).

Referring to FIGS. 35A-35E, a photoresist layer can be applied over the contact-level dielectric layer 80, and can be lithographically patterned to form openings over areas of the memory opening fill structures 58 and horizontally-extending portions of the electrically conductive layers 46 that underlie the stepped bottom surfaces of the retro-stepped dielectric material portions 65. An anisotropic etch process can be performed to form drain contact via cavities over the drain regions 63 of the memory opening fill structures 58, and to form layer contact via cavities over the horizontally-extending surfaces of the electrically conductive layers 46 underlying the retro-stepped dielectric material portions 65. At least one conductive material can be deposited in the drain contact via cavities to form drain contact via structures 88, and can be deposited in the layer contact via cavities to form layer contact via structures 86.

Referring to FIGS. 1-8B and 28A-35E and according to the third embodiment of the present disclosure, a three-dimensional memory device is provided, which comprises: a first alternating stack (32, 46) of first insulating layers 32 and first electrically conductive layers 46 and a second alternating stack (32, 46) of second insulating layers 32 and second electrically conductive layers 46 that are located over a substrate 8 between a pair of first-type lateral isolation trench fill structures (74A, 76A) that laterally extend along a first horizontal direction hd1 and laterally spaced apart from each other along a second horizontal direction hd2; and a composite dielectric isolation structure located between the first alternating stack (32, 46) and the second alternating stack (32, 46) and comprising a pair of retro-stepped dielectric material portions 65, an insulating support structure 276 comprising a vertical insulating wall portion 276W located between the pair of retro-stepped dielectric material portions 65, and a pair of second-type lateral isolation trench fill structures (74B, 76B) that are laterally spaced apart along the first horizontal direction hd1 by the insulating support structure 276.

In one embodiment, the vertical insulating wall portion 276W comprises a first lengthwise sidewall that laterally extends along the first horizontal direction hd1 and contacts a first retro-stepped dielectric material portion 65 of the pair of retro-stepped dielectric material portions 65, and a second lengthwise sidewall that laterally extends along the first horizontal direction hd1 and contact a second retro-stepped dielectric material portion 65 of the pair of retro-stepped dielectric material portions 65. In one embodiment, the vertical insulating wall portion 276W comprises a first end wall in contact with one of the pair of second-type lateral isolation trench fill structures (74B, 76B); and a second end wall in contact with another of the pair of second-type lateral isolation trench fill structures (74B, 76B).

In one embodiment, each of the pair of retro-stepped dielectric material portions 65 has a respective first variable lateral extent along the first horizontal direction hd1 that increases stepwise with a vertical distance from a horizontal plane including a bottommost surface of the first alternating stack (32, 46) and the second alternating stack (32, 46). In one embodiment, each of the pair of retro-stepped dielectric material portions 65 has a respective second variable lateral extent along the second horizontal direction hd2 that increases gradually without any step with the vertical distance from the horizontal plane.

In one embodiment, the insulating support structure 276 comprises a finned insulating support structure which further comprises vertical stacks of insulating fins 276F that laterally extend outward from the vertical insulating wall portion 276W. Each vertical stack of insulating fins 276F has a variable lateral extent along the first horizontal direction hd1 that decreases with a vertical distance from a horizontal plane including a bottommost surface of the first alternating stack (32, 46) and the second alternating stack (32, 46). In one embodiment, each vertical stack of insulating fins 276F has a same lateral extent along the second horizontal direction hd2 that is invariant with the vertical distance from the substrate 8.

In one embodiment, each of the insulating fins 276F comprises a respective convex sidewall surface segment that faces a respective concave sidewall surface segment of a respective one of the first electrically conductive layers 46 and the second electrically conductive layers 46; and a respective planar surface segment that is parallel to the first horizontal direction hd1 and contacting a respective one of the pair of second-type lateral isolation trench fill structures (74B, 76B).

The various embodiments described above can provide a support structure, such as a vertical stack of dielectric material plates 42', a pair of finned insulating support structures 176, and/or an insulating support structure 276, between a pair of second-type lateral isolation trenches (79B or 79C) adjacent to each retro-stepped dielectric material portion 65. The support structure provides structural support to the insulating layers 32 and the retro-stepped dielectric material portions 65 during replacement of sacrificial material layers 42 with electrically conductive layers 46. Pattern collapse can be prevented or reduced during formation of the laterally-extending cavities 43.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art.

What is claimed is:

1. A three-dimensional memory device, comprising:

insulating layers that are vertically spaced apart from each other and that continuously laterally extend between a first first-type lateral isolation trench fill structure and a second first-type lateral isolation trench fill structure that laterally extend along a first horizontal direction and laterally spaced apart from each other along a second horizontal direction;

first electrically conductive layers vertically interlaced with the insulating layers and contacting the first first-type lateral isolation trench fill structure;

second electrically conductive layers vertically interlaced with the insulating layers and contact the second first-type lateral isolation trench fill structure; and a composite dielectric isolation structure located between the first electrically conductive layers and the second electrically conductive layers and comprising a retro-stepped dielectric material portion, a vertical stack of dielectric material plates, and a pair of second-type lateral isolation trench fill structures that are laterally spaced apart along the first horizontal direction;

wherein each of the second-type lateral isolation trench fill structures comprises a respective insulating liner comprising a respective portion of an insulating liner material and contacting inner sidewalls of the respective etch stop liner, the first insulating layers, the second insulating layers, the first electrically conductive layers, and the second electrically conductive layers.

2. The three-dimensional memory device of claim 1, wherein:

the retro-stepped dielectric material portion has a first lateral extent along the second horizontal direction; and each dielectric material plate in the vertical stack of dielectric material plates has a second lateral extent along the second horizontal direction that is less than the first lateral extent.

3. The three-dimensional memory device of claim 1, wherein the dielectric material plates within the vertical stack of dielectric material plates have lateral extents along the first horizontal direction that decrease with a vertical distance from a horizontal plane including a bottommost surface of the vertical stack.

4. The three-dimensional memory device of claim 1, wherein each dielectric material plate within the vertical stack of dielectric material plates has a respective sidewall that is parallel to the second horizontal direction and contacts a respective vertical sidewall segment of the retro-stepped dielectric material portion.

5. The three-dimensional memory device of claim 1, wherein each dielectric material plate within the vertical stack of dielectric material plates comprises a concave sidewall segment located at a same level as a respective electrically conductive layer selected from the first electrically conductive layers and the second electrically conductive layers, and is in contact with a convex sidewall segment of a structural element selected from the respective electrically conductive layer or a backside blocking dielectric layer that contacts the respective electrically conductive layer.

6. The three-dimensional memory device of claim 5, wherein each dielectric material plate within the vertical stack of dielectric material plates further comprises:

a first planar sidewall segment in contact with a planar sidewall segment of a first etch stop liner that contacts a second-type lateral isolation trench fill structure of the pair of second-type lateral isolation trench fill structures; and a second planar sidewall segment in contact with a planar sidewall segment of the structural element.

7. The three-dimensional memory device of claim 1, wherein each of the first-type lateral isolation trench fill structures comprises a respective additional insulating liner comprising a respective additional portion of the insulating liner material.

8. The three-dimensional memory device of claim 1, wherein the retro-stepped dielectric material portion has a first variable lateral extent along the first horizontal direction that increases stepwise with a vertical distance from a horizontal plane including a bottommost surface of the vertical stack.

9. The three-dimensional memory device of claim 8, wherein the retro-stepped dielectric material portion has a second variable lateral extent along the second horizontal direction that increases gradually without any step along the second horizontal direction.

10. The three-dimensional memory device of claim 1, wherein a dielectric material plate within the vertical stack of dielectric material plates comprises:

first sidewall segments laterally extending along the first horizontal direction and contacting one of the second-type lateral isolation trench fill structures;

a second sidewall segment laterally extending along the second horizontal direction and contacting the one of the second-type lateral isolation trench fill structures;

a first concave surface segment located at a level of one of the first electrically conductive layers and in contact with a convex sidewall of a first structural element that is selected from the one of the first electrically conductive layers and a first blocking dielectric layer that contacts the one of the first electrically conducive layers; and a third sidewall segment laterally extending along the first horizontal direction and in contact with a planar sidewall of the first structural element.

11. The three-dimensional memory device of claim 1, wherein a plurality of dielectric material plates within the vertical stack of dielectric material plates has a uniform width along the second horizontal direction that is less than a minimum lateral dimension of the retro-stepped dielectric material portion along the second horizontal direction.

12. The three-dimensional memory device of claim 1, further comprising first memory openings extending through a first alternating stack of the first electrically conductive layers vertically interlaced with the insulating layers;

second memory openings extending through a second alternating stack of the second electrically conductive layers vertically interlaced with the insulating layers; and memory opening fill structures located in the first and the second memory openings, wherein each of the memory opening fill structures comprises a memory film and a vertical semiconductor channel.

* * * * *